United States Patent [19]
Matlow

[11] Patent Number: 5,328,556
[45] Date of Patent: Jul. 12, 1994

[54] WAFER FABRICATION

[75] Inventor: Sheldon L. Matlow, San Jose, Calif.

[73] Assignee: Nace Technology, Inc., San Jose, Calif.

[21] Appl. No.: 999,209

[22] Filed: Dec. 31, 1992

[51] Int. Cl.$^5$ .................... H01L 21/306; B44C 1/22; B05D 3/06; B08B 3/12

[52] U.S. Cl. .................... 156/643; 118/723 R; 134/1; 156/345; 427/460

[58] Field of Search ............... 156/643, 646, 345, 662, 156/659.1; 427/460, 508, 533, 534, 553, 554; 134/1; 118/723 R, 723 MW, 50.1, 620; 204/192.3, 192.32, 192.37, 298.33, 298.38, 298.07

[56] References Cited
U.S. PATENT DOCUMENTS

| | | | |
|---|---|---|---|
| 4,689,112 | 8/1987 | Bersin | 156/345 X |
| 4,718,976 | 1/1988 | Fujimura | 156/345 X |
| 4,816,098 | 3/1989 | Davis et al. | 156/345 |

*Primary Examiner*—William A. Powell
*Attorney, Agent, or Firm*—Fliesler, Dubb, Meyer & Lovejoy

[57] ABSTRACT

Method and apparatus are set forth for providing a reactive radical species at a substrate surface. A wall structure defines an interior chamber. A substrate is mounted in the chamber at a target position therein with a surface region of the substrate oriented in a selected direction. A first vaporous chemical is introduced to the chamber with the first vaporous chemical flowing toward the surface region of the substrate. A first radical species is generated from the first vaporous chemical intermediate the position of introduction of the first vaporous chemical and the substrate surface region and at a pressure of no more than about 0.1 Torr without producing significant amounts of ionized species. The first radical species flows toward the surface region of the substrate. The chamber is evacuated and maintained at a pressure of $\leq 10^{-7}$ Torr during the introduction of the first vaporous chemical. A second vaporous species may be introduced which reacts with the first radical species to produce a second radical species. Deposition, etching and cleaning can thereby be provided.

34 Claims, 2 Drawing Sheets

WAFER FABRICATION

TECHNICAL FIELD

The present invention relates to an apparatus and a method for providing a reactive radical species at a substrate surface. The apparatus and method can serve for cleaning the surface, etching, with or without patterning, the surface, and deposition of layers on the surface of any desired thickness. The apparatus and method are particularly useful for the processing of semiconductor wafers but is also useful for coating objects for protective purposes and can further be used to grow crystalline objects such as diamonds.

BACKGROUND OF THE INVENTION

The semiconductor industry is continually attempting to develop smaller and finer delineations on the semiconductor devices and to, at the same time, increase the throughput of acceptable devices. There are a number of factors involved which effect the transferring onto wafers of contaminants. These include the use of high temperatures in wafer processing, the use of high electric fields near the surface, the use of liquids in contact with wafers during processing, the use of relatively high gas pressures (greater than one Torr), for example, during wafer processing and the handling of wafers by processing personnel.

At higher temperatures the mobility of contaminants in and on the wafer is greatly increased. Such elevated temperatures are used during epitaxy, diffusion and post-ion implantation annealing.

The use of high electrical fields near the wafer results in at least two types of problems. Charged particles on the surface have their mobilities greatly enhanced by the high fields. Furthermore, the high fields used in ion implantation and reactive ion etching impart large momenta to charged particles in the vicinity of the wafer. These large-momentum charged particles can drive surface contaminants into the wafer and can cause crystal damage to the wafer (as in the case of ion implantation). A crystal defect can be considered to be a contaminant or a set of contaminants relative to several semiconductor device functions.

Liquids are well known to exhibit a 'bathtub ring' effect. This effect is the removing of a contaminant from one surface (or area on a surface) to another surface (or another area on the surface). Furthermore, dissolved materials in the liquid can deposit out on the surfaces in contact with the liquid.

When vapor phase chemistries are carried out on the surface of the wafer the by-products must be able to escape from the surface, or they will interfere with the desired chemistries, and they become trapped on the surface (or in the material being deposited when deposition chemistries are being used).

Finally, it is well-known that the 'dirtiest things' in a clean room are the people in it. Some handling of wafers by people at this stage of development of wafer fabrication is unavoidable. It is, however, essential that this handling be minimized.

DISCLOSURE OF INVENTION

The present invention is directed to overcoming one or more of the problems as set forth above.

In accordance with an embodiment of the invention an apparatus is set forth for providing a reactive radical species at a substrate surface. The apparatus comprises a wall structure which defines an interior chamber. Mounting means serves for mounting a substrate in the chamber at a target position therein with a surface region of the substrate oriented in a selected direction. First vaporous chemical introducing means serves for introducing a first vaporous chemical to the chamber with the first vaporous chemical flowing toward the surface region of the substrate. First radical species generating means intermediate the first vaporous chemical introducing means and the substrate surface serves for generating a first radical species from the first vaporous chemical at a pressure of no more than about 0.1 Torr without producing significant amounts of ionized species with the first radical species flowing toward the surface region of the substrate. Pumping means serves for evacuating the chamber and for maintaining a pressure within the chamber of $\leq 10^{-7}$ Torr during the introduction of the first vaporous chemical.

In accordance with another embodiment of the invention a method is set forth for providing a reactive radical species at a substrate surface. The method comprises mounting a substrate in a sealed chamber at a target position therein with a surface region of the substrate oriented in a selected direction. A first vaporous chemical is introduced to the chamber with the first vaporous chemical flowing toward the surface region of the substrate. A first radical species is generated from the first vaporous chemical at a position in the chamber intermediate the place of introduction of the vaporous chemical and the surface region of the substrate without producing significant amounts of ionized species with the first radical species flowing toward the surface region of the substrate. The chamber is evacuated at a rate sufficient for maintaining a pressure within the chamber of $10^{-7}$ Torr or below during the introduction of the first vaporous chemical.

In accordance with another embodiment yet of the invention a method is set forth of cleaning a substrate to remove one or more solids or molecules from a surface thereof. The method comprises generating a neutral activated chemical species without generating a substantial quantity of ionized activated species at a pressure of no more than about 0.1 Torr within a sealed evacuatable chamber. The neutral activated chemical species is flowed against the surface, the neutral activated chemical species being selected to react with and convert at least one of the solids or molecules to a vaporous species. The chamber is evacuated at an evacuation rate sufficient to maintain the pressure therein at $\leq 10^{-7}$ Torr during the flowing until a desired quantity of the solid or molecules has been removed by vaporization.

Another embodiment still of the invention is a method of etching into a surface of a substrate. The method comprises generating a neutral activated chemical species without generating a substantial quantity of ionized activated species at a pressure of no more than about 0.1 Torr within a sealed evacuatable chamber. The neutral activated chemical species is contacted with the surface, the neutral activated chemical species being selected to react with and convert the surface to a vaporous species until a desired quantity of the surface has been removed by vaporization. The chamber is evacuated at an evacuation rate sufficient to maintain the pressure therein at $\leq 10^{-7}$ Torr during the flowing until a desired quantity of the surface has been removed by vaporization.

An embodiment of the invention provides a method of depositing a chemical species on the a surface region of a substrate. The method comprises mounting a substrate in a sealed chamber at a target position therein with the surface region of the substrate oriented in a selected direction. A first vaporous chemical is introduced to the chamber with the first vaporous chemical flowing toward the surface region of the substrate. A first radical species is generated from the first vaporous chemical at a position in the chamber intermediate the place of introduction of the vaporous chemical and the surface region of the substrate without producing significant amounts of ionized species with the first radical species flowing toward the surface region of the substrate. The chamber is evacuated at a rate sufficient for maintaining a pressure within the chamber of $10^{-7}$ Torr or below during the introduction of the first vaporous chemical. A second vaporous chemical is introduced to the chamber intermediate the position of generation of the first radical species and the surface region of the substrate. The second vaporous chemical flows toward the surface region of the substrate. The second vaporous chemical is selected to react with the first radical species such that substantially all of the second vaporous chemical reacts with the first radical species to produce a second radical species flowing toward the surface region of the substrate. The second radical species, on contacting the surface region of the substrate, deposits the chemical species.

The present invention makes use of very far from thermodynamic equilibrium (VFFTE) chemistries thereby minimizing or avoiding entirely the above-mentioned problems of the prior art. With VFFTE chemistries heating of the wafers are not required; no charged particles are used in the vicinity of the wafers; no liquids are used; only total gas pressures below one Torr are used; and handling of wafers by people is minimized.

BRIEF DESCRIPTION OF THE DRAWINGS

The invention will be better understood by reference to the Figures of the drawings wherein.

Figure 1:
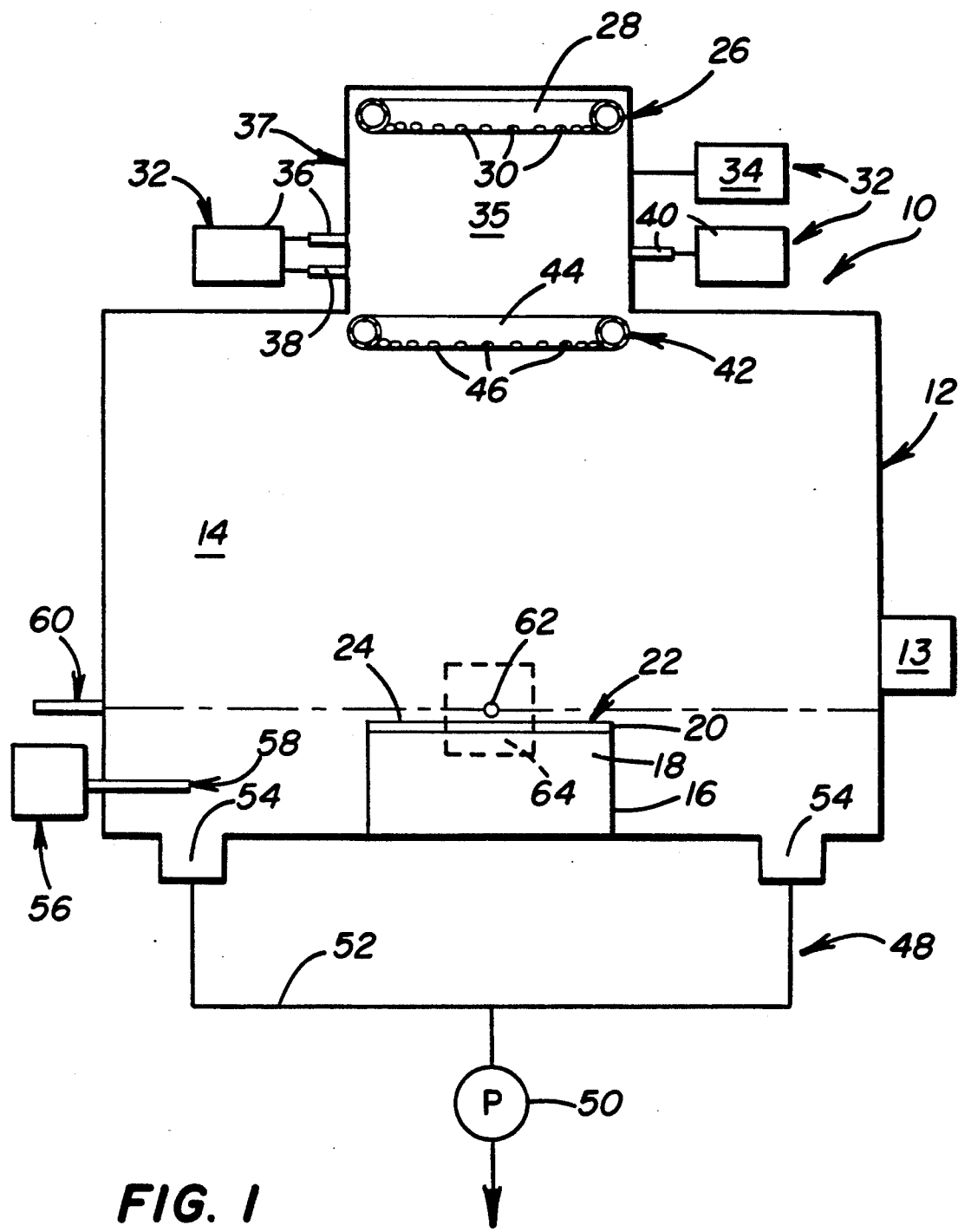
FIG. 1 illustrates, schematically, an apparatus in accordance with an embodiment of the invention which is suitable for carrying out methods in accordance with embodiments of the invention.

Illustration 3 (which is a part of the text rather than a separate drawing) illustrates, schematically, energy levels and energy interactions.

BEST MODE FOR CARRYING OUT INVENTION

Microwave generators are useful in certain embodiments of the invention. Microwave generators useful in the accordance with the present invention will generally be operated at less than the avalanche mode of operation. The frequency is not critical. Typically, commercial 2.45 Gigahertz microwave generators can be utilized. They generally will have a power above one kilowatt and at times as much as or even more than 20 kilowatts. The current will be generally low, for example, no more than 2 amperes. The electron energy is kept low enough so that substantially no ionic species are formed. Instead, only radical species are formed. When electron guns are utilized in accordance with various embodiments of the present invention they are generally utilized at a maximum of about 20 volts since at higher voltages ionization would occur. Typically the electron gun would operate at relatively high amperage, normally from 3 to 1,000 amps.

When tunable lasers are utilized, they are generally subject to the same parameters as are the electron guns. Typically they will be operated at a wavelength which falls within a range from about 600 to about 3,000 Angstroms.

When either electron guns or lasers are utilized, they are preferably utilized in a symmetrically placed mode preferably with an odd number of electron guns or tunable lasers, the electron guns being positioned so as to provide a relatively even sweep of energy across the chemical species being introduced whereby the activated species impinging on the wafer surface are relatively evenly distributed over the entire surface of the wafer.

Chemicals introduced can be utilized as diluents, as reactants with surface species or as sources of secondary radicals formed by the reaction of the primary radicals formed in the neutral activated species generating portion of the vacuum chamber. In the latter instance substantially all of the species impinging on the surface of the substrate will be in the nature of secondary radicals produced by reaction of the initial activated species with the vaporous chemical being introduced nearer the target, possibly with some excess of the first radical species also being present. If the chemicals introduced serve as reactants with surface species they will arrive at the surface along with the primary radicals. Diluents are useful in removing photoresists and the like so as to moderate the reaction with the primary radicals.

In operation a substrate is mounted in a sealed chamber at a target position therein with a surface region of the substrate oriented in a selected direction. A first vaporous chemical is introduced to the chamber with the first vaporous chemical flowing toward the surface region of the substrate. In the particular embodiment illustrated this would occur at an upper chemical introduction circle. A first radical species is generated from the first vaporous chemical at a position in the chamber intermediate the place of introduction the vaporous chemical and the surface region of the substrate without producing significant amounts of ionized species with the first radical species flowing toward the surface region of the substrate. The chamber is evacuated at a rate sufficient for maintaining a pressure within the chamber of $10^{-7}$ Torr or below during the introduction of the first vaporous chemical.

As mentioned above, a second vaporous chemical can be introduced to the chamber intermediate the position of generation of the first radical species and the surface region of the substrate, with the second vaporous chemical flowing toward the surface region of the substrate, the second vaporous chemical being selected to react with the first radical species to produce a second radical species flowing towards the surface region of the substrate. The geometry of introduction of the first vaporous chemical and the geometry of the first species generating means is preferably such as to provide substantial uniform distribution of the second radical species over the surface region of the substrate.

The specific spacing and positioning of the upper circle, a lower circle at which the second vaporous species can be introduced, the wafer and even the walls of the vacuum chamber can be important to the practice invention. When a microwave cavity is utilized to produce the first activated species the microwave cavity will generally be in the region between the upper and the lower circles or rings, a distance of 3 to 6 inches. The distance between the lower ring to the wafer surface will generally be from about 6 inches to about 12 inches. Generally the width of the chamber should be about three times of the diameter of the wafer being treated. This, along with the high pumping rate provided, serves to assure that the surface of the wafer will be relatively uniformly impinged upon by the activated or radical species.

FIG. 1 illustrates an apparatus 10 in accordance with an embodiment of the invention. The apparatus 10 includes a wall structure 12 which defines an interior chamber 14 accessible via an evacuatable entry port 13. Mounting means 16, in the embodiment illustrated a platform 18, serves for mounting a substrate 20, suitably a semiconductor wafer, in the chamber 14 at a target position 22 therein with a surface region 24 of the substrate 20 oriented in a selected direction (upwardly in the particular environment illustrated but the orientation is arbitrary and the direction which gravity acts is not important to the invention).

First vaporous chemical introducing means 26, in the embodiment illustrated an upper ring 28 having a plurality of holes 30, is located within the chamber 14 and is oriented to direct the first vaporous species toward the surface region 24 of the substrate 20. In the particular embodiment illustrated the holes 30 are evenly spaced about the ring 28 to provide as even a flow and as uniform a distribution as possible of vaporous species over the surface region 24 of the substrate 20.

First radical species generating means 32 is provided intermediate the first vaporous species introducing means 26 and the substrate surface region 24. The first radical species generating means 32 serves for generating a first radical species from the first vaporous chemical at a pressure of no more than about 0.1 Torr without producing significant amounts, and preferably zero, of ionized species with the first radical species flowing toward the surface region 24 of the substrate 20.

There are several alternatives for providing generation of the first radical species. For example, the first radical species generating means may be, or may include, a microwave generator 34 along with a microwave cavity 35 defined by walls 37. The microwave generator 34 may be used in combination with a defocussed electron gun and power supply 36. One or more additional defocussed electron guns 38 may be present. Also, and in what is a preferred embodiment, a plurality of defocussed electron guns 36,38 may be utilized without the microwave generator 34 (and without the microwave cavity walls 37). Instead of, or in addition to the electron guns, one can provide a $\beta$-emitter, for example, a nickel $\beta$-emitter, positioned so as to provide electrons in the cavity 35. The $\beta$-emitter can be present in elemental or combined form. The result will be a less expensive but generally less efficient apparatus. As still another embodiment useful alone or in combination with the microwave generator 34 and the defocussed electron gun 36 or guns 36,38, a defocussed laser and power supply 40, generally a tunable laser, may be used to generate the first radical species. The location of the first radical generating means 32 and the location and orientation of the first vaporous species introducing means 26 are such as to provide a substantially uniform distribution of the first radical species over the surface region 24 of the substrate 20.

In accordance with a preferred embodiment of the invention the chamber 14, where the substrate 20 is mounted, is at least about three times the width of the largest cross-dimension of the surface region 24.

In accordance with an embodiment and certain uses and methods of the invention it may be desirable or necessary to introduce a second vaporous species between the first radical species generating means 32 and the surface region 24 of the substrate 20. In such instances second vaporous chemical introducing means 42 is provided for introducing the second vaporous species intermediate the first radical species generating means 32 and the surface region 24 of the substrate 20. The second vaporous species is flowed towards the surface region 24 of the substrate 20. It is selected to react with the first radical species to produce a second radical species flowing toward the surface region 24 of the substrate 20. In the particular embodiment illustrated the second vaporous species introducing means 42 is similar in construction to the first vaporous species introducing means 26. More particularly, it includes a ring 44 with a plurality of oriented holes 46. When two vaporous species introducing means are present in the desired orientation it becomes possible to select and use a first vaporous species which can readily form the first radical species and, through reaction of the first radical species with the second vaporous species, to produce a second radical species which could not be readily directly produced by radical species generating means alone, i.e., by defocussed electron guns, defocussed lasers and/or microwave generators.

Means 48 is provided for evacuating the chamber 14 at a rate sufficient for maintaining a pressure within the chamber of $10^{-7}$ Torr or below during the introduction of the first vaporous species. In the particular environment illustrated the evacuating means 48 is in the nature of a high speed pump 50. Relatively large conduits 52 lead from the chamber 14 to the pump 50. Preferably, the conduits 52 open onto openings 54 which are located about and downstream from the substrate 20 whereby vaporous species generated at and/or flowing past the substrate 20 are efficiently carried through the large openings 54 and the large conduits 52 to the high speed pump 50.

The invention provides a number of capabilities. For example, a radical species can be produced which can carry out a chemical reaction on the surface region 24 of the substrate 20. Deposition of a chemical can be carried out in this manner. If desired, the radical species can be used to clean (remove one or more solids from) the surface 24 of the substrate 20. The surface region 24 of the substrate 20 can be etched using this technique. This can be done in connection with etching techniques such as masking to provide a desired etching pattern. An advantage of the apparatus and method of the invention is that a single apparatus can be used in sequential steps to carry out different chemistries. For example, a selected radical species, e.g., atomic hydrogen, may be generated for a time sufficient to clean the surface 24 of the substrate 20. Thereafter, through introducing one or more different vaporous chemicals thereby changing the first and/or second radical species, deposition can proceed in the same apparatus without changing the substrate or its orientation.

The composition of the gaseous species being evacuated from the chamber 14 can be monitored by monitoring means 56 which can include a probe 58 which is positioned in the chamber 14 adjacent the openings 54.

The monitoring means 56 can utilize any convenient analytical technique, e.g., mass spectroscopy, gas chromatography or visible, laser fluorescent spectroscopy, ultraviolet or infrared spectroscopy. In the Figure a laser 60 powered by a power source (not shown) can provide a laser beam 63, shown in phantom, across and above the surface 24 of the substrate 20 and a detector 62 located at 90° from the direction of the laser beam along with an optical spectrometer 64 for monitoring the chemical reactions. When the composition being monitored changes such can be used as an indication or determinant that the desired layer has been fully or sufficiently removed.

II. THERMODYNAMICS

A. Equilibrium Thermodynamics

In Classical Thermodynamics the First Law (The Conservation of Energy) is written $$dE = q + w, \quad [I\text{-}1]$$

where dE is the differential change in the internal energy of the system, q is an infinitesimal amount of work done by the environment on the system. (In the earlier literature the convention used was that of the work done by the system rather than on the system. Thus, [I-1] was formerly written $dE = q - w$.) Although dE is an exact differential (independent of path), q and w may not be. It is therefore desirable to define the paths in ways such that dE is expressible in terms of exact differentials. There are several ways in which this can be done. q can be replaced with C dT, where C is the heat capacity, and T is the absolute temperature. (It will be convenient to represent extensive variables—those proportional to the amount of matter in the system—in bold print and intensive variables—those not proportional to the amount of matter in the system—in ordinary print). w can be replaced by $a_1 dA_1 + a_2 dA_2 + \ldots + a_n dA_n$ where $a_1$ is an intensive variable such as pressure, a mechanical force, the electromotive force, the magnetic field or a chemical potential; and $A_1$ is the associated extensive variable such as volume, distance, the electric charge, the magnetization or the number of moles of a chemical species, respectively. Using the Einstein summation convention we can now write [I-1] as $$\begin{aligned} dE &= CdT + \sum_{i=1}^{n} a_i dA_i \\ &= CdT + a_i dA_i \text{ (}i\text{ summed from 1 to }n\text{)} \end{aligned} \quad [I\text{-}2]$$

Equation [I-2] has two peculiarities. The first differential on the right side of the equation is that of an intensive variable, whereas all the other $n+1$ differentials are those of extensive variables, and there is no intensive variable associated with the internal energy.

We shall define a new extensive variable, $$dS = CdT/T \quad [I\text{-}3]$$

called 'Entropy'. We can now rewrite [I-2] as $$\begin{aligned} dE &= TdS + a_i dA_i \quad (i \text{ summed from 1 to } n) \\ &= a_i dA_i \quad (i \text{ summed from 1 to } n+1) \end{aligned} \quad [I\text{-}4]$$

Recognizing that integers are intensive variables, we can rewrite [I-4] as $$\begin{aligned} 0 &= a_i dA_i - 1(dE) \\ &= a_i dA_i (i \text{ summed from 0 to } n+1) \end{aligned} \quad [I\text{-}5]$$

where $d/A_0 = dE$ and $a_0 = -1$.

At the first blush [I-5] looks strange. The right hand side is the sum of products of intensive variables and their associated extensive variables. The left hand side is simply zero, an integer. The answer to this apparent inconsistency is that the $a_1$'s are the elements of a vector. The $dA_1$'s are the elements of a second vector which is orthogonal to the first vector. Hence, their scalar product is zero. Although [I-5] has some interesting mathematical consequence, [I-4] is more useful for the present discussion.

We shall consider a closed system which is of constant volume and is surrounded by an 'energy controlling' bath. Traditionally a closed system is defined as one for which energy can be transferred between the system and the environment, but mass cannot be transferred. By Relativity, however, energy and mass are two different facets of the same entity. Thus, the traditional definition of a closed system is 'leaky'. We shall, therefore, define a closed system as one for which only zero rest mass particles can be transferred between the system and the environment.

Traditionally the environment here would be called a 'temperature controlling' or 'temperature controlled' bath. Since, as we shall show temperature is not always defined, we prefer the appellation 'energy controlling'. (If one wishes to be strictly accurate, one should note that an 'energy controlling' bath is not the same as a 'temperature controlling' bath. With a 'temperature controlling' bath a system can undergo a phase transition during which the temperature of the system does not change, but the energy does. With an 'energy controlling' bath a phase change cannot occur unless the bath is reset to allow the net transfer of energy between the system and the bath.) At equilibrium $$a_i dA_i = 0 \text{ (at equilibrium), (i summed from 1 to n),} \quad [I\text{-}6]$$

and $$dS/dE = 1/T \quad [I\text{-}7]$$

Figure 2:
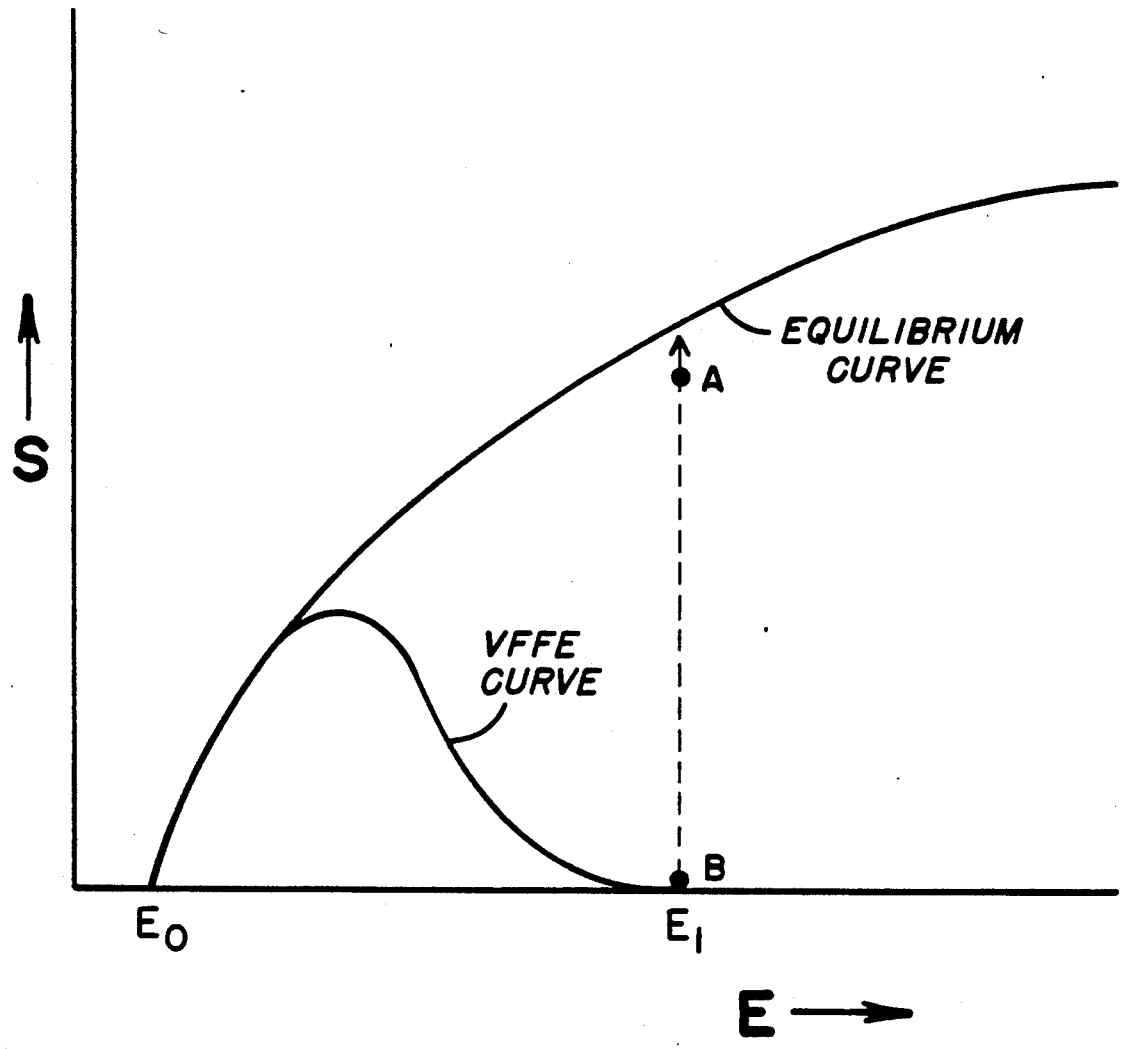
FIG. 2 illustrates, graphically, equilibrium and very far from equilibrium (VFFE) energy/entropy relationships.

(For near-equilibrium conditions we should use the partial derivative with the notation that all of the $A_1$'s of [I-6] are held constant). In FIG. 2, the curve labelled 'EQUILIBRIUM CURVE' represents [I-7] with the acknowledgement of the Third law requirement that entropy start at the value of zero, and with the acknowledgement that Relativity and Quantum Mechanics require that the internal energy start at a value greater than zero. We shall return to FIG. 2 when we discuss Non-Equilibrium Thermodynamics. Returning now to [I-4], we can rewrite the equation as $$dE - TdS = a_1 dA_1 \text{ (i summed from 1 to n)} \quad [I\text{-}8]$$

We now define a new extensive variable, $A_H$, such that $$dA_H = dE - TdS \quad [I\text{-}9]$$

$A_H$ is the 'Helmholtz Free Energy'. It is standardly represented by 'A'. We have appended the H subscript in order to distinguish it from the other $A_1$'s. Substituting [I-9] into [I-8] we obtain $$dA_H = a_1 a_1 dA_1 \text{ (1 summed from 1 to n)} \qquad \text{[I-10]}$$

By virtue of [I-6]
$$dA_H = 0 \text{ (at equilibrium)} \qquad \text{[I-11]}$$

One of the terms on the right hand side of [I-10] is $PdV_e$, where P is the pressure of the system and $V_e$ is the volume of the environment. Since $$dV_s = -dV_e$$

where $V_s$ is the volume of the system, we can rewrite [I-10] as $$dA_H = -PdV_s + a_1 dA_i \text{ (i summed from 2 to n)}.$$

It is traditional to define $A_H$ for constant volume conditions. Thus, $$dA_H = a_1 dA_1 \text{ } (dV_s = 0) \text{ (i summed from 2 to n)} \qquad \text{[I-13]}$$

Since so much chemistry is carried out under constant pressure rather than constant volume conditions, it is convenient to introduce two more extensive variables, H-'Enthalpy', and G-'Free Enthalpy', more usually called 'Gibbs Free Energy', by $$dH = dE + PdV_s \text{ and} \qquad \text{[I-14]}$$

$$\begin{aligned} dG &= dH - TdS \\ &= dE + PdV_s - TdS \end{aligned} \qquad \text{[I-15]}$$

From [I-9], [I-12] and [I-15] we obtain $$dG = a_1 dA_1 \text{ (i summed from 2 to n)} \qquad \text{[I-16]}$$

For constant pressure conditions the requirement for equilibrium is $$a_1 dA_1 = 0 \text{ (at equilibrium, constant pressure) (i summed from 2 to n)} \qquad \text{[I-17]}$$

Thus,
$$dG = 0 \text{ (at equilibrium, constant pressure)} \qquad \text{[I-18]}$$

Standardly, it is $\Delta H$, $\Delta G$ and S (constant pressure) which are measured and tabulated, rather than $\Delta E$, $\Delta A_H$ and S (constant volume). If we restrict our considerations to systems at low pressures, the ideal gas law, $$PV = nRT \qquad \text{[I-19]}$$

or $$P\Delta V = \Delta nRT \text{ (constant P,T)} \qquad \text{[I-20]}$$

is applicable. For vapor phase reactions for which the sum of the number of reactant molecules is equal to the sum of the number of product molecules, $\Delta n = 0$, and hence $P\Delta Y = 0$. Thus, $$\Delta H = \Delta E \text{ } (\Delta n = 0) \qquad \text{[I-21]}$$

We can therefore, use the data of the standard tabulations of $\Delta H_f^0$ (standard Enthalpies of formation), to calculate the $\Delta E_r^0$'s (standard Internal Energies of reaction) of reaction for which $\Delta n = 0$.

From Equilibrium Statistical Mechanics, using the *Principle of the Equipartition of Energy*, we can obtain at equilibrium $$\{[N(j)/g(j)]/[N(i)/g(i)]\} \exp [\Delta H(ji)/kT] = 1, \qquad \text{[I-22]}$$

where $N(j)$ is the number of items under discussion in states for which the enthalpy is $\Delta H(J)$, $g(j)$ is the number of such states (the 'multiplicity'), k is the Boltzmann constant, T is the absolute temperature and $\Delta R(ji)$ is the change in enthalpy of the item in going from one of the i-th states to one of the j-th states. For the purposes of [I-22] it is assumed that $$\Delta H(ji) > 0. \qquad \text{[I-23]}$$

Since the exponential term in [I-22] is positive definite by virtue of [I-23], it follows that $$N(j)/g(j) < N(i)/g(i) \qquad \text{[I-24]}$$

for all values of T. In order that $$N(j)/g(j) > N(i)/g(i) \qquad \text{[I-25]}$$

T would have to be negative. This cannot, however, be the case since T is an absolute temperature. In VFFTE systems such as those which we shall be discussing later, [I-25] is the case. Thus, we must conclude that temperature is not defined for VFFTE systems.

Equation [I-22] can be rearranged to a more familiar form.

$$[N(j)/g(j)] = [N(i)/g(i)] \exp [-\Delta H(hi)/kT],$$

or $$[N(j)/N(i)] = [g(j)/g(i)] \exp[-\Delta H(ji)/kT].$$

Let $$S(j) = k \ln [g(j)] \qquad \text{[I-26]}$$

$$\Delta S(ji) = \Delta S(j) - \Delta S(i) \qquad \text{[I-27]}$$

and $$K(ji) = N(j)/N(i) \qquad \text{[I-28]}$$

Using the definition of the Gibbs Free Energy, [I-15], we have $$K(ji) = \exp[-\Delta G(hi)/kT] \qquad \text{[I-29]}$$

(The reader may be surprised to find an extensive variable 'sitting by itself' in [I-22], [I-26] and I-29]. This is because the Boltzmann constant's units are J/K/molecule. It, thus, is an 'extensive constant'. Equation [I-26] is the equation developed by Max Karl Ernst Ludwig Planck in his work on the 'Black Body Problem' for which he invented the constant 'k', which is known as 'Boltzmann's Constant' rather than 'Planck's Constant'. The appellation 'Planck's constant', of course, is reserved for 'h'—the quantum of action. Planck invented h in his work on the 'Black Body Problem'.)

B. VFFTE Thermodynamics

Although equilibrium thermodynamics can be, and is, applied to near-equilibrium systems, it cannot be applied to VFFTE systems. The discussion of [I-22] showed that T is not defined for VFFTE systems. If T is not defined, then by virtue of [I-19] P is not defined. If it were, then by [I-19] we could define T. Similarly, $A_H$, H and G—by virtue of [I-9], [I-14] and [I-15], respectively—cannot be defined. We are, thus, left with only E, S, V and the N(j)'s for VFFTE systems.

Some very 'strange' things happen in VFFTE systems. Let us consider, as a simple example, a system with three energy levels and three items which can be in any of the three energy states (cf. ILLUSTRATION 3]. As we did relative to ILLUSTRATION 2, we shall assume that the system has a constant volume and is in an energy-controlled bath. The energy levels have the energy values $E_1=0$, $E_2=1$ and $E_3=2$. We start with all three items in the $E_3$ state. $E=6$ and $g=1$. By [I-26], if $g=1$, $S=0$. We now stepwise remove one unit of energy. We must consider two Cases—the items are distinquishable and the items are indistinguishable.

crease in the entropy with any decrease in the internal energy.

Consider the point A in FIG. 2. The system is near equilibrium. Holding the energy of the system constant, we find that the entropy of the system increases until it reaches the equilibrium value. Now consider the point B. Here we have a VFFTE system like that in ILLUSTRATION 3. Holding the energy of the system constant, we find that nothing happens. The entropy does not change! There is no mechanism available by which it can. As we lower the energy of the system the entropy follows the 'VFFTE CURVE'. When the energy has lowered sufficiently, the curve joints the 'EQUILIBRIUM CURVE'. Of course, not all systems are like that of ILLUSTRATION 3. The 'trick' is to choose those systems and conditions so that the system will follow the 'VFFTE CURVE'. Before we consider how to make such choices, we must discuss first some of the factors involved in the kinetics of chemical reactions.

III. CHEMICAL REACTION KINETICS

A. Absolute Reaction Rate Theory

Absolute Reaction Rate Theory is also known in the literature as 'Activated Complex Theory' and Transition State Theory'. In order to clarify the use of these different terms let us consider a simple model reaction.

ILLUSTRATION 3

```
E3 = 2   X1 X2 X3            X2 X3   X1        X3      X1 X2
E2 = 1   _____              X1              X2              X3
E1 = 0   _____             _____          _____         _____
          E = 6                  E = 5
          g = 1(1)*               g = 3(1)*
            (a)                     (b)

X2 X3    X1     X3    X1 X2     X1             X2             X3
          X1       X2           X3              X2 X3    X1    X3    X1 X2
                                 E = 4
                                 g = 6(2)*
                                   (c)

X3       X2          X3   X1          X2           X1
           X2               X3    X1           X3    X1          X2
           X1       X1              X2          X2          X3          X3
                                 E = 3
                                 g = 6(2)*
                                   (d)

X2 X3   X1     X3   X1 X2    X1             X2             X3
         X1               X2          X3             X2 X3  X1   X3   X1 X2
                                 E = 2                  E = 1
                                 g = 3(1)*              g = 3(1)*
                                   (e)                    (f)

X1 X2 X3
                              E = 0
                              g = 1(1)*
                                (g)
```

ILLUSTRATION 3 E

| | | g | |
|---|---|---|---|
| | | DISTINGUISHABLE ITEMS | INDISTINGUISHABLE ITEMS |
| (a) | 6 | 1 | 1 |
| (b) | 5 | 3 | 1 |
| (c) | 4 | 6 | 2 |
| (c) | 4 | 6 | 2 |
| (d) | 3 | 6 | 2 |
| (e) | 2 | 3 | 1 |
| (f) | 1 | 3 | 1 |

(*g values in parentheses are for indistinguishable items)

In either case as the energy of the system is reduced the entropy increases initially reaches a maximum value, and then decreases. This is not the behavior which we noted for equilibrium systems (FIG. 2. EQUILIBRIUM CURVE). There we observed a de- $$A+B \rightarrow C+D \quad \text{[I-30]}$$

It is assumed that the reactants combine for a short period of time to form the 'activated complex' AB which then decomposes to form the products. Thus, [I-30] is written $$A+B \rightarrow AB^\ddagger \rightarrow C+D \quad \text{[I-30a]}$$

It is further assumed that the reactants are in equilibrium with the activated complex, or—more accurately—that the reactions $$A+B \rightarrow AB^\ddagger$$

and $$AB^\ddagger \rightarrow A+B$$

are fast compared with $$AB^\ddagger \rightarrow C+D$$

Thus, [I-30a] becomes $$A+B \rightleftharpoons AB^\ddagger \rightarrow C+D \quad \text{[I-30b]}$$

If we consider traditional chemical kinetics, we can write $$\frac{d[C]}{dt} = k_r[A][B], \quad \text{[I-31]}$$

where the square brackets here indicate concentrations (and not equation numbers), t is time and $k_r$ is the rate constant. The rate with which AB decomposes is equal to [AB] times a frequency term, kT/h, where k is Boltzmann's constant, T is the absolute temperature and h is Planck's constant. We shall not prove here that kT/h is the correct frequency term because of the complexities of the proof which involves concepts from statistical quantum mechanics. Thus, we can also write $$\frac{d[C]}{dt} = \frac{kT}{h}[AB^\ddagger]. \quad \text{[I-32]}$$

Since $$[AB^\ddagger] = K^\ddagger [A][B], \quad \text{[I-33]}$$

where $K^\ddagger$ is the 'equilibrium constant', we can combine [I-31] and [I-32] to obtain $$\begin{aligned} k_r &= \frac{kT}{h} \frac{[AB^\ddagger]}{[A][B]} \\ &= \frac{kT^\ddagger}{h} K \\ &= \frac{kT}{h} \exp[-\Delta G^\ddagger /kT] \text{ (by [I-29])} \end{aligned} \quad \text{[I-34]}$$

From the viewpoint of dimensional analysis [I-34] appears to be in error. The dimensionality of $k_r$ appears to be time$^{-1}$, but in [I-31] its dimensionality is concentration$^{-1}$ time$^{-1}$. Going back to the derivation of [I-29] we see that [I-34] really should have been written $$k_r = \frac{kT}{h} \frac{g(AB^\ddagger)}{g(A)g(B)} \exp[-\Delta H^\ddagger /kT], \quad \text{[I-35]}$$

where $\Delta H^\ddagger$ is the enthalpy of activation. Since the g's are proportional to concentrations, the dimensionality of g (AB)/g(A)g(B) is concentration$^{-1}$. This fact is hidden by [I-26] in which g is treated as though it were dimensionless. By virtue of entropy being an extensive variable, g must be proportional to the amount of material. Thus, [I-34] is valid whether the reaction is unimolecular, bimolecular, trimolecular, etc.

At the thermodynamic equilibrium the principle of the equipartition of energy applies. Each translational and rotational degree of freedom 'receives' kT/2 as its energy 'allotment'. Each vibrational degree of freedom 'receives' a 'double allotment', kT. This is because a vibrational degree of freedom is actually two—a kinetic energy degree of freedom and a potential energy degree of freedom. Let W be the total amount of energy available in the system, and n be the number of degrees of freedom, then at equilibrium $$W=nkT/2 \quad \text{[I-36]}$$

and $$kT=2W/n \quad \text{[I-37]}$$

Under VFFTE conditions W is not equipartitioned among all degrees of freedom. It is restricted to just a few degrees of freedom. Let us assume that there are p such degrees of freedom where and define $$p<<n \quad \text{[I-38]}$$

$$q=2/p, \quad \text{[I-39]}$$

then $$\frac{1}{p} >> \frac{1}{n},$$

$$\frac{2}{p} >> \frac{2}{n},$$

$$q >> \frac{2}{n}$$

and $$qW>>kT. \quad \text{[I-40]}$$

Since T and $\Delta H$ are not defined under VFFTE conditions, we must rewrite [I-34] as $$k_r(VFFTE) = \frac{qW}{h} \cdot \exp[\Delta S/k] \cdot \exp[-\Delta E/qW]. \quad \text{[I-41]}$$

By virtue of [I-40] the first factor on the right is much greater than the corresponding factor in [I-35]. The second factors in the two equations are essentially equal. There is a small difference between $\Delta S$ under constant pressure conditions and $\Delta S$ under constant volume conditions. The third factor in [I-41] is much greater than that in [I-35] even when the difference between $\Delta H$ and $\Delta E$ is taken into account. Thus, a reaction will be much faster under VFFTE conditions than under Near Thermodynamic Equilibrium (NTE) conditions.

Since under NTE conditions W is partitioned among many degrees of freedom, it is possible for several different reaction paths to have sufficient activation energy (or enthalpy) for reactions to occur. As a result several other products besides the desired one may be produced. The desired product is, therefore, contaminated by these other products. If the purity of the desired product is crucial for its intended use, the presence of these contaminants can be a very serious problem.

If the system is properly prepared for the VFFTE reaction, all or most of W will be in the degree (or degrees) of freedom which will lead to the desired product. Thus, the product will be produced much purer than that produced under NTE conditions as well as being produced much faster. (How to prepare the system properly for the VFFTE reaction may not be obvious and may require a considerable amount of ingenuity.)

Let us consider a specific example of these principles. Suppose that we wish to generate methyl radicals from methane. We could use dioxygen or monoxygen as the oxidant.

[I-42]  $CH_4(g) + O_2(g) \rightarrow CH_3(g) + HO_2(g)$
        $-51 \quad 0 \quad\quad 148 \quad\quad 14$, $\Delta G_r^0(298\ K.) = +213\ kJ\ mol^{-1}$,
or
[I-43]  $CH_4(g) + O(g) \rightarrow CH_3(g) + OH(g)$
        $-51 \quad 232 \quad 148 \quad 34$, $\Delta G_r^0(298\ K.) = +1\ kJ\ mol^{-1}$,
followed by
[I-44]  $CH_4(g) + HO_2(g) \rightarrow CH_3(g) + HO_2(g)$
        $-51 \quad 14 \quad 148 \quad -105$, $\Delta G_r^0(298\ K.) = +80\ kJ\ mol^{-1}$,
or
[I-45]  $CH_4(g) + OH(g) \rightarrow CH_3(g) + H_2O(g)$
        $-51 \quad 34 \quad 148 \quad -229$, $\Delta G_r^0(298\ K.) = -64\ kJ\ mol^{-1}$.

(Note:
All thermodynamic data are from Reference (A) unless the Reference is specifically stated.) Thus, we see that the monoxygen reaction is more exo-ergonic than the dioxygen reaction, and the follow up reaction from the monoxygen reaction (the OH reaction) is, more exo-ergonic than the follow up reaction from the dioxygen reaction (the $HO_2$ reaction).

For a proposed chemical reaction to be useful it must be thermodynamically permitted and kinetically favorable. The greater the exo-ergonicity (and/or the exo-thermicity) of a chemical reaction is, the more likely it is that the reaction will be fast. This is, of course, not a guarantee. It is, however, guaranteed that a reaction which is highly endo-ergonic (and/or endothermic) will be very slow. As a test of this Principle let us look at the rate constants for these four reactions. The data are taken from <I-1>.

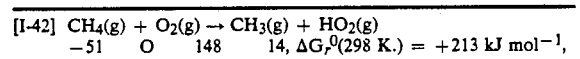

$k[I-42] = 6.67 \times 10^{-11}\ exp(-28,640/T) cm^3$ molecule$^{-1} s^{-1}$, [I-46]

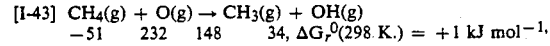

$k[I-43] = 1.7 \times 10^{-15} T^{1.5}\ exp(-4,330/T) cm^3$ molecule$^{-1} s^{-1}$, [I-47]

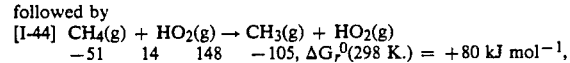

$k[I-44] = 3.0 \times 10^{-13}\ exp(-9,350/T) cm^3$ molecule$^{-1} s^{-1}$ [I-48]

and

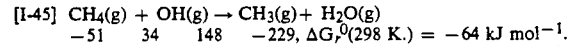

$k[I-45] = 3.2 \times 10^{-19} T^{2.4} exp(-1,060/T) cm^3$ molecule$^{-1} s^{-1}$. [I-49]

$k([I-42], 298K) = 1.22 \times 10^{-52} cm^3$ molecule$^{-1} s^{-1}$, $k([I-43], 298K) = 4.3 \times 10^{-18} cm^3$ molecule$^{-1} s^{-1}$, $k([I-44], 298K) = 7.1 \times 10^{-27} cm^3$ molecule$^{-1} s^{-1}$ and $k(I-45], 298K) = 7.9 \times 10^{-15} cm^3$ molecule$^{-1} s^{-1}$.

Thus we find that the Principle holds for this case.

By raising the temperature of the system for [I-42] the reaction rate of [I-43] can be attained. What is the required temperature?

$k([I-42], T) = k([I-43], 287K)$ $6.7 \times 10^{-11} exp(-28,640/T) = 4.3 \times 10^{-18}$ $T = 1729K.$ While specialized equipment is required to operate at so high a temperature, it can be done. At so high a temperature, however, numerous side reactions can be expected to occur. For example, for the reaction $CH_4(g) = C(graphite) + 2H_2(g)$ [I-50]

$K_r([I-50], 1700K) = 975$ [I-51]

Thus, at equilibrium only about 0.1% of the carbon is in the form of methane. The vast majority of the carbon has been deposited on the surfaces of the reactor. Since $\Delta G_f^0(C, g, 4600K) = +0.5kJ\ mol^{-1}$, there will also be a negligible quantity of carbon vapor at 1729K.

Since $\Delta H_f^0(O, g, 298K) = +249\ kJ\ mol^{-1}$, a significant amount of energy, we should also consider how much energy is required to heat the methane and dioxygen from 298K to 1729K. The proper way in which to calculate these quantities is to integrate $C_p$ with respect to T from 298K to 1729K. A simple way to approximate these quantities is to multiply the average value of $C_p$ over the temperature range by the temperature range. Thus, $$\Delta H(CH_4, g, 298 \rightarrow 1729) = 68.1 \times 10^{-3} \times (1729 - 298) \quad [I-52]$$
$$= 97.5\ kJ\ mol^{-1}$$

The factor of $10^{-3}$ is present because heat capacities are usually given in $J\ mol^{-1}\ K^{-1}$. Similarly, $$\Delta H(CH_2, g, 298 \rightarrow 1729) = 34.1 \times 10^{-3} \times (1729 - 298) \quad [I-53]$$
$$= 48.8\ kJ\ mol^{-1}$$

To these two energy requirements we must add the energy required to heat the reactor from 298K to 1729K. Although iron melts at 1809K, let us assume that the reactor is made of 100 gram atoms of iron (around twelve pounds).

$$\Delta H(100\ Fe, cr, 298 \rightarrow 1729) = 100 \times 38.0 \times 10^{-3} \times (1729 - 298) + 100(0.9 + 0.8) \quad [I-54]$$
$$= 5,608\ kJ/100\ gram\ atoms$$

where 0.9 kJ/gram atom and 0.8 kJ/gram atom are the heats of transition from the alpha phase to the gamma phase and from the gamma phase to the delta phase, respectively. Thus, although it requires more energy to generate the monoxygen than is required to heat the methane and dioxygen from 298K to 1729K, the monoxygen requirement is quite small when the total 1729K energy requirement is considered.

As another example, let us consider the generation of formyl from formaldehyde. Again the kinetic data are from <I-1>.

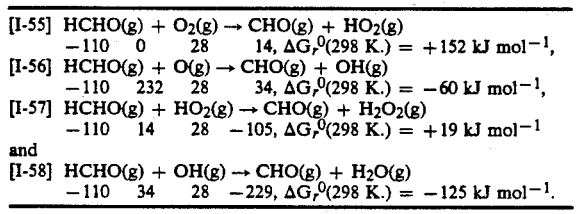

| [I-55] | HCHO(g) + O$_2$(g) → CHO(g) + HO$_2$(g) |
| | $-110 \quad 0 \quad 28 \quad 14$, $\Delta G_r^0$(298 K.) = +152 kJ mol$^{-1}$ |
| [I-56] | HCHO(g) + O(g) → CHO(g) + OH(g) |
| | $-110 \quad 232 \quad 28 \quad 34$, $\Delta G_r^0$(298 K.) = $-60$ kJ mol$^{-1}$ |
| [I-57] | HCHO(g) + HO$_2$(g) → CHO(g) + H$_2$O$_2$(g) |
| | $-110 \quad 14 \quad 28 \quad -105$, $\Delta G_r^0$(298 K.) = +19 kJ mol$^{-1}$ |
| and | |
| [I-58] | HCHO(g) + OH(g) → CHO(g) + H$_2$O(g) |
| | $-110 \quad 34 \quad 28 \quad -229$, $\Delta G_r^0$(298 K.) = $-125$ kJ mol$^{-1}$ |

$$k([I-55]) = 3.4 \times 10^{-11} exp(-19,600/T) cm^3 \text{ molecules}^{-1} s^{-1}, \quad [\text{I-59}]$$

$$k([I-56]) = 3.0 \times 10^{-11} exp(-1,500/T) cm^3 \text{ molecule}^{-1} s^{-1}, \quad [\text{I-60}]$$

$$k([I-57]) = 3.3 \times 10^{-12} exp(-5,870/T) cm^3 \text{ molecule}^{-1} s^{-1} \quad [\text{I-61}]$$

and $$k([I-58]) = 5.7 \times 10^{-15} T^{1.18} exp(225/T) cm^3 \text{ molecule}^{-1} s^{-} \quad [\text{I-62}]$$

$$k([I-55], 298K) = 9.3 \times 10^{-40} cm^3 \text{ molecule}^{-1} s^{-1},$$

$$k([I-56], 298K) = 1.65 \times 10^{-13} cm^3 \text{ molecule}^{-1} s^{-1},$$

$$k([I-57], 298K) = 9.2 \times 10^{-21} cm^3 \text{ molecule}^{-1} s^{-1}$$

and $$k([I-58], 298K) = 1.01 \times 10^{-11} cm^3 \text{ molecule}^{-1} s^{-1}.$$

$$k([I-55], T) = k([I]-56], 298K).$$

$$3.4 \times 10^{-11} exp(-19600/T) = 1.65 \times 10^{-13}$$

$$T = 3679 \, K.$$

$$HCHO(g) = C(graphite) + H_2(g) + \tfrac{1}{2}O_2(g) \quad [\text{I-63}]$$

and $$K_r([I-63], 3600K) = 1.69. \quad [\text{I-64}]$$

Again we find that the reactions which are more exo-ergonic are faster. The temperature of 3679K is much too high for an iron reactor. Because formaldehyde is more stabile relative to the elements than methane is, [I-64] is much smaller than [I-51] even though the temperature is much higher.

B. Collision Theory

Although Absolute Reaction Rate Theory, being based on Quantum Mechanics, is more elegant and more definitive than Collision Theory, the latter nonetheless remains quite valuable for the insights which it provides. Unlike Absolute Reaction Rate Theory all reactions, being based on the Kinetic Theory of Gases, Collision Theory is applicable only to gas phase reactions and heterogeneous reactions in which one of the phases is the gas phase.

We begin with the assumption that the gas phase consists of two kinds of molecules, which we designate by A and B, and that the molecules can be approximated by spheres. The diameters of these spheres are $d_A$ and $d_B$, respectively. If the centers of an A molecule and a B molecule are within a distance $$d_{AB} = (d_A + d_B)/2, \quad [\text{I-65}]$$

collision will occur. The collision frequency will be given by $$Z_{AB} = \pi d_{AB}^2 \bar{v}_{AB} N_A N_B / V^2, \quad [\text{I-66}]$$

where $\bar{v}_{AB}$ is the mean relative speed of the two molecules, $N_A$ and $N_B$ are the number of molecules of A and B, respectively, and V is the volume of the gas phase.

From the Kinetic Molecular Theory of Gases $$\bar{v}_{AB} = (8 \, kT/\pi\mu)^{\tfrac{1}{2}}, \quad [\text{I-67}]$$

where $$\mu = \frac{m_A m_B}{m_A + m_B}, \quad [\text{I-68}]$$

$m_A$ and $m_B$ being the masses of molecule A and molecule B, respectively. It should be noted that, although the units of [I-67] appear to be ms$^{-1}$ (or cm s$^{-1}$), the units which must be used are actually ms$^{-1}$ molecule$^{-1}$ because $\bar{v}_A$, for example is the sum of the speeds of all of the A molecules divided by the number of A molecules. Most texts ignore this 'nicety'. We will find in what follows that our results will have the wrong units if we ignore this 'nicety'.

The substitution of [I-67] into [I-66] yields $$Z_{AB} = \frac{N_A N_B}{V^2} (\pi d_{AB}^2) \left(\frac{8 \, kT}{\pi\mu}\right)^{\tfrac{1}{2}} \quad [\text{I-69}]$$

$$= 2 (2\pi)^{\tfrac{1}{2}} \left(\frac{N_A N_B}{V^2}\right) (d_{AB}^2) \left(\frac{kT}{\mu}\right)^{\tfrac{1}{2}}$$

If A and B are the same kind of molecule, $$\frac{1}{\mu} = \frac{m_A + m_A}{m_A m_A}$$

$$= \frac{2}{m_A}$$

and $$Z_{AA} = \tfrac{1}{2} \times 2(2\pi)^{\tfrac{1}{2}} \left(\frac{N_A}{V}\right)^2 (d_A^2) \left(\frac{2 \, kT}{m_A}\right)^{\tfrac{1}{2}} \quad [\text{I-70}]$$

$$= 2(\pi^{\tfrac{1}{2}}) \left(\frac{N_A}{V}\right)^2 (d_A^2) \left(\frac{kT}{m_A}\right)^{\tfrac{1}{2}}$$

$$= 2(\pi^{\tfrac{1}{2}}) \left(\frac{N_A}{V}\right)^2 (d_A^2) \left(\frac{RT}{M_A}\right)^{\tfrac{1}{2}}$$

where the initial factor of $\tfrac{1}{2}$ is to correct for counting each molecule twice—once as a collider and once as a collidee, R is the molar gas constant (8.31 J mol$^{-1}$K$^{-1}$) and $M_A$ is the molar mass in kg.

The number of collisions experienced by one molecule in unit time is $$Z_A = 4(\pi^{\frac{1}{2}})\left(\frac{N_A}{V}\right)(d_A{}^2)\left(\frac{RT}{M_A}\right)^{\frac{1}{2}}, \quad [\text{I-71}]$$

and the mean speed is $$\bar{v}_A = \left(\frac{8\,RT}{\pi M_A}\right)^{\frac{1}{2}}. \quad [\text{I-72}]$$

Thus, the average distance traveled between collisions, the 'mean free path', is $$\lambda = \frac{\bar{v}_A}{Z_A} \quad [\text{I-73}]$$

$$= \frac{2\left(\frac{2}{\pi}\right)^{\frac{1}{2}}\left(\frac{RT}{M_A}\right)^{\frac{1}{2}}}{4(\pi^{\frac{1}{2}})\left(\frac{N_A}{v}\right)(d_A{}^2)\left(\frac{RT}{M_A}\right)^{\frac{1}{2}}}$$

$$= \frac{1}{(2)^{\frac{1}{2}}(\pi)\left(\frac{N_A}{V}\right)(d_A{}^2)}$$

The triple collision frequency can be estimated by means of the assumption $$\frac{Z_{AAA}}{Z_{AA}} = \frac{d_A}{\lambda}, \quad [\text{I-74}]$$

on the idea that the probability of a third molecule colliding with two molecules which have collided, before they 'bounce apart', is proportional to the ratio of its collision diameter and its mean free path. Thus, $$Z_{AAA} = \frac{2\,(\pi)^{\frac{1}{2}}\left(\frac{N_A}{v}\right)(d_A{}^2)\left(\frac{RT}{M_A}\right)^{\frac{1}{2}}(d_A)}{1/(2^{\frac{1}{2}})(\pi)(N_A/V)(d_A{}^2)} \quad [\text{I-75}]$$

$$= (2\pi)^{3/2}\left(\frac{N_A}{V}\right)^3 (d_A{}^5)\left(\frac{RT}{M_A}\right)^{\frac{1}{2}}.$$

It will be instructive to evaluate [I-73], [I-70] and [I-75] for some specific cases. At 273K and one atmosphere pressure (STP) $6.02 \times 10^{23}$ molecules occupy $22.41 = 22.4 \times 10^3 \text{ cm}^3 = 22.4 \times 10^{-3} \text{ m}^3 = 2.24 \times 10^{-2} \text{ m}^3$.

Thus, $$\frac{N_A}{v}(STP) = \frac{6.02 \times 10^{23} \text{ molecules}}{2.24 \times 10^{-2} \text{ m}^3} \quad [\text{I-76}]$$

$$= 2.69 \times 10^{25} \text{ molecules/m}^3.$$

From <I-2> we obtain the following collision diameters

| SPECIES | $d_A$ (nm) |
|---|---|
| CO | 0.316 |
| H$_2$ | 0.276 |
| O$_2$ | 0.290 |

The average of these three values is 0.294 nm. Thus, we can consider dioxygen to be a 'typical' molecule.

$$\lambda(O_2, STP) = 1/(2)^{\frac{1}{2}}(\pi)(2.69 \times 10^{25} \text{ molecules m}^{-3}) \quad [\text{I-77}]$$

$$(2.90 \times 10^{-10} \text{ m})^2$$

$$= 9.95 \times 10^{-8} \text{ m}$$

$$= 9.95 \times 10^{-6} \text{ cm}$$

$$= 995 \text{ Å}.$$

$$Z(O_2, O_2, STP) = 2(\pi)^{\frac{1}{2}}(2.69 \times 10^{25} \text{ molecules m}^{-3})^2 \times \quad [\text{I-78}]$$

$$(2.90 \times 10^{-10} \text{ m})^2 \times$$

$$\left(\frac{8.31\,J\,\text{mol}^{-1}\,K^{-1} \times 237K}{32 \times 10^{-3} \text{ kg mol}^{-1}}\right)^{\frac{1}{2}} \text{molecule}^{-1}$$

$$= 5.74 \times 10^{34} \text{ molecules m}^{-3}\,s^{-1}$$

$$= 5.74 \times 10^{28} \text{ molecules cm}^{-3}\,s^{-1}.$$

It should be noted that $J = \text{kgm}^2 s^{-2}$.

If every collision leads to a chemical reaction, the rate constant will be $$k_2 = Z(O_2, O_2, STP)/N_{O2}/V)^2 \quad [\text{I-79}]$$

$$= 5.74 \times 10^{28} \text{ molecules cm}^{-3}\,s^{-1}/(2.69 \times 10^{19} \text{ molecules cm}^{-3})^2$$

$$= 7.93 \times 10^{-11} \text{ cm}^3 \text{ molecule}^{-1}\,s^{-1},$$

where the subscript on the k indicates a bimolecular reaction. From <I-3> we obtain the following $CF_3(g) + H(g) \rightarrow CF_2(g) + HF(g), k_2 = 9.1 \times 10^{-} \text{ cm}^3$ molecule$^{-1}\,s^{-1}$, [I-80]

$CF_2(g) + H(g) \rightarrow CF(g) + HF(g), k_2 = 3.9 \times 10^{-11} \text{ cm}^3$ molecule$^{-1}\,s^{-1}$ [I-81]

and $CF(g) + H(g) \rightarrow C(g) + HF(g), + HF(g),$
$k_2 = 1.9 \times 10^{-11} \text{ cm}^3$ molecule$^{-1}\,s^{-1}$. [I-82]

Thus, we see that each collision of a monohydrogen and a trifluoromethyl undoubtedly leads to a reaction. It should be noted that, if we had used ms$^{-1}$, rather than ms$^{-1}$ molecule$^{-1}$, as the units for [I-67], we would not have obtained the correct units for [I-79].

$$Z(O_2, O_2, O_2, STP) = (2\pi)^{3/2}(2.69 \times 10^{25} \text{ molecules m}^{-3})^3 \times \quad [\text{I-83}]$$

$$(2.90 \times 10^{-10} \text{ m})^5 \times$$

$$\left(\frac{8.31\,J}{\text{mol}^{-1}K^{-1} \times 273K}{32 \times 10^{-3} \text{ kg mol}^{-1}}\right)^{\frac{1}{2}} \text{molecule}^{-1}$$

$$= 1.674 \times 10^{32} \text{ molecules m}^{-3}\,s^{-1}.$$

Thus, for every trimolecular collision at STP about 350 bimolecular collisions occur.

At 0.1 Torr N/V is reduced by a factor of 1/7600 (1 atmosphere = 760 Torr). Thus, $$Z(O_2, O_2\ 273K, 0.1 \text{ Torr}) = 5.74 \times 10^{34} \times (7600)^{-2} \quad [\text{I-84}]$$

$$= 9.94 \times 10^{26} \text{ molecules m}^{-3}\,s^{-1},$$

$$Z(O_2,O_2,O_2,273K,0.1\text{ Torr}) = 1.674 \times 10^{32} \times (7600)^{-3} \quad [\text{I-85}]$$
$$= 3.81 \times 10^{20} \text{ molecules}^2 \text{ m}^{-3} \text{ s}^{-1}$$

and $$\lambda(O_2,273K,0.1\text{ Torr}) = 9.95 \times 10^{-6} \times 7600 \quad [\text{I-86}]$$
$$= 7.56 \times 10^{-2} \text{ cm}.$$

Thus, for every trimolecular collision at 273K and 0.1 Torr about 2.6 million bimolecular collisions occur. At 0.1 Torr, therefore, there are effectively no trimolecular collisions, and the mean free path is almost one millimeter!

C. The Arrhenius Equation

No discussion of Chemical Reaction Kinetics would be complete without at least mentioning the Arrhenius Equation.

$$k_r = A \exp(-E^*/kT), \quad [\text{I-87}]$$

an empirical equation which is useful in describing the change in $k_r$ with temperature. $E^*$ is the 'activation energy'. $A$ is known as the 'frequency factor', the fraction of the collisions which have the proper orientation of the molecules. A more sophisticated form of [I-87] takes into account that A is actually a function of temperature.

$$k_r B(T) \exp(-E^*/kT). \quad [\text{I-88}]$$

The comparison of [I-88] with [I-35] yields $$B(T) = \frac{kT}{h} \cdot \frac{g(AB^\ddagger)}{g(A)g(B)}$$

and $$E^* = \Delta H^\ddagger.$$

If in [I-34] we assume that $\Delta H^\ddagger = 0$ (no enthalpy of activation), $$k_r = \frac{kT}{h} \cdot \frac{V}{N} \exp(\Delta S^\ddagger/k), \quad [\text{I-89}]$$

where the factor of V/N is introduced because of the form of the ratio of multiplicities in [I-35]—two molecules combine to form one activated complex, $$(N/V)/(N/V)^2 = V/N.$$

For the formation of a chemical bond the entropy decreases by about $1.7 \times 10^{-22}$ J bond$^{-1}$ K$^{-1}$. In the activated complex about half a bond is formed. Thus, if the molecules do not need a specific orientation to react, $$k_r = \frac{1.38 \times 10^{-23} \text{ J K}^{-1} \times 273 K^{-1}}{6.63 \times 10^{-34} \text{ Js}} \times \quad [\text{I-90}]$$
$$\frac{1}{2.69 \times 10^{25} \text{ molecules m}^{-3}} \times \exp(-1.7 \times 10^{-22} \text{ J bond}^{-1} K^{-1} \times 0.5 \text{ bonds}/1.38 \times 10^{-23} JK^{-1})$$
$$= 5.68 \times 10^{12} s^{-1} \times 3.72 \times 10^{-26} \text{ m}^3 \text{ molecule}^{-1} \times$$
$$2.11 \times 10^{-3} \times (10^6 \text{ cm}^3 \text{ m}^{-3})$$
$$= 4.46 \times 10^{-10} \text{ cm}^3 \text{ molecule}^{-1} s^{-1}.$$

It should be noted that this value is 5.6 times as large as that calculated using 'rigid sphere' Collision theory, [I-79].

Referring back to [I-80]–[I-82], we see that the experimental values of the rate constants are all somewhat smaller than that calculated in [I-90]. In the calculation of [I-90] we assumed that 'the molecules do not need a specific orientation to react'. Since not all of the surface of $CF_3$ on collision with H will yield HF, an orientation factor is clearly involved. This is even more so the case with $CF_2$ and a fortiori the case with CF. Since $$\frac{k_2 [I\text{-}82]}{k_2 [I\text{-}90]} = \frac{1.9 \times 10^{-11} \text{ cm}^3 \text{ molecule}^{-1} s^{-1}}{4.5 \times 10^{-10} \text{ cm}^3 \text{ molecule}^{-1} s^{-1}} \quad [\text{I-91}]$$
$$= 4.2 \times 10^{-2},$$

this would be the fraction of the surface of the CF molecule which will yield HF on collision with H if CF were a sphere. The area of a portion of a sphere is given by $$A(\phi) = 2\pi r^2 (1 - \cos\phi), \quad 0 \le \phi \le 180°. \quad [\text{I-92}]$$

If we equate [I-91] and [I-92] divided by $4\pi r^2$ (the total surface area of a sphere), we obtain $$\frac{2\pi r^2 (1-\cos\theta)}{4\pi r^2} = 4.2 \times 10^{-2},$$
$$1 - \cos\theta = 8.4 \times 10^{-2},$$
$$\cos\theta = 9.16 \times 10^{-1}$$

and $$\phi = 23.7°. \quad [\text{I-93}]$$

If we use a circle as the model of CF, then [I o 91] is a measure of the fraction of the circumference which is reactive.

$$C = r\theta, \quad 0 \le \theta \le 2\pi \text{ radians},$$
$$\frac{r\theta}{2\pi r} = 4.2 \times 10^{-2}$$

and $$\theta = 8.4 \times 10^{-2} \pi \text{ radians} \quad [\text{I-94}]$$
$$= 8.4 \times 10^{-2} \text{ radians} \times \frac{180°}{\pi \text{ radians}}$$
$$= 15.1°.$$

Both of these models are, of course, very poor approximations to the CF molecule, but the fact that I-93] and [I-94] are not that much different is indicative that the value is in the 'right ball park'.

IV. THE VFFTE APPARATUS

Before we begin our discussion of the details of the VFFTE chemistries for wafer fabrication, it will be useful to describe the VFFTE apparatus (Apparatus). At this time we will limit our discussion to those aspects of the Apparatus related to wafer-wide chemistries. Those aspects of the apparatus related to patterning will be discussed later.

The Apparatus comprises a vacuum system with a large chamber and a high speed pumping system which will keep most of the chamber at a maximum of 100 nanoTorr. The diameter of the chamber should be at least three times the diameter of the wafer. The chamber is connected to two load locks which can be pumped down independently of the main chamber and each other. The load locks—main chamber complex is equipped with a robotics system which will transfer wafers between the load locks and the main chamber, and which will hold the wafer in place in the main chamber with a minimum of linear and rotational motions during the carrying out of the chemistries.

Above the main chamber and connected to it is the 'activation system' which consists of an upper vapor inlet circle, the activation chamber and the lower vapor inlet circle. The activation chamber can be a microwave cavity, a chamber which is irradiated by an electron gun (or guns) providing a defocused beam(s) of high current of low energy (1-25 eV) electrons or a chamber which is irradiated by a tunable laser (or lasers) with a defocused beam(s) with a high flux of photons in the desired energy range.

Since the charge on an electron is $1.602 \times 10^{-19}$ C, $$1 \, eV = 1.602 \times 10^{-19} \, J.$$

Furthermore, $$E = h\nu \text{ and } c = \lambda\nu,$$

therefore $$E = hc/\pi \qquad [I-95]$$
$$= hc\bar{\nu},$$

where $\bar{\nu}$ is in wave numbers (cm$^{-1}$). Thus, $$\begin{aligned} E(\bar{\nu} = 1 \text{ cm}^{-1}) &= 6.626 \times 10^{-34} \, Js \times 2.998 \times \\ & \quad 10^{10} \text{ cm s}^{-1} \times 1 \text{ cm}^{-1} \\ &= 1.986 \times 10^{-23} \, J, \end{aligned}$$

or $$\begin{aligned} 1 \text{ cm}^{-1} &= 1.986 \times 10^{-23} \, J \\ &= 1.986 \times 10^{-23} \, J \times \frac{1 \, eV}{1.602 \times 10^{-19} \, J} \\ &= 1.240 \times 10^{-4} \, eV, \end{aligned} \qquad [I-96]$$

or $$1 \, eV = 8.064 \times 10^3 \text{ cm}^{-1} \qquad [I-96a]$$

and $$(eV)(\text{Å}) = 1.240 \times 10^4. \qquad [I-96b]$$

Into the upper circle is introduced the vapor species which is to be activated. The proper valving and controls are connected to the circle so that several different species are available for activation at controlled flow rates. (Only one species is being activated at a time.) Into the lower circle is introduced the vapor species (or more than one species) which is (are) to react with and/or dilute the activated species. (In some cases no species is introduced into the lower circle. All the chemistries are carried out by the activated species reacting with the materials on the surface of the wafer including, in some cases, the surface of the wafer itself.)

As with the upper circle the proper valving and controls are connected to the lower circle so that several different species are available at controlled flow rates.

Since many of the possible species used are toxic, corrosive and/or flammable, the source containers must be enclosed in safety chambers with the appropriate monitor/warning systems in case of leaks. Furthermore, since the effluents may also be toxic, corrosive and/or flammable, the Apparatus must have means for safely disposing of the effluents.

Finally, the apparatus must have a control computer which will control the valves, controls and pumps in the proper sequences as well as the movements of the wafers. The instructions to the control computer can be on tapes or discs or can be inputs from design computers.

V. UPPER CIRCLE CHEMISTRIES

A. Introduction

As was indicated in SECTION I. high electric fields near the wafer are to be avoided. This includes the presence of charged particles near or on the surface of the wafer. Thus, activation involving ionization is to be avoided as much as possible. This means that the conditions in the activation chamber should be adjusted to maximize electronic excitation (including dissociation) and minimize ionization. Because the cross section versus energy curves for electronic excitation and ionization frequently peak at widely different energies, these adjustments can be made for the vapor species which we have chosen for discussion here.

Since the excitation-dissociation energies are 3 to 15 eV above the thermodynamic dissociation energies, the particles leaving the activation chamber can have energies 145 to 725 kJ mol$^{-1}$ above the ground states. The tabulated thermodynamic data are generally for ground states. Thus, reactions may be much more exothermic than the ground state calculations indicate. Furthermore, the excited state species reaction energies may be so great as to cause thermal damage to the wafer. In these cases we dilute and partially de-energize the excited state species by introducing the ground state diatomic species by means of the lower circle. B. Carbon Monoxide Carbon monoxide is a valuable reagent for the etching of metals which form volatile carbonyls such as $Cr(CO)_6$, $Fe(CO)_6$, $Mo(CO)_6$, $Ni(CO)_4$ and $W(CO)_6$. It should be noted that all of these metals have unpaired d-electrons. The ground state of CO is $X^1\Sigma^+$. Since this state has no unpaired electrons, its rate of reaction with metals at 'room temperature' is not very great. The first electronic excited state is $a^3\pi$ which has two unpaired electrons.

The ionization potential for CO is 14.01 eV <I-4>. The dissociation energy for the X $^1\Sigma^+$ state is 11.09 eV <I-5>. The only triplet excited state with a reasonable lifetime is the $a^3\pi$ state with an excitation energy of 6.01 eV and a lifetime of 7.5-9.5 ms (depending on the vibrational state) <I-6>. By [I-72]

$$\bar{v}(CO, 298K) = \left( \frac{8.31 \, J \, mol^{-1} \, K^1 \times 298K}{\pi \times 38 \times 10^{-3} \, kg \, mol^{-1}} \right) \qquad [I-97]$$
$$= 1.44 \times 10^2 \, m \, s^{-1} \, molecule^{-1}$$

In 9 ms the CO molecule will travel about 1.3 m. Thus, the excited CO molecules will have sufficient time to traverse the distance from the bottom of the activation chamber to the surface of the wafer and react with the metal there.

From cross section curves <I-7> we estimate that the cross section for excitation to the $a^3\pi$ state at $\sim 7$ eV is $\sim 1 \times 10^{-16}$ cm$^2$. The dissociation and ionization cross sections are, of course, zero at $\sim$7eV.

C. Difluorine

Monofluorine is an extremely powerful oxidizing agent. In addition there are numerous volatile fluorides. The ionization potential of difluorine is 15.7 eV <I-8>, and the dissociation energy is 1.56 eV <I-9>.

Difluorine has a continuous absorption region with a maximum at 2845 Å (4.36 ev) <I-10>. From potential energy curves we estimate the Franck-Condon region excitation energy from the $^1\Sigma_g{}^{30}$ ground state to the $^1\Pi_u$ repulsive state to be $\sim 2.7 \times 10^4$ cm$^{-1}$ (3.3 eV) to $\sim 4.2 \times 10^4$ cm$^{-1}$ (5.2 ev) <I-11>.

D. Dihydrogen

Just as monofluorine is a powerful oxidizing agent, monohydrogen is a powerful reducing agent. In addition there are numerous volatile hydrides. The ionization potential of dihydrogen is 15.4 eV <I-12>. The dissociation energy is 4.48 eV <I-13>.

Dihydrogen can dissociate to the $b^3\Sigma_u{}^{30}$, H(1s)+H(1s), state or to the B' $^1\Sigma_u{}^+$, H(1s)+H(2s), by excitation from the X $^1\Sigma_g{}^+$ ground state <I-14>. For the excitation to the B' $^1\Sigma_u{}^+$ state $$H_2(g) + h\nu \rightarrow H(1s) + H(2p, 2s), \quad [I\text{-}98]$$

$$\lambda = 844.7 \text{Å} (14.68 \, eV)$$

<I-13>. Since H (2s) and H(2p) have the same energy in the absence of a magnetic field, both products are given. It should be noted that the lifetime of the H(2p) state is only $1.6 \times 10^{-19}$ s, whereas the H(2s) state is metastabile with a lifetime of $1.4 \times 10-1$ s <I-15>. The peak in the photo dissociation curve is $\sim 840$ Å (14.76V) with a cross section of $\sim 3.1 \times 10^{-17}$ cm$^2$ <I-15>. The excitation to the $b^3\Theta_u{}^+$ state is reported to have a cross section of $\sim 9 \times 10^{-17}$ cm$^2$ at $\sim 15$ eV <I-16>.

Since the transition from the H(2s)/H(2p) states to the H (1s) state is 10.2 eV <I-17>, and since the dissociation energy of dihydrogen is 4.48 eV, the sum is 14.68 eV. Thus, it is possible that the experimental data have been misinterpreted. It may be that the only excitation is that of [I-98]. The apparent dissociation from the $b^3\Sigma_u{}^+$ state could be the result of the rapid decay of the H(2p) state to the H(1s) state. In any case the required excitation energy for the dissociation of dihydrogen is $-14.72$–14.8 eV. Since this is so close to the ionization energy of 15.4 eV, the excitation energy must be controlled carefully to avoid the formation of a significant amount of $H_2{}^+$.

E. Dioxygen

Monoxygen is a powerful oxidizing agent, but it is not as powerful as monofluorine. There are numerous volatile oxides. The ionization potential of dioxygen is 12.06 eV <I-18>, and the dissociation energy is 5.12 eV <I-19>.

The ground state of dioxygen is the X $^3\Sigma_g{}^-$ state. Some of the excited states, their excitation energies <A> and their lifetimes <I-20> are

| | | |
|---|---|---|
| $a \, {}^1\Delta_g$ | 0.98eV | 2,700 s |
| $b \, {}^1\Sigma_g{+}$ | 1.63eV | 11 s |
| $c \, {}^1\Sigma_u{}^-$ | 4.05eV | $\sim 10^4$ s |
| $C \, {}^3\Delta_{ui}$ | 4.26eV | $> 10^5$ s |
| $A \, {}^3\Sigma_u{}^+$ | 4.34eV | $\sim 0.2$ s |
| $B \, {}^3\Sigma_u{}^-$ | 6.12eV | $40 \times 10^{-19}$ s |

Except for the first two excited states all of the excited states are repulsive. The cross section for dissociation is approximately $$Q_{DISS} = Q_{EXC}(B\,{}^3\Sigma_u{}^-) + Q_{EXC}(A\,{}^3\Sigma_u{}^+ + C\,{}^3\Delta_u + c\,{}^1\Sigma_u{}^-) \approx \quad [I\text{-}99]$$
$$7.5 \times 10^{-17} \text{ cm}^2 + \sim 0.9 \times 10^{-17} \text{ cm}^2 \text{ (at 20eV)} \approx$$
$$8.4 \times 10^{-17} \text{ cm}^2 \text{ (at 20eV)}.$$

For ionization plus dissociative ionization $Q_{ION}$(gross) $\approx 1$–$2 \times 10^{-17}$ cm$^2$ <I-21>. The ratio of $Q_{DISS}$ to $Q_{ION}$ (gross) is probably much higher than these numbers would indicate since R. L. McCarthy <I-22> did not find any charged particles outside of the microwave cavity on dissociating dioxygen in a 2.45 GHZ microwave field. Furthermore, he observed a yield of 0.80 gram atoms/kW-hr for monoxygen.

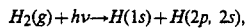

$$\frac{0.80 \text{ gram atom}}{\text{kW} - \text{hr}} \times \frac{1 \text{ hr}}{3600 \text{ s}} \times \frac{6.02 \times 10^{23} \text{ atoms}}{\text{gram atom}} \times$$

$$\frac{kJ}{1000 \, J} = \frac{1.338 \times 10^{17} \text{ atoms}}{J} = \frac{1 \text{ atom}}{7.48 \times 10^{-18} J} \times$$

$$\frac{1.602 \times 10^{-19} J}{\text{eV}} = \frac{1 \text{ atom}}{46.7 \text{eV}}.$$

Thus, his system was operating at about 43% efficiency in generating monoxygens if the system was using electrons with an average effective energy of about 20 eV. McCarthy also reported a yield of 1.0 gram atoms of monohydrogen per hW-hr. If the efficiencies are the same for oxygen and hydrogen, the average effective electron energy in the hydrogen case was 16 eV.

E. C. Zipf <I-23> indicates that the excitation energy in the Franck-Condon region of the X $3\Sigma_g{}^1$ ($^3P + {}^3P$) state to the repulsive ($^3P + {}^5S$) state is around 20 to 27 eV. For 27 eV McCarthy's efficiency is $\sim 59\%$. The excitation energy from the monoxygen ground state, $^3P$ (1s$^2$ 2s$^2$ 2p$^4$) to the $^5S^o$ (1s$^2$ 2s$^2$ 2p$^3$ 2s) state is 9.14 eV <I-24>. With a dissociation energy for dioxygen of 5.12 eV and a $^5S$ excitation energy of 9.14 eV the sum is 14.26 eV. Thus, the monoxygen atoms generated at 20 eV have average kinetic energies of about 2.9 eV. The $^5S^o$ state has a lifetime of about 600 μs <I-24>. Substituting 16 for 38 in [I-97] we obtain $$v(0, 298K) = \left( \frac{8.31 J \text{ mol}^{-1} K^{-1} \times 298K}{\pi \times 16 \times 10^{-3} \text{ kg mol}^{-1}} \right)^{\frac{1}{2}}$$

$$= 2.22 \times 10^2 \, m \cdot s^{-1}$$

In $6 \times 10^{-4}$S the $^5S^o$ atom will have traversed 0.13 m (5.2 inches). Thus, it is likely that very few, if any, $^5S$ atoms will reach the substrate.

In addition to the $^5S^o$ excited state there are also the following excited states of monoxygen:

| | | |
|---|---|---|
| $^1D$ | $(1s^2\ 2s^2\ 2p^4)$ | 1.96 eV |
| $^1S$ | $(1s^2\ 2s^2\ 2^4)$ | 4.19 eV |
| $^3S^o$ | $(1s^2\ 2s^2\ 2p^3\ 3s)$ | 9.52 eV |
| $^3P$ | $(1s^2\ 2s^2\ 2p^3\ 3p)$ | 10.98 eV, |

For the dissociation of dioxygen to these excited states the following are reported:

| | |
|---|---|
| $O(2p^4\ ^3P) + O(3s^1\ ^3S^o)$ | 14.65 eV |
| $O(2p^4\ ^3P) + O(3p^1\ ^3P)$ | 16.12 eV |
| $O(2p^4\ ^1D) + O(3s^1\ ^3S^o)$ | 16.61 eV |
| $O(2p^4\ ^1S) + O(3s^1\ ^3S^o)$ | 18.74 eV |

<I-25>. Thus, the average kinetic energies of the generated monoxygen atoms may be as low as 0.6 eV. This is, however, still rather high. If a considerable amount of monoxygen is used as in the removal of photoresists, the wafer can absorb a considerable amount of energy. To prevent this undesirable heating of the wafer the monoxygen is diluted with dioxygen from the lower circle. We shall discuss the details of this chemistry later when we discuss photoresist removal.

VFFTE CHEMISTRIES FOR WAFER FABRICATION AND RELATED TECHNOLOGIES

PART TWO

CLEANING AND ETCHING

VI. INTRODUCTION

As was indicated in SECTION III., by means of the lower circle species are introduced which react with and/or dilute the activated species from the upper circle. The discussions following will be concerned with the thermodynamics and kinetics of vapor phase interactions between the upper circle activated species and the lower circle species in a few cases, but mainly they will be concerned with the thermodynamics and kinetics of the heterogeneous reactions of vapor phase species with the surface of the wafer. The thermodynamic data used in the calculations are for the ground state species rather than excited state species. Thus, in most cases the actual reactions are much more energetic than the calculations indicate.

Since the chemistries used for cleaning and etching are the same, the two subjects are discussed together. The topics to be considered are SECTION VII. REMOVAL OF PARTICULATES
SECTION VIII. REMOVAL OF ORGANICS
SECTION IX. REMOVAL OF INORGANICS.

The analyses of the inorganic substances are organized by the Periodic Table Groups. If the standard state for the element is a condensed phase, it is discussed first. The compounds considered are the oxides, the chlorides, the nitrates and the fluorides—the oxides because of the exposures to monoxygen and dioxygen (e.g. air), the chlorides because of the ubiquitousness of NaCl etc., the nitrates because of the nitric acid etches, and the fluorides because of the hydrofluoric acid etches and the use of monofluorine. In general only those cases are discussed for which there are adequate thermodynamic data.

Frequently, both the vapor phase and one of the condensed phases exist at 298K. An important factor is the equilibrium vapor pressure of the species. This can be calculated by means of the free energy of sublimation or vaporization. Since the standard state of the vapor species is that at one atmosphere pressure, the equilibrium constant is equal to the equilibrium vapor pressure of the vapor phase expressed in atmospheres. Thus, with p as the equilibrium vapor pressure and K as the equilibrium constant $$p = K = exp(-\Delta G^0/298R)$$

If we require that the vapor pressure be greater than 0.1 Torr, then $$\frac{0.1}{760} = 1.32 \times 10^{-4} > exp(-\Delta G^0/298 \times 8.31 \times 10^{-3})$$

or $$\Delta G^0 < 22.1\ kJ\ mol^{-1}\ (p > 0.1\ Torr). \qquad [\text{II-1}]$$

If, however, we require that p be greater than $10^{-7}$ Torr, then $$\Delta G^0 < 56.3\ kJ\ mol^{-1}(p > 10^{-7}\ Torr).$$

VII. REMOVAL OF PARTICULATES

It is obvious that as line widths decrease particulate contaminations become a more severe problem. For 10 $\mu m$ line widths a 0.5 $\mu m$ diameter particle is not a major cause for concern. For 0.1 $\mu m$ line widths a 0.5 $\mu m$ diameter particle can be a disaster. The minimization of the number of particles in the apparatus and the removal of those that are on the wafer's surface is a must. Particulates can 'enter' the Apparatus by airborne contamination, by being carried in on the surface of the wafer and by being generated in the apparatus from the rubbing together of moving parts.

Since the main chamber of the Apparatus is entered only by means of the load locks (except during maintenance), since wafers are loaded into, and unloaded from, the locks in stacks rather than individually, and since the locks are pumped down before being opened to the main chamber, the airborne contamination is minimized. Since the wafer is held in place during the carrying out of all the chemistries, the only moving of parts is the opening of the load locks to the main chamber and the moving of the wafer between the load locks and the center of the main chamber, with one wafer being moved to the 'unload' lock while another is being moved to the center of the main chamber. Thus, parts are moving only before and after all of the chemistries are carried out. In addition, since the wafers are never touched from the post-polishing cleaning until they are removed from the 'unload' lock, the number of particulates on the surface of the wafer is minimized. It is assumed that the post-polishing cleaning is carried out in a simplified version of the Apparatus.

Because maintenance on the Apparatus is a sine qua non, the room in which the Apparatus is located must be a 'relatively' clean room. An 'ultra-clean' room, however, is not required. Thus, as an additional feature the enormous costs of 'ultra-clean' rooms are not required.

Although the species stream approaching the wafer has a pressure of about 0.1 Torr, the majority of the volume of the main chamber is at a maximum of 100 nanoTorr. This large pressure differential generates a force which will 'sweep' the particulates off of the surface of the wafer. For the calculations following we shall assume that the particle is iron and is a sphere. The following facts will be used in the calculations:

$$1 N = 1 \text{ kg } m s^{-2},$$
$$1 \text{ Torr} = 133 \text{ } N m^{-2},$$
$$\rho(Fe) = 7.86 \text{ g cm}^{-3}$$

$$= \frac{7.86 \text{ g}}{\text{cm}^3} \times \frac{1 \text{kg}}{10^3 \text{g}} \times \frac{10^6 \text{cm}^3}{1 \text{m}^3}$$

$$= 7.86 \times 10^3 \text{kg m}^{-3}$$

and $G=9.81 \text{ } ms^{-2}$ (the gravitational constant).

Let r be the radius of the particle. The cross sectional area of the particle is $$A = \pi r^2 (m^2),$$

and the mass of the particle is $$M = \frac{4\pi r^3}{3} \rho (\text{kg}).$$

The pressure gradient acting on the particle is $$\Delta P = (10^{-1} - 10^{-7}) \text{Torr}$$
$$\approx 13.3 \text{ } N m^{-2},$$

and the force on the particle because of the pressure gradient is $$F = A\Delta P$$
$$= \pi r^2 (m^2) \times 13.3 \text{ } (Nm^{-2})$$
$$= 13.3 \text{ } \pi r^2 \text{ } (N).$$

The acceleration of the particle because of F is $$a = F/M$$
$$= 13.3 \text{ } \pi r^2 (N) \times \tfrac{3}{4} \pi r^3 \rho \text{ } (\text{kg}^{-1})$$
$$= 39.9/4 r \rho \text{ } (ms^{-2}).$$

For the particle to be moved by the force F, F must be large compared with the gravitational force. Thus, $$a > G,$$

$$\frac{39.9}{4 r \rho} > G,$$

$$\frac{4 r \rho}{39.9} < G^{-1}$$

and $$r < \frac{39.9}{4\rho G} = \frac{39.9}{4 \times 7.86 \times 10^3 \times 9.81} \quad [\text{II-3}]$$

$$= 1.29 \times 10^{-4} \text{ } m$$
$$= 129 \text{ } \mu m.$$

Thus, we find that the pressure gradient will cause the removal of particulars of the size with which we are concerned provided that the article is not 'glued' to the surface by an organic coating or by electrostatic charge. Let us, therefore, now turn to the question of the removal of organics from the surface of the wafer and the surfaces of the particulates. (Since electrostatic charges are found in, or on the surfaces of, insulators, the organic insulators will be removed by the organics removal chemistries. Thus, their electrostatic charges will be removed. Similarly, the inorganic insulators and their electrostatic charges will be removed by the inorganic removal chemistries.)

VIII. REMOVAL OF ORGANICS

A. Hydrocarbons

The study of the removal of organics by monoxygen oxidation is complicated by the fact that the monoxygen may be in an excited state and that the products may be in excited states. For the ground state of monoxygen, $^3p$ ($1s^2$ $2s^2$ $2p^4$), $$\Delta H_f^0 (O, g, 298K) = 249 \text{ } kJ \text{ } mol^{-1}$$

$$\Delta G_f^0 (O, g, 298K) = 232 \text{ } kJ \text{ } mol^{-1}.$$

By means of the data in SECTION V.E. we can calculate the heats of formation of some of the excited states of monoxygen:

$$\Delta H_f^0 (O, {}^1D, g, 298K) = 438 kJ \text{ } mol^{-1}$$

$$\Delta H_f^0 (O, {}^1S, g, 298K) = 653 kJ \text{ } mol^{-1}$$

$$\Delta H_f^0 (O, {}^5S, g, 298K) = 1131 kJ \text{ } mol^{-1}.$$

Similarly, the heats of formation of the first two excited states of dioxygen are $$\Delta H_f^0 (O_2, {}^1\Delta_g, g, 298K) = 94 kJ \text{ } mol^{-1}$$

$$\Delta H_f^0 (O_2, {}^1\Sigma_g^+, g, 298K) = 157 kJ \text{ } mol^{-1}.$$

Since the two monoxygens attacking a carbon atom on a surface are coming from the same side of the carbon atom, the electronic state of the carbon dioxide formed may be the $\tilde{A}$ $^1B_2$ ($\Delta_u$) state rather than the $X$ $^1\Sigma_g^+$ ground state. The ground state is, of course, linear whereas the excited state is bent. The excited state is 8.41 eV above the ground state <II-1>. Thus, $$\Delta H_f^0 (CO_2, g, 298K) = -394 kJ \text{ } mol^{-1}$$

$$\Delta G_f^0 (CO_2, g, 298K) = -394 kJ \text{ } mol^{-1}$$

$$\Delta H_f^0 (CO_2, {}^1\Delta_u, g, 298K) = +418 kJ \text{ } mol^{-1}$$

The first excited state of hydroxyl is the A $^2\Sigma^{30}$ state which is 4.02 eV above the X $^2\pi_{3/2}$ ground state <II-2>. Thus, $$\Delta H_f^0 (OH, g, 298K) = +39 kJ \text{ } mol^{-1}$$

$$\Delta G_f^0 (OH, g, 298K) = +34 kJ \text{ } mol^{-1}$$

i $\Delta H_f^0 (OH, {}^2\Sigma^{30}, g, 298K) = +427 kJ \text{ } mol^{-1}.$

In SECTION III.A. we discussed the reaction of methane with monoxygen. We shall continue that discussion here.

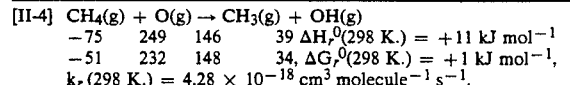
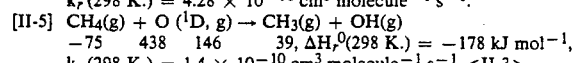
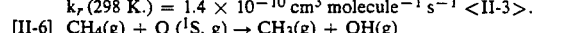
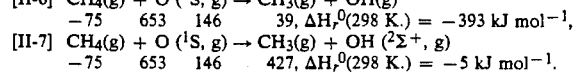

[II-4] $CH_4(g) + O(g) \rightarrow CH_3(g) + OH(g)$
  −75   249   146   39  $\Delta H_r^0(298 \text{ K.}) = +11 \text{ kJ mol}^{-1}$
  −51   232   148   34, $\Delta G_r^0(298 \text{ K.}) = +1 \text{ kJ mol}^{-1}$,
  $k_r(298 \text{ K.}) = 4.28 \times 10^{-18} \text{ cm}^3 \text{ molecule}^{-1} \text{ s}^{-1}$.

[II-5] $CH_4(g) + O \text{ } (^1D, g) \rightarrow CH_3(g) + OH(g)$
  −75   438   146   39, $\Delta H_r^0(298 \text{ K.}) = -178 \text{ kJ mol}^{-1}$,
  $k_r(298 \text{ K.}) = 1.4 \times 10^{-10} \text{ cm}^3 \text{ molecule}^{-1} \text{ s}^{-1}$ <II-3>.

[II-6] $CH_4(g) + O \text{ } (^1S, g) \rightarrow CH_3(g) + OH(g)$
  −75   653   146   39, $\Delta H_r^0(298 \text{ K.}) = -393 \text{ kJ mol}^{-1}$,

[II-7] $CH_4(g) + O \text{ } (^1S, g) \rightarrow CH_3(g) + OH \text{ } (^2\Sigma^+, g)$
  −75   653   146   427, $\Delta H_r^0(298 \text{ K.}) = -5 \text{ kJ mol}^{-1}$.

The $^5S$ state of monoxygen, of course, is a much more powerful oxidizing agent than even the $^1S$ state of monoxygen. Because of the short lifetime of the $^5S$ state, not many of them can be expected to arrive at the wafer surface.

Of all of the hydrocarbons methane is the most difficult to oxidize. For example, $$C_2H_6(g) + O(g) \longrightarrow C_2H_5(g) + OH(g) \quad [\text{II-8}]$$

$$-85 \quad\quad 249 \quad\quad 108 \quad\quad 39, \Delta H_r^0(298K) = -17 \text{ kJ mol}^{-1},$$

$$k_f(298K) = 9.1 \times 10^{-16} \text{ cm}^3 \text{ molecule}^{-1} s^{-1}.$$

The enthalpies of formation of ethane and ethyl are from <B>, and the rate constant is from >II-4>.

The most difficult step in the oxidation of a hydrocarbon is the abstraction of a hydrogen atom. The formation of the carbon-oxygen bond is much faster.

$$CH(g) + O(g) \longrightarrow CO(g) + H(g), k_f(298K) = \quad [\text{II-9}]$$
$$9.5 \times 10^{-11} \text{ cm}^3 \text{ molecule}^{-1} s^{-1},$$

$$CH_2(g) + O(g) \longrightarrow CO(g) + H_2(g), k_f(298K) = \quad [\text{II-10}]$$
$$1.3 \times 10^{-10} \text{ cm}^3 \text{ molecule}^{-1} s^{-1}$$

and $$CH_3(g) + O(g) \longrightarrow HCHO(g) + H(g) \, k_f(298K) = \quad [\text{II-11}]$$
$$1.4 \times 10^{-10} \text{ cm}^3 \text{ molecule}^{-1} s^{-1}. \, \text{<II-5>}.$$

Even dioxygen is an effective oxidizing agent for the formation of a carbon-oxygen bond. In the following reactions M represents a third body which is required for the removal of the energy of the bond(s) formed. $k_{28}$ is the second order rate constant under the conditions that the concentration of M is so high that a small change in its concentration has no effect on the rate of the reaction.

$$CH_3(g) + O_2(g) + M \longrightarrow CH_3O_2(g) + M, k_\infty = \quad [\text{II-12}]$$
$$2.2 \times 10^{-12} \text{ cm}^3 \text{ molecule}^{-1} s^{-1},$$

$$C_2H_5(g) + O_2(g) + M \longrightarrow C_2H_5O_2(g) + M \, k_\infty = \quad [\text{II-13}]$$
$$5 \times 10^{-12} \text{ cm}^3 \text{ molecule}^{-1} s^{-1},$$

$$n\text{-}C_3H_7(g) + O_2(g) + M \longrightarrow n\text{-}C_3H_7O_2(g) + \quad [\text{II-14}]$$
$$M, k_\infty = 6 \times 10^{-12} \text{ cm}^3 \text{ molecule}^{-1} s^{-1}$$

and $$i\text{-}C_3H_7(g) + O_2(g) + M \longrightarrow i\text{-}C_3H_7O_2(g) + \quad [\text{II-15}]$$
$$M, k_\infty = 1.5 \times 10^{-11} \text{ cm}^3 \text{ molecule}^{-1} s^{-1} \text{ <II-6>}.$$

The organic molecules discussed above are all small vapor phase species. The organics on the wafer surface, however, are primarily large molecules. Adequate thermodynamic data are not available for most polymers. We shall, therefore, use eicosane, $C_{20}H_{42}$, as a model compound. The thermodynamic data for eicosane are $$\Delta H_f^0(g, 298K) = -456 \text{ kJ mol}^{-1}, \, \text{<II-7>},$$

$$\Delta G_f^0(g, 298K) = +117 \text{ kJ mol}^{-1}, \, \text{<II-7>},$$

$$\Delta H_{sub}(298K) = 101 \text{ kJ mol}^{-1}, \, \text{<II-8>},$$

$$S^0(c, 298K) = 559 \text{ J mol}^{-1} K^{-1}, \, \text{<II-9>}.$$

For the solid phase we take $$\Delta H_f^0(c, 298K) = \Delta H_f^0(g, 298K) - \Delta H_{sub}(298K)$$
$$= -456 - 101$$
$$= -557 \text{ kJ mol}^{-1},$$

and $$\Delta G_f^0(c, 298K) = \Delta H_f^0(c, 298K) - T\Delta S_f^0(c, 298K),$$

where $$\Delta S_f^0(c, 298K) = S^0(c, 298K) - $$
$$20 \times S^0(\text{graphite}, 298K) - $$
$$21 \times S^0(H_2, g, 298K)$$
$$= 559 - 20 \times 6 - 21 \times 131$$
$$= -2.3 \text{ kJ mol}^{-1} K^{-1}.$$

Thus, $$\Delta G_f^0(c, 298K) = -557 - 298(-2.3)$$
$$= +128 \text{ kJ mol}^{-1},$$

and $$C_{20}H_{42}(c) + 82 \, O(g) \longrightarrow 20 \, CO_2(g) + 42 \, OH(g) \quad [\text{II-16}]$$

$$-557 \quad\quad 82 \times 249 \quad\quad 20 \times -394 \quad 42 \times 39,$$

$$\Delta H_r^0(298K) = -26,103 \text{ kJ mol}^{-1}$$

$$128 \quad\quad 82 \times 232 \quad\quad 20 \times -394 \quad 42 \times 34,$$

$$\Delta G_r^0(298K) = -25,604 \text{ kJ mol}^{-1}.$$

Clearly, the monoxygen oxidation of eicosane is highly exothermic and highly exo-ergonic even with the use of ground state monoxygen.

The enormous magnitude of $\Delta H_r^0$ is however the source of a serious problem. The generation of so much heat will result in the temperature of the wafer being elevated to undesirably high levels. The goal, therefore, is to find a set of conditions for which the $\Delta H_r^0$ is negative and of sufficient magnitude to ensure a rapid reaction, but not of so large a magnitude as to produce temperature rise problems.

We have noted that the carbon dioxide formed is probably in the $^1\Delta_u$ state. The situation for the excited state of hydroxyl is more complicated and requires some discussion. The $^3p$ ground state of monoxygen has the electron configuration

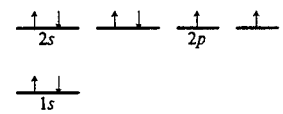

The $^1D$ excited state has the electron configuration

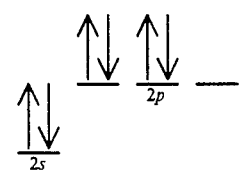

The $^1S$ excited state has the electron configuration

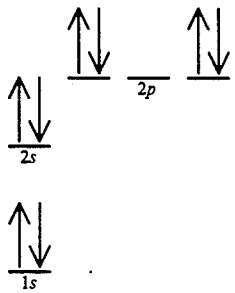

The $^2\pi$ ground state of hydroxyl has two electrons in the $\sigma$-bond formed from an oxygen 2p orbital and the hydrogen 1s orbital. Thus, there are a total of three electrons in the other two 2p orbitals. In the $^2\Sigma$ state the $\sigma$-bond has only one electron, and there are a total of four electrons in the other two 2p orbitals of the oxygen. Since the hydrogen is bringing its electron with it to form the $\sigma$-bond, the $^3p$ state of monoxygen can form only the $^2\pi$ state of hydroxyl. The $^1D$ and $^1S$ states of monoxygen, on the other hand, can form only the $^2\Sigma$ state of hydroxyl.

With these facts in mind let us now consider several variations on [II-16].

[II-17] $C_{20}H_{42}(c) + 82\ O(g) \longrightarrow 20\ CO_2^*(g) + 42\ OH(g)$
$\quad\quad -557 \quad\quad 82 \times 249 \quad\quad 20 \times 418 \quad\quad 42 \times 39,$
$\quad\quad \Delta H_r^0(298\ K) = -9863\ kJ\ mol^{-1},$

[II-18] $C_{20}H_{42}(c) + 42\ O(g) + 20\ O_2(g)$
$\quad\quad -557 \quad\quad 42 \times 249 \quad\quad 0$
$\quad\quad \longrightarrow 20\ CO_2^*(g) + 42\ OH(g)$
$\quad\quad\quad\quad\quad 20 \times 418 \quad\quad 42 \times 39,$
$\quad\quad \Delta H_r^0(298\ K) = +97\ kJ\ mol^{-1},$ and

[II-19] $C_{20}H_{42}(c) + 42\ O(g) + 18\ O_2(g) + 2\ O_2^*(1\Delta, g)$
$\quad\quad -557 \quad\quad 42 \times 249 \quad\quad 0 \quad\quad 2 \times 94$
$\quad\quad \longrightarrow 20\ CO_2^*(g) + 42\ OH(g)$
$\quad\quad\quad\quad\quad 20 \times 418 \quad\quad 42 \times 39,$
$\quad\quad \Delta H_r^0(298\ K) = -91\ kJ\ mol^{-1}.$ Thus, we find that by diluting the monoxygen with dioxygen, a small portion of which have been excited by the monoxygen to the $^1\Delta$ state, we can have the oxidation proceed at a reasonable rate without causing significant heating of the substrate.

If the organic mass is very small, the heat generated is never a problem. When, however, the organic mass is large as is the case with a photoresist layer, the heat generated can be quite large. To analyze the magnitude of the problem let us assume the following:
resist composition—$C_{20}H_{42}$ (Molecular Mass 282.6)
resist density—1.0 g cm$^{-3}$
resist thickness—1 $\mu$m ($10^{-4}$ cm)
wafer diameter—8 inches (20.3 cm).
Eicosane is actually more difficult to oxidize than a polymer. One out of ten of the carbons is a methyl carbon. In polymers this ratio is much lower. The density of eicosane is about 0.8 g cm$^{-3}$, but the density of polymers like the photoresists is about 1.0 g cm$^{-3}$.

The number of 'moles' of eicosane in the resist layer is $$n = \frac{\pi\ (20.3/2)^2\ cm^2 \times 10^{-4}\ cm \times 1.0\ g\ cm^{-3}}{282.6\ g\ mol^{-1}} \quad [II-20]$$
$$= 1.145 \times 10^{-4}\ mol$$

Using the enthalpy of reaction for [II-19] we calculate the total heat generated to be $$\Delta H_r = 91\ kJ\ mol^{-1} \times 1.145 \times 10^{-4}\ mol^{-1} \quad [II-21]$$
$$= 10.4\ J$$

The heat capacity of silicon is 20.0 JK$^1$ mol$^{-1}$ and the atomic mass is 28.1 g mol$^{-1}$ <A>. The density of silicon is 2.33 g cm$^{-3}$ <II-10>. Thus, if the wafer is $2.5 \times 10^{-2}$ cm thick and the heat is evenly distributed, the temperature rise is $$\Delta T = \frac{10.4\ J}{20\ JK^{-1}mol^{-1}} \times \quad [II-22]$$
$$\frac{28.1\ g\ mol^{-1}}{2.33\ g\ cm^{-3} \times 2.5 \times 10^{-2}\ cm \times \pi\ (20.3/2)^2\ cm^2},$$
$$= 0.78K$$

an insignificant temperature rise.

We must now turn our attention to what could be a much more serious problem. We noted in SECTION V.E. that the two monoxygen atoms formed by the dissociation of dioxygen at 20 eV must have average kinetic energies of about 2.9 eV ($2.8 \times 10^2$ kJ mol$^{-1}$). By [II-20] there are $1.145 \times 10^{-4}$ moles of eicosane, and by [II-19] each mole of eicosane requires 42 gram atoms of monoxygen as well as 20 moles of dioxygen. Thus, the total kinetic energy of the generated monoxygen is $$K.E.\ (monooxygen) = 2.8 \times 10^2\ kJ\ mol^{-1} \times \quad [II-23]$$
$$(42\ mol/mole\ of\ eicosane) \times$$
$$(1.145 \times 10^{-4}\ moles\ of\ eicosane)$$
$$= 1.346\ kJ$$

By [II-22] this much energy reaching the wafer, if it were evenly distributed throughout the wafer (which it would not be), would cause a temperature rise of $$\Delta T = 0.78K \times \frac{1.364\ kJ}{10.4\ J} \quad [II-24]$$
$$= 102.3K$$

This much of a temperature rise throughout the wafer would not be serious, but the energy would actually be concentrated at the surface.

The energy required to produce the $^1\Delta$ dioxygen in ]II-19] is $$\Delta E = 94\ kJ\ mol^{-1} \times 2 \times 1.145 \times 10^{-4}\ mol \quad [II-25]$$
$$= 2.15 \times 10^{-2}\ kJ$$

The kinetic energy of [II-23] is, thus, 62.5 times the amount of energy needed for the $^1\Delta$ excitation. We must, therefore, find a way to modify the chemistry of [II-19]. One possibility would be to use less monoxygen and more $^1\Delta$ dioxygen. In the abstraction of a hydrogen atom a dioxygen molecule produces a hydroperoxo ($HO_2$) rather than the hydroxyl which a monoxygen produces. Thus, if only dioxygens are used,

[II-26]  $C_{20}H_{42}(c) + 20\ O_2(g) + 42\ O_2^*(^1\Delta,\ g) \longrightarrow 20\ CO_2^*(g) + 42\ HO_2(g)$
  $-557$ $\quad 20 \times 0 \quad 42 \times 94 \quad\quad\quad\quad\quad 20 \times 418 \quad 42 \times 2,$
  $\Delta H_r^0(298\ K) = +5053\ kJ\ mol^{-1}.$ Let us try a 'mixture' of [II-19] and [II-26].

[II-27]  $C_{20}H_{42}(c) + 27\ O(g) + 35\ O_2^*(^1\Delta,g) \longrightarrow 20\ CO_2^*(g) + 27\ OH(g) + 15\ HO_2(g)$
  $-557 \quad\quad 27 \times 249 \quad 35 \times 94 \quad\quad\quad\quad 20 \times 418 \quad\quad 27 \times 39 \quad\quad 15 \times 2,$
  $\Delta H_r^0(298\ K) = -13\ kJ\ mol^{-1}.$ The kinetic energy of the monoxygens in [II-27] is (27/42) times that of [II-23] or 0.87 kJ. The excitation energy necessary to generate the $^1\Delta$ dioxygens is $$\Delta E(^1\Delta) = 94\ kJ\ mol^{-1} \times (35\ \text{moles/mole of eicosane}) \times$$
$$(1.145 \times 10^{-4}\ \text{moles of eicosane})$$
$$= 0.38\ kJ$$

Thus, the excess energy is 0.49 kJ. By [II-24] the temperature rise is $$\Delta T = 0.78 \times \frac{0.49\ kJ}{10.4\ J}$$
$$= 36.8K$$

For [II-27] the ratio of dioxygen entering the lower circle to that entering the upper circle is $35:(27/2)=2.6$. Thus, with a ratio of the order of 3:1 the removal of the photoresist can be carried out at a reasonable rate without significant heating of the wafer. The exact value of the ratio has to be determined experimentally since all photoresists are not alike, every monoxygen generated will not reach the wafer (some will diffuse out of the 'target' area) and not all collisions between monoxygens and dioxygens will result in the excitation of the dioxygen to the $^1\Delta$ state.

B. Fluorocarbons

Fluorocarbons play a key role in the deposition of low dielectric constant dielectrics. The vaporization reagent of choice here is monohydrogen. As a demonstration of the efficacy of monohydrogen in the breaking of carbon-fluorine bonds we consider the stepwise reactions of tetrafluoromethane with monohydrogen.

[II-28]  $CF_4(g) + H(g) \rightarrow CF_3(g) + HF(g)$
  $-933 \quad\quad 218 \quad\quad -470 \quad\quad -272,\ \Delta H_r^0(298\ K.) =$
  $\quad\quad\quad\quad\quad\quad\quad\quad\quad\quad\quad\quad\quad\quad -27\ kJ\ mol^{-1}$
  $-888 \quad\quad 203 \quad\quad -457 \quad\quad -275,\ \Delta G_r^0(298\ K.) =$
  $\quad\quad\quad\quad\quad\quad\quad\quad\quad\quad\quad\quad\quad\quad -47\ kJ\ mol^{-1},$

[II-29]  $CF_3(g) + H(g) \rightarrow CF_2(g) + HF(g)$
  $-470 \quad\quad 218 \quad\quad -182 \quad\quad -272,\ \Delta H_r^0(298\ K.) =$
  $\quad\quad\quad\quad\quad\quad\quad\quad\quad\quad\quad\quad\quad\quad -202\ kJ\ mol^{-1}$
  $-457 \quad\quad 203 \quad\quad -192 \quad\quad -275,\ \Delta G_r^0(298\ K.) =$
  $\quad\quad\quad\quad\quad\quad\quad\quad\quad\quad\quad\quad\quad\quad -213\ kJ\ mol^{-1},$

[II-30]  $CF_2(g) + H(g) \rightarrow CF(g) + HF(g)$
  $-182 \quad\quad 218 \quad\quad 255 \quad\quad -272,\ \Delta H_r^0(298\ K.) =$
  $\quad\quad\quad\quad\quad\quad\quad\quad\quad\quad\quad\quad\quad -53\ kJ\ mol^{-1}$
  $-192 \quad\quad 203 \quad\quad 224 \quad\quad -275,\ \Delta G_r^0(298\ K.) =$
  $\quad\quad\quad\quad\quad\quad\quad\quad\quad\quad\quad\quad\quad -62\ kJ\ mol^{-1}$ and

[II-31]  $CF(g) + H(g) \rightarrow C(g) + HF(g)$
  $255 \quad\quad 218 \quad\quad 717 \quad\quad -272,\ \Delta H_r^0(298\ K.) =$
  $\quad\quad\quad\quad\quad\quad\quad\quad\quad\quad\quad\quad\quad -28\ kJ\ mol^{-1}$
  $224 \quad\quad 203 \quad\quad 671 \quad\quad -275,\ \Delta G_r^0(298\ K.) =$
  $\quad\quad\quad\quad\quad\quad\quad\quad\quad\quad\quad\quad\quad -31\ kJ\ mol^{-1}.$ Based on the thermodynamic data the expectation is that [II-28]–[II-31] are fast reactions. This expectation is substantiated by the experimental data. The rate constants for [II-29]–[II-31] are $9 \times 10^{-11}$, $3.9 \times 10^{-11}$ and $1.9 \times 10^{-11}\ cm^3\ molecule^{-1}\ s^{-1}$, respectively (cf. [II-80]–[II-82]).

Having demonstrated the efficiency of monohydrogen in breaking carbon-fluorine bonds, we must now consider the efficacy of monohydrogen in breaking carbon-carbon bonds in fluorocarbons.

[II-32]  $C_2F_6(g) + H(g) \rightarrow CF_3H(g) + CF_3(g)$
  $-1344 \quad\quad 218 \quad\quad -697 \quad\quad -470,\ \Delta H_r^0(298\ K.) =$
  $\quad\quad\quad\quad\quad\quad\quad\quad\quad\quad\quad\quad\quad\quad -41\ kJ\ mol^{-1}$
  $-1258 \quad\quad 203 \quad\quad -663 \quad\quad -457,\ \Delta G_r^0(298\ K.) =$
  $\quad\quad\quad\quad\quad\quad\quad\quad\quad\quad\quad\quad\quad\quad -65\ kJ\ mol^{-1}.$ Finally, we consider the volatilization of polytetrafluoroethylene by monohydrogen.

[II-32]  $1/n\ (C_2F_4)_n(cr) + 12\ H(g) \rightarrow 2CH_4(g) + 4HF(g)$
  $-820 \quad\quad 12 \times 218 \quad 2 \times -75 \quad 4 \times -272,\ \Delta H_r^0(298\ K.) = -3034\ kJ\ mol^{-1}.$ The datum on polytetrafluoroethylene is from <B>.

IX. REMOVAL OF INORGANICS

A. General Principles

In SECTION V.E. we noted that the dioxygen at 20 eV must have average kinetic energies of about 2.9 eV (280 kJ $mol^{-1}$). Similarly, in SECTION V.C. we noted that the dissociation of difluorine to two monofluorines is 1.56 eV, but that the Franck-Condon region excitation energy is 3.3 eV to 5.2 eV. If we assume that the excitation energy is 5.0 eV, the average kinetic energy of the monofluorines formed is $$\frac{5.0 - 1.56}{2} = 1.76\ eV \rightarrow 166\ kJ\ mol^{-1}.$$

In considering monoxygen or monofluorine as volatilizing reagents these kinetic energies must be added to the enthalpies of formation to obtain the enthalpies of reaction for reactions in which these species are reagents. Not all of the enthalpy of reaction, however, will go into volatilizing the oxides or fluorides formed. Some will go into the kinetic energies of the volatile species, and some will go into the heating of the substrate. In our analyses we shall assume that the enthalpy of reaction must be at least four times that of the enthalpy of sublimation of the oxide or fluoride. The enthalpies of reaction calculated using the ground state enthalpies of all species will be designated in the usual way by $\Delta H_r^0(298K)$. The enthalpies of reaction calculated using the excited state enthalpy for at least one species will be designated $\Delta H_r^*(298K)$.

B. Group IA.

The enthalpies of sublimation of the oxides and fluoride of lithium are

| | | |
|---|---|---|
| $Li_2O$ | 432 kJ mol$^{-1}$ | (1728) |
| $Li_2O_2$ | 390 kJ mol$^{-1}$ | (1560) |
| LiF | 270 kJ mol$^{-1}$ | (1080). |

The numbers in the parentheses are the 'times four' values.

[II-34] $\quad 2Li(cr) = O(g) \rightarrow Li_2O(cr)$
$\quad\quad 2 \times 0 \quad 249 \quad\quad -599, \Delta H_r^0(298 \text{ K.}) = -848 \text{ kJ mol}^{-1}$
$\quad\quad\quad\quad\quad\quad\quad\quad\quad\quad\quad\quad \Delta H_r^0(298 \text{ K.}) = -1128 \text{ kJ mol}^{-1},$
$\quad\quad 2 \times 0 \quad 232 \quad\quad -562, \Delta H_r^0(298 \text{ K.}) = -794 \text{ kJ mol}^{-1},$

TABLE II-1

GROUP IA THERMODYNAMIC DATA
$\Delta H_f^0(298 \text{ K.})/\Delta G_f^0(298 \text{ K.})$
(kJ mol$^{-1}$)

| SPECIES | Li | Na | K | Rb | Cs |
|---|---|---|---|---|---|
| M$_2$O | | | | | |
| (cr) | −599/−562 | 418/−379 | −363/−322 | −339*/— | 346/−308 |
| (g) | −167/−187 | −36*/−52* | −63*/— | −50*/— | −92/−106 |
| M$_2$O$_2$ | | | | | |
| (cr) | −633/−571 | −513/−450 | −496/−430 | −472*/— | — |
| (g) | −243/−246 | — | −159*/— | — | −247*/— |
| MO | +84/+60 | +84/+61 | +71/+50 | — | +63/+43 |
| (g) | | | | | |
| MCl | | | | | |
| (cr) | −408/−384 | −411/−384 | −437/−409 | −435*/−408* | −443/−414 |
| (g) | −196/−217 | −181/−201 | −215/−233 | −229*/−247* | −240/−258 |
| MF | | | | | |
| (cr) | −611/−589 | −575/−545 | −569/−539 | −558*/— | −555/−525 |
| (g) | −341/−362 | −290/−310 | −327/−345 | −331*/−349* | −356/−372 |
| MNO$_3$ | −483*/−381 | −468*/−367* | −495*/−395* | −495*/−396* | −506*/−407* |
| (cr) | | | | | |

(*Ref. <B>).

[II-35] $\quad Li_2O(cr) + O(g) \rightarrow Li_2O_2(cr)$
$\quad\quad -599 \quad 249 \quad\quad -633, \Delta H_r^0(298 \text{ K.}) = -283 \text{ kJ mol}^{-1}$
$\quad\quad\quad\quad\quad\quad\quad\quad\quad\quad\quad\quad \Delta H_r^0(298 \text{ K.}) = -563 \text{ kJ mol}^{-1}$
$\quad\quad -562 \quad 232 \quad\quad -571, \Delta G_r^0(298 \text{ K.}) = -241 \text{ kJ mol}^{-1},$
[II-36] $\quad 2 LiCl(cr) = 3 O(g) \rightarrow Li_2O(cr) + 2 ClO(g)$
$\quad\quad 2 \times -408 \quad 3 \times 249 \quad -599 \quad 2 \times 101, \Delta H_r^0(298 \text{ K.}) = -328 \text{ kJ mol}^{-1}$
$\quad\quad\quad\quad\quad\quad\quad\quad\quad\quad\quad\quad\quad\quad\quad\quad \Delta H_r^*(298 \text{ K.}) = -1222 \text{ kJ mol}^{-1}$
$\quad\quad 2 \times -384 \quad 3 \times 232 \quad -562 \quad 2 \times 98, \Delta G_r^0(298 \text{ K.}) = -294 \text{ kJ mol}^{-1},$
[II-37] $\quad 2 LiCl(cr) + 6 O(g) \rightarrow Li_2O_2(cr) + 2ClO_2(g)$
$\quad\quad 2 \times -408 \quad 6 \times 249 \quad -633 \quad 2 \times 102*, \Delta H_r^0(298 \text{ K.}) = -1107 \text{ kJ mol}^{-1}$
$\quad\quad\quad\quad\quad\quad\quad\quad\quad\quad\quad\quad\quad\quad\quad\quad \Delta H_r^*(298 \text{ K.}) = -2787 \text{ kJ mol}^{-1}$
$\quad\quad 2 \times -384 \quad 6 \times 232 \quad -571 \quad 2 \times 120*, \Delta G_r^0(298 \text{ K.}) = -955 \text{ kJ mol}^{-1}$
[II-38] $\quad 2 LiF(cr) + 3 O(g) \rightarrow Li_2O(cr) = 2 FO(g)$
$\quad\quad 2 \times -617 \quad 3 \times 249 \quad -599 \quad 2 \times 109, \Delta H_r^0(298 \text{ K.}) = +106 \text{ kJ mol}^{-1}$
$\quad\quad\quad\quad\quad\quad\quad\quad\quad\quad\quad\quad\quad\quad\quad\quad \Delta H_r^*(298 \text{ K.}) = -734 \text{ kJ mol}^{-1}$
$\quad\quad 2 \times -589 \quad 3 \times 232 \quad -562 \quad 2 \times 105, \Delta G_r^0(298 \text{ K.}) = +130 \text{ kJ mol}^{-1}$
and
[II-39] $\quad 2 LiF(cr) = 6 O(g) \rightarrow Li_2O_2(cr) + 2 FO_2(g)$
$\quad\quad 2 \times -617 \quad 6 \times 249 \quad -633 \quad 2 \times 13, \Delta H_r^0(298 \text{ K.}) = -867 \text{ kJ mol}^{-1}$
$\quad\quad\quad\quad\quad\quad\quad\quad\quad\quad\quad\quad\quad\quad\quad\quad \Delta H_r^*(298 \text{ K.}) = -2547 \text{ kJ mol}^{-1}$
$\quad\quad 2 \times -589 \quad 6 \times 232 \quad -571 \quad 2 \times 27, \Delta G_r^0(298 \text{ K.}) = -745 \text{ kJ mol}^{-1}.$ (*Ref. <B>).

1. THERMODYNAMIC DATA

We note that none of the condensed phase compounds listed in TABLE II-1 are self-volatilizing under the criteria of [II-1] or [II-2].

2. LITHIUM

Although [II-37] and [II-39] are sufficiently energetic that some lithium peroxide may volatilize, even excess monoxygen reacting with lithium oxide will not generate sufficient energy to volatilize the lithium peroxide formed. Thus, the monoxygen used to remove organics will not by itself also remove all the lithium species.

[II-40] $\quad Li_2O(cr) + 4 F(g) \rightarrow 2 LiF(cr) + F_2O(g)$

-continued

|  | −599 | 4 × 79 | 2 × −617 | 24, | $\Delta H_r^0$(298 K.) = 927 kJ mol$^{-1}$ |
|---|---|---|---|---|---|
|  |  |  |  |  | $\Delta H_r^*$(298 K.) = −1591 kJ mol$^{-1}$ |
|  | −562 | 4 × 62 | 2 × −587 | 42, | $\Delta G_r^0$(298 K.) = −822 kJ mol$^{-1}$, |
| [II-41] | Li$_2$O$_2$(cr) + 6 F(g) → 2 LiF(cr) + 2 F$_2$O(g) | | | | |
|  | −633 | 6 × 79 | 2 × −617 | 2 × 24, | $\Delta H_r^0$(298 K.) = −1027 kJ mol$^{-1}$ |
|  |  |  |  |  | $\Delta H_r^*$(298 K.) = −2023 kJ mol$^{-1}$ |
|  | −571 | 6 × 62 | 2 × −587 | 2 × 42, | $\Delta G_r^0$(298 K.) = −895 kJ mol$^{-1}$ |
| and | | | | | |
| [II-42] | LiNO$_3$(cr) + 10 F(g) → LiF(cr) + NF$_3$(g) + 3 F$_2$O(g) | | | | |
|  | −483 | 10 × 79 | −617 −124 | 3 × 24, | $\Delta H_r^0$(298 K.) = −976 kJ mol$^{-1}$ |
|  |  |  |  |  | $\Delta H_r^*$(298 K.) = −2636 kJ mol$^{-1}$ |
|  | −381 | 10 × 62 | −587 −83 | 3 × 42, | $\Delta G_r^0$(298 K.) = −783 kJ mol$^{-1}$. |

Of the three reactions with monofluorine only, [II-42] is sufficiently energetic to meet the 'times four' criterion. This suggests that it is advisable to add nitrogen dioxide to the dioxygen in the lower circle. Thus,

| [II-43] | Li$_2$O(cr) + O(g) + 2NO$_2$(g) → 2 LiNO$_3$(cr) | | | | |
|---|---|---|---|---|---|
|  | −599 | 249 | 2 × 33 | 2 × −483, | $\Delta H_r^0$(298 K.) = −682 kJ mol$^{-1}$ |
|  | −562 | 232 | 2 × 51 | 2 × −381, | $\Delta G_r^0$(298 K.) = −534 kJ mol$^{-1}$, |
| and | | | | | |
| [II-44] | Li$_2$O$_2$(cr) + 2 NO$_2$(g) → 2 LiNO$_3$(cr) | | | | |
|  | −633 | 2 × 33 | 2 × −483, | $\Delta H_r^0$(298 K.) = −399 kJ mol$^{-1}$ | |
|  | −571 | 2 × 51 | 2 × −381, | $\Delta G_r^0$(298 K.) = −293 kJ mol$^{-1}$. | |

By this means we can convert all of the lithium compounds to lithium nitrate during the monoxygen reactions. Dioxygen, of course, is used in the lower circle only when there is a large quantity of organics to remove. When this is not the case only nitrogen dioxide need be used in the lower circle. In our analyses of the chemistries of the other alkali metals we shall consider the conversion of all compounds to the nitrates during the monoxygen reactions.

3. SODIUM

The enthalpy of sublimation of sodium fluoride is 285 kJ mol$^{-1}$. The 'times four' criterion is, therefore, 1140 kJ mol$^{-1}$.

| [II-45] | Na(cr) + O(g) + NO$_2$(g) → NaNO$_3$(cr) | | | | |
|---|---|---|---|---|---|
|  | 0 | 249 | 33 | −468, | $\Delta H_r^0$(298 K.) = −750 kJ mol$^{-1}$ |
|  | 0 | 232 | 51 | −369, | $\Delta G_r^0$(298 K.) = −652 kJ mol$^{-1}$, |
| [II-45] | Na$_2$O(cr) + O(g) + 2 NO$_2$(g) → 2 NaNO$_3$(cr) | | | | |
|  | −418 | 249 | 2 × 33 | 2 × −468, | $\Delta H_r^0$(298 K.) = −833 kJ mol$^{-1}$ |
|  | −379 | 232 | 2 × 51 | 2 × −369, | $\Delta G_r^0$(298 K.) = −693 kJ mol$^{-1}$, |
| [II-46] | Na$_2$O$_2$(cr) + 2 NO$_2$(g) → 2 NaNO$_3$(cr) | | | | |
|  | −513 | 2 × 33 | 2 × −468, | $\Delta H_r^0$(298 K.) = −489 kJ mol$^{-1}$ | |
|  | −450 | 2 × 51 | 2 × −369, | $\Delta G_r^0$(298 K.) = −390 kJ mol$^{-1}$, | |
| [II-47] | NaCl(cr) + 3 O(g) + NO$_2$(g) → NaNO$_3$(cr) + ClO$_2$(g) | | | | |
|  | −411 | 3 × 249 | 33 | −468 | 102, $\Delta H_r^0$(298 K.) = −735 kJ mol$^{-1}$ |
|  | −384 | 3 × 232 | 51 | −369 | 120, $\Delta G_r^0$(298 K.) = −612 kJ mol$^{-1}$, |
| [II-48] | NaF(cr) + 3 O(g) + NO$_2$(g) → NaNO$_3$(cr) + FO$_2$(g) | | | | |
|  | −575 | 3 × 249 | 33 | −468 | 13, $\Delta H_r^0$(298 K.) = −660 kJ mol$^{-1}$ |
|  | −545 | 3 × 232 | 51 | −369 | 27, $\Delta G_r^0$(298 K.) = −544 kJ mol$^{-1}$ |
| and | | | | | |
| [II-49] | NaNO$_3$(cr) + 10F(g) → NaF(cr) + NF$_3$(g) + 3F$_2$O(g) | | | | |
|  | −468 | 10 × 79 | −575 −124 | 3 × 24, | $\Delta H_r^0$(298 K.) = −949 kJ mol$^{-1}$ |
|  |  |  |  |  | $\Delta H_r^*$(298 K.) = −2609 kJ mol$^{-1}$ |
|  | −369 | 10 × 62 | −545 −83 | 3 × 42, | $\Delta G_r^0$(298 K.) = −753 kJ mol$^{-1}$. |

The 'times four' criterion of 1140 kJ mol$^{-1}$ is easily met. Thus, the O/NO$_2$+F procedure works well for the removal of all sodium species.

4. POTASSIUM

The enthalpy of sublimation of potassium fluoride is 242 kJ mol$^{-1}$. The 'times four' criterion is, thus, 968 kJ mol$^{-1}$.

| [II-50] | K(cr) + O(g) + NO$_2$(g) → KNO$_3$(cr) | | | | |
|---|---|---|---|---|---|
|  | 0 | 249 | 33 | −495, | $\Delta H_r^0$(298 K.) = −777 kJ mol$^{-1}$ |
|  | 0 | 232 | 51 | −395, | $\Delta H_r^*$(298 K.) = −678 kJ mol$^{-1}$, |
| [II-51] | K$_2$O(cr) + O(g) + 2 NO$_2$(g) → 2 KNO$_3$ | | | | |
|  | −363 | 249 | 2 × 33 | 2 × −495, | $\Delta H_r^0$(298 K.) = −942 kJ mol$^{-1}$ |
|  | −322 | 232 | 2 × 51 | 2 × −395, | $\Delta G_r^0$(298 K.) = −802 kJ mol$^{-1}$, |
| [II-52] | K$_2$O$_2$(cr) + 2 NO$_2$(g) → 2 KNO$_3$ | | | | |
|  | −496 | 2 × 33 | 2 × −495, | $\Delta H_r^0$(298 K.) = −560 kJ mol$^{-1}$ | |
|  | −430 | 2 × 51 | 2 × −395, | $\Delta G_r^0$(298 K.) = −462 kJ mol$^{-1}$, | |
| [II-53] | KCl(cr) + 3O(g) + NO$_2$(g) → KNO$_3$(cr) + ClO$_2$(g) | | | | |
|  | −437 | 3 × 249 | 33 | −495 | 102, $\Delta H_r^0$(298 K.) = −736 kJ mol$^{-1}$ |
|  | −409 | 3 × 232 | 51 | −395 | 120, $\Delta G_r^0$(298 K.) = −613 kJ mol$^{-1}$, |
| [II-54] | KF(cr) + 3O(g) + NO$_2$(g) → KNO$_3$(cr) + FO$_2$(g) | | | | |
|  | −569 | 3 × 249 | 33 | −495 | 13, $\Delta H_r^0$(298 K.) = −693 kJ mol$^{-1}$ |
|  | −539 | 3 × 232 | 51 | −395 | 27, $\Delta G_r^0$(298 K.) = −576 kJ mol$^{-1}$, |

-continued and
[II-55]  $KNO_3(cr) \times 10F(g) \rightarrow KF(cr) + NF_3(g) + 3 F_2O(g)$
  −495  10 × 79  −569  −124  3 × 24,  $\Delta H_r^0(298 \text{ K.}) = -916 \text{ kJ mol}^{-1}$
                                      $\Delta H_r^*(298 \text{ K.}) = -2576 \text{ kJ mol}^{-1}$
  −395  10 × 6   −539  −83   3 × 42,  $\Delta H_r^0(298 \text{ K.}) = -721 \text{ kJ mol}^{-1}$.

The 'times four' criterion of 968 kJ mol$^{-1}$ is easily met. Thus, the O/NO$_2$+F procedure works well for the removal of all potassium species.

The enthalpy of sublimation of cesium fluoride is 199 kJ mol$^{-1}$, and the 'times four' criterion is 796 kJ mol$^{-1}$.

[II-62]  $Cs(cr) + O(g) + NO_2(g) \rightarrow CsNO_3(cr)$
  0     249     33              −506,  $\Delta H_r^0(298 \text{ K.}) = -788 \text{ kJ mol}^{-1}$
  0     232     51              −407,  $\Delta G_r^0(298 \text{ K.}) = -690 \text{ kJ mol}^{-1}$,
[II-63]  $Cs_2O(cr) + O(g) + 2NO_2(g) \rightarrow 2 CsNO_3(cr)$
  346   249   2 × 33   2 × −506,  $\Delta H_r^0(298 \text{ K.}) = -981 \text{ kJ mol}^{-1}$
  −308  232   2 × 51   2 × −407,  $\Delta G_r^0(298 \text{ K.}) = -840 \text{ kJ mol}^{-1}$,
[II-64]  $CsCl(cr) + 3O(g) + NO_2(g) \rightarrow CsNO_3(cr) + ClO_2(g)$
  −443  3 × 249  33   −506  102,  $\Delta H_r^0(298 \text{ K.}) = -741 \text{ kJ mol}^{-1}$
  −414  3 × 232  51   −407  120,  $\Delta G_r^0(298 \text{ K.}) = -620 \text{ kJ mol}^{-1}$,
[II-65]  $CsF(cr) + 3O(g) + NO_2(g) \rightarrow CsNO_3(cr) + FO_2(g)$
  −555  3 × 249  33   −506  13,   $\Delta H_r^0(298 \text{ K.}) = -718 \text{ kJ mol}^{-1}$
  −525  3 × 232  51   −407  27,   $\Delta G_r^0(298 \text{ K}) = -602 \text{ kJ mol}^{-1}$
and
[II-66]  $CsNO_3(cr) + 10F(g) \rightarrow CsF(cr) + NF_3(g) + 3F_2O(g)$
  −506  10 × 79  −555  −124  3 × 24,  $\Delta H_r^0(298 \text{ K.}) = -891 \text{ kJ mol}^{-1}$
                                       $\Delta H_r^*(298 \text{ K.}) = -2551 \text{ kJ mol}^{-1}$
  −407  10 × 62  −525  −83   3 × 42,  $\Delta G_r^0(298 \text{ K.}) = -695 \text{ kJ mol}^{-1}$.

5. RUBIDIUM

The enthalpy of sublimation of rubidium fluoride is 227 kJ mol$^{-1}$. The 'times four' criterion is, therefore, 908 kJ mol$^{-1}$.

The 'times four' criterion is met for [II-66] even without considering the kinetic energy of the monofluorines. The O/NO$_2$+F procedure works well for the removal of all cesium species.

[II-56]  $Rb(cr) + O(g) + NO_2(g) \rightarrow RbNO_3(cr)$
  0    249  33   −495,  $\Delta H_r^0(298 \text{ K.}) = -777 \text{ kJ mol}^{-1}$
  0    232  51   −396,  $\Delta G_r^0(298 \text{ K.}) = -679 \text{ kJ mol}^{-1}$,
[II-57]  $Rb_2O(cr) + O(g) + 2 NO_2(g) \rightarrow 2 RbNO_3(cr)$
  −339  249  2 × 33  2 × −495,  $\Delta H_r^0(298) = -966 \text{ kJ mol}^{-1}$,
[II-58]  $Rb_2O_2(cr) + 2NO_2(g) \rightarrow 2 RbNO_3(cr)$
  −472  2 × 33  2 × $\Delta H_r^0(298 \text{ K.}) = -584 \text{ kJ mol}^{-1}$,
        −495,
[II-59]  $RbCl(cr) + 3O(g) + NO_2(g) \rightarrow RbNO_3(cr) + ClO_2(g)$
  −435  3 × 249  33  −495  102,  $\Delta H_r^0(298 \text{ K.}) = -738 \text{ kJ mol}^{-1}$
  −408  3 × 232  51  −396  120,  $\Delta G_r^0(298 \text{ K.}) = -615 \text{ kJ mol}^{-1}$,
[II-60]  $RbF(cr) + 3O(g) + NO_2(g) \rightarrow RbNO_3(cr) + FO_2(g)$
  −558  3 × 249  33  −495  13,  $\Delta H_r^0(298 \text{ K.}) = -704 \text{ kJ mol}^{-1}$
and
[II-61]  $RbNO_3(cr) + 10F(g) \rightarrow RbF(cr) + NF_3(g) + 3F_2O(g)$
  −495  10 × 79  −558  −124  3 × 24,  $\Delta H_r^0(298 \text{ K.}) = -905 \text{ kJ mol}^{-1}$
                                       $\Delta H_r^*(298 \text{ K.}) = -2565 \text{ kJ mol}^{-1}$.

The 'times four' criterion of 908 kJ mol$^{-1}$ is easily met, and the O/NO$_2$+F procedure works well for the removal of all rubidium species.

6. CESIUM

C. Group IIA.

1. THERMODYNAMIC DATA

TABLE II-2

| | | GROUP IIA THERMODYNAMIC DATA $\Delta H_f^0(298 \text{ K.})/\Delta G_f^0(298 \text{ K.})$ (kJ mol$^{-1}$) | | | | |
|---|---|---|---|---|---|---|
| SPECIES | | Be | Mg | Ca | Sr | Ba |
| Mo | (cr) | −608/−579 | −601/−569 | −635/−604 | −592/−561 | −548/−520 |
|    | (g)  | +136/+111 | +58/+35   | +44/+21   | −13/−35   | −124/−145 |
| MCl$_2$ | (cr) | −491/−466 | −642/−592 | −796/−748 | −829/−780 | −859/−810 |
|         | (g)  | −360/−366 | −392/−399 | −472/−479 | −473/−484 | −499/−511 |
| MF$_2$  | (cr) | −1027/−979 | −1124/−1071 | −1226/−1173 | −1217/−1165 | −1209/−1158 |
|         | (g)  | −796/−801 | −727/−733 | −789/−793 | −766/776  | −804/−814 |
| M(NO$_3$)$_2$ | (cr) | — | −791*/−589* | −938*/−743* | −978*/780* | −992*/797* |

(*Ref. <B>).

We note that none of the condensed phase compounds listed in TABLE II-2. are self-volatilizing under the criteria of [II-1] or [II-2].

The enthalpy of sublimation of magnesium fluoride is 397 kJ mol$^{-1}$, and the 'times four' criterion is 1588 kJ mol$^{-1}$.

| [II-71] | Mg(cr) + 2O(g) + 2NO$_2$(g) → Mg(NO$_3$)$_2$ | | | | |
|---|---|---|---|---|---|
| | 0 | 2 × 249 | 2 × 33 | | −791, $\Delta H_r^0$(298 K.) = −1355 kJ mol$^{-1}$ |
| | 0 | 2 × 232 | 2 × 51 | | −589, $\Delta G_r^0$(298 K.) = −1155 kJ mol$^{-1}$, |
| [Ii-72] | MgO(cr) + O(g) + 2NO$_2$(g) → Mg(NO$_3$)$_2$ | | | | |
| | −601 | 249 | 2 × 33 | | −791, $\Delta H_r^0$(298 K.) = −505 kJ mol$^{-1}$ |
| | −569 | 232 | 2 × 51 | | −589, $\Delta G_r^0$(298 K.) = −354 kJ mol$^{-1}$, |
| [II-73] | MgCl$_2$(cr) + 6O(g) + 2NO$_2$(g) → Mg(NO$_3$)$_2$ + 2ClO$_2$(g) | | | | |
| | −642 | 6 × 249 | 2 × 33 | −791 | 2 × 102, $\Delta H_r^0$(298 K.) = −1505 kJ mol$^{-1}$ |
| | −592 | 6 × 232 | 2 × 51 | −589 | 2 × 120, $\Delta G_r^0$(298 K.) = −1251 kJ mol$^{-1}$, |
| [II-74] | MgF$_2$(cr) + 6O(g) + 2NO$_2$(g) → Mg(NO$_3$)$_2$ + 2FO$_2$(g) | | | | |
| | −1124 | 6 × 249 | 2 × 33 | −791 | 2 × 13, $\Delta H_r^0$(298 K.) = −1201 kJ mol$^{-1}$ |
| | −1071 | 6 × 232 | 2 × 51 | −589 | 2 × 27, $\Delta G_r^0$(298 K.) = −958 kJ mol$^{-1}$ |
| and | | | | | |
| [II-75] | Mg(NO$_3$)$_2$(cr) + 20F(g) → MgF$_2$(cr) + 2NF$_3$(g) + 6F$_2$O(g) | | | | |
| | −791 | 20 × 79 | −1124 | 2 × −124 | 6 × 24, $\Delta H_r^0$(298 K.) = −2017 kJ mol$^{-1}$ |
| | | | | | $\Delta H_r^*$(298 K.) = −5337 kJ mol$^{-1}$ |
| | −589 | 20 × 62 | −1071 | 2 × −83 | 6 × 42, $\Delta G_r^0$(298 K.) = −1636 kJ mol$^{-1}$. |

2. BERYLLIUM

The enthalpy of sublimation of beryllium fluoride is 231 kJ mol$^{-1}$. The 'times four' criterion is 924 kJ [mol$^{-1}$. In the absence of any thermodynamic data on beryllium nitrate we are unable to investigate the reactions of nitrogen dioxide with compounds of beryllium.

The 'times four' criterion is met for [II-75] even without considering the kinetic energy of the monofluorines. Thus, the O/NO$_2$+F procedure works well for the removal of all magnesium species.

4. CALCIUM

The enthalpy of sublimation of calcium fluoride is 442 kJ mol$^{-1}$, and the 'times four' criterion is 1768 kJ

| [II-67] | Be(cr) + O(g) → BeO(cr) | | | |
|---|---|---|---|---|
| | 0 | 249 | | −608, $\Delta H_r^0$(298 K.) = −857 kJ mol$^{-1}$ |
| | 0 | 232 | | −579, $\Delta G_r^0$(298 K.) = −811 kJ mol$^{-1}$, |
| [II-68] | BeCl$_2$(cr) + 5O(g) → BeO(cr) + 2ClO$_2$(g) | | | |
| | −491 | 5 × 249 | −608 | 2 × 102, $\Delta H_r^0$(298 K.) = −1158 kJ mol$^{-1}$ |
| | | | | $\Delta H_r^*$(298 K.) = −2558 kJ mol$^{-1}$ |
| | −466 | 5 × 232 | −579 | 2 × 120, $\Delta G_r^0$(298 K.) = −1033 kJ mol$^{-1}$, |
| [II-69] | BeF$_2$(cr) + 5O(g) → BeO(cr) + 2FO$_2$(g) | | | |
| | −1027 | 5 × 249 | −608 | 2 × 13, $\Delta H_r^0$(298 K.) = −800 kJ mol$^{-1}$ |
| | | | | $\Delta H_r^*$(298 K.) = −2200 kJ mol$^{-1}$ |
| | −979 | 5 × 232 | −579 | 2 × 27, $\Delta G_r^0$(298 K.) = −706 kJ mol$^{-1}$ |
| and | | | | |
| [II-70] | BeO(cr) + 4F(g) → BeF$_2$(cr) + F$_2$O(g) | | | |
| | −608 | 4 × 79 | −1027 | 24, $\Delta H_r^0$(298 K.) = −711 kJ mol$^{-1}$ |
| | | | | $\Delta H_r^*$(298) = −1375 kJ mol$^{-1}$ |
| | −579 | 4 × 62 | −979 | 42, $\Delta G_r^0$(298 K.) = −606 kJ mol$^{-1}$. |

Thus, [II-70] exceeds the 'times four' criterion for beryllium fluoride. The 'times four' criterion for BeO is 2976 kJ mol$^{-1}$ which neither [II-68] or [II-69] meet. Thus, the O+F procedure works well for the removal of all species of beryllium considered even in the absence of NO$_2$.

3. MAGNESIUM mol$^{-1}$.

| [II-76] | Ca(cr) + 2O(g) + 2NO$_2$(g) → Ca(NO$_3$)$_2$(cr) | | | | |
|---|---|---|---|---|---|
| | 0 | 2 × 249 | 2 × 33 | | −938, $\Delta H_r^0$(298 K.) = −1436 kJ mol$^{-1}$ |
| | 0 | 2 × 232 | 2 × 51 | | −743, $\Delta G_r^0$(298 K.) = −1207 kJ mol$^{-1}$, |
| [II-77] | CaO(cr) + O(g) + 2NO$_2$(g) → Ca(NO$_3$)$_2$(cr) | | | | |
| | −635 | 249 | 2 × 33 | | −938, $\Delta H_r^0$(298 K.) = − kJ mol$^{-1}$ |
| | −604 | 232 | 2 × 51 | | −743, $\Delta G_r^0$(298 K.) = −473 kJ mol$^{-1}$, |
| [II-78] | CaCl$_2$(cr) + 6O(g) + 2NO$_2$(g) → Ca(NO$_3$)$_2$(cr) + 2ClO$_2$(g) | | | | |
| | −796 | 6 × 249 | 2 × 33 | −938 | 2 × 102, $\Delta H_r^0$(298 K.) = −1498 kJ mol$^{-1}$ |
| | −748 | 6 × 232 | 2 × 51 | −743 | 2 × 120, $\Delta G_r^0$(298 K.) = −1249 kJ mol$^{-1}$, |
| [II-79] | CaF$_2$(cr) + 6O(g) + 2NO$_2$(g) → Ca(NO$_3$)$_2$(cr) + 2FO$_2$(g) | | | | |
| | −1226 | 6 × 249 | 2 × 33 | −938 | 2 × 13, $\Delta H_r^0$(298 K.) = −1246 kJ mol$^{-1}$ |
| | −1173 | 6 × 232 | 2 × 51 | −743 | 2 × 27, $\Delta G_r^0$(298 K.) = −1010 kJ mol$^{-1}$ |
| and | | | | | |
| [II-80] | Ca(NO$_3$)$_2$(cr) + 20F(g) → CaF$_2$(cr) + 2NF$_3$(g) + 6F$_2$O(g) | | | | |
| | −938 | 20 × 79 | −1226 | 2 × −124 | 6 × 24, $\Delta H_r^0$(298 K.) = −1972 kJ mol$^{-1}$ |
| | | | | | $\Delta H_r^*$(298 K.) = −5292 kJ mol$^{-1}$ |
| | −743 | 20 × 62 | −1173 | 2 × −83, | 6 × 42, $\Delta G_r^0$(298 K.) = −1584 kJ mol$^{-1}$. |

The 'times four' criterion is met for [II-80] even without considering the kinetic energy of the monofluorines. Thus, the O/NO$_2$+F procedure works well for the removal of all calcium species.

5. STRONTIUM

The enthalpy of sublimation of strontium fluoride is 451 kJ mol$^{-1}$, and the 'times four' criterion is 1804 kJ mol$^{-1}$.

| | | | | | |
|---|---|---|---|---|---|
| [II-81] | Sr(cr) + 2O(g) + 2NO$_2$(g) → Sr(NO$_3$)$_2$(cr) | | | | |
| | 0 | 2 × 249 | 2 × 33 | −978, | $\Delta H_r^0$(298 K.) = −1542 kJ mol$^{-1}$ |
| | 0 | 2 × 232 | 2 × 51 | −780, | $\Delta G_r^0$(298 K.) = −1346 kJ mol$^{-1}$, |
| [II-82] | SrO(cr) + O(g) + 2nO$_2$(g) → Sr(NO$_3$)$_2$(cr) | | | | |
| | −592 | 249 | 2 × 33 | −978, | $\Delta H_r^0$(298 K.) = −701 kJ mol$^{-1}$ |
| | −561 | 232 | 2 × 51 | −780, | $\Delta G_r^0$(298 K.) = −553 kJ mol$^{-1}$, |
| [II-83] | SrCl$_2$(cr) + 6O(g) + 2NO$_2$(g) → Sr(NO$_3$)$_2$(cr) + 2ClO$_2$(g) | | | | |
| | −829 | 6 × 249 | 2 × 33 | −978 | 2 × 102, $\Delta H_r^0$(298 K.) = −1505 kJ mol$^{-1}$ |
| | −780 | 6 × 232 | 2 × 51 | −780 | 2 × 120, $\Delta G_r^0$(298 K.) = −1254 kJ mol$^{-1}$, |
| [II-84] | SrF$_2$(cr) + 6O(g) + 2NO$_2$(g) → Sr(NO$_3$)$_2$(cr) + 2FO$_2$(g) | | | | |
| | −1217 | 6 × 249 | 2 × 33 | −978 | 2 × 13, $\Delta H_r^0$(298 K.) = −1295 kJ mol$^{-1}$ |
| | −1165 | 6 × 232 | 2 × 51 | −780 | 2 × 27, $\Delta G_r^0$(298 K.) = −1055 kJ mol$^{-1}$ |
| and | | | | | |
| [II-85] | Sr(NO$_3$)$_2$(cr) + 2OF(g) → SrF$_2$(cr) + 2NF$_3$(g) + 6F$_2$O(g) | | | | |
| | −978 | 20 × 79 | −1217 | 2 × −124 | 6 × 24, $\Delta H_r^0$(298 K.) = −1923 kJ mol$^{-1}$ |
| | | | | | $\Delta H_r^*$(298 K.) = −5243 kJ mol$^{-1}$ |
| | −780 | 20 × 62 | −1165 | 2 × −83 | 6 × 42, $\Delta G_r^0$(298 K.) = −1539 kJ mol$^{-1}$. |

The 'times four' criterion is met for [II-85] even without considering the kinetic energy of the monofluorines. Thus the O/NO$_2$+F procedure works well for the removal of all strontium species.

6. BARIUM

The enthalpy of sublimation of barium fluoride is 405 kJ mol$^{-1}$, and the 'times four' criterion is 1620 kJ mol$^{-1}$.

| | | | | | |
|---|---|---|---|---|---|
| [II-86] | Ba(cr) + 2O(g) + 2NO$_2$(g) → Ba(NO$_3$)$_2$(cr) | | | | |
| | 0 | 2 × 249 | 2 × 33 | −992, | $\Delta H_r^0$(298 K.) = −1556 kJ mol$^{-1}$ |
| | 0 | 2 × 232 | 2 × 51 | −797, | $\Delta G_r^0$(298 K.) = −1368 kJ mol$^{-1}$, |
| [II-87] | BaO(cr) + O(g) + 2NO$_2$(g) → Ba(NO$_3$)$_2$(cr) | | | | |
| | −548 | 249 | 2 × 33 | −992, | $\Delta H_r^0$(298 K.) = 759 kJ mol$^{-1}$ |
| | −520 | 232 | 2 × 41 | −797, | $\Delta G_r^0$(298 K.) = −611 kJ mol$^{-1}$, |
| [II-88] | BaCl$_2$(cr) + 6O(g) + 2NO$_2$(g) → Ba(NO$_3$)$_2$(cr) + 2ClO$_2$(g) | | | | |
| | −859 | 6 × 249 | 2 × 33 | −992 | 2 × 102, $\Delta H_r^0$(298 K.) = −1489 kJ mol$^{-1}$ |
| | −810 | 6 × 232 | 2 × 51 | −797 | 2 × 120, $\Delta G_r^0$(298 K.) = −1241 kJ mol$^{-1}$, |
| [II-89] | BaF$_2$(cr) + 6O(g) + 2NO$_2$(g) → Ba(NO$_3$)$_2$(cr) + 2FO$_2$(g) | | | | |
| | −1209 | 6 × 249 | 2 × 33 | −992 | 2 × 13, $\Delta H_r^0$(298 K.) = −1317 kJ mol$^{-1}$ |
| | −1158 | 6 × 232 | 2 × 51 | −797 | 2 × 27, $\Delta G_r^0$(298 K.) = −1079 kJ mol$^{-1}$ |
| and | | | | | |
| [II-90] | Ba(NO$_3$)$_2$(cr) + 2OF(g) → BaF$_2$(cr) + 2NF$_3$(g) + 6F$_2$O(g) | | | | |
| | −992 | 20 × 70 | −1209 | 2 × −124 | 6 × 24, $\Delta H_r^0$(298 K.) = −1901 kJ mol$^{-1}$ |
| | | | | | $\Delta H_r^*$(298 K.) = −5221 kJ mol$^{-1}$ |
| | −797 | 20 × 62 | −1158 | 2 × −83 | 6 × 42, $\Delta G_r^0$(298 K.) = −1515 kJ mol$^{-1}$. |

Once again we find that the 'times four' criterion is met even without considering the kinetic energy of the monofluorines. Thus, the O/NO$_2$+F procedure works well for the removal of all alkali metal and alkaline earth metal species.

D. Group IIIA.

1. INTRODUCTION

Whereas the elements of Groups IA and IIA would not be expected to be present on a wafer as the element or as an 'alloy', this is not the case for the elements of Group IIIA. Aluminium and aluminum-copper alloys are frequently used as electrical conductors. Elementary boron may be present as a by-product of ion implantation. Furthermore, there is a large family of III-V compound semiconductors.

In addition to the O/NO$_2$ and F reagents we shall introduce a third reagent—methyl. Methyl is generated by introducing an excess of methane into the monofluorine stream by means of the lower circle.

| [II-91] CH$_4$(g) + F(g) → CH$_3$(g) + HF(g) | | | | |
|---|---|---|---|---|
| −75 | 79 | 146 | −272, | $\Delta H_r^0$(298 K.) = −130 kJ mol$^{-1}$ |
| −51 | 62 | 148 | −275, | $\Delta G_r^0$(298 K.) = −138 kJ mol$^{-1}$. |

For [II-91] $k_r$(298K) = 8 × 10$^{-11}$ cm$^3$ molecule$^{-1}$ s$^{-1}$ <II-11>, <II-12>. Thus, reaction occurs with essentially every collision.

In Table II-3 are listed the enthalpies of formation of the methyl compounds of Groups IIB, IIIA, IVA, VA and VIA and their enthalpies of sublimation or vaporization. All of the data are from Ref. <B> except where specifically noted. The symbol 'Me' represents the CH$_3$ radical.

Me$_3$B, Me$_3$N, MeO and Me$_2$O are all gases at 298K. Me$_3$ requires an additional 39.9 kJ mol$^{-1}$ to volatilize by the criteria of [II-1]. All of the other compounds will self-volatilize by the criterion of [11-2]. (These comments, strictly speaking are not correct. The criteria apply to the free energies and not to the enthalpies.).

TABLE II-3

METHYL COMPOUNDS THERMODYNAMIC DATA
$\Delta H_f^0(298\text{ K.})$
$\Delta H_s^0(298\text{ K.})$ or $\Delta H_v^0(298\text{ K.})$
(kJ mol$^{-1}$)

| IIB | IIB | IVA | VA | VIA |
|---|---|---|---|---|
| | | Me$_4$C(cr) — 196** 28 | | MeO(g) + 18* |
| | Me$_3$B(l) — 143 19 | (l) — 190** 22 | Me$_3$N(l) — 46 22 | |
| | (g) — 124 | (g) — 168** | (g) — 24 | Me$_2$O(g) — 184 |
| | Me$_3$Al(l) — 136 62 | Me$_4$Si(l) — 272*** 27 | Me$_3$P(l) — 129*** 28 | Me$_2$S(l) — 65 28 |
| | (g) — 74 | (g) — 245*** | (g) — 101*** | (g) — 37 |
| Me$_2$Zn(l) + 23 30 | Me$_3$Ga(l) — 78 33 | Me$_4$Ge(l) — 98*** 27 | Me$_3$As(l) — 16*** 29 | |
| (g) + 53 | (g) — 45 | (g) — 71*** | (g) + 13*** | |
| | Me$_3$In(cr) + 125*** 48 | | | |
| Me$_2$Cd(l) + 64 38 | | Me$_4$Sn(l) — 5 33 | Me$_3$Sb(l) + 1*** 31 | |
| (g) + 102 | (g) + 173*** | (g) — 19 | (g) + 32*** | |
| Me$_2$Hg(l) + 60 34 | | Me$_4$Pb(l) + 98 38 | Me$_3$Bi(l) + 158*** 36 | |
| (g) + 94 | | (g) + 136 | (g) + 194*** | |

(*Ref. <II-13>, Ref. <II-14>, *Ref. <II-15>).

The thermodynamic data for both Group III A and Group V A are presented her. This is because the analyses of the chemistries of the III-V compounds obviously require both sets of data.

TABLE II-4

GROUP IIIA THERMODYNAMIC DATA
$\Delta H_f^0(298\text{ K.})/\Delta G_f^0(298\text{ K.})$
(kJ mol$^{-1}$)

| SPECIES | | B | Al | Ga | In |
|---|---|---|---|---|---|
| M$_2$O$_3$ | (cr) | −1272/−1193 | −1676/−1582 | 1089*/−998* | −926*/−831* |
| | (g) | −836/−825 | | | |
| MO$_2$ | (g) | −285/−290 | −86/−92 | | |
| MCl$_3$ | (cr) | | −706/−630 | −525*/−455* | −537*/— |
| | (l) | −427*/−387* | | | |
| | (g) | −403/−388 | −585/−570 | | −374*/— |
| MF | (g) | −116/−144 | −266/−291 | −252*/— | −203*/— |
| MF$_2$ | (g) | −590/−601 | −695/−704 | | |
| MF$_3$ | (cr) | | −1510/−1431 | −1163*/−1085* | |
| | (g) | −1136/−1119 | −1209/−1193 | | |
| MN | (cr) | −251/−225 | −318/−287 | −110*/— | −18*/— |
| MP | (cr) | −79*/— | −166*/— | −88*/— | −89*/−77* |
| MAs | (cr) | | −116*/— | −71*/−68* | −59*/−54* |
| MSb | (cr) | | | −42*/−39* | −30*/−26* |

(*Ref. <B>).

TABLE II-5

GROUP VA THERMODYNAMIC DATA
$\Delta H_f^0(298\text{ K.})/\Delta G_f^0(298\text{ K.})$
(kJ mol$^{-1}$)

| SPECIES | | N | P | As | Sb | Bi |
|---|---|---|---|---|---|---|
| MO | (g) | +90/+87 | −24/−47 | +70a/— | +199a/— | |
| M$_2$O$_3$ | (cr) | | | | | −574a/−494a |
| M$_2$O$_4$ | (cr) | | | −794a/— | | |
| M$_2$O$_5$ | (cr) | | | −925a/−782a | | |
| | | | | −1441a/−1268a | | |
| M$_4$O$_6$ | (cr) | | | −1314a/−1152a | | |
| | (g) | | −2214/−2085 | −1209a/−1098a | | |
| MO$_2$ | (g) | +33/+51 | −315/317 | | | |
| M$_4$O$_{10}$ | (cr) | | −3010/−2723 | | | |
| | (g) | | −2904/−2670 | | | |
| MO$_3$ | (g) | +71/+116 | | | | |
| MCl$_3$ | (cr) | | | | −382a/−324a | −379a/− 315a |
| | (l) | +230a/— | −320a/−272a | −308a/−259a | | |
| | (g) | | −287a/−268a | −262a/−249a | −314a/−301a | −266a/−256a |

TABLE II-5-continued
GROUP VA THERMODYNAMIC DATA
$\Delta H_f^0(298\ K.)/\Delta G_f^0(298\ K.)$
$(kJ\ mol^{-1})$

| SPECIES | | N | P | As | Sb | Bi |
|---|---|---|---|---|---|---|
| MCl$_5$ | (cr) | | −444a/— | | | |
| | (l) | | | | −440a/−350a | |
| | (g) | | −375a/−305a | | −394a/−334a | |
| MF$_3$ | (cr) | | | | −916a/— | −904b/−940b |
| | (l) | | | −821a/−774a | | |
| | (g) | −132/−91 | −958/−937 | −786a/−771a | −47a/— | |

(a Ref. <B>, b Ref. <II-17>)

It should be noted that the nitrates of aluminum, gallium and indium exist only as the hydrates. On dehydration they decompose to the oxides.

3. BORON

The only boron compounds listed in TABLE II-4 which are not gases at 289K are B$_2$O$_3$, BN and BP.

| O + F |
| F |
| O + Me |
| Me. |

[II-92]  B(cr) + 1.5O(g) → 0.5B$_2$O$_3$(cr)
    0    1.5 × 249                  0.5 × −1272, $\Delta H_r^0(298\ K.) = -1010\ kJ\ mol^{-1}$
    0    1.5 × 232                  0.5 × −1193, $\Delta G_r^0(298\ K.) = -974\ kJ\ mol^{-1}$,

[II-93]  0.5B$_2$O$_3$(cr) + 0.5O(g) → BO$_2$(g)
    0.5 × −1272  0.5 × 249          −285, $\Delta H_r^0(298\ K.) = +226\ kJ\ mol^{-1}$
    0.5 × −1193  0.5 × 232          −290, $\Delta G_r^0(298\ K.) = +190\ kJ\ mol^{-1}$,

[II-94]  BN(cr) + 3.5O(g) → 0.5B$_2$O$_3$(cr) + NO$_2$(g)
    −251    3.5 × 249    0.5 × −1272    +31, $\Delta H_r^0(298\ K.) = -1226\ kJ\ mol^{-1}$
    −225    3.5 × 232    0.5 × −1193    +51, $\Delta G_r^0(298\ K.) = -1132\ kJ\ mol^{-1}$ and

[II-95]  BP(cr) + 4O(g) → 0.5N$_2$O$_3$(cr) + 0.25P$_4$O$_{10}$(cr)
    −79    4 × 249    0.5 × −1272    0.25 × −3010, $\Delta H_r^0(298\ K.) = -2306\ kJ\ mol^{-1}$.

In all of these reactions boric oxide remains as a residue. In [II-95] the phosphorus oxide will volatilize since the 'times four' criterion is 106 kJ/mole of BP.

[II-96]  B(cr) + 3F(g) → BF$_3$(g)
    0    3 × 79      −1136    $\Delta H_r^0(298\ K.) = -1373\ kJ\ mol^{-1}$
    0    3 × 62      −1119    $\Delta G_r^0(298\ K.) = -1305\ kJ\ mol^{-1}$,

[II-97]  B$_2$O$_3$(cr) + 12F(g) → 2BF$_3$(g) + 3F$_2$O(g)
    −1272  12 × 79  2 × −1136  3 × 24, $\Delta H_r^0(298\ K.) = -1876\ kJ\ mol^{-1}$
    −1193  12 × 62  2 × −1119  3 × 42, $\Delta G_r^0(298\ K.) = -1663\ kJ\ mol^{-1}$,

[II-98]  BN(cr) + 6F(g) → BF$_3$(g) + NF$_3$(g)
    −251  6 × 79    −1136    −132, $\Delta H_r^0(298\ K.) = -1491\ kJ\ mol^{-1}$
    −225  6 × 62    −1119    −91, $\Delta G_r^0(298\ K.) = -1357\ kJ\ mol^{-1}$,

[II-99]  BP(cr) + 6F(g) → BF$_3$(g) + PF$_3$(g)
    −79  6 × 79    −1136    −958, $\Delta H_r^0(298\ K.) = -2489\ kJ\ mol^{-1}$,

[II-100]  B(Cr) + 3CH$_3$(g) → (CH$_3$)$_3$B(g)
    0    3 × 146        2 × −124, $\Delta H_r^0(298\ K.) = -686\ kJ\ mol^{-1}$,

[II-101]  B$_2$O$_3$(cr) + 12CH$_3$(g) → 2(CH$_3$)$_3$B(g) + (CH$_3$)$_2$O(g)
    −1272  12 × 146        3 × −184, $\Delta H_r^0(298\ K.) = -1280\ kJ\ mol^{-1}$,

[II-102]  BN(cr) + 6CH$_3$(g) → (CH$_3$)$_3$B(g) + (CH$_3$)$_3$N(g)
    −251  6 × 146  −124    −24, $\Delta H_r^0(298\ K.) = -773\ kJ\ mol^{-1}$ and

[II-103]  BP(cr) + 6CH$_3$(g) → (CH$_3$)$_3$B(g) + (CH$_3$)$_3$P(g)
    −79  6 × 146  −124    −101, $\Delta H_r^0(298\ K.) = -1022\ kJ\ mol^{-1}$.

Thus, there are four procedures which are effective in volatilizing all of the boron species present:

4. ALUMINUM

None of the aluminum compounds meet the criteria of either [II-1] or [II-2]. We must, therefore, depend on the 'times four' criterion. For aluminum fluoride it is 1204 kJ mol$^{-1}$. For trimethyl aluminum it is 248 kJ mol$^{-1}$.

[II-104]  Al(cr) + 1.5O(g) → 0.5Al$_2$O$_3$(cr)
    0    1.5 × 249             0.5 × −1676, $\Delta H_r^0(298\ K.) = -1212\ kJ\ mol^{-1}$,
    0    1.5 × 232             0.5 × −1582, $\Delta G_r^0(298\ K.) = -1139\ kJ\ mol^{-1}$,

[II-105]  AlCl$_3$(cr) + 7.5O(g) → 0.5Al$_2$O$_3$(cr) + 3ClO$_2$(g)
    −706  7.5 × 249  0.5 × −1676  3 × 102, $\Delta H_r^0(298\ K.) = -1694\ kJ\ mol^{-1}$
    −630  25 × 232  0.5 × −1582  3 × 120, $\Delta G_r^0(298\ K.) = -1541\ kJ\ mol^{-1}$,

[II-106]  AlF$_3$(cr) + 7.5O(g) → 0.5Al$_2$O$_3$(cr) + 3FO$_2$(g)
    −1510  7.5 × 249  0.5 × −1676  3 × 13, $\Delta H_r^0(298\ K.) = -1156\ kJ\ mol^{-1}$
    −1431  7.5 × 232  0.5 × −1582  3 × 27, $\Delta G_r^0(298\ K.) = -1019\ kJ\ mol^{-1}$, -continued

[II-107] AlN(cr) + 3.5O(g) → 0.5Al$_2$O$_3$(cr) + NO$_2$(g)
 −318    3.5 × 249    0.5 × −1676        33, ΔH$_r^0$(298 K.) = −1398 kJ mol$^{-1}$
 −287    3.5 × 232    0.5 × −1582        51, ΔG$_r^0$(298 K.) = −1265 kJ mol$^{-1}$,

[II-108] AlP(cr) + 4O(g) → 0.5Al$_2$O$_3$(cr) + 0.25P$_4$O$_{10}$(cr)
 −166    4 × 249    0.5 × −1676    0.25 × −3010, ΔH$_r^0$(298 K.) = −2420 kJ mol$^{-1}$ and

[II-109] AlAs(cr) + 3O(g) → 0.5Al$_2$O$_3$(cr) + 0.25As$_4$O$_6$(cr)
 −116    3 × 249    0.5 × −1676    0.25 × −1314, ΔH$_r^0$(298 K.) = −1798 kJ mol$^{-1}$.

[II-110] Al(cr) + 3F(g) → AlF$_3$(cr)
 0    3 × 79              −1510, ΔH$_r^0$(298 K.) = −1747 kJ mol$^{-1}$
 0    3 × 62              −1431, ΔG$_r^0$(298 K.) = −1617 kJ mol$^{-1}$,

[II-111] Al$_2$O$_3$(cr) + 12F(g) → 2AlF$_3$(cr) + 3F$_2$O(g)
 −1676   12 × 79    2 × −1510    3 × 24, ΔH$_r^0$(298 K.) = −2220 kJ mol$^{-1}$
 −1582   12 × 62    2 × −1431    3 × 42, ΔG$_r^0$(298 K.) = −1898 kJ mol$^{-1}$, (This reaction is 94 kJ mol$^{-1}$ of AlF$_3$ below the 'times four' criterion.)

[II-112] P$_4$O$_{10}$(cr) + 32F(g) → 4PF$_3$(g) + 10F$_2$O(g)
 −3010   32 × 79    4 × −958    10 × 24, ΔH$_r^0$(298 K.) = −3110 kJ mol$^{-1}$
 −2723   32 × 62    4 × −959    10 × 42, ΔG$_r^0$(298 K.) = −2589 kJ mol$^{-1}$,

[II-113] As$_4$O$_6$(cr) + 24F(g) → 4AsF$_3$(g) + 6F$_2$O(g)
 −1314   24 × 79    4 × −786    6 × 24, ΔH$_r^0$(298 K.) = −3582 kJ mol$^{-1}$
 −1152   24 × 62    4 × −770    6 × 42, ΔG$_r^0$(298 K.) = −3164 kJ mol$^{-1}$,

[II-114] AlN(cr) + 6F(g) → AlF$_3$(cr) + NF$_3$(g)
 −318    6 × 79    −1510    −132, ΔH$_r^0$(298 K.) = −1798 kJ mol$^{-1}$
 −287    6 × 62    −1431    −91, ΔG$_r^0$(298 K.) = −1607 kJ mol$^{-1}$,

[II-115] AlP(cr) + 6F(g) → AlF$_3$(cr) + PF$_3$(g)
 −166    6 × 79    −1510    −958, ΔH$_r^0$(298 K.) = −2776 kJ mol$^{-1}$ and

[II-116] AlAs(cr) + 6F(g) → AlF$_3$(cr) + AsF$_3$(l)
 −116    6 × 79    −1510    −821, ΔH$_r^0$(298 K.) = −2689 kJ mol$^{-1}$.

The 'times four' criterion for arsenic trifluoride is 140 kJ mol$^{-1}$. Thus, the 'times four' criterion for [II-109] is 1204+140=1344 kJ mol$^{-1}$. Monofluorine is therefore, an effective volatilizing reagent for [II-110]–[II-116].

5. GALLIUM

Except for trimethylgallium we do not have sufficient data to determine volatilization criteria. For trimethylgallium the 'times four' criterion is 132 kJ mol$^{-1}$.

[II-117] Al(cr) + 3CH$_3$(g) → (CH$_3$)$_3$Al(l)
 0    3 × 146              −136, ΔH$_r^0$(298 K.) = −574 kJ mol$^{-1}$,

[II-118] Al$_2$O$_3$(cr) + 12CH$_3$(g) → 2(CH$_3$)$_3$Al(l) + 3(CH$_3$)$_2$O(g)
 −1676   12 × 146    2 × −136    3 × −184, ΔH$_r^0$(298 K.) = −900 kJ mol$^{-1}$,

[II-119] P$_4$O$_{10}$(cr) + 32CH$_3$(g) → 4(CH$_3$)$_3$P(g) + 10(CH$_3$)$_2$O(g)
 −3010   32 × 146    4 × −101    10 × −184, ΔH$_r^0$(298 K.) = −3906 kJ mol$^{-1}$,

[II-120] As$_4$O$_6$(cr) + 24CH$_3$(g) → 4(CH$_3$)$_3$As(g) + 6(CH$_3$)$_2$O(g)
 −1314   24 × 146    4 × 13    6 × −184, ΔH$_r^0$(298 K.) = −3242 kJ mol$^{-1}$,

[II-121] AlN(cr) + 6CH$_3$(g) → (CH$_3$)$_3$Al(l) + (CH$_3$)$_3$N(g)
 −318    6 × 146    −136    −24, ΔH$_r^0$(298 K.) = −718 kJ mol$^{-1}$,

[II-122] AlP(cr) + 6CH$_3$(g) → (CH$_3$)$_3$Al(l) + (CH$_3$)$_3$P(g)
 −166    6 × 146    −136    −101, ΔH$_r^0$(298 K.) = −947 kJ mol$^{-1}$ and

[II-123] AlAs(cr) + 6CH$_3$(g) → (CH$_3$)$_3$Al(l) + (CH$_3$)$_3$As(g)
 −116    6 × 146    −136    +13, ΔH$_r^0$(298 K.) = −883 kJ mol$^{-1}$.

Thus, we again find the quartet of effective procedures,

O + F, Ḟ (cf. note after [II-111])
O + Me, Me.

Because of the lack of adequate thermodynamic data, we shall not carry out the monofluorine analyses. The reactions of methyl with the phosphorous and arsenic oxides are given above ([II-119] and [II-120]) and will not be repeated here.

[II-124] Ga(c) + 1.5O(g) → 0.5Ga$_2$O$_3$(cr)
 0    1.5 × 249              0.5 × −1089, ΔH$_r^0$(298 K.) = −918 kJ mol$^{-1}$
 0    1.5 × 232              0.5 × −998, ΔG$_r^0$(298 K.) = −847 kJ mol$^{-1}$,

[II-125] GaCl$_3$(cr) + 7.5O(g) → 0.5Ga$_2$O$_3$(cr) + 3ClO$_2$(g)
 −525    7.5 × 249    0.5 × −1089    3 × 102, ΔH$_r^0$(298 K.) = −1581 kJ mol$^{-1}$
 −455    7.5 × 232    0.5 × −998     3 × 120, ΔG$_r^0$(298 K.) = −1424 kJ mol$^{-1}$,

[II-126] GaF$_3$(cr) + 7.5O(g) → 0.5Ga$_2$O$_3$(cr) + 3FO$_2$(g)
 −1163   7.5 × 249    0.5 × −1089    3 × 13, ΔH$_r^0$(298 K.) = −1210 kJ mol$^{-1}$
 −1085   7.5 × 232    0.5 × −998     3 × 27, ΔG$_r^0$(298 K.) = −1073 kJ mol$^{-1}$,

[II-127] GaN(cr) + 3.5O(g) → 0.5Ga$_2$O$_3$(cr) + NO$_2$(g)
 −110    3.5 × 249    0.5 × −1087    33, ΔH$_r^0$(298 K.) = −1273 kJ mol$^{-1}$,

[II-128] GaP(Cr) + 4O(g) → 0.5Ga$_2$O$_3$(cr) + 0.25P$_4$O$_{10}$(cr)
 −88    4 × 249    0.5 × −1089    0.25 × −3010, ΔH$_r^0$(298 K.) = −2205 kJ mol$^{-1}$,

[II-129] GaAs(cr) + 3O(g) → 0.5Ga$_2$O$_3$(cr) + 0.25Al$_4$O$_6$(cr)
 −71    3 × 247    0.5 × 1089    0.25 × −1314, ΔH$_r^0$(298 K.) = −1549 kJ mol$^{-1}$, and

[II-130] GaSb(cr) + 3O(g) → 0.5Ga$_2$O$_3$(cr) + 0.25Sb$_4$O$_6$(cr)

-continued

| | | | | |
|---|---|---|---|---|
| | −42 | 3 × 247 | 0.5 × −1089 | 0.25 × −1441, $\Delta H_r^0(298\ K.) = -1610\ kJ\ mol^{-1}$. |
| [II-131] | Ga(cr) + 3CH$_3$(g) → (CH$_3$)$_3$Ga(l) | | | |
| | 0 | 3 × 146 | | −78, $\Delta H_r^0(298\ K.) = -516\ kJ\ mol^{-1}$, |
| [II-132] | 0.5Ga$_2$O$_3$(cr) + 6CH$_3$(g) → (CH$_3$)$_3$Ga(l) + 1.5(CH$_3$)$_2$O(g) | | | |
| | 0.5 × −1089 | 6 × 146 | −78 | 1.5 × −184, $\Delta H_r^0(298\ K.) = -686\ kJ\ mol^{-1}$, |
| [II-133] | GaCl$_3$(cr) + 6CH$_3$(g) → (CH$_3$)$_3$Ga(l) + 3CH$_3$Cl(g) | | | |
| | −525 | 6 × 146 | −78 | 3 × −84, $\Delta H_r^0(298\ K.) = -681\ kJ\ mol^{-1}$, |
| [II-134] | GaF$_3$(cr) + 6CH$_3$(g) → (CH$_3$)$_3$Ga(l) + 3CH$_3$F(g) | | | |
| | −1163 | 6 × 146 | −78 | 3 × −234, $\Delta H_r^0(298\ K.) = -493\ kJ\ mol^{-1}$, |
| [II-135] | GaN(cr) + 6CH$_3$(g) → (CH$_3$)$_3$Ga(l) + (CH$_3$)$_3$N(g) | | | |
| | −110 | 6 × 146 | −78 | −24, $\Delta H_r^0(298\ K.) = -868\ kJ\ mol^{-1}$, |
| [II-136] | GaP(cr) + 6CH$_3$(g) → (CH$_3$)$_3$Ga(l) + (CH$_3$)$_3$P(g) | | | |
| | −88 | 6 × 146 | −78 | −101, $\Delta H_r^0(298\ K.) = -967\ kJ\ mol^{-1}$, |
| [II-137] | GaAs(cr) + 6CH$_3$(g) → (CH$_3$)$_3$Ga(l) + (CH$_3$)$_3$As(g) | | | |
| | −71 | 6 × 146 | −78 | 13, $\Delta H_r^0(298\ K.) = -870\ kJ\ mol^{-1}$, |
| [II-138] | GaSb(cr) + 6CH$_3$(g) → (CH$_3$)$_3$Ga(l) + (CH$_3$)$_3$Sb(g) | | | |
| | −42 | 6 × 146 | −78 | 32, $\Delta H_r^0(298\ K.) = -880\ kJ\ mol^{-1}$ |
| and | | | | |
| [II-139] | Sb$_4$O$_6$(cr) + 24CH$_3$(g) → 4(CH$_3$)$_3$Sb + 6(CH$_3$)$_2$O(g) | | | |
| | −1441 | 24 × 146 | 4 × 32 | 6 × −184, $\Delta H_r^0(298\ K.) = -3039\ kJ\ mol^{-1}$. |

Thus, we have two effective procedures. O+Me and Me.

6. INDIUM

The 'times four' criterion for trimethylindium is 192 kJ mol$^{-1}$. Again because of the lack of adequate thermodynamic data, we shall not carry out the monofluorine analyses.

| UPPER CIRCLE | LOWER CIRCLE |
|---|---|
| O$_2$ | NO$_2$ (O$_2$*) |
| F$_2$ | — |
| F$_2$ | CH$_4$ |

(*O$_2$ is used in the lower circle as a diluent when photoresists are removed to prevent overheating of the wafer.)

| | | | | |
|---|---|---|---|---|
| [II-140] | In(cr) + 1.5O(g) → 0.5In$_2$O$_3$(cr) | | | |
| | 0 | 1.5 × 249 | 0.5 × −926, $\Delta H_r^0(298\ K.) = -837\ kJ\ mol^{-1}$ | |
| | 0 | 1.5 × 232 | 0.5 × −831, $\Delta G_r^0(298\ K.) = -764\ kJ\ mol^{-1}$, | |
| [II-141] | InCl$_3$(cr) + 7.5O(g) → 0.5In$_2$O$_3$(cr) + 3ClO$_2$(g) | | | |
| | −537 | 7.5 × 249 | 0.5 × −926 | 3 × 102, $\Delta H_r^0(298\ K.) = -1488\ kJ\ mol^{-1}$, |
| [II-142] | InN(cr) + 3.5O(g) → 0.5In$_2$O$_3$(cr) + NO$_2$(g) | | | |
| | −18 | 3.5 × 249 | 0.5 × −926 | 33, $\Delta H_r^0(298\ K.) = -1284\ kJ\ mol^{-1}$, |
| [II-143] | InP(cr) + 3.5O(g) → 0.5In$_2$O$_3$(cr) + 0.25P$_4$O$_{10}$(cr) | | | |
| | −88 | 3.5 × 249 | 0.5 × −926 | 0.25 × 3010, $\Delta H_r^0(298\ K.) = -1999\ kJ\ mol^{-1}$, |
| [II-144] | InAs(cr) + 3.5O(g) → 0.5In$_2$O$_3$(cr) + 0.25 As$_4$O$_6$(cr) | | | |
| | −59 | 3.5 × 249 | 0.5 × −926 | 0.25 × −1314, $\Delta H_r^0(298\ K.) = -1604\ kJ\ mol^{-1}$ |
| and | | | | |
| [II-145] | InSb + 3.5O(g) → 0.5In$_2$O$_3$(cr) + 0.25Sb$_4$O$_6$(cr) | | | |
| | −30 | 3.5 × 249 | 0.3 × −926 | 0.25 × −1441, $\Delta H_r^0(298\ K.) = -1665\ kJ\ mol^{-1}$. |
| [II-146] | In(cr) + 3CH$_3$(g) → (CH$_3$)$_3$In(cr) | | | |
| | −0 | 3 × 146 | | 125, $\Delta H_r^0(298\ K.) = -313\ kJ\ mol^{-1}$, |
| [II-147] | In$_2$O$_3$(cr) + 6CH$_3$(g) → (CH$_3$)$_3$In(cr) + 1.5(CH$_3$)$_2$O(g) | | | |
| | 0.5 × −926 | 6 × 146 | 125 | 1.5 × −184, $\Delta H_r^0(298\ K.) = -564\ kJ\ mol^{-1}$, |
| [II-148] | InCl$_3$(cr) + 6CH$_3$(g) → (CH$_3$)$_3$In(cr) + 3CH$_3$Cl(g) | | | |
| | −537 | 6 × 146 | 125 | 3 × −84, $\Delta H_r^0(298\ K.) = -466\ kJ\ mol^{-1}$, |
| [II-149] | InN(cr) + 6CH$_3$(g) → (CH$_3$)$_3$In(cr) + (CH$_3$)$_3$N(g) | | | |
| | −18 | 6 × 146 | 125 | −24, $\Delta H_r^0(298\ K.) = -757\ kJ\ mol^{-1}$, |
| [II-150] | InP(cr) + 6CH$_3$(g) → (CH$_3$)$_3$In(cr) + (CH$_3$)$_3$P(g) | | | |
| | −88 | 6 × 146 | 125 | −101, $\Delta H_r^0(298\ K.) = -764\ kJ\ mol^{-1}$, |
| [II-151] | InAs(cr) + 6CH$_3$(g) → (CH$_3$)$_3$In(cr) + (CH$_3$)$_3$As(g) | | | |
| | −59 | 6 × 146 | 125 | 13, $\Delta H_r^0(298\ K.) = -679\ kJ\ mol^{-1}$ |
| and | | | | |
| [II-152] | InSb(cr) + 6CH$_3$(g) → (CH$_3$)$_3$In(cr) + (CH$_3$)$_3$In(cr) + (CH$_3$)$_3$Sb(g) | | | |
| | −30 | 6 × 146 | 125 | −32, $\Delta H_r^0(298\ K.) = -689\ kJ\ mol^{-1}$. |

Again we have two effective procedures O+Me and Me.

E. Group IV A.

1. INTRODUCTION

At this point we have introduced three reagants O/NO$_2$, F and Me. In terms of upper circle/lower circle reagents they are Although this three step process is adequate for the removal of Group IVA elements and compounds, we shall introduce monohydrogen as a useful alternative reagent. The three step process leaves the surface 'dangling bonds' attached to fluorine atoms. If a deposition is to be made on the freshly cleaned surface, it is more desirable that the surface atoms be bonded to hydrogens rather than fluorines.

2. THERMODYNAMIC DATA

TABLE II-6

GROUP IVA THERMODYNAMIC DATA
$\Delta H_f^0(298\ K.)/\Delta G_f^0(298\ K.)$
(kJ mol$^{-1}$)

| SPECIES | | C | Si | Ge | Sn | Pb |
|---|---|---|---|---|---|---|
| Diamond | | 1.9*/2.9* | | | | |
| MO | (cr) | | | −262*/−237* | −286*/−257* | −217*/−188* |
| | (g) | −110/−137 | −100/−127 | −46*/−73* | +15*/−8* | |
| MO$_2$ | (cr) | | −911/−856 | −551*/−497* | −581*/−520* | −277*/−217* |
| | (g) | −394/−394 | | | | |
| MF | (g) | +255/+223 | −20/−52 | −33*/— | | |
| MF$_2$ | (cr) | | | | | −664*/−617* |
| | (g) | −182/−192 | −588/−598 | ~−500*/— | | |
| MF$_3$ | (g) | −470/−457 | −1085/−1573 | | | |
| MF$_4$ | (cr) | | | | | −942*/— |
| | (g) | −933/−888 | −1615/−1573 | | | |
| MH | (g) | +594/+561 | +377/+343 | | | |
| MH$_2$ | (g) | +386/+369 | +245**/— | | | |
| MH$_3$ | (g) | +146/+148 | +209**/— | | | |
| MH$_4$ | (g) | −75/−51 | +34/+57 | +91*/+113* | +163*/+188* | |

(*Ref. <B>, **Ref. <II-16>).

3. CARBON

[II-153] C(graphite) + O(g) → CO(g)
    0    249    −110, $\Delta H_r^0(298\ K.) = -359$ kJ mol$^{-1}$
    0    232    −137, $\Delta G_r^0(298\ K.) = -369$ kJ mol$^{-1}$,

[II-154] C(graphite) + 2O(g) → CO$_2$(g)
    0    2 × 249    −394, $\Delta H_r^0(298\ K.) = -892$ kJ mol$^{-1}$
    0    2 × 232    −394, $\Delta G_r^0(298\ K.) = -858$ kJ mol$^{-1}$,

[II-155] C(graphite) + F(g) → CF(g)
    0    79    255, $\Delta H_r^0(298\ K.) = +116$ kJ mol$^{-1}$
    0    62    223, $\Delta G_r^0(298\ K.) = +161$ kJ mol$^{-1}$,

[II-156] C(graphite) + 2F(g) → CF$_2$(g)
    0    2 × 79    −182, $\Delta H_r^0(298\ K.) = -340$ kJ mol$^{-1}$
    0    2 × 62    −192, $\Delta G_r^0(298\ K.) = -316$ kJ mol$^{-1}$,

[II-157] C(graphite) + 3F(g) → CF$_3$(g)
    0    3 × 79    −470, $\Delta H_r^0(298\ K.) = -707$ kJ mol$^{-1}$
    0    3 × 62    −457, $\Delta G_r^0(298\ K.) = -643$ kJ mol$^{-1}$,

[II-158] C(graphite) + 4F(g) → CF$_4$(g)
    0    4 × 79    −933, $\Delta H_r^0(298\ K.) = -1249$ kJ mol$^{-1}$
    0    4 × 62    −888, $\Delta G_r^0(298\ K.) = -1136$ kJ mol$^{-1}$,

[II-159] C(graphite) + 4CH$_3$(g) → (CH$_3$)$_4$C(g)
    0    4 × 146    −168, $\Delta H_r^0(298\ K.) = -751$ kJ mol$^{-1}$,

[II-160] C(graphite) + H(g) → CH(g)
    0    218    594, $\Delta H_r^0(298\ K.) = +376$ kJ mol$^{-1}$
    0    203    561, $\Delta G_r^0(298\ K.) = +358$ kJ mol$^{-1}$,

[II-161] C(graphite) + 2H(g) → CH$_2$(g)
    0    2 × 218    386, $\Delta H_r^0(298\ K.) = -50$ kJ mol$^{-1}$
    0    2 × 203    369, $\Delta G_r^0(298\ K.) = -7$ kJ mol$^{-1}$,

[II-162] C(graphite) + 3H(g) → CH$_3$(g)
    0    3 × 218    146, $\Delta H_r^0(298\ K.) = -508$ kJ mol$^{-1}$
    0    3 × 203    148, $\Delta G_r^0(298\ K.) = -461$ kJ mol$^{-1}$

[II-163] C(graphite) + 4H(g) → CH$_4$(g)
    0    4 × 218    −75, $\Delta H_r^0(298\ K.) = -947$ kJ mol$^{-1}$
    0    4 × 203    −51, $\Delta G_r^0(298\ K.) = -863$ kJ mol$^{-1}$.

Although all of the calculations in this SECTION are for graphite, they are also valid for diamond since the enthalpy and free energy of formation of diamond are so small. Without thermodynamic data on the stepwise reactions, [II-159 must be considered as questionably effective. Only the reaction generating CO of the three possible diatomic products is thermodynamically favorable. None of these reactions, [II-153], [II-155] and [II-160], are kinetically favorable. The oxidation, fluoridation and hydrogenation of both graphite and diamond surfaces are well known phenomena. For the monofluorine and monohydrogen reactions at least two reagent-carbon bonds must be formed before a volatile product is generated. In some cases three or four reagent-carbon bonds are required. For the monoxygen case clearly two-carbon-oxygen single bonds (σ-bonds) will yield a volatile product.

4. SILICON

[II-164] Si(cr) + O(g) → SiO(g)
    0            −100, $\Delta H_r^0(298\ K.) = -349$ kJ mol$^{-1}$
    0    232    −127, $\Delta G_r^0(298\ K.) = -359$ kJ mol$^{-1}$,

[II-165] Si(cr) + 2O(g) → SiO$_2$(g)
    0    2 × 249    −911, $\Delta H_r^0(298\ K.) = -1409$ kJ mol$^{-1}$
    0    2 × 232    −856, $\Delta G_r^0(298\ K.) = -1320$ kJ mol$^{-1}$,

[II-166] Si(cr) + F(g) → SiF(g)
    0    79    −20, $\Delta H_r^0(298\ K.) = -99$ kJ mol$^{-1}$
    0    62    −52, $\Delta G_r^0(298\ K.) = -114$ kJ mol$^{-1}$,

[II-167] Si(cr) + 2F(g) → SiF$_2$(g)
    0    2 × 79    −588, $\Delta H_r^0(298\ K.) = -746$ kJ mol$^{-1}$
    0    2 × 62    −598, $\Delta G_r^0(298\ K.) = -722$ kJ mol$^{-1}$,

[II-168] Si(cr) + 3F(g) → SiF$_3$(g)
    0    3 × 79    −1085, $\Delta H_r^0(298\ K.) = -1322$ kJ mol$^{-1}$
    0    3 × 62    −1073, $\Delta G_r^0(298\ K.) = -1259$ kJ mol$^{-1}$,

[II-169] Si(cr) + 4F(g) → SiF$_4$(g)
    0    4 × 79    −1615, $\Delta H_r^0(298\ K.) = -1931$ kJ mol$^{-1}$
    0    4 × 62    −1593, $\Delta G_r^0(298\ K.) = -1841$ kJ mol$^{-1}$,

[II-170] SiO$_2$(cr) + 2F(g) → SiO(g) + F$_2$O(g)
    −911    2 × 79    −100    24, $\Delta H_r^0(298\ K.) = +677$ kJ mol$^{-1}$
    −856    2 × 62    −129    42, $\Delta G_r^0(298\ K.) = +647$ kJ mol$^{-1}$,

[II-171] SiO$_2$(cr) + 4F(g) → Si(cr) + 2F$_2$O(g)
    −911    4 × 79    0    2 × 24, $\Delta H_r^0(298\ K.) = +643$ kJ mol$^{-1}$
    −856    4 × 62    0    2 × 42, $\Delta G_r^0(298\ K.) = +692$ kJ mol$^{-1}$,

[II-172] SiO$_2$(cr) + 5F(g) → SiF(g) + 2F$_2$O(g)

-continued

```
          −911    5 × 79    −20     2 × 24, ΔH_r^0(298 K.) = +544 kJ mol^-1
          −856    5 × 62    −52     2 × 42, ΔG_r^0(298 K.) = +578 kJ mol^-1,
[II-173]  SiO_2(cr) + 6F(g) → SiF_2(g) + 2F_2O(g)
          −911    6 × 79    −588    2 × 24, ΔH_r^0(298 K.) = −103 kJ mol^-1
          −856    6 × 62    −598    2 × 42, ΔG_r^0(298 K.) = −30 kJ mol^-1,
[II-174]  SiO_2(cr) + 7F(g) → SiF_3(g) + 2F_2O(g)
          −911    7 × 79    −1085   2 × 24, ΔH_r^0(298 K.) = −679 kJ mol^-1
          −856    7 × 62    −1073   2 × 42, ΔG_r^0(298 K.) = −567 kJ mol^-1,
[II-175]  SiO_2(cr) + 8F(g) → SiF_4(g) + 2F_2O(g)
          −911    8 × 79    −1615   2 × 24, ΔH_r^0(298 K.) = −1288 kJ mol^-1
          −856    8 × 62    −1573   2 × 42, ΔG_r^0(298 K.) = −1129 kJ mol^-1;
[II-176]  Si(cr) + 4CH_3(g) → (CH_3)_4Si(g)
          0       4 × 146   −245,   ΔH_r^0(298 K.) = −829 kJ mol^-1,
[II-177]  SiO_2(cr) + CH_3(g) → SiO(g) + CH_3O(g)
          −911    146       −100    18, ΔH_r^0(298 K.) = +683 kJ mol^-1,
[II-178]  SiO_2(cr) + 2CH_3(g) → SiO(g) + (CH_3)_2O(g)
          −911    2 × 146   −100    −184, ΔH_r^0(298 K.) = +335 kJ mol^-1,
[II-179]  SiO_2(cr) + 3CH_3(g) → Si(cr) + (CH_3)_2O(g) + CH_3O(g)
          −911    3 × 146   0       −184  18, ΔH_r^0(298 K.) = +307 kJ mol^-1,
[II-180]  SiO_2(cr) + 4CH_3(g) → Si(cr) + 2(CH_3)_2O(g)
          −911    4 × 146   0       2 × −184, ΔH_r^0(298 K.) = −41 kJ mol^-1,
[II-181]  SiO_2(cr) + 8CH_3(g) → (CH_3)_4Si(g) + 2(CH_3)_2O(g)
          −911    8 × 146   −245    2 × −184, ΔH_r^0(298 K.) = −870 kJ mol^-1,
[II-182]  Si(cr) + H(g) → SiH(g)
          0       218       377, ΔH_r^0(298 K.) = +159 kJ mol^-1,
          0       203       343, ΔG_r^0(298 K.) = +140 kJ mol^-1,
[II-183]  Si(cr) + 2H(g) → SiH_2(g)
          0       2 × 218   245, ΔH_r^0(298 K.) = −191 kJ mol^-1,
[II-184]  Si(cr) + 3H(g) → SiH_3(g)
          0       3 × 218   209, ΔH_r^0(298 K.) = −445 kJ mol^-1,
[II-185]  Si(Cr) + 4H(g) → SiH_4(g)
          0       4 × 218   34, ΔH_r^0(298 K.) = −838 kJ mol^-1
          0       4 × 203   57, ΔG_r^0(298 K.) = −755 kJ mol^-1,
[II-186]  SiO_2(cr) + H(g) → SiO(g) + OH(g)
          −911    218       −100    39, ΔH_r^0(298 K.) = +632 kJ mol^-1
          −856    203       −127    34, ΔG_r^0(298 K.) = +560 kJ mol^-1,
[II-187]  SiO_2(cr) + 2H(g) → SiO(g) + H_2O(g)
          −911    2 × 218   −100    −242, ΔH_r^0(298 K.) = +133 kJ mol^-1
          −856    2 × 203   −127    −229, ΔG_r^0(298 K.) = +94 kJ mol^-1,
[II-188]  SiO_2(cr) + 3H(g) → Si(cr) + H_2O(g) + OH(g)
          −911    3 × 218   0       −242   39, ΔH_r^0(298 K.) = +54 kJ mol^-1
          −856    3 × 203   0       −229   34, ΔG_r^0(298 K.) = +52 kJ mol^-1,
[II-189]  SiO_2(cr) + 4H(g) → Si(cr) + 2H_2O(g)
          −911    4 × 218   0       2 × −242, ΔH_r^0(298 K.) = −445 kJ mol^-1
          −856    4 × 203   0       2 × −229, ΔG_r^0(298 K.) = −414 kJ mol^-1,
[II-190]  SiO_2(cr) + 5H(g) → SiH(g) + 2H_2O(g)
          −911    5 × 218   377     2 × −242, ΔH_r^0(298 K.) = −286 kJ mol^-1
          −856    5 × 203   343     2 × −229, ΔG_r^0(298 K.) = −274 kJ mol^-1,
[II-191]  SiO_2(cr) + 6H(g) → SiH_2(g) + 2H_2O(g)
          −911    6 × 218   245     2 × −242, ΔH_r^0(298 K.) = −636 kJ mol^-1,
[II-192]  SiO_2(cr) + 7H(g) → SiH_3(g) + 2H_2O(g)
          −911    7 × 218   209     2 × −242, ΔH_r^0(298 K.) = −890 kJ mol^-1,
and
[II-193]  SiO_2 + 8H(g) → SiH_4(g) + 2H_2O(g)
          −911    8 × 218   34      2 × −242, ΔH_r^0(298 K.) = −1283 kJ mol^-1
          −856    8 × 203   57      2 × −229, ΔG_r^0(298 K.) = −1169 kJ mol^-1.
```

Reactions [II-164] and [II-165 are expected to form a 'surface crust' rather than a volatile compound or a 'body' oxide. For kinetic reasons the reaction a monofluorine with silicon is not expected to yield a volatile species unless there are at least two fluorines per silicon. The reaction of monofluorine with silicon dioxide is not expected to yield a volatile silicon species unless there are at least six monofluorines per silicon dioxide.

In the absence of thermodynamic data on $(CH_3)_xSi$ for $x = 1, 2, 3$ definitive statements cannot be made with respect to the reactions of methyl with silicon or silicon dioxide. It is clear, however, that between four and eight methyls per silicon dioxide are required to yield a volatile silicon species.

A minimum of two monohydrogens per silicon is required for kinetic reasons as well as thermodynamic reasons for the production of a volatile silicon species. For kinetic reasons a minimum of six monohydrogens are required per silicon dioxide for the production of a volatile silicon species.

5. GERMANIUM

```
[II-194]  Ge(cr) + O(g) → GeO(cr)
          0       249       −262, ΔH_r^0(298 K.) = −511 kJ mol^-1
          0       232       −237, ΔG_r^0(298 K.) = −469 kJ mol^-1,
[II-195]  GeO(cr) + O(g) → GeO_2(cr)
          −262    249       −551, ΔH_r^0(298 K.) = −538 kJ mol^-1
          −237    232       −497, ΔG_r^0(298 K.) = −492 kJ mol^-1,
[II-196]  Ge(cr) + F(g) → GeF(cr)
          0       79        −33, ΔH_r^0(298 K.) = 112 kJ mol^-1,
[II-197]  Ge(cr) + 2F(g) → GeF_2(cr)
```

-continued

| | | | | |
|---|---|---|---|---|
| | 0 | 2 × 79 | −500, | $\Delta H_r^0(298\ K.) = -658\ kJ\ mol^{-1}$, |
| [II-198] | $GeO(cr) + 3F(g) \rightarrow GeF(g) + F_2O(g)$ | | | |
| | −262 | 3 × 79 | −33 | 24, $\Delta H_r^0(298\ K.) = +16\ kJ\ mol^{-1}$, |
| [II-199] | $GeO(cr) + 4F(g) \rightarrow GeF_2(g) + F_2O(g)$ | | | |
| | −262 | 4 × 79 | −500 | 24, $\Delta H_r^0(298\ K.) = -530\ kJ\ mol^{-1}$, |
| [II-200] | $GeO_2(cr) + 5F(g) \rightarrow GeF(g) + 2F_2O(g)$ | | | |
| | −551 | 5 × 79 | −33 | 2 × 24, $\Delta H_r^0(298\ K.) = +171\ 538\ kJ\ mol^{-1}$, |
| [II-201] | $GeO_2(cr) + 6F(g) \rightarrow GeF_2(g) + 2F_2O(g)$ | | | |
| | −551 | 6 × 79 | −500 | 2 × 24, $\Delta H_r^0(298\ K.) = -375\ kJ\ mol^{-1}$, |
| [II-202] | $Ge(cr) + 4CH_3(g) \rightarrow (CH_3)_4Ge(g)$ | | | |
| | 0 | 4 × 146 | −71, | $\Delta H_r^0(298\ K.) = -655\ kJ\ mol^{-1}$, |
| [II-203] | $GeO(cr) + 6CH_3(g) \rightarrow (CH_3)_4Ge(g) + (CH_3)_2O(g)$ | | | |
| | −262 | 6 × 146 | −71 | −184, $\Delta H_r^0(298\ K.) = -869\ kJ\ mol^{-1}$, |
| [II-204] | $GeO_2(Cr) + 8CH_3(g) \rightarrow (CH_3)_4Ge(g) + 2(CH_3)_2O(g)$ | | | |
| | −551 | 8 × 146 | −71 | 2 × −184, $\Delta H_r^0(298\ K.) = -1056\ kJ\ mol^{-1}$, |
| [II-205] | $Ge(cr) + 4H(g) \rightarrow GeH_4(g)$ | | | |
| | 0 | 4 × 218 | 91, | $\Delta H_r^0(298\ K.) = -781\ kJ\ mol^{-1}$ |
| | 0 | 4 × 203 | 113, | $\Delta G_r^0(298\ K.) = -699\ kJ\ mol^{-1}$, |
| [II-206] | $GeO(cr) + 6H(g) \rightarrow GeH_4(g) + H_2O(g)$ | | | |
| | −262 | 6 × 218 | 91 | −242, $\Delta H_r^0(298\ K.) = -1197\ kJ\ mol^{-1}$ |
| | −237 | 6 × 203 | 113 | −229, $\Delta G_r^0(298\ K.) = -1097\ kJ\ mol^{-1}$, | and

| | | | | |
|---|---|---|---|---|
| [II-207] | $GeO_2(cr) + 8H(g) \rightarrow GeH_4(g) + 2H_2O(g)$ | | | |
| | −551 | 8 × 218 | 91 | 2 × −242, $\Delta H_r^0(298\ K.) = -1586\ kJ\ mol^{-1}$ |
| | −497 | 8 × 203 | 113 | 2 × −229, $\Delta G_r^0(298\ K.) = -1472\ kJ\ mol^{-1}$. |

Thus, we find that monofluorine, methyl and monohydrogen are all effective reagents for the removal of all germanium species.

6. TIN

Both $SnF_2$ and $SnF_4$ are known compounds. In the absence of thermodynamic data on them, however, we can make no comments regarding the efficacy of monofluorine as a volatilizing reagent for tin species. Both

| | | | | |
|---|---|---|---|---|
| [II-208] | $Sn(cr) + O(g) \rightarrow SnO(cr)$ | | | |
| | 0 | 248 | | −286, $\Delta H_r^0(298\ K.) = -534\ kJ\ mol^{-1}$ |
| | 0 | 232 | | −257, $\Delta G_r^0(298\ K.) = -489\ kJ\ mol^{-1}$, |
| [II-209] | $SnO(cr) + O(g) \rightarrow SnO_2(g)$ | | | |
| | −286 | 248 | | −581, $\Delta H_r^0(298\ K.) = -544\ kJ\ mol^{-1}$ |
| | −257 | 232 | | −520, $\Delta G_r^0(298\ K.) = -495\ kJ\ mol^{-1}$, |
| [II-210] | $Sn(cr) + 4CH_3(g) \rightarrow (CH_3)_4Sn(g)$ | | | |
| | 0 | 4 × 146 | | −19, $\Delta H_r^0(298\ K.) = -603\ kJ\ mol^{-1}$ |
| [II-211] | $SnO(cr) + 6CH_3(g) \rightarrow (CH_3)_4Sn(g) + CH_3)_2O(g)$ | | | |
| | −286 | 6 × 146 | −19 | −184, $\Delta H_r^0(298\ K.) = -793\ kJ\ mol^{-1}$ |
| [II-212] | $SnO_2(cr) + 8CH_3(g) \rightarrow (CH_3)_4Sn(g) + 2(CH_3)_2O(g)$ | | | |
| | −581 | 8 × 146 | −19 | 2 × −184, $\Delta H_r^0(298\ K.) = -974\ kJ\ mol^{-1}$, |
| [II-213] | $Sn(cr) + 4H(g) \rightarrow SnH_4(g)$ | | | |
| | 0 | 4 × 218 | 163, | $\Delta H_r^0(298\ K.) = -709\ kJ\ mol^{-1}$ |
| | 0 | 4 × 203 | 188, | $\Delta G_r^0(298\ K.) = -624\ kJ\ mol^{-1}$, |
| [II-214] | $SnO(cr) + 6H(g) \rightarrow SnH_4(g) + H_2O(g)$ | | | |
| | −286 | 6 × 218 | 163 | −242, $\Delta H_r^0(298\ K.) = -1101\ kJ\ mol^{-1}$ |
| | −257 | 6 × 203 | 188 | −229, $\Delta G_r^0(298\ K.) = -1002\ kJ\ mol^{-1}$ | and

| | | | | |
|---|---|---|---|---|
| [II-215] | $SnO_2(cr) + 8H(g) \rightarrow SnH_4(g) + 2H_2O(g)$ | | | |
| | −581 | 8 × 218 | 163 | 2 × −242, $\Delta H_r^0(298\ K.) = -1481\ kJ\ mol^{-1}$ |
| | −520 | 8 × 203 | 188 | 2 × −229, $\Delta G_r^0(298\ K.) = -1374\ kJ\ mol^{-1}$. | methyl and monohydrogen are effective reagents.

| | | | | |
|---|---|---|---|---|
| [II-216] | $Pb(cr) + O(g) \rightarrow PbO(cr)$ | | | |
| | 0 | 249 | | −217, $\Delta H_r^0(298\ K.) = -466\ kJ\ mol^{-1}$ |
| | 0 | 232 | | −188, $\Delta G_r^0(298\ K.) = -420\ kJ\ mol^{-1}$, |
| [II-217] | $PbO(cr) + O(g) \rightarrow PbO_2(cr)$ | | | |
| | −217 | 249 | | −277, $\Delta H_r^0(298\ K.) = -309\ kJ\ mol^{-1}$ |
| | −188 | 232 | | −217, $\Delta G_r^0(298\ K.) = -261\ kJ\ mol^{-1}$, |
| [II-218] | $PbF_2(cr) + 5O(g) \rightarrow PbO(cr) + 2FO_2(g)$ | | | |
| | −664 | 5 × 249 | −217 | 2 × 13, $\Delta H_r^0(298\ K.) = -772\ kJ\ mol^{-1}$ |
| | −617 | 5 × 232 | −188 | 2 × 27, $\Delta G_r^0(298\ K.) = -677\ kJ\ mol^{-1}$, |
| [II-218] | $PbF_2(cr) + 6O(g) \rightarrow PbO_2(cr) + 2FO_2(g)$ | | | |
| | −664 | 6 × 249 | −277 | 2 × 13, $\Delta H_r^0(298\ K.) = -1081\ kJ\ mol^{-1}$ |
| | −617 | 6 × 232 | −217 | 2 × 27, $\Delta G_r^0(298\ K.) = -938\ kJ\ mol^{-1}$, |
| [II-219] | $PbF_4(cr) + 9O(g) \rightarrow PbO(cr) + 4FO_2(g)$ | | | |
| | −942 | 9 × 249 | −217 | 4 × 13, $\Delta H_r^0(298\ K.) = -1464\ kJ\ mol^{-1}$, |
| [II-220] | $PbF_4(cr) + 10O(g) \rightarrow PbO_2(cr) + 4FO_2(g)$ | | | |
| | −942 | 10 × 249 | −277 | 4 × 13, $\Delta H_r^0(298\ K.) = -1773\ kJ\ mol^{-1}$, |
| [II-221] | $Pb(cr) + 2F(g) \rightarrow PbF_2(cr)$ | | | |
| | 0 | 2 × 79 | | −664, $\Delta H_r^0(298\ K.) = -822\ kJ\ mol^{-1}$ |
| | 0 | 2 × 62 | | −617, $\Delta G_r^0(298\ K.) = -741\ kJ\ mol^{-1}$, |
| [II-222] | $PbF_2(cr) + 2F(g) \rightarrow PbF_4(cr)$ | | | |
| | −664 | 2 × 79 | | −942, $\Delta H_r^0(298\ K.) = -436\ kJ\ mol^{-1}$, |

-continued

| | | | | |
|---|---|---|---|---|
| [II-223] | $PbO(cr) + 4F(g) \rightarrow PbF_2(cr) + F_2O(g)$ | | | |
| | −217 | 4 × 79 | −664 | 24, $\Delta H_r^0(298 \text{ K.}) = -739 \text{ kJ mol}^{-1}$ |
| | −188 | 4 × 62 | −617 | 42, $\Delta G_r^0(298 \text{ K.}) = -635 \text{ kJ mol}^{-1}$, |
| [II-224] | $PbO(cr) + 6F(g) \rightarrow PbF_4(cr) + F_2O(g)$ | | | |
| | −217 | 6 × 79 | −942 | 24, $\Delta H_r^0(298 \text{ K.}) = -1175 \text{ kJ mol}^{-1}$, |
| [II-225] | $PbO_2(cr) + 6F(g) \rightarrow PbF_2(cr) + 2F_2O(g)$ | | | |
| | −277 | 6 × 79 | −664 | 2 × 24, $\Delta H_r^0(298 \text{ K.}) = -813 \text{ kJ mol}^{-1}$ |
| | −217 | 6 × 62 | −617 | 2 × 42, $\Delta G_r^0(298 \text{ K.}) = -688 \text{ kJ mol}^{-1}$, |
| [II-226] | $PbO_2(cr) + 8F(g) \rightarrow PbF_4(cr) + 2F_2O(g)$ | | | |
| | −277 | 8 × 79 | −942 | 2 × 24, $\Delta H_r^0(298 \text{ K.}) = -1249 \text{ kJ mol}^{-1}$, |
| [II-227] | $Pb(cr) + 4CH_3(g) \rightarrow (CH_3)_4Pb(g)$ | | | |
| | 0 | × 146 | | 136, $\Delta H_r^0(298 \text{ K.}) = -448 \text{ kJ mol}^{-1}$, |
| [II-228] | $PbO(cr) + 6CH_3(g) \rightarrow (CH_3)_4Pb(g) + (CH_3)_2O(g)$ | | | |
| | −217 | 6 × 146 | 136 | −184, $\Delta H_r^0(298 \text{ K.}) = -707 \text{ kJ mol}^{-1}$, |
| [II-229] | $PbO_2(cr) + 8CH_3(g) \rightarrow (CH_3)_4Pb(g) + 2(CH_3)_2O(g)$ | | | |
| | −277 | 8 × 146 | 136 | 2 × −184, $\Delta H_r^0(298 \text{ K.}) = -1123 \text{ kJ mol}^{-1}$, |
| [II-230] | $PbF_2(cr) + 6CH_3(g) \rightarrow (CH_3)_4Pb(g) + 2CH_3F(g)$ | | | |
| | −664 | 6 × 146 | 136 | 2 × −284, $\Delta H_r^0(298 \text{ K.}) = 544 \text{ kJ mol}^{-1}$, |
| and | | | | |
| [II-231] | $PbF_4(cr) + 8CH_3(g) \rightarrow (CH_3)_4Pb(g) + 4CH_3F(g)$ | | | |
| | −942 | 8 × 146 | 136 | 3 × −234, $\Delta H_r^0(298 \text{ K.}) = -1026 \text{ kJ mol}^{-1}$. |

Thus, we find that methyl is effective for the volatilization of all of the lead compounds discussed here.

F. Group V A.

1. INTRODUCTION

Much of the chemistry of the GROUP VA. elements has been discussed in SECTION IX.D. (GROUP IIIA.). For the convenience of the reader all of the pertinent chemistries except for those of nitrogen will be discussed here.

2. PHOSPHOROUS

| | | | |
|---|---|---|---|
| [II-232] | $P(cr) + O(g) \rightarrow PO(g)$ | | |
| | 0 | 249 | −24, $\Delta H_r^0(298 \text{ K.}) = -273 \text{ kJ mol}^{-1}$ |
| | 0 | 232 | −47, $\Delta G_r^0(298 \text{ K.}) = -279 \text{ kJ mol}^{-1}$, |
| [II-233] | $P(cr) + 1.5O(g) \rightarrow 0.25P_4O_6(g)$ | | |
| | 0 | 1.5 × 249 | 0.25 × −2214, $\Delta H_r^0(298 \text{ K.}) = -927 \text{ kJ mol}^{-1}$ |
| | 0 | 1.5 × 232 | 0.25 × −2085, $\Delta G_r^0(298 \text{ K.}) = -869 \text{ kJ mol}^{-1}$, |
| [II-234] | $P(cr) + 2O(g) \rightarrow PO_2(g)$ | | |
| | 0 | 2 × 249 | −315, $\Delta H_r^0(298 \text{ K.}) = -813 \text{ kJ mol}^{-1}$ |
| | 0 | 2 × 232 | −317, $\Delta G_r^0(298 \text{ K.}) = -781 \text{ kJ mol}^{-1}$, |
| [II-235] | $P(cr) + 2.5O(g) \rightarrow 0.25P_4O_{10}(g)$ | | |
| | 0 | 2.5 × 249 | 0.25 × −3010, $\Delta H_r^0(298 \text{ K.}) = -1375 \text{ kJ mol}^{-1}$ |
| | 0 | 2.5 × 232 | 0.25 × −2723, $\Delta G_r^0(298 \text{ K.}) = -1261 \text{ kJ mol}^{-1}$, |
| [II-236] | $P(cr) + 3F(g) \rightarrow PF_3(g)$ | | |
| | 0 | 3 × 79 | −958, $\Delta H_r^0(298 \text{ K.}) = -1195 \text{ kJ mol}^{-1}$ |
| | 0 | 3 × 62 | −937, $\Delta G_r^0(298 \text{ K.}) = -1123 \text{ kJ mol}^{-1}$, |
| and | | | |
| [II-237] | $P_4O_{10}(cr) + 32F(g) \rightarrow 4PF_3(g) + 10F_2O(g)$ | | |
| | −3010 | 32 × 79 | 4 × −958  10 × 24, $\Delta H_r^0(298 \text{ K.}) = -3110 \text{ kJ mol}^{-1}$ |
| | −2723 | 32 × 62 | 4 × −937, 10 × 42, $\Delta G_r^0(298 \text{ K.}) = -2549 \text{ kJ mol}^{-1}$. |

The 'times four' criterion for $P_4O_{10}$ is 424 kJ mol$^{-1}$. Thus, the $P_4O_{10}$ generated by [II-235] will vaporize. By [II-237] monofluorine will remove any of the compound present which is not generated by [II-235].

| | | | |
|---|---|---|---|
| [II-238] | $P(cr) + 3CH_3(g) \rightarrow (CH_3)_3P(g)$ | | |
| | 0 | 3 × 146 | −101, $\Delta H_r^0(298 \text{ K.}) = -539 \text{ kJ mol}^{-1}$ |
| and | | | |
| [II-239] | $P_4O_{10}(cr) + 32CH_3(g) \rightarrow 4(CH_3)_3P(g) + 10(CH_3)_2O(g)$ | | |
| | −3010 | 32 × 146  4 × −101 | 10 × −184, $\Delta H_r^0(298 \text{ K.}) = -3906 \text{ kJ mol}^{-1}$ |

Thus, methyl as well as monofluorine is an effective reagent for the removal of phosphorous species.

| | | | |
|---|---|---|---|
| [II-240] | $P(cr) + H(g) \rightarrow PH(g)$ | | |
| | 0 | 218 | 254, $\Delta H_r^0(298 \text{ K.}) = +36 \text{ kJ mol}^{-1}$ |
| | 0 | 203 | 227, $\Delta G_r^0(298 \text{ K.}) = +24 \text{ kJ mol}^{-1}$, |
| [II-241] | $P(cr) + 2H(g) \rightarrow PH_2(g)$ | | |
| | 0 | 2 × 218 | 126, $\Delta H_r^0(298 \text{ K.}) = -310 \text{ kJ mol}^{-1}$ |
| | 0 | 2 × 203 | 121, $\Delta G_r^0(298 \text{ K.}) = -285 \text{ kJ mol}^{-1}$, |
| [II-242] | $P(cr) + 3H(g) \rightarrow PH_3(g)$ | | |
| | 0 | 3 × 218 | 23, $\Delta H_r^0(298 \text{ K.}) = -631 \text{ kJ mol}^{-1}$ |

-continued

|  |  |  |  |
|---|---|---|---|
| 0 | 3 × 203 | 31, | $\Delta G_r^0(298\ K.) = -578\ kJ\ mol^{-1}$ | and

[II-243] $P_4O_{10}(cr) + 32H(g) \rightarrow 4PH_3(g) + 10H_2O(g)$
  −3010   32 × 218   4 × 23   10 × −242,  $\Delta H_r^0(298\ K.) = -6294\ kJ\ mol^{-1}$
  −2723   32 × 203   4 × 31   10 × −229,  $\Delta G_r^0(298\ K.) = -5939\ kJ\ mol^{-1}$.

Thus, should it not be desirable to use either monofluorine or methyl, monohydrogen is quite effective in removing phosphorous species.

tile, and the pentafluoride (for which we have no thermodynamic data) is a gas.

3. ARSENIC

[II-244] $As(cr) + O(g) \rightarrow AsO(g)$
  0   249   70, $\Delta H_r^0(298\ K.) = -179\ kJ\ mol^{-1}$,

[II-245] $As(cr) + 1.5O(g) \rightarrow 0.25As_4O_6(cr)$
  0   1.5 × 249   0.25 × −1314, $\Delta H_r^0(298\ K.) = -702\ kJ\ mol^{-1}$
  0   1.5 × 232   0.25 × −1152, $\Delta G_r^0(298\ K.) = -636\ kJ\ mol^{-1}$,

[II-246] $As(cr) + 2O(g) \rightarrow 0.5\ As_2O_4(cr)$
  0   2 × 249   0.5 × −794, $\Delta H_r^0(298\ K.) = -895\ kJ\ mol^{-1}$,

[II-247] $As(cr) + 2.5O(g) \rightarrow 0.5As_2O_5(cr)$
  0   2.5 × 249   0.5 × −925, $\Delta H_r^0(298\ K.) = -1085\ kJ\ mol^{-1}$,

[II-248] $As(cr) + 3F(g) \rightarrow AsF_3(g)$
  0   3 × 79   −786, $\Delta H_r^0(298\ K.) = -1023\ kJ\ mol^{-1}$
  0   3 × 62   −771, $\Delta G_r^0(298\ K.) = -957\ kJ\ mol^{-1}$,

[II-249] $As_4O_6(cr) + 24F(g) \rightarrow 4AsF_3(g) + 6F_2O(g)$
  −1314   24 × 79   4 × −786   6 × 24, $\Delta H_r^0(298\ K.) = -3582\ kJ\ mol^{-1}$
  −1152   24 × 62   4 × −771   6 × 42, $\Delta G_r^0(298\ K.) = -3168\ kJ\ mol^{-1}$,

[II-250] $As_2O_4(cr) + 14F(g) \rightarrow 2AsF_3(g) + 4F_2O(g)$
  −794   14 × 79   2 × −786   4 × 24, $\Delta H_r^0(298\ K.) = -1788\ kJ\ mol^{-1}$ and

[II-251] $As_2O_5(cr) + 16F(g) \rightarrow 2AsF_3(g) + 5F_2O(g)$
  −925   16 × 79   2 × −786   5 × 24, $\Delta H_r^0(298\ K.) = -1791\ kJ\ mol^{-1}$.

Thus, monofluorine is effective in removing all of the oxides of arsenic as well as arsenic itself.

[II-252] $As(cr) + 3CH_3(g) \rightarrow (CH_3)_3As(g)$
  0   3 × 146   13, $\Delta H_r^0(298\ K.) = -425\ kJ\ mol^{-1}$,

[II-253] $As_4O_6(cr) + 24CH_3(g) \rightarrow 4(CH_3)_3As(g) + 6(CH_3)_2O(g)$
  −1314   24 × 146   4 × 13   6 × −184, $\Delta H_r^0(298\ K.) = -3242\ kJ\ mol^{-1}$,

[II-254] $As_2O_4(cr) + 14CH_3(g) \rightarrow 2(CH_3)_3As(g) + 4(CH_3)_2O(g)$
  −794   14 × 146   2 × 13   4 × −184, $\Delta H_r^0(298\ K.) = -1960\ kJ\ mol^{-1}$,

[II-255] $As_2O_5(cr) + 16CH_3(g) \rightarrow 2(CH_3)_3As(g) + 5(CH_3)_2O(g)$
  −925   16 × 146   2 × 13   5 × −184, $\Delta H_r^0(298\ K.) = -2305\ kJ\ mol^{-1}$,

[II-256] $As(cr) + 3H(g) \rightarrow AsH_3(g)$
  0   3 × 218   66, $\Delta H_r^0(298\ K.) = -588\ kJ\ mol^{-1}$
  0   3 × 203   69, $\Delta G_r^0(298\ K.) = 540\ kJ\ mol^{-1}$,

[II-257] $As_4O_6(cr) + 24H(g) \rightarrow 4AsH_3(g) + 6H_2O(g)$
  −1314   24 × 218   4 × 66   6 × −242, $\Delta H_r^0(298\ K.) = -5106\ kJ\ mol^{-1}$,
  −1152   24 × 203   4 × 69   6 × −229, $\Delta G_r^0(298\ K.) = -4818\ kJ\ mol^{-1}$,

[II-258] $As_2O_4(cr) + 14H(g) \rightarrow 2AsH_3(g) + 4H_2O(g)$
  −794   14 × 218   2 × 66   4 × −242, $\Delta H_r^0(298\ K.) = -3094\ kJ\ mol^{-1}$ and

[II-259] $As_2O_5(cr) + 16H(g) \rightarrow 2AsH_3(g) + 5H_2O(g)$
  −925   16 × 218   2 × 66   5 × −242, $\Delta H_r^0(298\ K.) = -3641\ kJ\ mol^{-1}$.

Except for AsO the oxides of arsenic are not expected to be volatile in the Apparatus. The trifluoride is vola- Thus, both methyl and monohydrogen are effective in removing all of the oxides of arsenic as well as arsenic itself.

4. ANTIMONY

[II-260] $Sb(cr) + O(g) \rightarrow SbO(g)$
  0   249   199, $\Delta H_r^0(298\ K.) = -50\ kJ\ mol^{-1}$,

[II-261] $Sb(cr) + 1.5O(g) \rightarrow 0.25Sb_4O_6(g)$
  0   1.5 × 249   0.25 × −1441, $\Delta H_r^0(298\ K.) = -734\ kJ\ mol^{-1}$
  0   1.5 × 232   0.25 × −1268, $\Delta G_r^0(298\ K.) = -665\ kJ\ mol^{-1}$,

[II-262] $Sb(cr) + 2O(g) \rightarrow 0.5Sb_2O_4(cr)$
  0   2 × 249   0.5 × −908, $\Delta H_r^0(298\ K.) = -952\ kJ\ mol^{-1}$
  0   2 × 232   0.5 × −796, $\Delta G_r^0(298\ K.) = -862\ kJ\ mol^{-1}$,

[II-263] $Sb(cr) + 2.5O(g) \rightarrow 0.5Sb_2O_5(cr)$
  0   2.5 × 249   0.5 × −972, $\Delta H_r^0(298\ K.) = -1108\ kJ\ mol^{-1}$
  0   2.5 × 232   0.5 × −829, $\Delta G_r^0(298\ K.) = -974\ kJ\ mol^{-1}$,

[II-264] $Sb(cr) + F(g) \rightarrow SbF(g)$
  0   79   −47, $\Delta H_r^0(298\ K.) = -126\ kJ\ mol^{-1}$,

[II-265] $Sb(cr) + 3F(g) \rightarrow SbF_3(cr)$
  0   3 × 79   −916, $\Delta H_r^0(298\ K.) = -1153\ kJ\ mol^{-1}$,

[II-266] $Sb_4O_6(cr) + 24F(g) \rightarrow 4SbF_3(cr) + 6F_2O(g)$

-continued

```
          -1441  24 × 79     4 × -916      6 × 24, ΔH_r^0(298 K.) = -3975 kJ mol^-1,
[II-267] Sb_2O_4(cr) + 14F(g) → 2SbF_3(cr) + 4F_2O(g)
          -908   14 × 79     2 × -916      4 × 24, ΔH_r^0(298 K.) = -1934 kJ mol^-1,
and
[II-268] Sb_2O_5(cr) + 16F(g) → 2SbF_3(cr) + 5F_2O(g)
          -972   16 × 79     2 × -916      5 × 24, ΔH_r^0(298 K.) = -2004 kJ mol^-1.
```

The enthalpy of sublimation of antimony trifluoride is 869 kJ mol$^{-1}$, making the 'times four' criterion 3476 kJ mol$^{-1}$. Thus, monofluorine is not an effective reagent for removing antimony species. (It should be noted that the enthalpy of reaction for [II-266] is for 4 antimony trifluorides.)

```
[II-269] Sb(cr) + 3CH_3(g) → (CH_3)_3Sb(g)
          0      3 × 146                   +32, ΔH_r^0(298 K.) = -406 kJ mol^-1,
[II-270] Sb_4O_6(cr) + 24CH_3(g) → 4(CH_3)_3Sb(g) + 6(CH_3)_2O(g)
          -1441  24 × 146   4 × 32         6 × 184, ΔH_r^0(298 K.) = -3039 kJ mol^-1,
[II-271] Sb_2O_4(cr) + 14CH_3(g) → 2(CH_3)_3Sb(g) + 4(CH_3)_2O(g)
          -908   14 × 146   2 × 32         4 × -184, ΔH_r^0(298 K.) = -1808 kJ mol^-1,
[II-272] Sb_2O_5(cr) + 16CH_3(g) → 2(CH_3)_3Sb(g) + 5(CH_3)_2O(g)
          -972   16 × 146   2 × 32         5 × -184, ΔH_r^0(298 K.) = -2220 kJ mol^-1,
[II-273] SbF_3(cr) + 4CH_3(g) → (CH_3)_3Sb(g) + 3CH_3F(g)
          -916   4 × 146    32             3 × -234, ΔH_r^0(298 K.) = -338 kJ mol^-1,
[II-274] Sb(cr) + 3H(g) → SbH_3(g)
          0      3 × 218                   145, ΔH_r^0(298 K.) = -509 kJ mol^-1
          0      3 × 203                   148, ΔG_r^0(298 K.) = -461 kJ mol^-1,
[II-275] Sb_4O_6(cr) + 24H(g) → 4SbH_3(g) + 6H_2O(g)
          -1441  24 × 218   4 × 145        6 × -242, ΔH_r^0(298 K.) = -4663 kJ mol^-1
          -1268  24 × 203   4 × 148        6 × -229, ΔG_r^0(298 K.) = 4386 kJ mol^-1,
[II-276] Sb_2O_4(cr) + 14H(g) → 2SbH_3(g) + 4H_2O(g)
          -908   14 × 18    2 × 145        4 × -242, ΔH_r^0(298 K.) = -2822 kJ mol^-1
          -796   14 × 203   2 × 148        4 × -229, ΔG_r^0(298 K.) = -2666 kJ mol^-1,
[II-277] Sb_2O_5(cr) + 16H(g) → 2SbH_3(g) + 5H_2O(g)
          -972   16 × 218   2 × 145        5 × -242, ΔH_r^0(298 K.) = -3436 kJ mol^-1
          -829   16 × 203   2 × 148        5 × -229, ΔG_r^0(298 K.) = -3268 kJ mol^-1
and
[II-278] SbF_3(cr) + 6H(g) → SbH_3(g) + 3HF(g)
          -916   6 × 218    145            4 × -272, ΔH_r^0(298 K.) = -1063 kJ mol^-1.
```

Thus, both methyl and monohydrogen are effective reagents for the removal of all of the antimony species discussed here.

5. BISMUTH

```
[II-279] Bi(cr) + 1.5O(g) → 0.5Bi_2O_3(cr)
          0      1.5 × 249                 0.5 × -574, ΔH_r^0(298 K.) = -660 kJ mol^-1
          0      1.5 × 232                 0.5 × -494, ΔG_r^0(298 K.) = -595 kJ mol^-1,
[II-280] BiCl_3(cr) + 7.5O(g) → 0.5Bi_2O(cr) + 3ClO_2(g)
          -379   7.5 × 249   0.5 × -574    3 × 102, ΔH_r^0(298 K.) = -1470 kJ mol^-1,
          -315   7.5 × 232   0.5 × -494    3 × 120, ΔG_r^0(298 K.) = -1312 kJ mol^-1,
[II-281] BiF_3(cr) + 7.5O(g) → 0.5Bi_2O_3(cr) + 3FO_2(g)
          -904   7.5 × 249   0.5 × -574    3 × 13, ΔH_r^0(298 K.) = -1212 kJ mol^-1
          -940   7.5 × 232   0.5 × -494    3 × 27, ΔG_r^0(298 K.) = -966 kJ mol^-1,
[II-282] Bi(cr) + 3CH_3(g) → (CH_3)_3Bi(g)
          0      3 × 146                   194, ΔH_r^0(298 K.) = -244 kJ mol^-1,
[II-283] Bi_2O_3(cr) + 12CH_3(g) → 2(CH_3)_3Bi(g) + 3(CH_3)_2O(g)
          -574   12 × 146   2 × 194        3 × -184, ΔH_r^0(298 K.) = -1342 kJ mol^-1,
[II-284] BiCl_3(cr) + 6CH_3(g) → (CH_3)_3Bi(g) + CH_3Cl(g)
          -379   6 × 146    194            3 × -84, ΔH_r^0(298 K.) = -555 kJ mol^-1
and
[II-285] BiF_3(cr) + 6CH_3(g) → (CH_3)_3Bi(g) + 3CH_3F(g)
          -904   6 × 146    194            3 × -234, ΔH_r^0(298 K.) = -480 kJ mol^-1.
```

Thus, methyl is an effective reagent for the removal of all of the bismuth species discussed here.

G. Group VI A.

1. THERMODYNAMICS

TABLE II-7

GROUP VIA THERMODYNAMIC DATA
$\Delta H_f^0(298\ K.)/\Delta G_f^0(298\ K.)$
(kJ mol$^{-1}$)

| SPECIES | S | Se | Te |
|---|---|---|---|
| MO (g) | +5/-24 | +53[a]/+27[a] | +65[a]/+38[a] |
| MO_2 (cr) | -225[a]/— | -323[a]/-270[a] | |
| (g) | -297/-300 | | |
| MO_3 (cr) | -455[a]/-374[a] | -167[a]/— | |
| (l) | -441[a]/-374[a] | | |
| (g) | -396/-371 | | |
| MF (g) | +13/-14 | | |
| MF_2 (g) | -297/-303 | | |
| MF_3 (g) | -503/-488 | | |
| MF_4 (g) | -763/-722 | | |
| MF_5 (g) | -908/-839 | | |
| MF_6 (g) | -1220/-1116 | -1117[a]/-1017[a] | -1318[a]/— |
| HM (g) | +139/+105 | | |

TABLE II-7-continued
GROUP VIA THERMODYNAMIC DATA
$\Delta H_f^0(298\text{ K.})/\Delta G_f^0(298\text{ K.})$

| [II-286] | S(cr) + O(g) → SO(g) | | | |
|---|---|---|---|---|
| | 0 | 249 | 5, | $\Delta H_r^0(298\text{ K.}) = -244$ kJ mol$^{-1}$ |
| | 0 | 232 | −21, | $\Delta G_r^0(298\text{ K.}) = -253$ kJ mol$^{-1}$, |
| [II-287] | S(cr) + 2O(g) → SO$_2$(g) | | | |
| | 0 | 2 × 249 | −297, | $\Delta H_r^0(298\text{ K.}) = -795$ kJ mol$^{-1}$ |
| | 0 | 2 × 232 | −300, | $\Delta G_r^0(298\text{ K.}) = -764$ kJ mol$^{-1}$, |
| [II-288] | S(cr) + 3O(g) → SO$_3$(g) | | | |
| | 0 | 3 × 249 | −396, | $\Delta H_r^0(298\text{ K.}) = -1143$ kJ mol$^{-1}$ |
| | 0 | 3 × 232 | −371, | $\Delta G_r^0(298\text{ K.}) = -1067$ kJ mol$^{-1}$, |
| [II-289] | S(cr) + F(g) → SF(g) | | | |
| | 0 | 79 | +13, | $\Delta H_r^0(298\text{ K.}) = -66$ kJ mol$^{-1}$ |
| | 0 | 62 | −14, | $\Delta G_r^0(298\text{ K.}) = -76$ kJ mol$^{-1}$, |
| [II-290] | S(cr) + 2F(g) → SF$_2$(g) | | | |
| | 0 | 2 × 79 | −297, | $\Delta H_r^0(298\text{ K.}) = -455$ kJ mol$^{-1}$ |
| | 0 | 2 × 62 | −303, | $\Delta G_r^0(298\text{ K.}) = -427$ kJ mol$^{-1}$, |
| [II-291] | S(cr) + 3F(g) → SF$_3$(g) | | | |
| | 0 | 3 × 79 | −503, | $\Delta H_r^0(298\text{ K.}) = -740$ kJ mol$^{-1}$ |
| | 0 | 3 × 62 | −488, | $\Delta G_r^0(298\text{ K.}) = -674$ kJ mol$^{-1}$, |
| [II-292] | S(cr) + 4F(g) → SF$_4$(g) | | | |
| | 0 | 4 × 79 | −763, | $\Delta H_r^0(298\text{ K.}) = -1079$ kJ mol$^{-1}$ |
| | 0 | 4 × 62 | −722, | $\Delta G_r^0(298\text{ K.}) = -970$ kJ mol$^{-1}$, |
| [II-293] | S(cr) + 5F(g) → SF$_5$(g) | | | |
| | 0 | 5 × 79 | −908, | $\Delta H_r^0(298\text{ K.}) = -1303$ kJ mol$^{-1}$ |
| | 0 | 5 × 62 | −839, | $\Delta G_r^0(298\text{ K.}) = -1149$ kJ mol$^{-1}$, |
| [II-294] | S(cr) + 6F(g) → SF$_6$(g) | | | |
| | 0 | 6 × 79 | −1220, | $\Delta H_r^0(298\text{ K.}) = -1694$ kJ mol$^{-1}$ |
| | 0 | 6 × 62 | −1116, | $\Delta G_r^0(298\text{ K.}) = -1488$ kJ mol$^{-1}$, |
| [II-295] | S(cr) + 2CH$_3$(g) → (CH$_3$)$_2$S(g) | | | |
| | 0 | 2 × 146 | −37, | $\Delta H_r^0(298\text{ K.}) = -329$ kJ mol$^{-1}$, |
| [II-296] | S(cr) + H(g) → HS(g) | | | |
| | 0 | 218 | 139, | $\Delta H_r^0(298\text{ K.}) = -79$ kJ mol$^{-1}$ |
| | 0 | 203 | 105, | $\Delta G_r^0(298\text{ K.}) = -98$ kJ mol$^{-1}$ |
| and | | | | |
| [II-297] | S(cr) + 2H(g) → H$_2$S(g) | | | |
| | 0 | 2 × 218 | −28, | $\Delta H_r^0(298\text{ K.}) = -464$ kJ mol$^{-1}$ |
| | 0 | 2 × 203 | −40, | $\Delta G_r^0(298\text{ K.}) = -446$ kJ mol$^{-1}$. |

| SPECIES | S | (kJ mol$^{-1}$) Se | Te |
|---|---|---|---|
| H$_2$M (g) | −28/−40 | +30$^a$/+16$^a$ | +100$^a$/— |

($^a$Ref. <B>).

2. SULFUR

By the criterion of [II-1] sulfur trioxide will vaporize spontaneously in the Apparatus. Thus, the only solid species of sulfur which will be considered here is sulfur itself.

Thus, monoxygen, monofluorine, methyl and monohydrogen are all effective volatilizing reagents.

3. SELENIUM

| [II-298] | Se(cr) + O(g) → SeO(g) | | | |
|---|---|---|---|---|
| | 0 | 249 | 53, | $\Delta H_r^0(298\text{ K.}) = -196$ kJ mol$^{-1}$ |
| | 0 | 232 | 27, | $\Delta G_r^0(298\text{ K.}) = -205$ kJ mol$^{-1}$, |
| [II-299] | Se(cr) + 2O(g) → SeO$_2$(cr) | | | |
| | 0 | 2 × 249 | −225, | $\Delta H_r^0(298\text{ K.}) = -723$ kJ mol$^{-1}$, |
| [II-300] | Se(cr) + 3O(g) → SeO$_3$(cr) | | | |
| | 0 | 3 × 249 | −167, | $\Delta H_r^0(298\text{ K.}) = -914$ kJ mol$^{-1}$, |
| [II-301] | Se(cr) + 6F(g) → SeF$_6$(g) | | | |
| | 0 | 6 × 79 | −1117, | $\Delta H_r^0(298\text{ K.}) = -1591$ kJ mol$^{-1}$ |
| | 0 | 6 × 62 | −1017, | $\Delta G_4^0(298\text{ K.}) = -1389$ kJ mol$^{-1}$, |
| [II-302] | SeO$_2$(cr) + 10F(g) → SeF$_6$(g) + 2F$_2$O(g) | | | |
| | −225 | 10 × 79 | −1117 | 2 × 24, $\Delta H_r^0(298\text{ K.}) = -1634$ kJ mol$^{-1}$, |
| [II-303] | SeO$_3$(cr) + 12F(g) → SeF$_6$(g) + 3F$_2$O(g) | | | |
| | −167 | 12 × 79 | −1117 | 3 × 24, $\Delta H_r^0(298\text{ K.}) = -1826$ kJ mol$^{-1}$, |
| [II-304] | Se(cr) + 2H(g) → H$_2$Se(g) | | | |
| | 0 | 2 × 218 | 30, | $\Delta H_r^0(298\text{ K.}) = -406$ kJ mol$^{-1}$ |
| | 0 | 2 × 203 | 16, | $\Delta G_r^0(298\text{ K.}) = -390$ kJ mol$^{-1}$, |
| [II-305] | SeO$_2$(cr) + 6H(g) → H$_2$Se(g) + 2H$_2$O(g) | | | |
| | −225 | 6 × 218 | 30 | 2 × −242, $\Delta H_r^0(298\text{ K.}) = -1537$ kJ mol$^{-1}$ |
| and | | | | |
| [II-306] | SeO$_3$(cr) + 8H(g) → H$_2$Se(g) + 3H$_2$O(g) | | | |
| | −167 | 8 × 218 | 30 | 3 × −242, $\Delta H_r^0(298\text{ K.}) = -2273$ kJ mol$^{-1}$. |

Thus, both monofluorine and monohydrogen are effective volatilizing reagents. Although methyl is probably an effective reagent also, we cannot confirm this in the absence of thermodynamic data.

4. TELLURIUM

[II-307]  Te(cr) + O(g) → TeO(g)

|   |   |   |   |
|---|---|---|---|
|  | 0 | 249 | 65, $\Delta H_r^0(298\ K.) = -184\ kJ\ mol^{-1}$ |
|  | 0 | 232 | 38, $\Delta G_r^0(298\ K.) = -194\ kJ\ mol^{-1}$, |
| [II-308] | Te(cr) + 2O(g) → TeO$_2$(cr) |  |  |
|  | 0 | 2 × 249 | $-323$, $\Delta H_r^0(298\ K.) = -821\ kJ\ mol^{-1}$ |
|  | 0 | 2 × 232 | $-270$, $\Delta G_r^0(298\ K.) = -734\ kJ\ mol^{-1}$, |
| [II-309] | Te(cr) + 6F(g) → TeF$_6$(g) |  |  |
|  | 0 | 6 × 79 | $-1318$, $\Delta H_r^0(298\ K.) = -1792\ kJ\ mol^{-1}$, |
| [II-310] | TeO$_2$(cr) + 10F(g) → TeF$_6$(g) + 2F$_2$O(g) |  |  |
|  | $-323$   10 × 79   $-1318$ | 2 × 24, $\Delta H_r^0(298\ K.) = -1737\ kJ\ mol^{-1}$, |  |
| [II-311] | Te(cr) + 2H(g) → H$_2$Te(g) |  |  |
|  | 0    2 × 218 | 100, $\Delta H_r^0(298\ K.) = -336\ kJ\ mol^{-1}$ |  |
| and |  |  |  |
| [II-312] | TeO$_2$(cr) + 6H(g) → H$_2$Te(g) + 2H$_2$O(g) |  |  |
|  | $-323$   6 × 218   100   2× $-242$, $\Delta H_r^0(298\ K.) = -1369\ kJ\ mol^{-1}$. |  |  |

Thus, both monofluorine and monohydrogen are effective volatilizing reagents. As is the case with selenium, methyl is probably an effective reagent also, but we cannot confirm this in the absence of thermodynamic data.

H. Summary of Main Group elements Chemistries

TABLE II-8

SUMMARY OF MAIN GROUP ELEMENTS CHEMISTRIES

| GROUP | O/NO$_2$ + F | O | F | O + CH$_3$ | CH$_3$ | H |
|---|---|---|---|---|---|---|
| IA | ALL |  |  |  |  |  |
| IIA | ALL |  |  |  |  |  |
| IIIA | B, Al(?) |  | B, Al(?) | ALL | ALL |  |
| IVA | C, Si, Ge | C | C, Si, Ge | ALL | ALL | C, Si, Ge, Sn |
| VA | P, As |  | P, As | ALL | ALL | P, As, Sb |
| VIA | ALL | S | ALL | S | S | ALL |

As the data in TABLE II-8 show the schedule O/-NO$_2$°F+CH$_3$ will remove all main group element species as well as non-fluorocarbon organics. If a large amount of fluorocarbon is present, such as in the case in which a fluorocarbon mask has been used, the schedule should be changed to H+O/NO$_2$+F+CH$_3$. If only a small amount of fluorocarbon is present, or suspected, the schedule O/NO$_2$+F+CH$_3$+H can be used. This schedule is preferred if silicon expitaxy, for example, is to be carried out immediately after the cleaning schedule. This is because the 'hydrogenated' surface usually leads to a better quality expitaxial layer. Since other chemistries must be added to the schedules for the removal of transition metal species and lanthanide species, we shall now turn to the analysis of the chemistries of these species.

I. Group III B.

1. THERMODYNAMICS

TABLE II-9

GROUP IIIB THERMODYNAMIC DATA
$\Delta H_f^0(298\ K.)/\Delta G_f^0(298\ K.)$
(kJ mol$^{-1}$)

| SPECIES |  | Sc | Y |
|---|---|---|---|
| MO | (g) | $-57/-83$ | $-39/-65$ |
| M$_2$O$_3$ | (cr) | $-1909/-1819$ | $-1905/-1817$ |
| MCl$_3$ | (cr) | $-925/—$ | $-1000/—$ |
| MF | (g) | $-139/-164$ | $-138/-163$ |
| MF$_2$ | (g) | $-642/-655$ |  |
| MF$_3$ | (cr) | $-1629/-1556$ | $-1719/-1645$ |
|  | (g) | $-1247/-1234$ | $-1289/-1278$ |
| MH$_2$ | (cr) | $-192/—$ | $-226/-185$ |
| MH$_3$ | (cr) |  | $-268/-209$ |

(all data are from Ref. <B>).

In the absence of any thermodynamic data on the nitrates we can make no definitive statement on the efficacy of the O/NO$_2$+F procedure. We shall return to this question after the completion of the analysis of the lanthanide species chemistries.

2 SCANDIUM

| [II-313] | Sc(cr) + O(g) → ScO(g) |  |  |  |
|---|---|---|---|---|
|  | 0 | 249 |  | $-57$, $\Delta H_r^0(298\ K.) = -306\ kJ\ mol^{-1}$ |
|  | 0 | 232 |  | $-83$, $\Delta G_r^0(298\ K.) = -315\ kJ\ mol^{-1}$, |
| [II-314] | Sc(cr) + 1.5O(g) → 0.5Sc$_2$O$_3$(g) |  |  |  |
|  | 0 | 1.5 × 249 | 0.5 × $-1909$, $\Delta H_r^0(298\ K.) = -1328\ kJ\ mol^{-1}$ |
|  | 0 | 1.5 × 232 | 0.5 × $-1819$, $\Delta G_r^0(298\ K.) = -1258\ kJ\ mol^{-1}$, |
| [II-315] | ScCl$_3$(cr) + 7.5O(g) → 0.5Sc$_2$O$_3$(cr) + 3ClO$_2$(g) |  |  |  |
|  | $-925$ | 7.5 × 249 | 0.5 × $-1909$ | 3 × 102, $\Delta H_r^0(298\ K.) = -1591\ kJ\ mol^{-1}$, |
| [II-316] | ScF$_3$(cr) + 7.5O(g) → 0.5Sc$_2$O$_3$(cr) + 3FO$_2$(g) |  |  |  |
|  | $-1629$ | 7.5 × 249 | 0.5 × $-1909$ | 3 × 13, $\Delta H_r^0(298\ K.) = -1154\ kJ\ mol^{-1}$ |
|  | $-1556$ | 7.5 × 232 | 0.5 × $-1819$ | 3 × 27, $\Delta G_r^0(298\ K.) = -1012\ kJ\ mol^{-1}$ |
| and |  |  |  |  |
| [II-317] | ScH$_2$(cr) + 2.5O(g) → 0.5Sc$_2$O$_3$(cr) + H$_2$O(g) |  |  |  |
|  | $-192$ | 2.5 × 249 | 0.5 × $-1909$ | $-242$, $\Delta H_r^0(298\ K.) = -1627\ kJ\ mol^{-1}$. |
| [II-318] | Sc(cr) + F(g) → ScF(g) |  |  |  |
|  | 0 | 79 |  | $-139$, $\Delta H_r^0(298\ K.) = -218\ kJ\ mol^{-1}$ |
|  | 0 | 62 |  | $-164$, $\Delta G_r^0(298\ K.) = -226\ kJ\ mol^{-1}$, |
| [II-319] | Sc(cr) + 2F(g) → ScF$_2$(g) |  |  |  |
|  | 0 | 2 × 79 |  | $-642$, $\Delta H_r^0(298\ K.) = -800\ kJ\ mol^{-1}$ |
|  | 0 | 2 × 62 |  | $-655$, $\Delta G_r^0(298\ K.) = -779\ kJ\ mol^{-1}$ |
| [II-320] | Sc(cr) + 3F(g) → ScF$_3$(cr) |  |  |  |
|  | 0 | 3 × 79 |  | $-1629$, $\Delta H_r^0(298\ K.) = -1866\ kJ\ mol^{-1}$ |
|  | 0 | 3 × 62 |  | $-1556$, $\Delta G_r^0(298\ K.) = -1742\ kJ\ mol^{-1}$, |
| [II-321] | 0.5Sc$_2$O$_3$(cr) + 6F(g) → ScF$_3$(cr) + 1.5OF$_2$(g) |  |  |  |
|  | 0.5 × $-1909$ | 6 × 79 | $-1629$ | 1.5 × 24, $\Delta H_r^0(298\ K.) = -1112\ kJ\ mol^{-1}$ |
|  | 0.5 × $-1819$ | 6 × 62 | $-1556$ | 1.5 × 42, $\Delta G_r^0(298\ K.) = -956\ kJ\ mol^{-1}$, |
| [II-322] | 0.5Sc$_2$O$_3$(cr) + 6F*(g) → ScF$_3$(cr) + 1.5OF$_2$(g) |  |  |  |

|  |  |  |  |  |
|---|---|---|---|---|
| 0.5 × −1909 | 6 × 245 | −1629 | 1.5 × 24, $\Delta H_r^*(298\ K.) = -2108\ kJ\ mol^{-1}$, |  |
| [II-323] ScCl$_3$(cr) + 12F(g) → ScF$_3$(cr) + 3ClF$_3$(g) |  |  |  |  |
| −925 | 12 × 79 | −1629 | 3 × −159, $\Delta H_r^0(298\ K.) = -2129\ kJ\ mol^{-1}$ |  |
| and |  |  |  |  |
| [II-324] ScH$_2$(cr) + 5F(g) → ScF$_3$(cr) + 2HF(g) |  |  |  |  |
| −192 | 5 × 29 | −1629 | 2 × −272, $\Delta H_r^0(298\ K.) = -2376\ kJ\ mol^{-1}$. |  |

The enthalpy of sublimation of scandium fluoride is 382 kJ mol$^{-1}$, and the 'times four' criterion is 1528 kJ mol$^{-1}$. Since the monofluorines are not in their ground state (cf. SECTION IX. A.), the criterion is met even for the sesquioxide.

O+F*
H+F
F* (in the absence of ScF$_3$).

3. YTTRIUM

The enthalpy of sublimation of yttrium trifluoride is

| | | | |
|---|---|---|---|
| [II-325] Sc$_2$O$_3$(cr) + 10 H(g) → 2 ScH$_2$(cr) + 3 H$_2$O(g) | | | |
| −1909 | 10 × 218 | 2 × −196 | 3 × −242, $\Delta H_r^0(298K) = -1381\ kJ\ mol^{-1}$, |
| [II-326] ScCl$_{3L\ (cr)}$ + 5 H(g) → ScH$_2$(cr) + 3 HCl(g) | | | |
| −925 | 5 × 218 | −192 | 3 × 92, $\Delta H_r^0(298K) = -633\ kJ\ mol^{-1}$ |
| and | | | |
| II-327] ScF$_3$(cr) + 5 H(g) → ScH$_2$(cr) + 3 HF(g) | | | |
| −1629 | 5 × 218 | −192 | 3 × −272, $\Delta H_r^0(298K) = -469\ kJ\ mol^{-1}$. |

Thus, for the volatilization of scandium species we have the choice of three procedures:

430 kJ mol$^{-1}$, and the 'times four' criterion is 1720 kJ mol$^{-1}$.

| | | | |
|---|---|---|---|
| [II-328] Y(cr) + O(g) → YO(g) | | | |
| 0 | 249 | | −39, $\Delta H_r^0(298\ K.) = -288\ kJ\ mol^{-1}$ |
| 0 | 232 | | −65, $\Delta G_r^0(298\ K.) = -297\ kJ\ mol^{-1}$, |
| [II-329] Y(cr) + 1.5O(g) → 0.5Y$_2$O$_3$(cr) | | | |
| 0 | 1.5 × 249 | | 0.5 × −1905, $\Delta H_r^0(298\ K.) = -1326\ kJ\ mol^{-1}$ |
| 0 | 1.5 × 232 | | 0.5 × −1817, $\Delta G_r^0(298\ K.) = -1256\ kJ\ mol^{-1}$, |
| [II-330] YCl$_3$(cr) + 7.5O(g) → Y$_2$O$_3$(cr) + 3ClO$_2$(g) | | | |
| −1000 | 7.5 × 249 | 0.5 × −1905 | 3 × 102, $\Delta H_r^0(298\ K.) = -1514\ kJ\ mol^{-1}$, |
| [II-331] YF$_3$(cr) + 7.5O(g) → 0.5Y$_2$O$_3$(cr) + 3FO$_2$(g) | | | |
| −1719 | 7.5 × 249 | 0.5 × −1905 | 3 × 13, $\Delta H_r^0(298\ K.) = -1062\ kJ\ mol^{-1}$ |
| −1645 | 7.5 × 232 | 0.5 × −1817 | 3 × 27, $\Delta G_r^0(298\ K.) = -922\ kJ\ mol^{-1}$, |
| [II-332] YH$_2$(cr) + 2.5O(g) → 0.5Y$_2$O$_3$(cr) + H$_2$O(g) | | | |
| −226 | 2.5 × 249 | 0.5 × −1905 | −242, $\Delta H_r^0(298\ K.) = -1591\ kJ\ mol^{-1}$ |
| −185 | 2.5 × 232 | 0.5 × −1817 | −229, $\Delta G_r^0(298\ K.) = -1532\ kJ\ mol^{-1}$, |
| and | | | |
| [II-333] YH$_3$(cr) + 3O(g) → 0.5Y$_2$O$_3$(cr) + 1.5H$_2$O(g) | | | |
| −268 | 3 × 249 | 0.5 × −1905 | 1.5 × −242, $\Delta H_r^0(298\ K.) = -1794\ kJ\ mol^{-1}$ |
| −209 | 3 × 232 | 0.5 × −1819 | 1.5 × −229, $\Delta G_r^0(298\ K.) = -1739\ kJ\ mol^{-1}$ |
| [II-334] Y(cr) + F(g) → YF(g) | | | |
| 0 | 79 | | −138, $\Delta H_r^0(298\ K.) = -217\ kJ\ mol^{-1}$ |
| 0 | 62 | | −163, $\Delta G_r^0(298\ K.) = -225\ kJ\ mol^{-1}$, |
| [II-335] Y(cr) + 3F(g) → YF$_3$(cr) | | | |
| 0 | 3 × 79 | | −1719, $\Delta H_r^0(298\ K.) = -1956\ kJ\ mol^{-1}$ |
| 0 | 3 × 62 | | −1645, $\Delta G_r^0(298\ K.) = -1831\ kJ\ mol^{-1}$, |
| [II-336] 0.5Y$_2$O$_3$(cr) + 6F(g) → YF$_3$(cr) + 1.5OF$_2$(g) | | | |
| 0.5 × −1905 | 6 × 79 | −1719 | 1.5 × 24, $\Delta H_r^0(298\ K.) = -1204\ kJ\ mol^{-1}$ |
| 0.5 × 1817 | 6 × 62 | −1645 | 1.5 × 42, $\Delta G_r^0(298\ K.) = -1046\ kJ\ mol^{-1}$, |
| [II-337] 0.5Y$_2$O$_3$(cr) + 6F*(g) → YF$_3$(cr) + 1.5OF$_2$(g) | | | |
| 0.5 × −1905 | 6 × 245 | −1719 | 1.5 × 24, $\Delta H_r^*(298\ K.) = -2200\ kJ\ mol^{-1}$, |
| [II-338] YCl$_3$(cr) + 12F(g) → YF$_3$(cr) + 3ClF$_3$(g) | | | |
| −1000 | 12 × 79 | −1719 | 3 × −159, $\Delta H_r^0(298\ K.) = -2144\ kJ\ mol^{-1}$, |
| [II-339] YH$_2$(cr) + 5F(g) → YF$_3$(cr) + 2HF(g) | | | |
| −226 | 5 × 29 | −1719 | 2 × −272, $\Delta H_r^0(298\ K.) = -2432\ kJ\ mol^{-1}$ |
| −185 | 5 × 62 | −1645 | 2 × −275, $\Delta G_r^0(298\ K.) = -2320\ kJ\ mol^{-1}$ |
| and | | | |
| [II-340] YH$_3$(cr) + 6F(g) → YF$_3$(cr) + 3HF(g) | | | |
| −268 | 6 × 79 | −1719 | 3 × −272, $\Delta H_r^0(298\ K.) = -2741\ kJ\ mol^{-1}$ |
| −209 | 6 × 62 | −1645 | 3 × −275, $\Delta G_r^0(298\ K.) = -2633\ kJ\ mol^{-1}$. |
| [II-341] Y$_2$O$_3$(cr) + 10H(g) → 2YH$_2$(cr) + 3H$_2$O(g) | | | |
| −1905 | 10 × 218 | 2 × −226 | 3 × 242, $\Delta H_r^0(298\ K.) = -1453\ kJ\ mol^{-1}$ |
| −1817 | 10 × 203 | 2 × −185 | 3 × −229, $\Delta G_r^0(298\ K.) = -1270\ kJ\ mol^{-1}$, |
| [II-342] Y$_2$O$_3$(cr) + 12H(g) → 2YH$_3$(cr) + 3H$_2$O(g) | | | |
| −1905 | 12 × 218 | 2 × −268 | 3 × −242, $\Delta H_r^0(298\ K.) = -1973\ kJ\ mol^{-1}$ |
| −1817 | 12 × 203 | 2 × −209 | 3 × −229, $\Delta G_r^0(298\ K.) = -1724\ kJ\ mol^{-1}$, |
| [II-343] YCl$_3$(cr) + 5H(g) → YH$_2$(cr) + 3HCl(g) | | | |
| −1000 | 5 × 218 | −226 | 3 × −92, $\Delta H_r^0(298\ K.) = -592\ kJ\ mol^{-1}$, |
| [II-344] YCl$_3$(cr) + 6H(g) → YH$_3$(cr) + 3HCl(g) | | | |
| −1000 | 6 × 218 | −268 | 3 × −92, $\Delta H_r^0(298\ K.) = -852\ kJ\ mol^{-1}$, |
| [II-345] YF$_3$(cr) + 5H(g) → YH$_2$(cr) + 3HF(g) | | | |
| −1719 | 5 × 218 | −226 | 3 × −272, $\Delta H_r^0(298\ K.) = -413\ kJ\ mol^{-1}$ |
| −1645 | 5 × 203 | −185 | 3 × −275, $\Delta G_r^0(298\ K.) = -380\ kJ\ mol^{-1}$ |

-continued and
[II-346] YF$_3$(cr) + 6H(g) → YH$_3$(cr) + 3HF(g)
  −1719   6 × 218   −268   3 × −272, $\Delta H_r^0$(298 K.) = −673 kJ mol$^{-1}$
  −1645   6 × 203   −209   3 × −275, $\Delta G_r^0$(298 K.) = −607 kJ mol$^{-1}$.

Thus, for the volatilization of yttrium species we have the choice of three procedures:
O+F*
H+F
F* (in the absence of YF$_3$).

J. The Lanthanides

1. THERMODYNAMICS

TABLE II-10

LANTHANIDE OXIDES THERMODYNAMIC DATA
$\Delta H_f^0$(298 K.)/$\Delta G_f^0$(298 K.)
(kJ mol$^{-1}$)

|    | MO(g)    | M$_2$O$_3$(cr) | MO$_2$(cr)   |
|----|----------|----------------|--------------|
| La | −121/−145 | −1794/−1706   |              |
| Ce | −128/−149 | −1796/−1706   | −1089/−1025  |
| Pr | ~−160/—  | −1810/—        | −949/—       |
| Nd | ~−130/—  | −1808/−1721    |              |
| Pm |          | NO DATA        |              |
| Sm | ~−130/—  | −1823/−1735    |              |
| Eu | ~−130/—  | −1663/—        |              |
| Gd | ~−70/—   | −1820/—        |              |
| Tb | ~−80/—   | −1865/—        | −972/—       |
| Dy | ~−80/—   | −1863/−1772    |              |
| Ho | ~−90/—   | −1881/−1791    |              |
| Er | ~−50/—   | −1898/−1809    |              |
| Tm | ~−80/—   | −1889/−1794    |              |
| Yb |          | −1815/−1727    |              |
| Lu | −15/−41  | −1878/−1789    |              |

(all data from Ref. <B>).

TABLE II-11

LANTHANIDE CHLORIDES THERMODYNAMIC DATA
$\Delta H_f^0$(298 K.)/$\Delta G_f^0$(298 K.)
(kJ mol$^{-1}$)

|    | MCl$_2$(Cr) | MCl$_3$(cr)    | MCl$_3$(g) |
|----|-------------|-----------------|------------|
| La |             | −1071/−1114a   | −741/—     |
| Ce |             | −1054/−978     | −728/—     |
| Pr |             | −1057/—        | −782/—     |
| Nd | −682/—      | −1041/—        | −724/—     |
| Pm |             | NO DATA        |            |
| Sm | −816/—      | −1026/—        |            |
| Eu | −824/—      | −936/—         |            |
| Gd |             | −1008/—        |            |
| Tb |             | −997/—         |            |
| Dy |             | −1000/—        |            |
| Ho |             | −1005/—        | −703/—     |
| Er |             | −999/—         | −699/—     |
| Tm |             | −987/—         | −695/—     |
| Yb | −800/—      | −960/—         |            |
| Lu |             | −946/—         | −649/—     |

(all data from Ref. <B>, except for a, Ref. <II-18>).

TABLE II-12

LANTHANIDE FLUORIDES THERMODYNAMIC DATA
$\Delta H_f^0$(298 K.)/$\Delta G_f^0$(298 K.)
(kJ mol$^{-1}$)

|    | MF(g) | MF$_2$(g) | MF$_3$(cr) | MF$_3$(cr) | MF$_3$(cr) | MF$_3$(g) |
|    | <B>   | <B>       | (<B>)      | <II-19>ff  | <II-23>)   | <B>       |
|----|-------|-----------|------------|-------------|-------------|-----------|
| La |       |           |            | −1782a/−1816a | −1657/—   |           |
| Ce |       |           |            | −1778b/−1813b | −1636/—   |           |
| Pr |       |           |            |             | −1623/—    |           |
| Nd | −159/— | −690/—   | −1657/—    | −1669c/−1703c | −1610/— | −1280/—   |
| Pm |       |           |            |             | −1602/—    |           |
| Sm | −264/— |          | −1778/—    |             | −1623/—    | −1372/—   |
| Eu | −293/— |          |            |             | −1531/—    |           |
| Gd | −172/— | −707/—   |            |             | −1586/—    | −1297/—   |
| Tb |       |           |            |             | −1569/—    |           |
| Dy | −180/— |          |            |             | −1561/—    |           |
| Ho | −180/— | −682/—   | −1707/—    | −1707d/−1741d | −1548/— | −1230/—   |
| Er | −188/— | −686/—   | −1711/—    |             | −1536/—    | −1230/—   |
| Tm |       |           |            |             | −1531/—    |           |
| Yb |       |           |            |             | −1469/—    |           |
| Lu |       |           |            |             | −1536/—    |           |

(a, 5Ref. <II-19>; b, Ref. <II-20>; c, Ref. <II-21>; d, Ref. <II-22>).

TABLE II-13

LANTHANIDE DIHYDRIDES (cr) THERMODYNAMIC DATA
$H_f^0$(298 K.)/$G_f^0$(298 K.)
(kJ mol$^{-1}$)

|    | <B>       | <II-24>    | <II-25>    |
|----|-----------|------------|------------|
| La |           | −189/−205  | −209/−163  |
| Ce | −205/−163 | −205/−222  | −205/−163  |
| Pr | −198/−154 | −197/−213  | −209/−163  |
| Nd | −192/—    | −192/−209  | −209/−167  |
| Pm |           | NO DATA    |            |
| Sm |           |            | −201/−159  |
| Eu |           | NO DATA    |            |
| Gd | −190/—    |            | −197/−159  |
| Tb |           |            | −213/−172  |
| Dy |           |            | −222/−175  |
| Ho | −216/—    |            | −226/−180  |
| Er | −205/—    |            | −226/−180  |
| Tm |           |            | −226/−180  |
| Tb | −176/—    |            | −180/−138  |
| Lu |           |            | −209/−163  |

It is well known that the lanthanides are very similar in their chemistries. The 'outer' electronic structures of scandium, yttrium and lanthanum are 3d 4s$^2$, 4d 5s$^2$ and 5d 6s$^2$, respectively. For lanthanum, however, a new factor enters the picture. For lanthanum and the following fourteen elements the 4f levels and the 5d levels are very close in energy. Only four of these fifteen elements (the lanthanides) have a 5d electron in their ground states. These are La, Ce, Gd and Lu. These similarities are reflected in many of the thermodynamic values of these elements.

Referring to TABLE II-10. we find that the enthalpies of formation of the sesquioxides are all relatively close together except for that of Eu. The average value, including Eu, is $-1829$ kJ mol$^{-1}$. The average absolute deviation is 43 kJ mol$^{-1}$ (2.4%) and the root mean square deviation is 58 kJ mol$^{-1}$ (3.2%). The deviation of the value for Eu from the average value is 166 kJ mol$^{-1}$ (9.1%). The deviation of the value for Sc is 80 kJ mol$^{-1}$ (4.4%). For the purpose of the calculations in the SECTIONS which follow we shall assume the following enthalpies of formation.

sesquioxide as reactant $\Delta H_f^0(O_{1.5}) = -1898$ kJ mol$^{-1}$ as product, $\Delta H_f^0(O_{1.5}') = -1663$ kJ mol$^{-1}$ dioxide as reactant, $\Delta H_f^0(O_2) = -1089$ kJ mol$^{-1}$ as product, $\Delta H_f^0(O_2') = -972$ kJ mol$^{-1}$ The rule which is followed here is to use the value which is largest in magnitude for the reactant and the value which is smallest in magnitude for the product. ('Magnitude' here means, of course, 'absolute magnitude'. This terminology precaution is necessary since all of the values are negative.) By using these extremum values we can use a single calculation ('worst case' analysis) to cover all fifteen elements.

Referring now to TABLE II-11. we find that a similar situation exists relative to the enthalpies of formation of the trichlorides. The average value is $-1006$ kJ mol$^{-1}$ with an average absolute deviation of 31 kJ mol$^{-1}$ (3.1%) and a root mean square deviation of 35 kJ mol$-1$ (3.5%). The deviation of the value for Sc is 81 kJ mol$^{-1}$ (8.1%). We shall assume in the calculations which follow the following enthalpies of formation;

dichloride as reactant, $\Delta H_f^0(Cl_2) = -824$ kJ mol$^{-1}$ as product, $\Delta H_f^0(\overline{Cl}_2) = -682$ kJ mol$^{-1}$ trichloride as reactant, $\Delta H_f^0(Cl_3) = -1071$ kJ mol$^{-1}$ as product, $\Delta H_f^0(\overline{Cl}_3) = -936$ kJ mol$^{-1}$.

For the trifluorides we require the enthalpies of formation for both the crystalline and gaseous states. As is indicated in TABLE II-12, we have only limited data for the gaseous species. Although we have extensive data on the crystalline states from <II-23>, the values are consistently lower than those from the more recent references, <B>, <II-19>, <II-20>, <II-21> and <II-22>. From <II-23> the average value of the enthalpy of formation of the crystalline trifluorides is $-1575$ kJ mol$^{-1}$ with an average absolute deviation of 42 kJ mol$^{-1}$ (2.7%) and a root mean square deviation of 49 kJ mol$^{-1}$ (3.1%). From the newer references the average value is $-1736$ kJ mol$^{-1}$ with an average absolute deviation of 43 kJ mol$^{-1}$ (2.5%) and a root mean square deviation of 46 kJ mol$^{-1}$ (2.6%). The deviation of the value for Sc is 107 kJ mol$^{-1}$ (6.2%).

The average value of the enthalpy of formation of the gaseous trifluorides is $-1282$ kJ mol$^{-1}$ with an absolute deviation of 42 kJ mol$^{-1}$ (3.3%) and a root mean square deviation of 52 kJ mol$^{-1}$ (4.1%). The deviation of the value for scandium is 35 kJ mol$^{-1}$ (2.7%). For those elements for which we can calculate the enthalpies of sublimation the largest value is for Er, 481 kJ mol$^{-1}$. For this value the 'times four' criterion is 1924 kJ mol$^{-1}$. In the calculations which follow wse shall use the following extremum values:

monofluoride as product, $\Delta H_f^0(F) = -159$ kJ mol$^{-1}$
difluoride as product, $\Delta H_f^0(F_2) = -682$ kJ mol$^{-1}$
trifluoride as reactant, $\Delta H_f^0(F_3) = -1782$ kJ mol$^{-1}$ as product, $\Delta H_f^0(F_3) = -1469$ kJ mol$^{-1}$ 'times four' criterion, 1924 kJ mol$^{-1}$ For the dihydrides the average value of the enthalpies of formation from <II−25> (the most recent reference as well as the most complete) is $-210$ kJ mol$^{-1}$ with an average absolute deviation of 9 kJ mol$^{-1}$ (4.3%) and a root mean square deviation of 13 kJ mol$^{-1}$ (6.2%). The extremum values which will be used are dihydride as reactant $\Delta H_f^0(H_2) = -226$ kJ mol$^{-1}$
as product, $\Delta H_f^0(H_2) = -180$ kJ mol$^{-1}$.

For the enthalpies of formation of the nitrates we have data for only five elements:

La $-1254$ kJ mol$^{-1}$
Ce $-1226$
Pr $-1229$
Nd $-1231$
Sm $-1212$.

The average value is $-1230$ kJ mol$^{-1}$ with an average absolute deviation of 10 kJ mol$^{-1}$ (0.81%) and a root mean square deviation of 14 kJ mol$^{-1}$ (1.1%). The spread of these data is quite small. These elements, however, are those with the lowest number of 4f electrons. We shall find that, even when large deviations from this average value are assumed, the reactions involving the nitrates are quite exothermic.

2. MONOXYGEN CHEMISTRIES

[II-347] $M(cr) + O(g) \rightarrow MO(g)$
  0    249                       $-15$, $\Delta H_r^0(298\ K.) = -264$ kJ mol$^{-1}$,

[II-348] $M(cr) + 1.5O(g) \rightarrow 0.5M_2O_3(cr)$
  0    1.5 × 249                 $0.5 \times -1663$, $\Delta H_r^0(298\ K.) = -1205$ kJ mol$^{-1}$,

[II-349] $M(cr) + 2O(g) \rightarrow MO_2(cr)$
  0    2 × 249                   $-972$, $\Delta H_r^0(298\ K.) = -1470$ kJ mol$^{-1}$,

[II-350] $MCl_2(cr) + 5.5O(g) \rightarrow 0.5M_2O_3(cr) + 2ClO_2(g)$
  $-824$   5.5 × 249   $0.5 \times -1663$   $2 \times 102$, $\Delta H_r^0(298\ K.) = -1173$ kJ mol$^{-1}$,

[II-351] $MCl_2(cr) + 6O(g) \rightarrow MO_2(cr) + 2ClO_2(g)$
  $-824$   6 × 249   $-972$   $2 \times 102$, $\Delta H_r^0(298\ K.) = -1438$ kJ mol$^{-1}$,

[II-352] $MCl_3(cr) + 7.5O(g) \rightarrow 0.5M_2O_3(cr) + 3ClO_2(g)$
  $-1071$   7.5 × 249   $0.5 \times -1663$   $3 \times 102$, $\Delta H_r^0(298\ K.) = -1322$ kJ mol$^{-1}$,

[II-353] $MCl_3(cr) + 8O(g) \rightarrow MO_2(cr) + 3ClO_2(g)$
  $-1071$   8 × 249   $-972$   $3 \times 102$, $\Delta H_r^0(298\ K.) = -1587$ kJ mol$^{-1}$,

[II-354] $MF_3(cr) + 7.5O(g) \rightarrow 0.5M_2O_3(cr) + 3FO_2(g)$
  $-1782$   7.5 × 249   $0.5 \times -1663$   $3 \times 13$, $\Delta H_r^0(298\ K.) = -878$ kJ mol$^{-1}$,

[II-355] $MF_3(cr) + 8O(g) \rightarrow MO_2(cr) + 3FO_2(g)$
  $-1782$   8 × 249   $-972$   $3 \times 13$, $\Delta H_r^0(298\ K.) = -1143$ kJ mol$^{-1}$,

[II-356] $MH_2(cr) + 2.5O(g) \rightarrow 0.5M_2O_3(cr) + H_2O(g)$
  $-226$   2.5 × 249   $0.5 \times -1663$   $-242$, $\Delta H_r^0(298\ K.) = -1470$ kJ mol$^{-1}$ and

[II-357] $MH_2(cr) + 3O(g) \rightarrow MO_2(cr) + H_2O(g)$

-226  3 × 249  −972       −242, $\Delta H_r^0(298 \text{ K.}) = -1735 \text{ kJ mol}^{-1}$.

3. MONOXYGEN PLUS NITROGEN DIOXIDE CHEMISTRIES so large as to be most unlikely, we can reasonably assume that all of the O/NO$_2$ reactions will go as written.

[II-358]  M(cr) + 3O(g) + 3NO$_2$(g) → M(NO$_3$)$_3$(cr)
    0  3 × 249  3 × 33   −1230, $\Delta H_r^0(298 \text{ K.}) = -2076 \text{ kJ mol}^{-1}$,

[II-359]  M$_2$O$_3$(cr) + 3O(g) + 6NO$_2$(g) → M(NO$_3$)$_3$(cr)
    −1898  3 × 249  6 × 33   2 × −1230, $\Delta H_r^0(298 \text{ K.}) = -1507 \text{ kJ mol}^{-1}$,

[II-360]  MO$_2$(cr) + O(g) + 3NO$_2$(g) → M(NO$_3$)$_3$(cr)
    −1089  249  3 × 33   −1230, $\Delta H_r^0(298 \text{ K.}) = -489 \text{ kJ mol}^{-1}$,

[II-361]  MCl$_2$(cr) + 7O(g) + 3NO$_2$(g) → M(NO$_3$)$_3$(cr) + 2ClO$_2$(g)
    −824  7 × 249  3 × 33  −1230  2 × 102, $\Delta H_r^0(298 \text{ K.}) = -2044 \text{ kJ mol}^{-1}$,

[II-362]  MCl$_3$(cr) + 9O(g) + 3NO$_2$(g) → M(NO$_3$)$_3$(cr) + 3ClO$_2$(g)
    −1071  9 × 249  3 × 33  −1230  3 × 102, $\Delta H_r^0(298 \text{ K.}) = -2193 \text{ kJ mol}^{-1}$,

[II-363]  MF$_3$(cr) + 9O(g) + 3NO$_2$(g) → M(NO$_3$)$_3$(cr) + 3FO$_2$(g)
    −1782  9 × 249  3 × 33  −1230  3 × 13, $\Delta H_r^0(298 \text{ K.}) = -1749 \text{ kJ mol}^{-1}$ and

[II-364]  MH$_2$(cr) + 4O(g) + 3NO$_2$(g) → M(NO$_3$)$_3$(cr) + H$_2$O(g)
    −226  4 × 249  3 × 33  −1230   −242, $\Delta H_r^0(298 \text{ K.}) = -2341 \text{ kJ mol}^{-1}$.

For reactions [II-358], [II-361], [II-362], [II-363] and [II-364] the enthalpy of formation of the nitrate could be zero, and the reactions would still be exothermic. For reaction [II-359] the enthalpy of formation of the nitrate could be −500 kJ mol$^{-1}$, and the reaction would still be exothermic. For the worst case, reaction [II-360] the enthalpy of formation of the nitrate could be −800 kJ mol$^{-1}$, and the reaction would still be exothermic. Since all of these deviations from −1230 kJ mol$^{-1}$ are

4. MONOFLUORINE CHEMISTRIES

[II-365]  M(cr) + F(g) → MF(g)
    0  79        −159, $\Delta H_r^0(298 \text{ K.}) = -238 \text{ kJ mol}^{-1}$,

[II-366]  M(cr) + 2F(g) → MF$_2$(g)
    0  2 × 79        −682, $\Delta H_r^0(298 \text{ K.}) = -840 \text{ kJ mol}^{-1}$,

[II-367]  M(cr) + 3F(g) → MF$_3$(g)
    0  3 × 79        −1469, $\Delta H_r^0(298 \text{ K.}) = -1706 \text{ kJ mol}^{-1}$,

[II-368]  M(cr) + 3F*(g) → MF$_3$(g)
    0  3 × 245        −1469, $\Delta H_r^*(298 \text{ K.}) = -2204 \text{ kJ mol}^{-1}$,

[II-369]  0.5M$_2$O$_3$(cr) + 6F(g) → MF$_3$(cr) + 1.5OF$_2$(g)
    0.5 × −1898  6 × 79  −1469  1.5 × 24, $\Delta H_r^0(298 \text{ K.}) = -958 \text{ kJ mol}^{-1}$,

[II-370]  0.5M$_2$O$_3$(cr) + 6F*(g) → MF$_3$(cr) + 1.5OF$_2$(g)
    0.5 × −1898  6 × 245  −1469  1.5 × 24, $\Delta H_r^*(298 \text{ K.}) = -1954 \text{ kJ mol}^{-1}$,

[II-371]  MO$_2$(cr) + 7F(g) → MF$_3$(cr) + 2OF$_2$(g)
    −1089  7 × 79  −1469  2 × 24, $\Delta H_r^*(298 \text{ K.}) = -885 \text{ kJ mol}^{-1}$,

[II-372]  MO$_2$(cr) + 7F*(g) → MF$_3$(cr) + 2OF$_2$(g)
    −1089  7 × 245  −1469  2 × 24, $\Delta H_r^*(298 \text{ K.}) = -2047 \text{ kJ mol}^{-1}$,

[II-373]  M(NO$_3$)$_3$(cr) + 30F(g) → MF$_3$(cr) + 3NF$_3$(g) + 9OF$_2$(g)
    −1230  30 × 79  −1469  3 × −124  9 × 24, $\Delta H_r^0(298 \text{ K.}) = -2765 \text{ kJ mol}^{-1}$,

[II-374]  M(NO$_3$)$_3$(cr) + 30F*(g) → MF$_3$(cr) + 3NF$_3$(g) + 9OF$_2$(g)
    −1230  30 × 245  −1469  3 × −124  9 × 24, $\Delta H_r^*(298 \text{ K.}) = -7745 \text{ kJ mol}^{-1}$,

[II-375]  MCl$_2$(cr) + 9F(g) → MF$_3$(cr) + 2ClF$_3$(g)
    −824  9 × 79  −1464  2 × −159, $\Delta H_r^0(298 \text{ K.}) = -1669 \text{ kJ mol}^{-1}$,

[II-376]  MCl$_2$(cr) + 9F*(g) → MF$_3$(cr) + 2ClF$_3$(g)
    −824  9 × 245  −1464  2 × −159, $\Delta H_r^*(298 \text{ K.}) = -3163 \text{ kJ mol}^{-1}$,

[II-377]  MCl$_3$(cr) + 12F(g) → MF$_3$(cr) + 3ClF$_3$(g)
    −1071  12 × 79  −1464  3 × −159, $\Delta H_r^0(298 \text{ K.}) = -1818 \text{ kJ mol}^{-1}$,

[II-378]  MCl$_3$(cr) + 12F*(g) → MF$_3$(cr) + 3ClF$_3$(g)
    −1071  12 × 245  −1469  3 × −159, $\Delta H_r^*(298 \text{ K.}) = -3810 \text{ kJ mol}^{-1}$ and

[II-379]  MH$_2$(cr) + 5F(g) → MF$_3$(cr) + 2HF(g)
    −226  5 × 79  −1464  2 × −272, $\Delta H_r^0(298 \text{ K.}) = -2177 \text{ kJ mol}^{-1}$.

Thus, we find that even under the extremum conditions monofluorine in its excited state will volatilize all of the lanthanide species analyzed here. Furthermore, even ground state monofluorine will volatilize the dihydrides and the nitrates will volatilize the dihydrides and the nitrates (unless the enthalpy of formation is more negative than −2000 kJ mol$^{-1}$ which is most unlikely.)

5. MONOHYDROGEN CHEMISTRIES

[II-380]  M(cr) + 2H(g) → MH$_2$(cr)
    0  2 × 218   −180, $\Delta H_r^0(298 \text{ K.}) = -616 \text{ kJ mol}^{-1}$,

[II-381]  M$_2$O$_3$(cr) + 10H(g) → 2MH$_2$(cr) + 3H$_2$O(g)
    −1898  10 × 218  2 × −180  3 × −242, $\Delta H_r^0(298 \text{ K.}) = -1368 \text{ kJ mol}^{-1}$,

[II-382]  MO$_2$(cr) + 6H(g) → MH$_2$(cr) + 2H$_2$O(g)
    −1089  6 × 218  −180  2 × −242, $\Delta H_r^0(298 \text{ K.}) = -883 \text{ kJ mol}^{-1}$,

[II-383]  M(NO$_3$)$_3$(cr) + 29H(g) → MH$_2$(cr) + 3NH$_3$(g) + 9H$_2$O(g)
    −1230  29 × 218  −180  3 × −46, 9 × −242, $\Delta H_r^0(298 \text{ K.}) = -7588 \text{ kJ mol}^{-1}$,

[II-384]  MCl$_2$(cr) + 4H(g) → MH$_2$(cr) + 2HCl(g)
    −824  4 × 218  −180  2 × −92, $\Delta H_r^0(298 \text{ K.}) = -412 \text{ kJ mol}^{-1}$,

[II-385] $MCl_3(cr) + 5H(g) \rightarrow MH_2(cr) + 3HCl(g)$
  $-1071 \quad 5 \times 218 \quad -180 \quad 3 \times -92, \Delta H_r^0(298 \text{ K.}) = -475 \text{ kJ mol}^{-1}$ and

[II-386] $MF_3(cr) + 5H(g) \rightarrow MH_2(cr) + 3HF(g)$
  $-1782 \quad 5 \times 218 \quad -180 \quad 3 \times -272, \Delta H_r^0(298 \text{ K.}) = -304 \text{ kJ mol}^{-1}.$

6. SUMMARY OF GROUP IIIB. AND LANTHANIDE PROCEDURES

Thus, we find that for the volatilization of the GROUP III B and lanthanide species we have the choice of four procedures.

O+F*
O/NO$_2$+F
H+F
F* (in the absence of MF$_3$).

(In addition it should be noted that the chemistries discussed here can be used to synthesize anhydrous lanthanide compounds. For example, reactions [II−358] and/or [II−359] can be used to synthesize anhydrous nitrates.)

K. Group IV B.

1. THERMODYNAMICS

Of the various chlorides only titanium tetrachloride will vaporize spontaneously in the Apparatus. Zirconium tetrachloride, however, is marginal by the criterion of [II−2]. The enthalpies of sublimation of the tetrafluorides of titanium, zirconium and hafnium are, 98, 237 and 260 kJ mol$^{-1}$, respectively. Thus, the 'times four' criteria are 392, 948 and 1040 kJ mol$^{-1}$, respectively.

TABLE II-14

| | GROUP IVB THERMODYNAMIC DATA $\Delta H_f^0(298 \text{ K.})/\Delta G_f^0(298 \text{ K.})$ (kJ mol$^{-1}$) | | |
|---|---|---|---|
| SPECIES | Ti | Zr | Hf |
| MO (cr) | −543/−513 | | |
| (l) | −494/−472 | | |
| (g) | +54/+25 | +59/+33 | +50a/— |
| M$_2$O$_3$ (cr) | −1521/−1434 | | |
| (l) | −1418/−1346 | | |
| MO$_2$ (cr) | −945/−889 | −1097/−1040 | −1145a/−1088a |
| (l) | −894/−845 | −1023/−973 | |
| (g) | −305/−313 | −286/−295 | |
| MO$_3$ (cr) | | −1008a/— | |
| MCl (g) | +154/+123 | +205/+174 | |

TABLE II-14-continued

| | GROUP IVB THERMODYNAMIC DATA $\Delta H_f^0(298 \text{ K.})/\Delta G_f^0(298 \text{ K.})$ (kJ mol$^{-1}$) | | |
|---|---|---|---|
| SPECIES | Ti | Zr | Hf |
| MCl$_2$ (cr) | −515/−466 | −431/−386 | |
| (l) | | −412/−370 | |
| (g) | −237/−245 | −186/−195 | |
| MCl$_3$ (cr) | −722/−654 | −714/−646 | |
| (g) | −539/−525 | −524/−514 | |
| MCl$_4$ (cr) | −815/−735 | −981/−890 | −990a/−901a |
| (l) | −804/−728 | | |
| (g) | −763/−727 | −870/−835 | −884a/— |
| MF (g) | −67/−98 | +83/+52 | |
| MF$_2$ (cr) | | −962/−913 | |
| (l) | | −937/−895 | |
| (g) | −688/−695 | −558/−571 | |
| MF$_3$ (cr) | −1432/−1313 | −1402/−1326 | |
| (g) | −1189/−1176 | −1105/−1094 | |
| MF$_4$ (cr) | −1649/−1559 | −1911/−1810 | 1930a/1830a |
| (g) | −1551/−1515 | −1674/−1636 | −1670a/— |
| MH$_2$ (cr) | −120a/−80a | −169a/−129a | |

(a, Ref. <B>)

2. TITANIUM

[II-387] $Ti(cr) + O(g) \rightarrow TiO(cr)$
  $0 \quad 249 \quad -543, \Delta H_r^0(298 \text{ K.}) = -792 \text{ kJ mol}^{-1}$
  $0 \quad 232 \quad -513, \Delta G_r^0(298 \text{ K.}) = -745 \text{ kJ mol}^{-1},$

[II-388] $TiO(cr) + 0.5O(g) \rightarrow 0.5Ti_2O_3(cr)$
  $-543 \quad 0.5 \times 249 \quad 0.5 \times -1521, \Delta H_r^0(298 \text{ K.}) = -342 \text{ kJ mol}^{-1}$
  $-513 \quad 0.5 \times 232 \quad 0.5 \times -1434, \Delta G_r^0(298 \text{ K.}) = -320 \text{ kJ mol}^{-1}$ and

[II-389] $0.5Ti_2O_3(cr) + 0.5O(g) \rightarrow TiO_2(cr)$
  $0.5 \times -1521 \quad 0.5 \times 249 \quad -945, \Delta H_r^0(298 \text{ K.}) = -309 \text{ kJ mol}^{-1}$
  $0.5 \times -1434 \quad 0.5 \times 232 \quad -894, \Delta G_r^0(298 \text{ K.}) = -293 \text{ kJ mol}^{-1}.$ The enthalpy of melting of titanium monoxide is 49 kJ mol$^{-1}$. Thus, by the 'times four' criterion [II-387] will yield the liquid monoxide. By [II-388[ the reaction will continue with the formation of the sesquioxide. The enthalpy of melting of the sesquioxide is 103 kJ mol$^{-1}$. Thus, by the 'times four' criterion (412<792+342) the liquid sesquioxide will be formed. By [II-389] the reaction will continue to the dioxide. The enthalpy of melting of the dioxide is 51 kJ mol$^{-1}$.

If the sesquioxide is formed from the crystalline monoxide, the liquid sesquioxide will not form. If, however, sufficient monoxygen is present to take the reaction to the dioxide, the liquid dioxide will form, and all of the monoxide and sesquioxide will be converted to the dioxide. Thus, in the subsequent reactions we need consider only the dioxide as the product of monoxygen reactions.

[II-390] $TiCl_2(cr) + 6O(g) \rightarrow TiO_2(cr) + 2ClO_2(g)$
  $-515 \quad 6 \times 249 \quad -945 \quad 2 \times 102, \Delta H_r^0(298 \text{ K.}) = -1720 \text{ kJ mol}^{-1}$
  $-466 \quad 6 \times 232 \quad -889 \quad 2 \times 120, \Delta G_r^0(298 \text{ K.}) = -1575 \text{ kJ mol}^{-1},$

[II-391] $TiCl_3(cr) + 8O(g) \rightarrow TiO_2(cr) + 3ClO_2(g)$
  $-722 \quad 8 \times 249 \quad -945 \quad 3 \times 102, \Delta H_r^0(298 \text{ K.}) = -1909 \text{ kJ mol}^{-1}$
  $-654 \quad 8 \times 232 \quad -889 \quad 3 \times 120, \Delta G_r^0(298 \text{ K.}) = -1731 \text{ kJ mol}^{-1},$

[II-392] $TiF_3(cr) + 8O(g) \rightarrow TiO_2(cr) + 3FO_2(g)$
  $-1432 \quad 8 \times 249 \quad -945 \quad 3 \times 13, \Delta H_r^0(298 \text{ K.}) = -1466 \text{ kJ mol}^{-1}$
  $-1313 \quad 8 \times 232 \quad -889 \quad 3 \times 27, \Delta G_r^0(298 \text{ K.}) = -1351 \text{ kJ mol}^{-1},$ -continued

| | | | | |
|---|---|---|---|---|
| [II-392] | $TiF_4(cr) + 10O(g) \rightarrow TiO_2(cr) + 4FO_2(g)$ | | | |
| | $-1649$ | $10 \times 249$ | $-945$ | $4 \times 13$, $\Delta H_r^0(298\ K.) = -1734\ kJ\ mol^{-1}$ |
| | $-1559$ | $10 \times 232$ | $-889$ | $4 \times 27$, $\Delta G_r^0(298\ K.) = -1542\ kJ\ mol^{-1}$ |
| and | | | | |
| [II-394] | $TiH_2(cr) + 3O(g) \rightarrow TiO_2(cr) + H_2O(g)$ | | | |
| | $-120$ | $3 \times 249$ | $-945$ | $-242$, $\Delta H_r^0(298\ K.) = -1814\ kJ\ mol^{-1}$ |
| | $-80$ | $3 \times 232$ | $-889$ | $-229$, $\Delta G_r^0(298\ K.) = -1734\ kJ\ mol^{-1}$, |
| [II-395] | $Ti(cr) + F(g) \rightarrow TiF(g)$ | | | |
| | 0 | 79 | | $-67$, $\Delta H_r^0(298\ K.) = -146\ kJ\ mol^{-1}$ |
| | 0 | 62 | | $-98$, $\Delta G_r^0(298\ K.) = -160\ kJ\ mol^{-1}$, |
| [II-396] | $Ti(cr) + 2F(g) \rightarrow TiF_2(g)$ | | | |
| | 0 | $2 \times 79$ | | $-688$, $\Delta H_r^0(298\ K.) = -846\ kJ\ mol^{-1}$ |
| | 0 | $2 \times 62$ | | $-695$, $\Delta G_r^0(298\ K.) = -819\ kJ\ mol^{-1}$, |
| [II-397] | $Ti(cr) + 3F(g) \rightarrow TiF_3(cr)$ | | | |
| | 0 | $3 \times 79$ | | $-1432$, $\Delta H_r^0(298\ K.) = -1667\ kJ\ mol^{-1}$ |
| | 0 | $3 \times 62$ | | $-1313$, $\Delta G_r^0(298\ K.) = -1499\ kJ\ mol^{-1}$ |
| and | | | | |
| [II-398] | $Ti(cr) + 4F(g) \rightarrow TiF_4(cr)$ | | | |
| | 0 | $4 \times 79$ | | $-1649$, $\Delta H_r^0(298\ K.) = -1965\ kJ\ mol^{-1}$ |
| | 0 | $4 \times 62$ | | $-1559$, $\Delta G_r^0(298\ K.) = -1807\ kJ\ mol^{-1}$. |

The enthalpy of sublimation of titanium trifluoride is 243 kJ mol$^{-1}$, and the 'times four' criterion is 972 kJ mol$-1$. Thus, the trifluoride formed by [II-397] as well as the tetrafluoride formed by [II-398] will volatilize. Thus, we must consider both the trifluoride as well as the tetrafluoride as possible volatilization products.

Thus, we have a choice of three procedures for the volatilization of titanium species:
O+F
H+F
F (in the absence of TiF$_4$).

3. ZIRCONIUM

| | | | | |
|---|---|---|---|---|
| [II-399] | $0.5Ti_2O_3 + 6F(g) \rightarrow TiF_3(cr) + 1.5OF_2(g)$ | | | |
| | $0.5 \times -1521$ | $6 \times 79$ | $-1432$ | $1.5 \times 24$, $\Delta H_r^0(298\ K.) = -1110\ kJ\ mol^{-1}$ |
| | $0.5 \times -1434$ | $6 \times 62$ | $-1313$ | $1.5 \times 42$, $\Delta G_r^0(298\ K.) = -905\ kJ\ mol^{-1}$, |
| [II-400] | $TiO_2(cr) + 7F(g) \rightarrow TiF_3(cr) + 2OF_2(g)$ | | | |
| | $-945$ | $7 \times 79$ | $-1432$ | $2 \times 24$, $\Delta H_r^0(298\ K.) = -992\ kJ\ mol^{-1}$ |
| | $-889$ | $7 \times 62$ | $-1313$ | $2 \times 42$, $\Delta G_r^0(298\ K.) = -774\ kJ\ mol^{-1}$, |
| [II-401] | $TiCl_2(cr) + 9F(g) \rightarrow TiF_3(cr) + 2ClF_3(g)$ | | | |
| | $-515$ | $9 \times 79$ | $-1432$ | $2 \times -159$, $\Delta H_r^0(298\ K.) = -1946\ kJ\ mol^{-1}$ |
| | $-466$ | $9 \times 62$ | $-1313$ | $2 \times -119$, $\Delta G_r^0(298\ K.) = -1643\ kJ\ mol^{-1}$, |
| [II-402] | $TiCl_3(cr) + 12F(g) \rightarrow TiF_3(cr) + 3ClF_3(g)$ | | | |
| | $-722$ | $12 \times 79$ | $-1432$ | $3 \times -159$, $\Delta H_r^0(298\ K.) = -2135\ kJ\ mol^{-1}$ |
| | $-654$ | $12 \times 62$ | $-1313$ | $3 \times -119$, $\Delta G_r^0(298\ K.) = -1760\ kJ\ mol^{-1}$ |
| and | | | | |
| [II-403] | $TiH_2(cr) + 5F(g) \rightarrow TiF_3(cr) + 2HF(g)$ | | | |
| | $-120$ | $5 \times 79$ | $-1432$ | $2 \times -272$, $\Delta H_r^0(298\ K.) = -2251\ kJ\ mol^{-1}$ |
| | $-80$ | $5 \times 62$ | $-1313$ | $2 \times -275$, $\Delta G_r^0(298\ K.) = -2093\ kJ\ mol^{-1}$. |

Thus, even without considering the tetrafluoride as the produce or excited state monofluorine as the reactant monofluorine is an effective volatilizing reagent for titanium species.

For the three crystalline fluorides of zirconium listed in TABLE II-14. the enthalpies of sublimation are 404 kJ mol$^{-1}$, 297 kJ mol$^{-1}$ and 237 kJ mol$^{-1}$ for the difluoride, the trifluoride and the tetrafluoride, respectively. The 'times four' criteria, therefore, are 1616 kJ mol$^{-1}$, 1188 kJ mol$^{-1}$ and 948 kJ mol$^{-1}$.

| | | | | |
|---|---|---|---|---|
| [II-404] | $Ti(cr) + 2H(g) \rightarrow TiH_2(cr)$ | | | |
| | 0 | $2 \times 218$ | $-120$ | $\Delta H_r^0(298\ K.) = -556\ kJ\ mol^{-1}$ |
| | 0 | $2 \times 203$ | $-80$ | $\Delta G_r^0(298\ K.) = -486\ kJ\ mol^{-1}$, |
| [II-405] | $Ti_2O_3(cr) + 10H(g) \rightarrow 2TiH_2(cr) + 3H_2O(g)$ | | | |
| | $-1521$ | $10 \times 218$ | $-120$ | $3 \times -242$, $\Delta H_r^0(298\ K.) = -1505\ kJ\ mol^{-1}$ |
| | $-1434$ | $10 \times 203$ | $-80$ | $3 \times -229$, $\Delta G_r^0(298\ K.) = -1363\ kJ\ mol^{-1}$, |
| [II-406] | $TiO_2(cr) + 6H(g) \rightarrow TiH_2(cr) + 2H_2O(g)$ | | | |
| | $-945$ | $6 \times 218$ | $-120$ | $2 \times -242$, $\Delta H_r^0(298\ K.) = -967\ kJ\ mol^{-1}$ |
| | $-889$ | $6 \times 203$ | $-80$ | $2 \times -229$, $\Delta G_r^0(298\ K.) = -867\ kJ\ mol^{-1}$, |
| [II-407] | $TiCl_2(cr) + 4H(g) \rightarrow TiH_2(cr) + 2HCl(g)$ | | | |
| | $-515$ | $4 \times 218$ | $-120$ | $2 \times -92$, $\Delta H_r^0(298\ K.) = -661\ kJ\ mol^{-1}$ |
| | $-466$ | $4 \times 203$ | $-80$ | $2 \times -95$, $\Delta G_r^0(298\ K.) = -616\ kJ\ mol^{-1}$, |
| [II-408] | $TiCl_3(cr) + 5H(g) \rightarrow TiH_2(cr) + 3HCl(g)$ | | | |
| | $-722$ | $5 \times 218$ | $-120$ | $3 \times -92$, $\Delta H_r^0(298\ K.) = -764\ kJ\ mol^{-1}$ |
| | $-654$ | $5 \times 203$ | $-80$ | $3 \times -95$, $\Delta G_r^0(298\ K.) = -726\ kJ\ mol^{-1}$, |
| [II-409] | $TiF_3(cr) + 5H(g) \rightarrow TiH_2(cr) + 3HF(g)$ | | | |
| | $-1432$ | $5 \times 218$ | $-120$ | $3 \times -272$, $\Delta H_r^0(298\ K.) = -594\ kJ\ mol^{-1}$ |
| | $-1313$ | $5 \times 203$ | $-80$ | $3 \times -275$, $\Delta G_r^0(298\ K.) = -607\ kJ\ mol^{-1}$ |
| and | | | | |
| [II-410] | $TiF_4(cr) + 6H(g) \rightarrow TiH_2(cr) + 4HF(g)$ | | | |
| | $-1649$ | $6 \times 218$ | $-120$ | $4 \times -272$, $\Delta H_r^0(298\ K.) = -867\ kJ\ mol^{-1}$ |
| | $-1559$ | $6 \times 203$ | $-80$ | $4 \times -275$, $\Delta G_r^0(298\ K.) = -839\ kJ\ mol^{-1}$. |

[II-411] Zr(cr) + O(g) → ZrO(g)
　　　　　0　　　249　　　　59, $\Delta H_r^0$(298 K.) = −190 kJ mol$^{-1}$
　　　　　0　　　232　　　　33, $\Delta G_r^0$(298 K.) = −199 kJ mol$^{-1}$,
[II-412] Zr(cr) + 2O(g) → ZrO$_2$(cr)
　　　　　0　　2 × 249　　−1097, $\Delta H_r^0$(298 K.) = −1595 kJ mol$^{-1}$
　　　　　0　　2 × 232　　−1040, $\Delta G_r^0$(298 K.) = −1504 kJ mol$^{-1}$
and
[II-413] ZrO$_2$(cr) + O(g) → ZrO$_3$(cr)
　　　−1097　　249　　　−1008, $\Delta G_r^0$(298 K.) = −160 kJ mol$^{-1}$.

The enthalpy of melting of zirconium dioxide is 74 kJ mol$^{-1}$, and the 'times four' criterion is 296 kJ mol$^{-1}$. Thus, reaction [II-412] will produce liquid zirconium dioxide. By [II-413] the reaction will continue to the trioxide. Since the $\Delta H_r^0$ for [II-413] is rather small, and since very little is known about the trioxide, we shall assume that the end product of the monoxygen reactions is the dioxide.

[II-414] ZrCl$_2$(cr) + 6O(g) → ZrO$_2$(cr) + 2ClO$_2$(g)
　　−431　　6 × 249　　−1097　　2 × 102, $\Delta H_r^0$(298 K.) = −1956 kJ mol$^{-1}$
　　−386　　6 × 232　　−1040　　2 × 120, $\Delta G_r^0$(298 K.) = −1866 kJ mol$^{-1}$,
[II-415] ZrCl$_3$(cr) + 8O(g) → ZrO$_2$(cr) + 3ClO$_2$(g)
　　−714　　8 × 249　　−1097　　3 × 102, $\Delta H_r^0$(298 K.) = −2069 kJ mol$^{-1}$
　　−646　　8 × 232　　−1040　　3 × 120, $\Delta G_r^0$(298 K.) = −1890 kJ mol$^{-1}$,
[II-416] ZrCl$_4$(cr) + 10O(g) → ZrO$_2$(cr) + 4ClO$_2$(g)
　　−981　　10 × 247　　−1097　　4 × 102, $\Delta H_r^0$(298 K.) = −2198 kJ mol$^{-1}$
　　−890　　10 × 232　　−1040　　4 × 120, $\Delta G_r^0$(298 K.) = −1990 kJ mol$^{-1}$,
[II-418] ZrF$_2$(cr) + 6O(g) → ZrO$_2$(cr) + 2FO$_2$(g)
　　−962　　6 × 249　　−1097　　2 × 13, $\Delta H_r^0$(298 K.) = −1603 kJ mol$^{-1}$
　　−913　　6 × 232　　−1040　　2 × 27, $\Delta G_r^0$(298 K.) = −1465 kJ mol$^{-1}$,
[II-419] ZrF$_3$(cr) + 8O(g) → ZrO$_2$(cr) + 3FO$_2$(g)
　　−1402　　8 × 249　　−1097　　3 × 13, $\Delta H_r^0$(298 K.) = −1648 kJ mol$^{-1}$
　　−1326　　8 × 232　　−1040　　3 × 27, $\Delta G_r^0$(298 K.) = −1489 kJ mol$^{-1}$,
[II-420] ZrF$_4$(cr) + 10O(g) → ZrO$_2$(cr) + 4FO$_2$(g)
　　−1911　　10 × 249　　−1097　　4 × 13, $\Delta H_r^0$(298 K.) = −1624 kJ mol$^{-1}$
　　−1810　　10 × 232　　−1040　　4 × 27, $\Delta G_r^0$(298 K.) = −1442 kJ mol$^{-1}$
and
[II-421] ZrH$_2$(cr) + 3O(g) → ZrO$_2$(cr) + H$_2$O(g)
　　−169　　3 × 249　　−1097　　−242, $\Delta H_r^0$(298 K.) = −1917 kJ mol$^{-1}$
　　−129　　3 × 232　　−1040　　−229, $\Delta G_r^0$(298 K.) = −1836 kJ mol$^{-1}$.
[II-422] Zr(cr) + F(g) → ZrF(g)
　　0　　79　　　　　　83, $\Delta H_r^0$(298 K.) = +4 kJ mol$^{-1}$
　　0　　62　　　　　　52, $\Delta G_r^0$(298 K.) = −10 kJ mol$^{-1}$,
[II-423] Zr(cr) + 2F(g) → ZrF$_2$(cr)
　　0　　2 × 79　　　−962, $\Delta H_r^0$(298 K.) = −1120 kJ mol$^{-1}$,
　　0　　2 × 62　　　−913, $\Delta G_r^0$(298 K.) = −1037 kJ mol$^{-1}$,
[II-424] Zr(cr) + 3F(g) → ZrF$_3$(cr)
　　0　　3 × 79　　　−1402, $\Delta H_r^0$(298 K.) = −1639 kJ mol$^{-1}$
　　0　　3 × 62　　　−1326, $\Delta G_r^0$(298 K.) = −1512 kJ mol$^{-1}$
and
[II-425] Zr(cr) + 4F(g) → ZrF$_4$(cr)
　　0　　4 × 79　　　−1911, $\Delta H_r^0$(298 K.) = −2227 kJ mol$^{-1}$
　　0　　4 × 62　　　−1810, $\Delta G_r^0$(298 K.) = −2058 kJ mol$^{-1}$.

Since both [II-424] and [II-424] meet their respective 'times four' criteria, we shall consider both the trifluoride and the tetrafluoride as potential volatilized products.

[II-426] ZrO$_2$(cr) + 7F(g) → ZrF$_3$(cr) + 2OF$_2$(g)
　　−1097　　7 × 79　　−1402　　2 × 24, $\Delta H_r^0$(298 K.) = −810 kJ mol$^{-1}$
　　−1040　　7 × 62　　−1326　　2 × 42, $\Delta G_r^0$(298 K.) = −636 kJ mol$^{-1}$,
[II-427] ZrO$_2$(cr) + 7F*(g) → ZrF$_3$(cr) + 2OF$_2$(g)
　　−1097　　7 × 245　　−1402　　2 × 24, $\Delta H_r^*$(298 K.) = −1972 kJ mol$^{-1}$,
[II-428] ZrO$_2$(cr) + 8F(g) → ZrF$_4$(cr) + 2OF$_2$(g)
　　−1097　　8 × 79　　−1911　　2 × 24, $\Delta H_r^0$(298 K.) = −1398 kJ mol$^{-1}$
　　−1040　　8 × 62　　−1810　　2 × 42, $\Delta G_r^0$(298 K.) = −1182 kJ mol$^{-1}$,
[II-429] ZrO$_3$(cr) + 9F(g) → ZrF$_3$(cr) + 3OF$_2$(g)
　　−1008　　9 × 79　　−1402　　3 × 24, $\Delta H_r^0$(298 K.) = −1033 kJ mol$^{-1}$,
[II-430] ZrO$_3$(cr) + 9F*(g) → ZrF$_3$(cr) + 3OF$_2$(g)
　　−1008　　9 × 245　　−1402　　3 × 24, $\Delta H_r^*$(298 K.) = −2527 kJ mol$^{-1}$
and
[II-431] ZrO$_3$(cr) + 10F(g) → ZrF$_4$(cr) + 3OF$_2$(g)
　　−1008　　10 × 79　　−1911　　3 × 24, $\Delta H_r^0$(298 K.) = −1621 kJ mol$^{-1}$.

Thus, excited state monofluorine will remove the oxides by way of the trifluoride, and ground state monofluorine will remove the oxides by way of the tetrafluoride.

[II-432] ZrCl$_2$(cr) + 9F(g) → ZrF$_3$(cr) + 2ClF$_3$(g)

-continued

|  |  |  |  |  |
|---|---|---|---|---|
| −431 | 9 × 79 | −1402 | 2 × −159, | $\Delta H_r^0(298 K.) = -2000$ kJ mol$^{-1}$, |
| −386 | 9 × 62 | −1326 | 2 × −119, | $\Delta G_r^0(298 K.) = -1736$ kJ mol$^{-1}$ |

[II-433] $ZrCl_3(cr) + 12F(g) \rightarrow ZrF_3(cr) + 3ClF_3(g)$

|  |  |  |  |  |
|---|---|---|---|---|
| −714 | 12 × 79 | −1402 | 3 × −159, | $\Delta H_r^0(298 K.) = -2113$ kJ mol$^{-1}$ |
| −646 | 12 × 62 | −1326 | 3 × −119, | $\Delta G_r^0(298 K.) = -1781$ kJ mol$^{-1}$, |

[II-434] $ZrCl_4(cr) + 15F(g) \rightarrow ZrF_3(cr) + 4ClF_3(g)$

|  |  |  |  |  |
|---|---|---|---|---|
| −981 | 15 × 79 | −1402 | 4 × −159, | $\Delta H_r^0(298 K.) = -2242$ kJ mol$^{-1}$ |
| −890 | 15 × 62 | −1326 | 4 × −119, | $\Delta G_r^0(298 K.) = -1842$ kJ mol$^{-1}$ | and

[II-435] $ZrH_2(cr) + 5F(g) \rightarrow ZrF_3(cr) + 2HF(g)$

|  |  |  |  |  |
|---|---|---|---|---|
| −169 | 5 × 79 | −1402 | 2 × −272, | $\Delta H_r^0(298 K.) = -2172$ kJ mol$^{-1}$ |
| −129 | 5 × 62 | −1326 | 2 × −275, | $\Delta G_r^0(298 K.) = -2057$ kJ mol$^{-1}$, |

[II-436] $ZrO_2(cr) + 6H(g) \rightarrow ZrH_2(cr) + 2H_2O(g)$

|  |  |  |  |  |
|---|---|---|---|---|
| −1097 | 6 × 218 | −169 | 2 × −242, | $\Delta H_r^0(298 K.) = -864$ kJ mol$^{-1}$ |
| −1040 | 6 × 203 | −129 | 2 × −229, | $\Delta G_r^0(298 K.) = -765$ kJ mol$^{-1}$, |

[II-437] $ZrO_3(cr) + 8H(g) \rightarrow ZrH_2(cr) + 3H_2O(g)$

|  |  |  |  |  |
|---|---|---|---|---|
| −1008 | 8 × 218 | −169 | 3 × −242, | $\Delta H_r^0(298 K.) = -1631$ kJ mol$^{-1}$, |

[II-438] $ZrCl_2(cr) + 4H(g) \rightarrow ZrH_2(cr) + 2HCl(g)$

|  |  |  |  |  |
|---|---|---|---|---|
| −431 | 4 × 218 | −169 | 2 × −92, | $\Delta H_r^0(298 K.) = -794$ kJ mol$^{-1}$ |
| −386 | 4 × 203 | −129 | 2 × −95, | $\Delta G_r^0(298 K.) = -745$ kJ mol$^{-1}$, |

[II-439] $ZrCl_3(cr) + 5H(g) \rightarrow ZrH_2(cr) + 3HCl(g)$

|  |  |  |  |  |
|---|---|---|---|---|
| −714 | 5 × 218 | −169 | 3 × −92, | $\Delta H_r^0(298 K.) = -821$ kJ mol$^{-1}$ |
| −646 | 5 × 203 | −129 | 3 × −95, | $\Delta G_r^0(298 K.) = -783$ kJ mol$^{-1}$, |

[II-440] $ZrCl_4(cr) + 6H(g) \rightarrow ZrH_2(cr) + 4HCl(g)$

|  |  |  |  |  |
|---|---|---|---|---|
| −981 | 6 × 218 | −169 | 4 × −92, | $\Delta H_r^0(298 K.) = -864$ kJ mol$^{-1}$ |
| −890 | 6 × 203 | −129 | 4 × −95, | $\Delta G_r^0(298 K.) = -837$ kJ mol$^{-1}$, |

[II-441] $ZrF_2(cr) + 4H(g) \rightarrow ZrH_2(cr) + 2HF(g)$

|  |  |  |  |  |
|---|---|---|---|---|
| −962 | 4 × 218 | −169 | 2 × −272, | $\Delta H_r^0(298 K.) = -623$ kJ mol$^{-1}$ |
| −913 | 4 × 203 | −129 | 2 × −275, | $\Delta G_r^0(298 K.) = -578$ kJ mol$^{-1}$, |

[II-442] $ZrF_3(cr) + 5H(g) \rightarrow ZrH_2(cr) + 3HF(g)$

|  |  |  |  |  |
|---|---|---|---|---|
| −1402 | 5 × 218 | −169 | 3 × −272, | $\Delta H_r^0(298 K.) = -673$ kJ mol$^{-1}$ |
| −1326 | 5 × 203 | −129 | 3 × −275, | $\Delta G_r^0(298 K.) = -643$ kJ mol$^{-1}$ | and

[II-443] $ZrF_4(cr) + 6H(g) \rightarrow ZrH_2(cr) + 4HF(g)$

|  |  |  |  |  |
|---|---|---|---|---|
| −1911 | 6 × 218 | −168 | 4 × −272, | $\Delta H_r^0(298 K.) = -653$ kJ mol$^{-1}$ |
| −1810 | 6 × 203 | −129 | 4 × −275, | $\Delta G_r^0(298 K.) = -637$ kJ mol$^{-1}$. |

Thus, we have the choice of three procedures for the volatilization of zirconium species:

O +F
H+F
F+(in the absence of ZrF$_4$).

4. HAFNIUM

The paucity of thermodynamic data on hafnium species precludes the extensive analyses which are possible for titanium and zirconium. It is, however, well known that zirconium and hafnium are quite similar in their chemistries. This can be seen by comparing the available thermodynamic data for hafnium with those of zirconium. Consider a given datum for hafnium from which has been subtracted the corresponding datum for zirconium. The difference varies from +4 kJ mol$^{-1}$ (gaseous MF$_4$) to −57 kJ mol$^{-1}$ (crystalline MO$_2$) for the enthalpies of formation. The average for the absolute values for the difference is 19 kJ mol$^{-1}$. If we assumed that this difference applies to the dihydride, then $$\Delta H_f^0(HfH_2(cr), 298K) = -169 \pm 19 kJ\ mol^{-1}.$$

We shall use the value −188 kJ mol$^{-1}$ when HfH$_2$ is a reactant and −150 kJ mol$^{-1}$ when it is a product.

[II-444] $Hf(cr) + O(g) \rightarrow HfO(g)$

|  |  |  |  |
|---|---|---|---|
| 0 | 249 |  | 50, $\Delta H_r^0(298 K.) = -199$ kJ mol$^{-1}$, |

[II-445] $Hf(cr) + 2O(g) \rightarrow HfO_2(cr)$

|  |  |  |  |
|---|---|---|---|
| 0 | 2 × 249 | −1145 | $\Delta H_r^0(298 K.) = -1643$ kJ mol$^{-1}$ |
| 0 | 2 × 232 | −1088, | $\Delta G_r^0(298 K.) = -1552$ kJ mol$^{-1}$, |

[II-446] $HfCl_4(cr) + 10O(g) \rightarrow HfO_2(cr) + 4ClO_2(g)$

|  |  |  |  |  |
|---|---|---|---|---|
| −990 | 10 × 249 | −1145 | 4 × 102, | $\Delta H_r^0(298 K.) = -2237$ kJ mol$^{-1}$ |
| −901 | 10 × 232 | −1088 | 4 × 120, | $\Delta G_r^0(298 K.) = -2027$ kJ mol$^{-1}$, |

[II-447] $HfF_4(cr) + 10O(g) \rightarrow HfO_2(cr) + 4FO_2(g)$

|  |  |  |  |  |
|---|---|---|---|---|
| −1930 | 10 × 249 | −1145 | 4 × 13, | $\Delta H_r^0(298 K.) = -1653$ kJ mol$^{-1}$ |
| −1830 | 10 × 232 | −1088 | 4 × 27, | $\Delta G_r^0(298 K.) = -1470$ kJ mol$^{-1}$, | and

[II-448] $HfH_2(cr) + 3O(g) \rightarrow HfO_2(cr) + H_2O(g)$

|  |  |  |  |  |
|---|---|---|---|---|
| −188 | 3 × 249 | −1145 | −242, | $\Delta H_r^0(298 K.) = -1946$ kJ mol$^{-1}$, |

[II-449] $Hf(cr) + 4F(g) \rightarrow HfF_4(cr)$

|  |  |  |  |
|---|---|---|---|
| 0 | 4 × 79 | −1930, | $\Delta H_r^0(298 K.) = -2246$ kJ mol$^{-1}$ |

-continued

[II-450] $HfO_2(cr) + 8F(g) \rightarrow HfF_4(cr) + 2OF_2(g)$
```
  0       4 × 62    −1830,  ΔG_f^0(298
                             K.) = −2078 kJ
                             mol^{-1},
```

[II-450] $HfO_2(cr) + 8F(g) \rightarrow HfF_4(cr) + 2OF_2(g)$
```
−1145    8 × 79    −1930    2 × 24,  ΔH_r^0(298 K.) = −1369 kJ mol^{-1}
−1088    8 × 62    −1830    2 × 42,
                            ΔG_f^0(298
                            K.) =
                            −1154 kJ
                            mol^{-1},
```

[II-451] $HfCl_4(cr) + 16F(g) \rightarrow HfF_4(cr) + 4ClF_3(g)$
```
−990    16 × 79    −1930    4 × ΔH_r^0(298 K.) = −2840 kJ mol^{-1}
                            −159,
−901    16 × 62    −1830    4 ×
                            −119,
                            ΔG_f^0(298
                            K.) =
                            −2397 kJ
                            mol^{-1}
``` and

[II-452] $HfH_2(cr) + 6F(g) \rightarrow HfF_4(cr) + 2HF(g)$
```
−188    6 × 79    −1930    2 × ΔH_r^0(298 K.) = −2760 kJ mol^{-1}
                           −272,
```

Since the 'times four' criterion for the volatilization of hafnium tetrafluoride is 1040 kJ mol$^{-1}$, monofluorine clearly is an effective volatilizing reagent for these hafnium species.

[II-453] $Hf(cr) + 2H(g) \rightarrow HfH_2(cr)$
```
  0    2 × 218              −150,  ΔH_r^0(298 K.) = −586 kJ mol^{-1},
```
[II-454] $HfO_2(cr) + 6H(g) \rightarrow HfH_2(cr) + H_2O(g)$
```
−1145   6 × 218   −150    2 × −242,  ΔH_r^0(298 K.) = −797 kJ mol^{-1},
```
[II-455] $HfCl_4(cr) + 6H(g) \rightarrow HfH_2(cr) + 4HCl(g)$
```
−990    6 × 218   −150    4 × −92,   ΔH_r^0(298 K.) = −836 kJ mol^{-1}
```
and
[II-456] $HfF_4(cr) + 6H(g) \rightarrow HfH_2(cr) + 4HF(g)$
```
−1930   6 × 218   −150    4 × −272,  ΔH_r^0(298 K.) = −616 kJ mol^{-1}.
```

As was the case for titanium and zirconium we have the choice of three procedures for the volatilization of hafnium species:

O+F
H+F
F (in the absence of HfF$_4$).

L. Group V B.

By the criterion of [II-1] VF$_5$(l) will volatilize spontaneously in the Apparatus. By the criterion of [II-2] VCl$_4$(l), NbF$_5$(cf), TaCl$_5$(cf) and (CH$_3$)$_5$Ta(l) will volatilize spontaneously in the Apparatus. Furthermore, the enthalpy of sublimation of niobium pentafluoride is 74 kJ mol$^{-1}$ with a 'times four' criterion of 296 kJ mol$^1$.

Since we do not know the enthapy of formation of tantalum tetrafluoride, we cannot calculate the 'times four' criterion for it. We note, however,

| SPECIES | M.P. (°C.) | B.P. (°C.) |
|---|---|---|
| VF$_5$ | 19.5 | 47.9 |
| NbF$_5$ | 76 | 225 |
| TaF$_5$ | 95-97 | 229 |

(Ref. <II-26>).

TABLE II-15
GROUP VB THERMODYNAMIC DATA
$\Delta H_f^0(298 K.)/\Delta G_f^0(298 K.)$

| SPECIES | | V (kJ mol$^{-1}$) | Nb | Ta |
|---|---|---|---|---|
| MO | (cr) | −432/−404 | −420/−392 | +192/+164 |
| | (l) | −371/−352 | −337/−320 | |
| | (g) | +128/+98 | +199/+169 | +251a/+222a |
| M$_2$O$_3$ | (cr) | −1219/−1139 | | |
| | (l) | −1093/−1029 | | |
| MO$_2$ | (cr) | −714/−659 | −795/−739 | |
| | (l) | −666/−662 | −711/−667 | |
| | (g) | −233/−232 | −200/−209 | −201/−211 |
| M$_2$O$_5$ | (cr) | −1551/−1419 | −1900/−1766 | −2046/−1911 |
| | (l) | −1491/−1378 | −1831/−1707 | −1957/−1834 |
| MCl$_2$ | (cr) | −452a/−406a | | |
| | (g) | −256a/— | | |
| MCl$_3$ | (cr) | −581a/−511a | −360a/— | −533a/— |
| MCl$_4$ | (cr) | | −694a/— | −702a/— |
| | (l) | −569a/−504a | | |
| | (g) | −526a/−492a | 561a/— | 561a/— |
| MCl$_5$ | (cr) | | −797/−684 | −858/−746 |
| | (l) | | −773/−674 | −834/−736 |
| | (g) | | | −765/−709 |
| MF$_4$ | (cr) | −1403a/— | | |
| MF$_5$ | (cr) | | −1814/−1699 | −1904a/— |
| | (l) | −1480a/−1373a | | |
| | (g) | −1434a/−1370a | −1740/−1674 | |
| M(CO)$_6$ | (g) | −987a/— | | |
| (CH$_3$)$_5$M | (l) | | | +170b/— |
| | (g) | | | +212b/— |

(a, Ref. <B>, b, Ref. <II-15>).

Since the data for the niobium and tantalum pentafluorides, are rather close, we can safely assume that the 'times four' criterion is less than 600 kJ mol$^{-1}$.

2. VANADIUM

[II-457] $V(cr) + O(g) \rightarrow VO(cr)$

-continued

|  |  |  |  |  |
|---|---|---|---|---|
|  | 0 | 249 | −432, | $\Delta H_r^0$(298 K.) = −681 kJ mol$^{-1}$ |
|  | 0 | 232 | −404, | $\Delta G_r^0$(298 K.) = −336 kJ mol$^{-1}$, |
| [II-458] | VO(cr) + 0.5O(g) → 0.5V$_2$O$_3$(cr) | | | |
|  | −432 | 0.5 × 249 | 0.5 × −1219, | $\Delta H_r^0$(298 K.) = −302 kJ mol$^{-1}$ |
|  | −404 | 0.5 × 232 | 0.5 × −1139, | $\Delta G_r^0$(298 K.) = −282 kJ mol$^{-1}$, |
| [II-459] | 0.5V$_2$O$_3$(cr) + 0.5O(g) → VO$_2$(cr) | | | |
|  | 0.5 × −1219 | 0.5 × 249 | −714, | $\Delta H_r^0$(298 K.) = −229 kJ mol$^{-1}$ |
|  | 0.5 × −1139 | 0.5 × 232 | −659, | $\Delta G_r^0$(298 K.) = −206 kJ mol$^{-1}$ |
| and | | | | |
| [II-460] | VO$_2$(cr) + 0.5O(g) → 0.5V$_2$O$_5$(cr) | | | |
|  | −714 | 0.5 × 249 | 0.5 × −1551, | $\Delta H_r^0$(298 K.) = −186 kJ mol$^{-1}$ |
|  | −659 | 0.5 × 232 | 0.5 × −1419, | $\Delta G_r^0$(298 K.) = −166 kJ mol$^{-1}$. |

The enthalpy of melting of the monoxide is 61 kJ mol$^{-1}$ with a 'times four' criterion of 244 kJ mol$^{-1}$.

Thus, the product of [II-457] will be the liquid. The enthalpy of melting of divanadium trioxide is 126 kJ mol$^{-1}$ with a 'times four' criterion of 504 kJ mol$^{-1}$. For one-half mole, therefore, the criterion is 252 kJ mol$^{-1}$, and the product of [II-458] is the liquid.

For the dioxide the enthalpy of melting is 48 kJ mol$^{-1}$ with a 'times four' criterion of 192 kJ mol$^{-1}$, and the product of [II-459] is the liquid. The enthalpy of melting of divanadium pentoxide is 60 kJ mol$^{-1}$ with a 'times four' criterion of 240 kJ mol$^{-1}$. For one-half mole, therefore, the criterion is 120 kJ mol$^{-1}$, and the product of [II-460] is the liquid.

The reaction of monoxygen with a solid may yield only a surface 'skin' of oxide. With a liquid the reaction will go to completion. Thus, for any sufficiently exothermic reaction with monoxygen the product will be divanadium pentoxide.

|  |  |  |  |  |  |
|---|---|---|---|---|---|
| [II-461] | VCl$_2$(cr) + 6.5O(g) → 0.5V$_2$O$_5$(cr) + 2ClO$_2$(g) | | | | |
|  | −452 | 6.5 × 249 | 0.5 × −1551 | 2 × 102, | $\Delta H_r^0$(298 K.) = −1738 kJ mol$^{-1}$ |
|  | −406 | 6.5 × 232 | 0.5 × −1419 | 2 × 120, | $\Delta G_r^0$(298 K.) = −1572 kJ mol$^{-1}$, |
| [II-462] | VCl$_3$(cr) + 8.5O(g) → 0.5V$_2$O$_5$(cr) + 3ClO$_2$(g) | | | | |
|  | −581 | 8.5 × 249 | 0.5 × −1551 | 3 × 102, | $\Delta H_r^0$(298 K.) = −2005 kJ mol$^{-1}$ |
|  | −511 | 8.5 × 232 | 0.5 × −1419 | 3 × 120, | $\Delta G_r^0$(298 K.) = −1810 kJ mol$^{-1}$ |
| and | | | | | |
| [II-463] | VF$_4$(cr) + 10.5O(g) → 0.5V$_2$O$_5$(cr) + 4FO$_2$(g) | | | | |
|  | −1403 | 10.5 × 249 | 0.5 × −1551 | 4 × 13, | $\Delta H_r^0$(298 K.) = −1935 kJ mol$^{-1}$. |

Thus, monoxygen will convert all of the halides to the molten divanadium pentoxide which will solidify at the end of the reaction.

|  |  |  |  |  |
|---|---|---|---|---|
| [II-464] | V(cr) + F(g) → VF$_4$(cr) | | | |
|  | 0 | 4 × 79 | −1403, | $\Delta H_r^0$(298 K.) = −1719 kJ mol$^{-1}$ |
| and | | | | |
| [II-465] | VF$_4$(cr) + F(g) → VF$_5$(l) | | | |
|  | −1403 | 79 | −1480, | $\Delta H_r^0$(298 K.) = −156 kJ mol$^{-1}$. |

Thus, any reaction with monofluorine which produces the tetrafluoride will proceed further to produce the liquid pentafluoride. As noted above the pentafluoride will spontaneously vaporize in the Apparatus.

|  |  |  |  |  |  |
|---|---|---|---|---|---|
| [II-466] | VO(cr) + 7F(g) → VF$_5$(l) + OF$_2$(g) | | | | |
|  | −432 | 7 × 79 | −1480 | 24, | $\Delta H_r^0$(298 K.) = −1577 kJ mol$^{-1}$ |
|  | −404 | 7 × 62 | −1373 | 42, | $\Delta G_r^0$(298 K.) = −1361 kJ mol$^{-1}$, |
| [II-467] | V$_2$O$_3$(cr) + 16F(g) → 2VF$_5$(l) + 3OF$_2$(g) | | | | |
|  | −1219 | 16 × 79 | 2 × −1480 | 3 × 24, | $\Delta H_r^0$(298 K.) = −2933 kJ mol$^{-1}$ |
|  | −1139 | 16 × 62 | 2 × −1373 | 3 × 42, | $\Delta G_r^0$(298 K.) = −2473 kJ mol$^{-1}$, |
| [II-468] | VO$_2$(cr) + 9F(g) → VF$_5$(l) + 2OF$_2$(g) | | | | |
|  | −714 | 9 × 79 | −1480 | 2 × 24, | $\Delta H_r^0$(298 K.) = −1429 kJ mol$^{-1}$ |
|  | −659 | 9 × 62 | −1373 | 2 × 42, | $\Delta G_r^0$(298 K.) = −1188 kJ mol$^{-1}$, |
| [II-469] | V$_2$O$_5$(cr) + 20F(g) → 2VF$_5$(l) + 5OF$_2$(g) | | | | |
|  | −1551 | 20 × 79 | 2 × −1480 | 5 × 24, | $\Delta H_r^0$(298 K.) = −2869 kJ mol$^{-1}$ |
|  | −1419 | 20 × 62 | 2 × −1373 | 5 × 42, | $\Delta G_r^0$(298 K.) = −2357 kJ mol$^{-1}$, |
| [II-470] | VCl$_2$(cr) + 11F(g) → VF$_5$(l) + 2ClF$_3$(g) | | | | |
|  | −452 | 11 × 79 | −1480 | 2 × −159, | $\Delta H_r^0$(298 K.) = −2215 kJ mol$^{-1}$ |

```
           −406   11 × 62    −1373      2 × −119,
                                        ΔG_r^0(298
                                         K.) =
                                        −1887 kJ
                                         mol^−1
``` and

[II-471]  $VCl_3(cr) + 14F(g) \rightarrow VF_5(l) + 3ClF_3(g)$
```
           −581   14 × 79    −1480      3 × −159,  ΔH_r^0(298 K.) = −2482 kJ mol^−1
           −511   14 × 62    −1373      3 × −119,
                                        ΔH_r^0(298
                                         K.) =
                                        −2087 kJ
                                         mol^−1.
```

Thus, both O+F and F are effective procedures for the volatilization of vanadium species.

Since vanadium hexacarbonyl is a highly volatile compound, it is worth investigating whether carbon monoxide is an effective volatilizing reagent for vanadium species.

The enthalpy of melting of the monoxide is 83 kJ mol$^{-1}$ with a 'times four' criterion of 332 kJ mol$^{-1}$. Thus, the product of [II-480] will be the liquid. For the dioxide the enthalpy of melting is 84 kJ mol$^{-1}$ with a 'times four' criterion of 336 kJ mol$^{-1}$, and the product of [II-481] will be the liquid. The enthalpy of melting of

[II-472]  $V(cr) + 6CO(g) \rightarrow V(CO)_6(g)$
```
             0      6 × −111         −987,   ΔH_r^0(298 K.) = −1653 kJ mol^−1,
```
[II-473]  $VO(cr) + 7CO(g) \rightarrow V(CO)_6(g) + CO_2(g)$
```
           −432    7 × −111    −987    −394,  ΔH_r^0(298 K.) = −1726 kJ mol^−1,
```
[II-474]  $V_2O_3(cr) + 15CO(g) \rightarrow 2V(CO)_6(g) + 3CO_2(g)$
```
          −1219   15 × −111   2 × −987   3 × −394,  ΔH_r^0(298 K.) = −3602 kJ mol^−1,
```
[II-475]  $VO_2(cr) + 8CO(g) \rightarrow V(CO)_6(g) + 2CO_2(g)$
```
           −714    8 × −111    −987    2 × −394,  ΔH_r^0(298 K.) = −1949 kJ mol^−1,
```
[II-476]  $V_2O_5 + 17CO(g) \rightarrow 2V(CO)_6(g) + 5CO_2(g)$
```
          −1551   17 × −111   2 × −987   5 × −394,  ΔH_r^0(298 K.) = −4280 kJ mol^−1
```
[II-477]  $VCl_2(cr) + 8CO(g) \rightarrow V(CO)_6(g) + 2COCl(g)$
```
           −452    8 × −111    −987    2 × 63,   ΔH_r^0(298 K.) = −1594 kJ mol^−1
```
[II-478]  $VCl_3(cr) + 9CO(g) \rightarrow V(CO)_6(g) + 3COCl(g)$
```
           −581    9 × −111    −987    3 × −63,  ΔH_r^0(298 K.) = −1594 kJ mol^−1
```
and
[II-479]  $VF_4(cr) + 10CO(g) \rightarrow V(CO)_6(g) + 4COF(g)$
```
          −1403   10 × −111    −987    4 × −172, ΔH_r^0(298 K.) = −1382 kJ mol^−1.
```

Thus, we have the choice of four procedures for the volatilization of vanadium species:

O+F
F
O+CO
CO

3. NIOBIUM

[II-480]  $Nb(cr) + O(g) \rightarrow NbO(cr)$
```
            0     249      −420,  ΔH_r^0(298 K.) = −669 kJ mol^−1
            0     232      −392,
                         ΔG_r^0(298 K.)
                          = −595 kJ
                           mol^−1,
```
[II-481]  $NbO(cr) + O(g) \rightarrow NbO_2(g)$
```
          −420   249       −795,  ΔH_r^0(298 K.) = −624 kJ mol^−1
          −392   232       −739,  ΔG_r^0(298 K.) = −579 kJ mol^−1,
```
and
[II-482]  $NbO_2(cr) + 0.5O(g) \rightarrow 0.5Nb_2O_5(cr)$
```
          −795   0.5 × 249   0.5 × −1900,  ΔH_r^0(298 K.) = −280 kJ mol^−1
          −739   0.5 × 232   0.5 × −1766,  ΔG_r^0(298 K.) = −260 kJ mol^−1.
``` diniobium pentoxide is 69 kJ mol$^{-1}$ with a 'times four' criterion of 276 kJ mol$^{-1}$. For one-half mole, therefore, the criterion is 138 kJ mol$^{-1}$, and the product of [II-482] is the liquid.

[II-483]  $NbCl_3(cr) + 8.5O(g) \rightarrow 0.5Nb_2O_5(cr) + 3ClO_2(g)$
```
           −360   8.5 × 249   0.5 × −1900   3 × 102,  ΔH_r^0(298 K.) = −2400 kJ mol^−1,
```
[II-484]  $NbCl_4(cr) + 10.5O(g) \rightarrow 0.5Nb_2O_5(cr) + 4ClO_2(g)$
```
           −694   10.5 × 249  0.5 × −1900   4 × 102,  ΔH_r^0(298 K.) = −2462 kJ mol^−1,
```
[II-485]  $NbCl_5(cr) + 12.5O(g) \rightarrow 0.5Nb_2O_5(cr) + 5ClO_2(g)$
```
           −797   12.5 × 249  0.5 × −1900   5 × 102,  ΔH_r^0(298 K.) = −2756 kJ mol^−1
           −684   12.5 × 232  0.5 × 1766    5 × 120,  ΔG_r^0(298 K.) = −2499 kJ mol^−1
```
and
[II-486]  $NbF_5(cr) + 12.5O(g) \rightarrow 0.5Nb_2O_5(cr) + 5FO_2(g)$
```
          −1814   12.5 × 249  0.5 × −1900   5 × 24,   ΔH_r^0(298 K.) = −2128 kJ mol^−1
          −1699   12.5 × 232  0.5 × −1766   5 × 42,   ΔG_r^0(298 K.) = −1874 kJ mol^−1.
```

Thus, monoxygen will convert all of the halides to the molten diniobium pentoxide which will solidify at the end of the reaction.

[II-487] $Nb(cr) + 5F(g) \rightarrow NbF_5(cr)$
  0   $5 \times 79$   $-1814$, $\Delta H_r^0(298\ K.) = -2209\ kJ\ mol^{-1}$
  0   $5 \times 62$   $-1699$, $\Delta G_r^0(298\ K.) = -2009\ kJ\ mol^{-1}$,
[II-488] $NbO(cr) + 7F(g) \rightarrow NbF_5(cr) + OF_2(g)$
  $-420$   $7 \times 79$   $-1814$   $24$, $\Delta H_r^0(298\ K.) = -1923\ kJ\ mol^{-1}$
  $-392$   $7 \times 62$   $-1699$   $42$, $\Delta G_r^0(298\ K.) = -1699\ kJ\ mol^{-1}$,
[II-489] $NbO_2(cr) + 9F(g) \rightarrow NbF_5(cr) + 2OF_2(g)$
  $-795$   $9 \times 79$   $-1814$   $2 \times 24$, $\Delta H_r^0(298\ K.) = -1682\ kJ\ mol^{-1}$
  $-739$   $9 \times 62$   $-1699$   $2 \times 42$, $\Delta G_r^0(298\ K.) = -1434\ kJ\ mol^{-1}$,
[II-490] $Nb_2O_5(cr) + 20F(g) \rightarrow 2NbF_5(cr) + 5OF_2(g)$
  $-1900$   $20 \times 79$   $2 \times -1814$   $5 \times 24$, $\Delta H_r^0(298\ K.) = -3188\ kJ\ mol^{-1}$
  $-1716$   $20 \times 62$   $2 \times -1699$   $5 \times 42$, $\Delta G_r^0(298\ K.) = -2662\ kJ\ mol^{-1}$,
[II-491] $NbCl_3(cr) + 14F(g) \rightarrow NbF_5(cr) + 3ClF_3(g)$
  $-360$   $14 \times 79$   $-1814$   $3 \times -159$, $\Delta H_r^0(298\ K.) = -3037\ kJ\ mol^{-1}$
and
[II-492] $NbCl_5(cr) + 20F(g) \rightarrow NbF_5(cr) + 5ClF_3(g)$
  $-797$   $20 \times 79$   $-1814$   $5 \times -159$, $\Delta H_r^0(298\ K.) = -3392\ kJ\ mol^{-1}$
  $-684$   $20 \times 62$   $-1699$   $5 \times -119$, $\Delta G_r^0(298\ K.) = -2850\ kJ\ mol^{-1}$.

Thus, we have the choice of two procedures for the volatilization of niobium species:
O+F
F

4. TANTALUM

[II-493] $Ta(cr) + O(g) \rightarrow TaO(cr)$
  0   $249$   $192$, $\Delta H_r^0(298\ K.) = -57\ kJ\ mol^{-1}$
  0   $203$   $164$, $\Delta G_r^0(298\ K.) = -39\ kJ\ mol^{-1}$,
and
[II-945] $TaO(cr) + 1.5O(g) \rightarrow 0.5Ta_2O_5(cr)$ $192$   $1.5 \times 249$   $0.5 \times -2046$, $\Delta H_r^0(298\ K.) = -1588\ kJ\ mol^{-1}$ $164$   $1.5 \times 203$   $0.5 \times -1911$, $\Delta G_r^0(298\ K.) = -1424\ kJ\ mol^{-1}$.

The enthalpy of melting of ditantalum pentoxide is 89 kJ mol$^{-1}$ with a 'times four' criterion of 356 kJ mol$^{-1}$.

[II-495] $TaCl_3(cr) + 8.5O(g) \rightarrow 0.5Ta_2O_5(cr) + 3ClO_2(g)$
  $-553$   $8.5 \times 249$   $0.5 \times -2046$   $3 \times 102$, $\Delta H_r^0(298\ K.) = -2280\ kJ\ mol^{-1}$,
[II-496] $TaCl_4(cr) + 10.5O(g) \rightarrow 0.5Ta_2O_5(cr) + 4ClO_2(g)$
  $-702$   $10.5 \times 249$   $0.5 \times -2046$   $4 \times 102$, $\Delta H_r^0(298\ K.) = -2528\ kJ\ mol^{-1}$,
[II-497] $TaCl_5(cr) + 12.5O(g) \rightarrow 0.5Ta_2O_5(cr) + 5ClO_2(g)$
  $-858$   $12.5 \times 249$   $0.5 \times -2046$   $5 \times 102$, $\Delta H_r^0(298\ K.) = -2768\ kJ\ mol^{-1}$
  $-746$   $12.5 \times 232$   $0.5 \times -1911$   $5 \times 120$, $\Delta G_r^0(298\ K.) = -2510\ kJ\ mol^{-1}$
and
[II-498] $TaF_5(cr) + 12.5O(g) \rightarrow 0.5Ta_2O_5(cr) + 5FO_2(g)$
  $-1904$   $12.5 \times 249$   $0.5 \times -2046$   $5 \times 13$, $\Delta H_r^0(298\ K.) = -2166\ kJ\ mol^{-1}$.

Thus, nonoxygen will convert all of the halides to ditantalum pentoxide.

[II-499] $Ta(cr) + 5(g) \rightarrow TaF_5(cr)$
  0   $5 \times 79$   $-1904$, $\Delta H_r^0(298\ K.) = -2299\ kJ\ mol^{-1}$,
[II-500] $TaO(cr) + 7F(g) \rightarrow TaF_5(cr) + OF_2(g)$
  $192$   $7 \times 79$   $-1904$   $24$, $\Delta H_r^0(298\ K.) = -2625\ kJ\ mol^{-1}$,
[II-501] $Ta_2O_5(cr) + 20F(g) \rightarrow TaF_5(cr) + 5OF_2(g)$
  $-2046$   $20 \times 79$   $-1904$   $5 \times 24$, $\Delta H_r^0(298\ K.) = -1318\ kJ\ mol^{-1}$,
[II-502] $TaCl_3(cr) + 14F(g) \rightarrow TaF_5(cr) + 3ClF_3(g)$
  $-533$   $14 \times 79$   $-1904$   $3 \times -159$, $\Delta H_r^0(298\ K.) = -2954\ kJ\ mol^{-1}$,
[II-503] $TaCl_4(cr) + 17F(g) \rightarrow TaF_5(cr) + 4ClF_3(g)$
  $-702$   $17 \times 79$   $-1904$   $4 \times -159$, $\Delta H_r^0(298\ K.) = -3181\ kJ\ mol^{-1}$
and
[II-504] $TaCl_5(cr) + 20F(g) \rightarrow TaF_5(cr) + 5ClF_3(g)$
  $-858$   $20 \times 79$   $-1904$   $5 \times -159$, $\Delta H_r^0(298\ K.) = -3421\ kJ\ mol^{-1}$.

Thus, we see that with the monofluorine reactions there is no difficulty in meeting the assumed 'times four' criterion for the volatilization of tantalum pentafluoride.

[II-505] $Ta(cr) + 5\ CH_3(g) \rightarrow (CH_3)_5Ta(l)$
  0   $5 \times 146$   $170$, $\Delta H_r^0(298\ K.) = .560\ kJ\ mol^{-1}$,
[II-506] $TaO(cr) + 7.CH_3(g) \rightarrow (CH_3)_5Ta(l) + (CH_3)_2O(g)$
  $192$   $7 \times 146$   $170$   $-184$, $\Delta H_r^0(298\ K.) = -1228\ kJ\ mol^{-1}$,
[II-507] $Ta_2O_5(cr) + 20\ CH_3(g) \rightarrow 2\ (CH_3)_5Ta(l) + 5\ (CH_3)_2O(g)$
  $-2046$   $20 \times 146$   $2 \times 170$   $5 \times -184$, $\Delta H_r^0(298\ K.) = -1454\ kJ\ mol^{-1}$,
[II-508] $TaCl_3(cr) + 8\ CH_3(g) \rightarrow (CH_3)_5Ta(l) + 3\ CH_3Cl(g)$
  $-533$   $8 \times 146$   $170$   $3 \times -84$, $\Delta H_r^0(298\ K.) = -717\ kJ\ mol^{-1}$,
[II-509] $TaCl_4(cr) + 9\ CH_3(g) \rightarrow (CH_3)_5Ta(l) + 4\ CH_3Cl(g)$
  $-702$   $9 \times 146$   $170$   $4 \times -84$, $\Delta H_r^0(298\ K.) = -778\ kJ\ mol^{-1}$,
[II-510] $TaCl_5(cr) + 10\ CH_3(g) \rightarrow (CH_3)_5Ta(l) + 5\ CH_3Cl(g)$ -continued −858  10 × 146  170  5 × −84, $\Delta H_r^0$(298 K.) = −852 kJ mol$^{-1}$ and

[II-511] TaF$_5$(cr) + 10 CH$_3$(g) → (CH$_3$)$_5$Ta(l) + 5 CH$_3$F(g)
−1904  10 × 146  170  5 × −234, $\Delta H_r^0$(298 K.) = .556 kJ mol$^{-1}$.

The enthalpy of vaporization of pentamethyltantalum is 42 kJ mol$^{-1}$ with a 'times four' criterion of 168 kJ mol$^{-1}$. Thus, methyl is an effective volatilizing reagent for tantalum species. We, therefore, have the choice of four procedures for the volatilization of tantalum species:

O+F
F (in the absence of Ta F$_5$)
O+CH$_3$
CH$_3$.

M. Group VI B.

1. THERMODYNAMICS

TABLE II-16

GROUP VI B THERMODYNAMIC DATA
$\Delta H_f^0$(298 K.)/$\Delta G_f^0$(298 K.)
(kJ mol$^{-1}$)

| SPECIES | Cr | Mo | W |
|---|---|---|---|
| MO | | | |
| (cr) | | | −272b/— |
| (g) | +188/+155 | +311/+278 | +425/+391 |
| M$_2$O$_3$ | | | |
| (cr) | −1135/−1053 | | |
| (l) | −1018/−950 | | |
| MO$_2$ | | | |
| (cr) | −598a/— | −588/−532 | −590/−534 |
| (g) | −75a/−87a | −8/−21 | +77/+62 |
| MO$_3$ | | | |
| (cr) | −590a/— | −745/−668 | −842/−764 |
| (l) | | −703/−638 | −789/−718 |
| (g) | −293/−273 | −346/−331 | −293/−277 |
| MCl | | | |
| (g) | | | +553/+518 |
| MCl$_2$ | | | |
| (cr) | −395a/−356a | −282a/— | −257/−220 |
| (g) | −128a/— | | −13/−29 |
| MCl$_3$ | | | |
| (cr) | −556a/−486a | −387a/— | −357b/— |
| (g) | | | −37b/— |
| MCl$_4$ | | | |
| (cr) | | −477/−402 | −443/−359 |
| (l) | | −463/−394 | |
| (g) | −427a/— | −384/−354 | −336/−306 |
| MCl$_5$ | | | |
| (cr) | | −527/−423 | −512/−402 |
| (l) | | −510/−417 | −495/−393 |
| (g) | | −448/−391 | −412/−357 |
| MCl$_6$ | | | |
| (cr) | | −523/−391 | −594/−456 |
| (l) | | | −569/−445 |
| (g) | | −439/−356 | −494/−409 |
| MF (g) | | +283/+248 | +386/+351 |

TABLE II-16-continued

GROUP VI B THERMODYNAMIC DATA
$\Delta H_f^0$(298 K.)/$\Delta G_f^0$(298 K.)
(kJ mol$^{-1}$)

| SPECIES | Cr | Mo | W |
|---|---|---|---|
| MF$_2$ | | | |
| (cr) | −778a/— | | −608b/— |
| (g) | −414a/— | −163/−175 | −188b/— |
| MF$_3$ | | | |
| (cr) | −1159a/−1088a | | |
| (g) | | −607/−596 | −608b/— |
| MF$_4$ | | | |
| (cr) | −1247a/— | | −1208b/— |
| (g) | | −948/−916 | −1030b/— |
| MF$_5$ | | | |
| (cr) | | | −1495b/— |
| (g) | | −1241/−1185 | −1394b/— |
| MF$_6$ | | | |
| (l) | | −1586/−1473 | −1748/−1632 |
| (g) | | −1558/−1472 | −1722/−1632 |
| M(CO)$_6$ | | | |
| (cr) | −1077a/— | −983/−878 | −960b/— |
| (g) | −1006a/— | −912a/−856a | −884b/— |
| (CH$_3$)$_6$M | | | |
| (l) | | | +739c/— |
| (g) | | | +772c/— |

(a, Ref. <B>, b, Ref. <II-27>, c, Ref. <II-15>).

By the criterion of [II-1] MoF$_6$(l), WF$_6$(l) and MO(CO)$_6$(cr) will volatilize spontaneously in the Apparatus. By Ref. <II-23> the enthalpy of sublimation of CrF$_4$ is 82 kJ mol$^{-1}$ with a 'times four' criterion of 328 kJ mol$^{-1}$. The enthalpy of sublimation of Cr(CO)$_6$ is 71 kJ mol$^{-1}$ with a 'times four' criterion of 284 kJ mol$^{-1}$.

The enthalpy of sublimation of WF$_4$ is 178 kJ mol$^{-1}$ with a 'times four' criterion of 712 kJ mol$^{-1}$. The enthalpy of sublimation of WF$_5$ is 101 kJ mol$^{-1}$ with a 'times four' criterion of 40 kJ mol$^{-1}$. For (W(CO)$_6$ the enthalpy of sublimation is 76 kJ mol$^{-1}$ with a 'times four' criterion of 304 kJ mol$^{-1}$, and for (CH$_3$)$_6$W the enthalpy of vaporization is 33 kJ mol$^{-1}$ with a 'times four ' criterion of 132 kJ mol$^{-1}$.

2. CHROMIUM

[II-512] Cr(cr) + O(g) → CrO(g)
0  249  188, $\Delta H_r^0$(298 K.) = −61 kJ mol$^{-1}$
0  232  155, $\Delta G_r^0$(298 K.) = −77 kJ mol$^{-1}$,

[II-513] Cr(cr) + 1.5 O(g) → 0.5 Cr$_2$O$_3$(cr)
0  1.5 × 249  0.5 × −1135, $\Delta H_r^0$(298 K.) = −941 kJ mol$^{-1}$
0  1.5 × 232  0.5 × −1053, $\Delta G_r^0$(298 K.) = −874 kJ mol$^{-1}$,

[II-514] 0.5 Cr$_2$O$_3$(cr) + 0.5 O(g) → CrO$_2$(cr)
0.5 × −1135  0.5 × 249  −598, $\Delta H_r^0$(298 K.) = −155 kJ mol$^{-1}$ and

[II-515] CrO$_2$(cr) + O(g) → CrO$_3$(cr)
−598  249  −590, $\Delta H_r^0$(298 K.) = −241 kJ mol$^{-1}$.

The enthalpy of melting of the sesquioxide is 117 kJ mol$^{-1}$ with a 'times four' criterion of 468 kJ mol$^{-1}$ (234 kJ/half mole). Thus, the product of [II-513] is actually the liquid. The enthalpy of sublimation of the trioxide is 297 kJ mol$^{-1}$ with a 'times four' criterion of 1188 kJ mol$^{-1}$. Since

[II-516] Cr(cr) + 3 O(g) → CrO₃(cr)
         0    3 × 249    −590, ΔH$_r^0$(298 K.) = −1337 kJ mol⁻¹, monoxygen will volatilize chromium, but not the sesquioxide nor the dioxide.

[II-517] CrCl₂(cr) + 7 O(g) → CrO₃(cr) + 2 ClO₂(g)
         −395   7 × 249   −590   2 × 102, ΔH$_r^0$(298 K.) = −1734 kJ mol⁻¹,
[II-518] CrCl₃(cr) + 9 O(g) → CrO₃(cr) + 3 ClO₂(g)
         −556   9 × 249   −590   3 × 102, ΔH$_r^0$(298 K.) = −1969 kJ mol⁻¹,
[II-519] CrF₂(cr) + 7 O(g) → CrO₃(cr) + 2 FO₂(g)
         −778   7 × 249   −590   2 × 13, ΔH$_r^0$(298 K.) = −1529 kJ mol⁻¹,
[II-520] CrF₃(cr) + 9 O(g) → CrO₃(cr) + 3 FO₂(g)
         −1159  9 × 249   −590   3 × 13, ΔH$_r^0$(298 K.) = −1633 kJ mol⁻¹
and
[II-521] CrF₄(cr) + 11 O(g) → CrO₃(cr) + 4 FO₂(g)
         −1247  11 × 249  −590   4 × 13, ΔH$_r^0$(298 K.) = −2030 kJ mol⁻¹.

Thus, monoxygen is an effective volatilizing reagent for the halides. Since it is not an effective volatilizing reagent for the sesquioxide or the dioxide, monoxygen cannot be used by itself.

[II-522] Cr(cr) + 2 F(g) → CrF₂(cr)
         0      2 × 79    −778, ΔH$_r^0$(298 K.) = −936 kJ mol⁻¹,
[II-523] CrF₂(cr) + F(g) → CrF₃(cr)
         −778     79      −1159, ΔH$_r^0$(298 K.) = −460 kJ mol⁻¹,
[II-524] CrF₃(cr) + F(g) → CrF₄(cr)
         −1159    79      −1247, ΔH$_r^0$(298 K.) = −167 kJ mol⁻¹
and
[II-525] Cr(cr) + 4 F(g) → CrF₄(cr)
         0       4 × 79    −1247, ΔH$_r^0$(298 K.) = −1563 kJ mol⁻¹.

Since the 'times four' criterion for the tetrafluoride is 328 kJ mol⁻¹, monofluorine is an effective exchange for chromium.

[II-526] 0.5 Cr₂O₃(cr) + 7 F(g) → CrF₄(cr) + 1.5 OF₂(g)
         0.5 × −1135  7 × 79    −1247    1.5 × 24, ΔH$_r^0$(298 K.) = −1196 kJ mol⁻¹,
[II-527] CrO₂(cr) + 8 F(g) → CrF₄(cr) + 2 OF₂(g)
         −598       8 × 79     −1247    2 × 24, ΔH$_r^0$(298 K.) = −1233 kJ mol⁻¹,
[II-528] CrO₃(cr) + 10 F(g) → CrF₄(cr) + 3 OF₂(g)
         −590       10 × 79    −1247    3 × 24, ΔH$_r^0$(298 K.) = −1375 kJ mol⁻¹,
[II-529] CrCl₂(cr) + 10 F(g) → CrF₄(cr) + 2 ClF₃(g)
         −395       10 × 79    −1247    2 × −159, ΔH$_r^0$(298 K.) = −1960 kJ mol⁻¹
and
[II-530] CrCl₃(cr) + 13 F(g) → CrF₄(cr) + 3 ClF₃(g)
         −556       13 × 79    −1247    3 × −159, ΔH$_r^0$(298 K.) = −2195 kJ mol⁻¹.
[II-531] Cr(cr) + 6 CO(g) → Cr(CO)₆(cr)
         0        6 × −111   −1077, ΔH$_r^0$(298 K.) = −411 kJ mol⁻¹,
[II-532] 0.5 Cr₂O₃(cr) + 7.5 CO(g) → Cr(CO)₆(cr) + 1.5 CO₂(g)
         0.5 × −1135  7.5 × −111   −1077    1.5 × −394, ΔH$_r^0$(298 K.) = −268 kJ mol⁻¹,
[II-533] 0.5 Cr₂O₃(cr) + 7.5 CO*(g) → Cr(CO)₆(cr) + 1.5 CO₂(g)
         0.5 × −1135  7.5 × 564    −1077    1.5 × −394, ΔH$_r^*$(298 K.) = −5330 kJ mol⁻¹,
[II-534] CrO₂(cr) + 8 CO(g) → Cr(CO)₆(cr) + 2 CO₂(g)
         −598       8 × −111    −1077    2 × −394, ΔH$_r^0$(298 K.) = −379 kJ mol⁻¹,
[II-535] CrO₃(cr) + 9 CO(g) → Cr(CO)₆(cr) + 3 CO₂(g)
         −590       9 × −111    −1077    3 × −394, ΔH$_r^0$(298 K.) = −670 kJ mol⁻¹,
[II-536] CrCl₂(cr) + 8 CO(g) → Cr(CO)₆(cr) + 2 COCl(g)
         −395       8 × −111    −1077    2 × −63, ΔH$_r^0$(298 K.) = +80 kJ mol⁻¹,
[II-537] CrCl₂(cr) + 8 CO*(g) → Cr(CO)₆(cr) + 2 COCl(g)
         −395       8 × 564     −1077    2 × −63, ΔH$_r^*$(298 K.) = −5320 kJ mol⁻¹,
[II-538] CrCl₃(cr) + 9 CO(g) → Cr(CO)₆(cr) + 3 COCl(g)
         −556       9 × −111    −1077    3 × −63, ΔH$_r^0$(298 K.) = +289 kJ mol⁻¹,
[II-539] CrCl₃(cr) + 9 CO*(g) → Cr(CO)₆(cr) + 3 COCl(g)
         −556       9 × 564     −1077    3 × −63, ΔH$_r^*$(298 K.) = −5786 kJ mol⁻¹,
[II-540] CrF₂(cr) + 8 CO(g) → Cr(CO)₆(cr) + 2 COF(g)
         −778       8 × −111    −1077    2 × −172, ΔH$_r^0$(298 K.) = +245 kJ mol⁻¹,
[II-541] CrF₂(cr) + 8 CO*(g) → Cr(CO)₆(cr) + 2 COF(g)
         −778       8 × 564     −1077    2 × −172, ΔH$_r^*$(298 K.) = −5155 kJ mol⁻¹,
[II-542] CrF₃(cr) + 9 CO(g) → Cr(CO)₆(cr) + 3 COF(g)
         −1159      9 × −111    −1077    3 × −172, ΔH$_r^0$(298 K.) = +565 kJ mol⁻¹,
[II-543] CrF₃(cr) + 9 CO*(g) → Cr(CO)₆(cr) + 3 COF(g)
         −1159      9 × 564     −1077    3 × −172, ΔH$_r^*$(298 K.) = −5510 J mol⁻¹,
[II-544] CrF₄(cr) + 9 CO(g) → Cr(CO)₆(cr) + 3 COF(g)
         −1247      10 × −111   −1077    4 × −172, ΔH$_r^0$(298 K.) = +592 kJ mol⁻¹
and
[II-545] CrF₄(cr) + 10 CO*(g) → Cr(CO)₆(cr) + 4 COF(g)
         −1247      10 × 564    −1077    4 × −172, ΔH$_r^*$(298 K.) = −6158 kJ mol⁻¹.

Since the 'times four' criterion for chromium carbonyl is 284 kJ mol⁻¹, we have four choices for the procedure for volatilization of the chromium species:
O+F
F (in the absence of CrF₄)
O+CO
CO*.

3. MOLYBDENUM

The free energies of sublimation of the tetrachloride, the pentachloride and the hexachloride are 48, 32 and 35 kJ mol$^{-1}$, respectively. Since these values lie between the criteria of [II-1] and [II-2], these chlorides will sublime spontaneously in the Apparatus. Thus, in our analyses we need consider only the di- and tri-chlorides.

-continued
$$0 \quad 3 \times 232 \quad -668, \Delta G_r^0(298 \text{ K.}) = -1364 \text{ kJ mol}^{-1}.$$

The monoxide will not form. The dioxide will, but will not volatilize. If the trioxide is formed, it will be as the liquid which will then solidify.

[II-549] MoCl$_2$(cr) + 6 O(g) → MoO$_2$(cr) + 2 ClO$_2$(g)
$-282 \quad 6 \times 249 \quad -588 \quad 2 \times 102, \Delta H_r^0(298 \text{ K.}) = -1596 \text{ kJ mol}^{-1}$,

[II-550] MoCl$_2$(cr) + 7 O(g) → MoO$_3$(cr) + 2 ClO$_2$(g)
$-282 \quad 7 \times 249 \quad -745 \quad 2 \times 102, \Delta H_r^0(298 \text{ K.}) = -2002 \text{ kJ mol}^{-1}$,

[II-551] MoCl$_3$(cr) + 8 O(g) → MoO$_2$(cr) + 3 ClO$_2$(g)
$-387 \quad 8 \times 249 \quad -588 \quad 3 \times 102, \Delta H_r^0(298 \text{ K.}) = -1887 \text{ kJ mol}^{-1}$ and

[II-552] MoCl$_3$(cr) + 9 O(g) → MoO$_3$(cr) + 3 ClO$_2$(g)
$-387 \quad 9 \times 249 \quad -745 \quad 3 \times 102, \Delta H_r^0(298 \text{ K.}) = -2293 \text{ kJ mol}^{-1}$.

[II-553] Mo(cr) + F(g) → MoF(g)
$0 \quad 79 \quad 283, \Delta H_r^0(298 \text{ K.}) = +204 \text{ kJ mol}^{-1}$
$0 \quad 62 \quad 248, \Delta G_r^0(298 \text{ K.}) = +186 \text{ kJ mol}^{-1}$,

[II-554] Mo(cr) + 2 F(g) → MoF$_2$(g)
$0 \quad 2 \times 79 \quad -163, \Delta H_r^0(298 \text{ K.}) = -321 \text{ kJ mol}^{-1}$
$0 \quad 2 \times 62 \quad -175, \Delta G_r^0(298 \text{ K.}) = -299 \text{ kJ mol}^{-1}$,

[II-555] Mo(cr) + 3 F(g) → MoF$_3$(g)
$0 \quad 3 \times 79 \quad -607, \Delta H_r^0(298 \text{ K.}) = -844 \text{ kJ mol}^{-1}$
$0 \quad 3 \times 62 \quad -596, \Delta G_r^0(298 \text{ K.}) = -782 \text{ kJ mol}^{-1}$,

[II-556] MoO$_2$(cr) + 6 F(g) → MoF$_2$(g) + 2 OF$_2$(g)
$-588 \quad 6 \times 79 \quad -163 \quad 2 \times 24, \Delta H_r^0(298 \text{ K.}) = -1 \text{ kJ mol}^{-1}$
$-532 \quad 6 \times 62 \quad -175 \quad 2 \times 42, \Delta G_r^0(298 \text{ K.}) = +69 \text{ kJ mol}^{-1}$,

[II-557] MoO$_2$(cr) + 7 F(g) → MoF$_3$(g) + 2 OF$_2$(g)
$-588 \quad 7 \times 79 \quad -607 \quad 2 \times 24, \Delta H_r^0(298 \text{ K.}) = -524 \text{ kJ mol}^{-1}$
$-532 \quad 7 \times 62 \quad -596 \quad 2 \times 42, \Delta G_r^0(298 \text{ K.}) = -414 \text{ kJ mol}^{-1}$,

[II-558] MoO$_3$(cr) + 8 F(g) → MoF$_2$(g) + 3 OF$_2$(g)
$-745 \quad 8 \times 79 \quad -163 \quad 3 \times 24, \Delta H_r^0(298 \text{ K.}) = +22 \text{ kJ mol}^{-1}$
$-668 \quad 8 \times 62 \quad -15 \quad 3 \times 42, \Delta G_r^0(298 \text{ K.}) = +123 \text{ kJ mol}^{-1}$,

[II-559] MoO$_3$(cr) + 9 F(g) → MoF$_3$(g) + 3 OF$_2$(g)
$-745 \quad 9 \times 79 \quad -607 \quad 3 \times 24, \Delta H_r^0(298 \text{ K.}) = -501 \text{ kJ mol}^{-1}$
$-668 \quad 9 \times 62 \quad -596 \quad 3 \times 42, \Delta G_r^0(298 \text{ K.}) = -360 \text{ kJ mol}^{-1}$,

[II-560] MoCl$_2$(cr) + 8 F(g) → MoF$_2$(g) + 2 ClF$_3$(g)
$-282 \quad 8 \times 79 \quad -163 \quad 2 \times -159, \Delta H_r^0(298 \text{ K.}) = -831 \text{ kJ mol}^{-1}$,

[II-561] MoCl$_2$(cr) + 9 F(g) → MoF$_3$(g) + 2 ClF$_3$(g)
$-282 \quad 9 \times 79 \quad -607 \quad 2 \times -159, \Delta H_r^0(298 \text{ K.}) = -1354 \text{ kJ mol}^{-1}$,

[II-562] MoCl$_3$(cr) + 11 F(g) → MoF$_2$(g) + 3 ClF$_3$(g)
$-387 \quad 11 \times 79 \quad -163 \quad 3 \times -159, \Delta H_r^0(298 \text{ K.}) = -1122 \text{ kJ mol}^{-1}$ and

[II-563] MoCl$_3$(cr) + 12 F(g) → MoF$_3$(g) + 3 ClF$_3$(g)
$-387 \quad 12 \times 79 \quad -607 \quad 3 \times -159, \Delta H_r^0(298 \text{ K.}) = -1645 \text{ kJ mol}^{-1}$.

[II-546] Mo(cr) + O(g) → MoO(g)
$0 \quad 249 \quad 311, \Delta H_r^0(298 \text{ K.}) = +62 \text{ kJ mol}^{-1}$
$0 \quad 232 \quad 278, \Delta H_r^0(298 \text{ K.}) = +46 \text{ kJ mol}^{-1}$, Thus, we find for all molybdenum species the trifluoride and higher fluorides will form. Except for the reactions with the oxides the difluoride will also form.

[II-564] Mo(cr) + 6 CO(g) → Mo(CO)$_6$(cr)
$0 \quad 6 \times -110 \quad -983, \Delta H_r^0(298 \text{ K.}) = -323 \text{ kJ mol}^{-1}$
$0 \quad 6 \times -137 \quad -878, \Delta G_r^0(298 \text{ K.}) = -56 \text{ kJ mol}^{-1}$,

[II-565] MoO$_2$(cr) + 8 CO(g) → Mo(CO)$_6$(cr) + 2 CO$_2$(g)
$-588 \quad 8 \times -110 \quad -983 \quad 2 \times -394, \Delta H_r^0(298 \text{ K.}) = -303 \text{ kJ mol}^{-1}$,
$-532 \quad 8 \times -137 \quad -878 \quad 2 \times -394, \Delta G_r^0(298 \text{ K.}) = -38 \text{ kJ mol}^{-1}$,

[II-566] MoO$_3$(cr) + 9 CO(g) → Mo(CO)$_6$(cr) + 3 CO$_2$(g)
$-745 \quad 9 \times -110 \quad -983 \quad 3 \times -394, \Delta H_r^0(298 \text{ K.}) = -430 \text{ kJ mol}^{-1}$
$-668 \quad 9 \times -137 \quad -878 \quad 3 \times -394, \Delta G_r^0(298 \text{ K.}) = -159 \text{ kJ mol}^{-1}$,

[II-567] MoCl$_2$(cr) + 8 CO(g) → Mo(CO)$_6$(cr) + 2 COCl(g)
$-282 \quad 8 \times -110 \quad -983 \quad 2 \times -63, \Delta H_r^0(298 \text{ K.}) = +53 \text{ kJ mol}^{-1}$,

[II-568] MoCl$_2$(cr) + 8 CO*(g) → Mo(CO)$_6$(cr) + 2 COCl(g)
$-282 \quad 8 \times 564 \quad -983 \quad 2 \times -63, \Delta H_r^*(298 \text{ K.}) = -5339 \text{ kJ mol}^{-1}$,

[II-569] MoCl$_3$(cr) + 9 CO(g) → Mo(CO)$_6$(cr) + 3 COCl(g)
$-387 \quad 9 \times -110 \quad -983 \quad 3 \times -63, \Delta H_r^0(298 \text{ K.}) = +205 \text{ kJ mol}^{-1}$ and

[II-570] MoCl$_3$(cr) + 9 CO*(g) → Mo(CO)$_6$(cr) + 3 COCl(g)
$-387 \quad 9 \times 564 \quad -983 \quad 3 \times -63, \Delta H_r^0(298 \text{ K.}) = -5861 \text{ kJ mol}^{-1}$.

[II-547] Mo(cr) + 2 O(g) → MoO$_2$(cr)
$0 \quad 2 \times 249 \quad -588, \Delta H_r^0(298 \text{ K.}) = -1086 \text{ kJ mol}^{-1}$
$0 \quad 2 \times 232 \quad -532, \Delta G_r^0(298 \text{ K.}) = -996 \text{ kJ mol}^{-1}$ and

[II-548] Mo(cr) + 3 O(g) → MoO$_3$(cr)
$0 \quad 3 \times 249 \quad -745, \Delta H_r^0(298 \text{ K.}) = -1492 \text{ kJ mol}^{-1}$ Thus, we have the choice of four procedures for the volatilization of molybdenum species:

O+F
F
O+CO
CO*.

4. TUNGSTEN

| | | | |
|---|---|---|---|
| [II-571] | W(cr) + O(g) → WO(cr) | | |
| | 0 | 249 | −272, $\Delta H_r^0$(298 K.) = −521 kJ mol$^{-1}$, |
| [II-572] | WO(cr) + O(g) → WO$_2$(cr) | | |
| | −272 | 249 | −590, $\Delta H_r^0$(298 K.) = −567 kJ mol$^{-1}$ |
| and | | | |
| [II-573] | WO$_2$(cr) + O(g) → WO$_3$(cr) | | |
| | −590 | 249 | −842, $\Delta H_r^0$(298 K.) = −501 kJ mol$^{-1}$ |
| | −534 | 232 | −764, $\Delta G_r^0$(298 K.) = −462 kJ mol$^{-1}$. |

The trioxide probably will form as the liquid and then solidify.

The tetra-, penta- and hexachlorides all meet the criterion of [II-2] and will volatilize spontaneously in the Apparatus.

| | | | | |
|---|---|---|---|---|
| [II-574] | WCl$_2$(cr) + 7 O(g) → WO$_3$(cr) + 2 ClO$_2$(g) | | | |
| | −257 | 7 × 249 | −842 | 2 × 102, $\Delta H_r^0$(298 K.) = −2124 kJ mol$^{-1}$ |
| | −220 | 7 × 232 | −764 | 2 × 120, $\Delta G_r^0$(298 K.) = −1928 kJ mol$^{-1}$ |
| and | | | | |
| [II-575] | WCl$_3$(cr) + 9 O(g) → WO$_3$(cr) + 3 ClO$_2$(g) | | | |
| | −357 | 9 × 249 | −842 | 3 × 102, $\Delta H_r^0$(298 K.) = −2420 kJ mol$^{-1}$. |

The enthalpy of sublimation of the trioxide is 549 kJ mol$^{-1}$ with a 'times four' factor of 2196 kJ mol$^{-1}$. Thus, the trioxide formed in [II-565] will volatilize. Since the monoxygen is at least in part in an excited state, the same comment applies to [II-574].

The 'times four' criterion for the volatilization of the di- and tri-fluorides are 1680 and 1260 kJ mol$^{-1}$, respectively.

| | | | |
|---|---|---|---|
| [II-576] | W(cr) + 2 F(g) → WF$_2$(cr) | | |
| | 0 | 2 × 79 | −608, $\Delta H_r^0$(298 K.) = −766 kJ mol$^{-1}$, |
| [II-577] | WF$_2$(cr) + F(g) → WF$_3$(cr) | | |
| | −608 | 79 | −923, $\Delta G_r^0$(298 K.) = −394 kJ mol$^{-1}$ |
| and | | | |
| [II-578] | WF$_3$(cr) + F(g) → WF$_4$(cr) | | |
| | −923 | 79 | −1208, $\Delta H_r^0$(298 K.) = −364 kJ mol$^{-1}$. |

Since 766+394+364=1524 and since the 'times four' criterion for the tetrafluoride is 712 kJ mol$^{-1}$, the tetrafluoride will volatilize. Higher fluorides may also be formed. They a fortiori will volatilize.

| | | | | |
|---|---|---|---|---|
| [II-579] | WO(cr) + 6 F(g) → WF$_4$(cr) + OF$_2$(g) | | | |
| | −272 | 6 × 79 | −1208 | 24, $\Delta H_r^0$(298 K.) = −1386 kJ mol$^{-1}$, |
| [II-580] | WO$_2$(cr) + 8 F(g) → WF$_4$(cr) + 2 OF$_2$(g) | | | |
| | −590 | 8 × 79 | −1208 | 2 × 24, $\Delta H_r^0$(298 K.) = −1202 kJ mol$^{-1}$, |
| [II-581] | WO$_3$(cr) + 10 F(g) → WF$_4$(cr) + 3 OF$_2$(g) | | | |
| | −842 | 10 × 79 | −1208 | 3 × 24, $\Delta H_r^0$(298 K.) = −1084 kJ mol$^{-1}$, |
| [II-582] | WCl$_2$(cr) + 10 F(g) → WF$_4$(cr) + 2 ClF$_3$(g) | | | |
| | −257 | 10 × 79 | −1208 | 2 × −159, $\Delta H_r^0$(298 K.) = −2059 kJ mol$^{-1}$ |
| and | | | | |
| [II-583] | WCl$_3$(cr) + 13 F(g) → WF$_4$(cr) + 3 ClF$_3$(g) | | | |
| | −357 | 13 × 79 | −1208 | 3 × −159, $\Delta H_r^0$(298 K.) = −2355 kJ mol$^{-1}$. |
| [II-584] | W(cr) + 6 CO(g) → W(CO)$_6$(cr) | | | |
| | 0 | 6 × −111 | −960, $\Delta H_r^0$(298 K.) = −294 kJ mol$^{-1}$, | | |
| [II-585] | W(cr) + 6 CO*(g) → W(CO)$_6$(cr) | | | |
| | 0 | 6 × 564 | −960, $\Delta H_r^*$(298 K.) = −4344 kJ mol$^{-1}$, | | |
| [II-586] | WO(cr) + 7 CO(g) → W(CO)$_6$(cr) + CO$_2$(g) | | | |
| | −272 | 7 × −111 | −960 | −394, $\Delta H_r^0$(298 K.) = −305 kJ mol$^{-1}$, |
| [II-587] | WO$_2$(cr) + 8 CO(g) → W(CO)$_6$(cr) + 2 CO$_2$(g) | | | |
| | −590 | 8 × −111 | −960 | 2 × −394, $\Delta H_r^0$(298 K.) = −270 kJ mol$^{-1}$, |
| [II-588] | WO$_2$(cr) + 8 CO*(g) → W(CO)$_6$(cr) + CO$_2$(g) | | | |
| | −590 | 8 × 564 | −960 | 2 × −394, $\Delta H_r^*$(298 K.) = −5670 kJ mol$^{-1}$, |
| [II-589] | WO$_3$(cr) + 9 CO(g) → W(CO)$_6$(cr) + 3 CO$_2$(g) | | | |
| | −842 | 9 × −111 | −960 | 3 × −394, $\Delta H_r^0$(298 K.) = −301 kJ mol$^{-1}$, |
| [II-590] | WO$_3$(cr) + 9 CO*(g) → W(CO)$_6$(cr) + 3 CO$_2$(g) | | | |
| | −842 | 9 × 564 | −960 | 3 × −394, $\Delta H_r^*$(298 K.) = −6376 kJ mol$^{-1}$, |
| [II-591] | WCl$_2$(cr) + 8 CO(g) → W(CO)$_6$(cr) + 2 COCl(g) | | | |
| | −257 | 8 × −111 | −960 | 2 × −63, $\Delta H_r^0$(298 K.) = +59 kJ mol$^{-1}$, |
| [II-592] | WCl$_2$(cr) + 8 CO*(g) → W(CO)$_6$(cr) + 2 COCl(g) | | | |
| | −257 | 8 × 564 | −960 | 2 × −63, $\Delta H_r^*$(298 K.) = −5341 kJ mol$^{-1}$, |
| [II-593] | WCl$_3$(cr) + 9 CO(g) → W(CO)$_6$(cr) + 3 COCl(g) | | | |
| | −357 | 9 × −111 | −960 | 3 × −63, $\Delta H_r^0$(298 K.) = +207 kJ mol$^{-1}$, |
| [II-594] | WCl$_3$(cr) + 9 CO*(g) → W(CO)$_6$(cr) + 3 COCl(g) | | | |
| | −357 | 9 × 564 | −960 | 3 × −63, $\Delta H_r^*$(298 K.) = −5868 kJ mol$^{-1}$, |
| [II-595] | WF$_2$(cr) + 8 CO(g) → W(CO)$_6$(cr) + 2 COF(g) | | | |
| | −602 | 8 × −111 | −960 | 2 × −172, $\Delta H_r^0$(298 K.) = +186 kJ mol$^{-1}$, |
| [II-596] | WF$_2$(cr) + 8 CO*(g) → W(CO)$_6$(cr) + 2 COF(g) | | | |
| | −602 | 8 × 564 | −960 | 2 × −172, $\Delta H_r^*$(298 K.) = −5214 kJ mol$^{-1}$, |
| [II-597] | WF$_3$(cr) + 9 CO(g) → W(CO)$_6$(cr) + 3 COF(g) | | | |
| | −923 | 9 × −111 | −960 | 3 × −172, $\Delta H_r^0$(298 K.) = +446 kJ mol$^{-1}$, |
| [II-598] | WF$_3$(cr) + 9 CO*(g) → W(CO)$_6$(cr) + 3 COF(g) | | | |
| | −923 | 9 × 564 | −960 | 3 × −172, $\Delta H_r^*$(298 K.) = −5629 kJ mol$^{-1}$, |
| [II-599] | WF$_4$(cr) + 10 CO(g) → W(CO)$_6$(cr) + 4 COF(g) | | | |
| | −1208 | 10 × −111 | −960 | 4 × −172, $\Delta H_r^0$(298 K.) = +670 kJ mol$^{-1}$, |
| [II-600] | WF$_4$(cr) + 10 CO*(g) → W(CO)$_6$(cr) + 4 COF(g) | | | |
| | −1208 | 10 × 564 | −960 | 4 × −172, $\Delta H_r^*$(298 K.) = −6080 kJ mol$^{-1}$, |
| [II-601] | WF$_5$(cr) + 11 CO(g) → W(CO)$_6$(cr) + 5 COF(g) | | | |
| | −1495 | 11 × −111 | −960 | 5 × −172, $\Delta H_r^0$(298 K.) = +896 kJ mol$^{-1}$, |
| and | | | | |
| [II-602] | WF$_5$(cr) + 11 CO*(g) → W(CO)$_6$(cr) + 5 COF(g) | | | |
| | −1495 | 11 × 564 | −960 | 5 × −172, $\Delta H_r^*$(298 K.) = −6529 kJ mol$^{-1}$. |

[II-603] $W(cr) + 6 CH_3(g) \rightarrow (CH_3)_6W(l)$
　　　　 0　　 6 × 146　 739,　 $\Delta H_r^0(298\ K.) = -137\ kJ\ mol^{-1}$,

[II-604] $WO(cr) + 8 CH_3(g) \rightarrow (CH_3)_6W(l) + (CH_3)_2O(g)$
　　　　 −272　 8 × 146　 739　　 −184,　 $\Delta H_r^0(298\ K.) = -341\ kJ\ mol^{-1}$,

[II-605] $WO_2(cr) + 10 CH_3(g) \rightarrow (CH_3)_6W(l) + 2 (CH_3)_2O(g)$
　　　　 −590　 10 × 146　 739　　 2 × −184,　 $\Delta H_r^0(298\ K.) = -499\ kJ\ mol^{-1}$,

[II-606] $WO_3(cr) + 12 CH_3(g) \rightarrow (CH_3)_6W(l) + 3 (CH_3)_2O(g)$
　　　　 −842　 12 × 146　 739　　 3 × −184,　 $\Delta H_r^0(298\ K.) = -723\ kJ\ mol^{-1}$,

[II-607] $WCl_2(cr) + 8 CH_3(g) \rightarrow (CH_3)_6W(l) + 2 CH_3Cl(g)$
　　　　 −257　 8 × 146　 739　　 2 × −84,　 $\Delta H_r^0(298\ K.) = -340\ kJ\ mol^{-1}$,

[II-608] $WCl_3(cr) + 9 CH_3(g) \rightarrow (CH_3)_6W(l) + 3 CH_3Cl(g)$
　　　　 −357　 9 × 146　 739　　 3 × −84,　 $\Delta H_r^0(298\ K.) = -470\ kJ\ mol^{-1}$,

[II-609] $WF_2(cr) + 8 CH_3(g) \rightarrow (CH_3)_6W(l) + 2 CH_3F(g)$
　　　　 −602　 8 × 146　 739　　 2 × −234,　 $\Delta H_r^0(298\ K.) = -295\ kJ\ mol^{-1}$,

[II-610] $WF_3(cr) + 9 CH_3(g) \rightarrow (CH_3)_6W(l) + 3 CH_3F(g)$
　　　　 −923　 9 × 146　 739　　 3 × −234,　 $\Delta H_r^0(298\ K.) = -354\ kJ\ mol^{-1}$,

[II-611] $WF_4(cr) + 10 CH_3(g) \rightarrow (CH_3)_6W(l) + 4 CH_3F(g)$
　　　　 −1208　 10 × 146　 739　　 4 × −234,　 $\Delta H_r^0(298\ K.) = -449\ kJ\ mol^{-1}$, and

[II-612] $WF_5(cr) + 11 CH_3(g) \rightarrow (CH_3)_6W(l) + 5 CH_3F(g)$
　　　　 −1495　 11 × 146　 739　　 5 × −234,　 $\Delta H_r^0(298\ K.) = -542\ kJ\ mol^{-1}$.

Thus, we have the choice of five procedures for the volatilization of tungsten species:
O+F
F
O+CO*
O+CH$_3$
CH$_3$.

N. Group VII B.

1. [II-THERMODYNAMICS

The 'times four' criterion for the species of interest at

| | | | |
|---|---|---|---|
| MnF$_2$ | 1044 kJ mol$^{-1}$ | ReF$_3$ | 640 kJ mol$^{-1}$ |
| MnF$_3$ | 888 | ReF$_4$ | 528 |
| Mn$_2$(CO)$_{10}$ | 252 | ReF$_5$ | 328 |
| | | ReF$_6$ | 116 |
| Re$_2$O$_7$ | 552 | Re$_2$(CO)$_{10}$ | 372. |

TABLE II-17
GROUP VII B. THERMODYNAMIC DATA
$\Delta H_f^0(298\ K.)/\Delta G_f^0(298\ K.)$
(kj mol$^{-1}$)

| SPECIES | | Mn | Re |
|---|---|---|---|
| MO | (cr) | −385a/−363a | |
| | (g) | +124a/— | |
| M$_3$O$_4$ | (cr) | −1388a/−1283a | |
| M$_2$O$_3$ | (cr) | −959a/−881a- | |
| MO$_2$ | (cr) | −520a/−465a | |
| MO$_3$ | (cr) | | −611b/−531b |
| M$_2$O$_7$ | (cr) | | −1238b/−1084b |
| | (g) | | −1100a/−994a |
| MCl | (g) | +42a/— | |
| | (g) | −264a/— | |
| MF | (g) | −22a/— | |
| MF$_2$ | (cr) | −795c/— | |
| | (g) | −534c/— | |
| MF$_3$ | (cr) | −996c/— | −711c/— |
| | (g) | −774c/— | −551c/ |
| MF$_4$ | (cr) | | −920c/— |
| | | | −788c/— |
| MF$_5$ | (cr) | | −941c/— |
| | (g) | | −859c/— |
| MF$_6$ | (l) | | −1151b/−1054b |
| | (g) | | −1122c/— |
| MCL$_3$ | (cr) | | −264b/−201b |
| MCL$_5$ | (cr) | | −372a/— |
| | (g) | −318a/— | |
| M$_2$(CO)$_{10}$ | (cr) | −1678a/— | −1651d/— |
| | (g) | −1615a/— | −1558d/— |

(a. Ref. <B>, b. Ref. <II-28>, c. Ref. <II-23>, d. Ref. <II-15>).

2. MANGANESE

[II-613] $Mn(cr) + O(g) \rightarrow MnO(cr)$
　　　　 0　　 249　　 −385,　 $\Delta H_r^0(298\ K.) = -634\ kJ\ mol^{-1}$
　　　　 0　　 203,　 −363,　 $\Delta G_r^0(298\ K.) = -566\ kJ\ mol^{-1}$,

[II-614] $MnO(cr) + \tfrac{1}{3} O(g) \rightarrow \tfrac{1}{3} Mn_3O_4(cr)$
　　　　 −385　 $\tfrac{1}{3}$ × 249　 $\tfrac{1}{3}$ × −1388,　 $\Delta H_r^0(298\ K.) = -161\ kJ\ mol^{-1}$
　　　　 −363　 $\tfrac{1}{3}$ × 203　 $\tfrac{1}{3}$ × −1283,　 $\Delta G_r^0(298\ K.) = -132\ kJ\ mol^{-1}$,

[II-615] $\tfrac{1}{3} Mn_3O_4(cr) + 1/6\ O(g) \rightarrow \tfrac{1}{2} Mn_2O_3(cr)$
　　　　 $\tfrac{1}{3}$ × −1388　 1/6 × 249　 $\tfrac{1}{2}$ × −959,　 $\Delta H_r^0(298\ K.) = -58\ kJ\ mol^{-1}$
　　　　 $\tfrac{1}{3}$ × −1283　 1/6 × 203　 $\tfrac{1}{2}$ × −881,　 $\Delta G_r^0(298\ K.) = -47\ kJ\ mol^{-1}$,

[II-616] $\tfrac{1}{2} Mn_2O_3(cr) + \tfrac{1}{2} O(g) \rightarrow MnO_2(cr)$
　　　　 $\tfrac{1}{2}$ × −959　 $\tfrac{1}{2}$ × 249　　 −520,　 $\Delta H_r^0(298\ K.) = -165\ kJ\ mol^{-1}$
　　　　 $\tfrac{1}{2}$ × −881　 $\tfrac{1}{2}$ × 203　　 −465,　 $\Delta G_r^0(298\ K.) = -126\ kJ\ mol^{-1}$,

[II-617] $MnCl_2(cr) + 5 O(g) \rightarrow MnO(cr) + 2 ClO_2(g)$
　　　　 −481　 5 × 249　 −385　 2 × 102,　 $\Delta H_r^0(298\ K.) = -945\ kJ\ mol^{-1}$
　　　　 −440　 5 × 232　 −363　 2 × 120,　 $\Delta G_r^0(298\ K.) = -843\ kJ\ mol^{-1}$,

[II-618] $MnF_2(cr) + 5 O(g) \rightarrow MnO(cr) + 2 FO_2(g)$
　　　　 −795　 5 × 249　 −385　 2 × 13,　 $\Delta H_r^0(298\ K.) = -809\ kJ\ mol^{-1}$ and

[II-619] $MnF_3(cr) + 7 O(g) \rightarrow MnO(cr) + 3 FO_2(g)$
　　　　 −996　 7 × 249　 −385　 3 × 13,　 $\Delta H_r^0(298\ K.) = -1093\ kJ\ mol^{-1}$.

[II-620] $Mn(cr) + 2 F(g) \rightarrow MnF_2(cr)$

-continued

[II-621] $\quad$ $\begin{array}{llll} & 0 & 2 \times 79 & -795, \quad \Delta H_r^0(298\ K.) = -953\ kJ\ mol^{-1}, \end{array}$
$\quad$ Mn(cr) + 3 F(g) → MnF$_3$(cr)
$\begin{array}{llll} & 0 & 3 \times 79 & -996, \quad \Delta H_r^0(298\ K.) = -1233\ kJ\ mol^{-1}, \end{array}$

[II-622] $\quad$ MnO(cr) + 4 F(g) → MnF$_2$(cr) + OF$_2$(g)
$\begin{array}{llll} -385 & 4 \times 79 & -795 & 13, \quad \Delta H_r^0(298\ K.) = -713\ kJ\ mol^{-1}, \end{array}$

[II-623] $\quad$ MnO(cr) + 5 F(g) → MnF$_3$(cr) + OF$_2$(g)
$\begin{array}{llll} -385 & 5 \times 79 & -996 & 13, \quad \Delta H_r^0(298\ K.) = -993\ kJ\ mol^{-1}, \end{array}$

[II-624] $\quad$ ⅓ Mn$_3$O$_4$(cr) + 14/3 F(g) → MnF$_2$(cr) + 4/3 OF$_2$(g)
$\begin{array}{llll} ⅓ \times -1388 & 14/3 \times 79 & -795 & 4/3 \times 13, \quad \Delta H_r^0(298\ K.) = -684\ kJ\ mol^{-1}, \end{array}$

[II-624a] $\quad$ ⅓ Mn$_3$O$_4$(cr) + 17/3 F(g) → MnF$_3$(cr) + 4/3 OF$_2$(g)
$\begin{array}{llll} ⅓ \times -1388 & 17/3 \times 79 & -996 & 4/3 \times 13, \quad \Delta H_r^0(298\ K.) = -964\ kJ\ mol^{-1}, \end{array}$

[II-625] $\quad$ ½ Mn$_2$O$_3$(cr) + 5 F(g) → MnF$_2$(cr) + 3/2 OF$_2$(g)
$\begin{array}{llll} 0.5 \times -959 & 5 \times 79 & -795 & 1.5 \times 13, \quad \Delta H_r^0(298\ K.) = -691\ kJ\ mol^{-1}, \end{array}$

[II-626] $\quad$ ½ Mn$_2$O$_3$(cr) + 6 F(g) → MnF$_3$(cr) + 3/2 OF$_2$(g)
$\begin{array}{llll} 0.5 \times -959 & 6 \times 79 & -996 & 1.5 \times 13, \quad \Delta H_r^0(298\ K.) = -971\ kJ\ mol^{-1}, \end{array}$

[II-627] $\quad$ MnO$_2$(cr) + 6 F(g) → MnF$_2$(cr) + 2 OF$_2$(g)
$\begin{array}{llll} -520 & 6 \times 79 & -795 & 2 \times 13, \quad \Delta H_r^0(298\ K.) = -723\ kJ\ mol^{-1}, \end{array}$

[II-628] $\quad$ MnO$_2$(cr) + 7 F(g) → MnF$_3$(cr) + 2 OF$_2$(g)
$\begin{array}{llll} -520 & 7 \times 79 & -996 & 2 \times 13, \quad \Delta H_r^0(298\ K.) = -1003\ kJ\ mol^{-1}, \end{array}$

[II-629] $\quad$ MnCl$_2$(cr) + 8 F(g) → MnF$_2$(cr) + 2 ClF$_3$(g)
$\begin{array}{llll} -481 & 8 \times 79 & -795 & 2 \times -159, \quad \Delta H_r^0(298\ K.) = -1264\ kJ\ mol^{-1} \end{array}$ and

[II-630] $\quad$ MnCl$_2$(cr) + 9 F(g) → MnF$_3$(cr) + 2 ClF$_3$(g)
$\begin{array}{llll} -481 & 9 \times 79 & -996 & 2 \times -159, \quad \Delta H_r^0(298\ K.) = -1544\ kJ\ mol^{-1}. \end{array}$ Thus, ground state monofluorine is an effective volatilizing reagent for all the manganese species except for the fluorides. Unless one is certain that there are no fluoride species present, the safe procedure is O+F.

-continued $\begin{array}{llll} 0 & 7 \times 249 & -1238, & \Delta H_r^0(298\ K.) = -2981\ kJ\ mol^{-1} \\ 0 & 7 \times 232 & -1084, & \Delta G_r^0(298\ K.) = \end{array}$

[II-631] $\quad$ 2 Mn(cr) + 10 CO(g) → Mn$_2$(CO)$_{10}$(cr)
$\begin{array}{llll} 0 & 10 \times -111 & -1678, & \Delta H_r^0(298\ K.) = -568\ kJ\ mol^{-1} \end{array}$

[II-632] $\quad$ 2 MnO(cr) + 12 CO(g) → Mn$_2$(CO)$_{10}$(cr) + 2 CO$_2$(g)
$\begin{array}{llll} 2 \times -385 & 12 \times -111 & -1678 & 2 \times -394, \quad \Delta H_r^0(298\ K.) = -364\ kJ\ mol^{-1}, \end{array}$

[II-633] $\quad$ ⅔ Mn$_3$O$_4$(cr) + 38/3 CO(g) → Mn$_2$(CO)$_{10}$(cr) + 8/3 CO$_2$(g)
$\begin{array}{llll} ⅔ \times -1388 & 38/3 \times -111 & -1678 & 8/3 \times -394, \quad \Delta H_r^0(298\ K.) = -397\ kJ\ mol^{-1}, \end{array}$

[II-634] $\quad$ Mn$_2$O$_3$(cr) + 13 CO(g) → Mn$_2$(CO)$_{10}$(cr) + 3 CO$_2$(g)
$\begin{array}{llll} -959 & 13 \times -111 & -1678 & 3 \times -394, \quad \Delta H_r^0(298\ K.) = -458\ kJ\ mol^{-1}, \end{array}$

[II-635] $\quad$ 2 MnO$_2$(cr) + 14 CO(g) → Mn$_2$(CO)$_{10}$(cr) + 4 CO$_2$(g)
$\begin{array}{llll} 2 \times 520 & 14 \times -111 & -1678 & 4 \times -394, \quad \Delta H_r^0(298\ K.) = -660\ kJ\ mol^{-1}, \end{array}$

[II-636] $\quad$ 2 MnCl$_2$(cr) + 14 CO(g) → Mn$_2$(CO)$_{10}$(cr) + 4 COCl(g)
$\begin{array}{llll} 2 \times -481 & 14 \times -111 & -1678 & 4 \times -63, \quad \Delta H_r^0(298\ K.) = +586\ kJ\ mol^{-1}, \end{array}$

[II-637] $\quad$ 2 MnCl$_2$(cr) + 14 CO*(g) → Mn$_2$(CO)$_{10}$(cr) + 4 COCl(g)
$\begin{array}{llll} 2 \times -481 & 14 \times 564 & -1678 & 4 \times -63, \quad \Delta H_r^*(298\ K.) = -8864\ kJ\ mol^{-1}, \end{array}$

[II-638] $\quad$ 2 MnF$_2$(cr) + 14 CO(g) → Mn$_2$(CO)$_{10}$(cr) + 4 COF(g)
$\begin{array}{llll} 2 \times -795 & 14 \times -111 & -1678 & 4 \times -172, \quad \Delta H_r^0(298\ K.) = +778\ kJ\ mol^{-1}, \end{array}$

[II-639] $\quad$ 2 MnF$_2$(cr) + 14 CO*(g) → Mn$_2$(CO)$_{10}$(cr) + 4 COF(g)
$\begin{array}{llll} 2 \times -795 & 14 \times 564 & -1678 & 4 \times -172, \quad \Delta H_r^*(298\ K.) = -8672\ kJ\ mol^{-1}, \end{array}$

[II-640] $\quad$ 2 MnF$_3$(cr) + 16 CO(g) → Mn$_2$(CO)$_{10}$(cr) + 6 COF(g)
$\begin{array}{llll} 2 \times -996 & 16 \times -111 & -1678 & 6 \times -172, \quad \Delta H_r^0(298\ K.) = +1058\ kJ\ mol^{-1} \end{array}$ and

[II-641] $\quad$ 2 MnF$_3$(cr) + 16 CO*(g) → Mn$_2$(CO)$_{10}$(cr) + 6 COF(g)
$\begin{array}{llll} 2 \times -996 & 16 \times 564 & -1678 & 6 \times -172, \quad \Delta H_r^*(298\ K.) = -9742\ kJ\ mol^{-1}. \end{array}$ Thus, we have the choice of three procedures for the volatilization of manganese species:

O+F
O+CO
CO*.

3. RHENIUM

[II-642] $\quad$ Re(cr) + 2 O(g) → ReO$_2$(cr)
$\begin{array}{lll} 0 & 2 \times 249 & -423, \Delta H_r^0(298\ K.) = -921\ kJ\ mol^{-1} \\ 0 & 2 \times 232 & -372, \Delta G_r^0(298\ K.) = -836\ kJ\ mol^{-1}, \end{array}$

[II-643] $\quad$ ReO$_2$(cr) + O(g) → ReO$_3$(cr)
$\begin{array}{lll} -423 & 249 & -611, \Delta H_r^0(298\ K.) = -437\ kJ\ mol^{-1} \\ -372 & 232 & -531, \Delta H_r^0(298\ K.) = -391\ kJ\ mol^{-1}, \end{array}$

[II-644] $\quad$ 2 Re(cr) + 7 O(g) → Re$_2$O$_7$(cr)
$\begin{array}{lll} 0 & 7 \times 249 & -1238, \Delta H_r^0(298\ K.) = -2981\ kJ\ mol^{-1} \\ 0 & 7 \times 232 & -1084, \Delta G_r^0(298\ K.) = -2708\ kJ\ mol^{-1}, \end{array}$

[II-645] $\quad$ 2 ReO$_2$(cr) + 3 O(g) → Re$_2$O$_7$(cr)
$\begin{array}{lll} 2 \times -423 & 3 \times 249 & -1238, \Delta H_r^0(298\ K.) = -1139\ kJ\ mol^{-1} \\ 2 \times -372 & 3 \times 232 & -1084, \Delta G_r^0(298\ K.) = -1036\ kJ\ mol^{-1} \end{array}$

[II-646] $\quad$ 2 ReO$_3$(cr) + O(g) → Re$_2$O$_7$(cr)
$\begin{array}{lll} 2 \times -611 & 249 & -1238, \Delta H_r^0(298\ K.) = -265\ kJ\ mol^{-1} \\ 2 \times -531 & 232 & -1084, \Delta G_r^0(298\ K.) = -254\ kJ\ mol^{-1} \end{array}$ and

[II-647] $\quad$ 2 ReO$_3$(cr) + O*(g) → Re$_2$O$_7$(cr)
$\begin{array}{lll} 2 \times -611 & 529 & -1238, \Delta H_r^*(298\ K.) = -545\ kJ\ mol^{-1}. \end{array}$ Since the 'times four' criterion for Re$_2$O$_7$ is 552 kJ mol$^{-1}$, even excited state monoxygen cannot be expected to be effective in the volatilization of the trioxide.

[II-648] 2 ReCl$_3$(cr) + 19 O(g) → Re$_2$O$_7$(cr) + 6 ClO$_2$(g)
  2 × −264  19 × 249  −1238  6 × 102, ΔH$_r^0$(298 K.) = −4829 kJ mol$^{-1}$
  2 × −201  19 × 232  −1084  6 × 120, ΔG$_r^0$(298 K.) = −4370 kJ mol$^{-1}$,
[II-649] 2 ReCl$_5$(cr) + 27 O(g) → Re$_2$O$_7$(cr) + 10 ClO$_2$(g)
  2 × −372  27 × 249  −1238  10 × 102, ΔH$_r^0$(298 K.) = −6197 kJ mol$^{-1}$,
[II-650] 2 ReF$_3$(cr) + 19 O(g) → Re$_2$O$_7$(cr) + 6 FO$_2$(g)
  2 × −711  19 × 249  −1238  6 × 13, ΔH$_r^0$(298 K.) = −4469 kJ mol$^{-1}$,
[II-651] 2 ReF$_4$(cr) + 23 O(g) → Re$_2$O$_7$(cr) + 8 FO$_2$(g)
  2 × −920  23 × 249  −1238  8 × 13, ΔH$_r^0$(298 K.) = −5021 kJ mol$^{-1}$,
[II-652] 2 ReF$_5$(cr) + 27 O(g) → Re$_2$O$_7$(cr) + 10 FO$_2$(g)
  2 × −941  27 × 249  −1238  10 × 13, ΔH$_r^0$(298 K.) = −5949 kJ mol$^{-1}$
and
[II-653] 2 ReF$_6$(cr) + 31 O(g) → Re$_2$O$_7$(cr) + 12 FO$_2$(g)
  2 × −1151  31 × 249  −1238  12 × 13, ΔH$_r^0$(298 K.) = −6499 kJ mol$^{-1}$
  2 × −1054  31 × 232  −1084  12 × 27,
  ΔG$_r^0$(298 K.) = −5844 kJ mol$^{-1}$.

Thus, we find that even ground state monoxygen is effective in the volatilization of the halides.

[II-654] Re(cr) + 3 F(g) → ReF$_3$(cr)
  0    3 × 79   −711, ΔH$_r^0$(298 K.) = −948 kJ mol$^{-1}$,
[II-655] ReF$_3$(cr) + F(g) → ReF$_4$(cr)
  −711   79    −920, ΔH$_r^0$(298 K.) = −288 kJ mol$^{-1}$,
[II-656] ReF$_4$(cr) + F(g) → ReF$_5$(cr)
  −920   79    −941, ΔH$_r^0$(298 K.) = −100 kJ mol$^{-1}$,
[II-657] ReF$_3$(cr) + 3 F(g) → ReF$_6$(cr)
  −711  3 × 79  −1151, ΔH$_r^0$(298 K.) = −677 kJ mol$^{-1}$,
[II-658] ReF$_4$(cr) + 2 F(g) → ReF$_6$(cr)
  −920  2 × 79  −1151, ΔH$_r^0$(298 K.) = −389 kJ mol$^{-1}$
and
[II-659] ReF$_5$(cr) + F(g) → ReF$_6$(cr)
  −941   79   −1151, ΔH$_r^0$(298 K.) = −289 kJ mol$^{-1}$.
[II-660] ReO$_2$(cr) + 10 F(g) → ReF$_6$(cr) + 2 OF$_2$(g)
  −423  10 × 79  −1151  2 × 24, ΔH$_r^0$(298 K.) = −1470 kJ mol$^{-1}$
  −372  10 × 62  −1122  2 × 42, ΔG$_r^0$(298 K.) = −1286 kJ mol$^{-1}$,
[II-661] ReO$_3$(cr) + 12 F(g) → ReF$_6$(cr) + 3 OF$_2$(g)
  −611  12 × 79  −1151  3 × 24, ΔH$_r^0$(298 K.) = −1416 kJ mol$^{-1}$
  −531  12 × 62  −1122  3 × 42, ΔG$_r^0$(298 K.) = −1209 kJ mol$^{-1}$,
[II-662] 0.5 Re$_2$O$_7$(cr) + 13 F(g) → ReF$_6$(cr) + 3.5 OF$_2$(g)
  0.5 × −1238  13 × 79  −1151  3.5 × 24, ΔH$_r^0$(298 K.) = −1475 kJ mol$^{-1}$
  0.5 × −1084  13 × 62  −1122  3.5 × 42, ΔG$_r^0$(298 K.) = −1239 kJ mol$^{-1}$,
[II-663] ReCl$_3$(cr) + 15 F(g) → ReF$_6$(cr) + 3 ClF$_3$(g)
  −264  15 × 79  −1151  3 × −159, ΔH$_r^0$(298 K.) = −2549 kJ mol$^{-1}$
  −201  15 × 62  −1122  3 × −119, ΔG$_r^0$(298 K.) = −2208 kJ mol$^{-1}$
and
[II-664] ReCl$_5$(cr) + 21 F(g) → ReF$_6$(cr) + 5 ClF$_3$(g)
  −372  21 × 79  −1151  5 × −159, ΔH$_r^0$(298 K.) = −3233 kJ mol$^{-1}$.
[II-665] 2 Re(cr) + 10 CO(g) → Re$_2$(CO)$_{10}$(cr)
  0   10 × −110   −1651, ΔH$_r^0$(298 K.) = −551 kJ mol$^{-1}$,
[II-666] 2 ReO$_2$(cr) + 14 CO(g) → Re$_2$(CO)$_{10}$(cr) + 4 CO$_2$(g)
  2 × −423  14 × −110  −1651  4 × −394, ΔH$_r^0$(298 K.) = −841 kJ mol$^{-1}$,
[II-667] 2 ReO$_3$(cr) + 16 CO(g) → Re$_2$(CO)$_{10}$(cr) + 6 CO$_2$(g)
  2 × −611  16 × −110  −1651  6 × −394, ΔH$_r^0$(298 K.) = −1033 kJ mol$^{-1}$,
[II-668] Re$_2$O$_7$(cr) + 17 CO(g) → Re$_2$(CO)$_{10}$(cr) + 7 CO$_2$(g)
  −1238  17 × −110  −1651  7 × −394, ΔH$_r^0$(298 K.) = −1301 kJ mol$^{-1}$,
[II-669] 2 ReCl$_3$(cr) + 16 CO(g) → Re$_2$(CO)$_{10}$(cr) + 6 COCl(g)
  2 × −264  16 × −110  −1651  6 × −63, ΔH$_r^0$(298 K.) = +259 kJ mol$^{-1}$,
[II-670] 2 ReCl$_3$(cr) + 16 CO*(g) → Re$_2$(CO)$_{10}$(cr) + 6 COCl(g)
  2 × −264  16 × 564  −1651  6 × −63, ΔH$_r^*$(298 K.) = −10,525 kJ mol$^{-1}$,
[II-671] 2 ReCl$_5$(cr) + 20 CO(g) → Re$_2$(CO)$_{10}$(cr) + 10 COCl(g)
  2 × −372  20 × −110  −1651  10 × −63, ΔH$_r^0$(298 K.) = +663 kJ mol$^{-1}$,
[II-672] 2 ReCl$_5$(cr) + 20 CO*(g) → Re$_2$(CO)$_{10}$(cr) + 10 COCl(g)
  2 × −372  20 × 564  −1651  10 × −63, ΔH$_r^*$(298 K.) = −12,817 kJ mol$^{-1}$,
[II-673] 2 ReF$_3$(cr) + 16 CO(g) → Re$_2$(CO)$_{10}$(cr) + 6 COF(g)

-continued

```
         2 × −711    16 ×        −1651       6 × ΔH_r^0(298 K.) = +499 kJ mol^{-1},
                     −110                   −172,
[II-674] 2 ReF_3(cr) + 16 CO*(g) → Re_2(CO)_{10}(cr) + 6 COF(g)
         2 × −711    16 × 564    −1651       6 × ΔH_r*(298 K.) = −10,285 kJ mol^{-1},
                                             −172,
[II-675] 2 ReF_4(cr) + 18 CO(g) → Re_2(CO)_{10}(cr) + 8 COF(g)
         2 × −920    18 ×        −1651       8 × ΔH_r^0(298 K.) = +793 mol^{-1},
                     −110                   −172,
[II-676] 2 ReF_4(cr) + 18 CO*(g) → Re_2(CO)_{10}(cr) + 8 COF(g)
         2 × −920    18 × 564    −1651       8 × ΔH_r*(298 K.) = −11,339 kJ mol^{-1},
                                             −172,
[II-677] 2 ReF_5(cr) + 20 CO(g) → Re_2(CO)_{10}(cr) + 10 COF(g)
         2 × −941    20 ×        −1651      10 × ΔH_r^0(298 K.) = +711 kJ mol^{-1},
                     −110                   −172,
[II-678] 2 ReF_5(cr) + 20 CO*(g) → Re_2(CO)_{10}(cr) + 10 COF(g)
         2 × −941    20 × 564    −1651      10 × ΔH_r((298 K.) = −12,769 kJ mol^{-1},
                                             −172,
[II-679] 2 ReF_6(cr) + 22 CO(g) → Re_2(CO)_{10}(cr) + 12 COF(g)
         2 × −1151   22 ×        −1651      12 × ΔH_r^0(298 K.) = +1007 kJ mol^{-1}
                     −110                   −172,
and
[II-680] 2 ReF_6(cr) + 22 CO*(g) → Re_2(CO)_{10}(cr) + 12 COF(g)
         2 × −1151   22 × 564    −1651      12 × ΔH_r*(298 K.) = −13,821 kJ mol^{-1}.
                                             −172,
```

Thus, we have the choice of four procedures for the volatilization of rhenium species:
O+F
(questionable if $ReF_6$ is present)
O+CO
CO*.

O. Group VIII B.

1. THERMODYNAMICS $Fe(CO)_5$, $Ni(CO)_4$, $RuO_4$, $OsO_4$ and $IrF_6$ will volatilize spontaneously in the apparatus by [II-1]. The 'times four' criterion for several species are:

|   |   |
|---|---|
| $FeF_2$ | 1264 kJ mol$^{-1}$ |
| $FeF_3$ | 884 |
| $CoF_2$ | 1264 |
| $CoF_3$ | 368 |
| $Co_2(CO)_8$ | 264 |
| $NiF_2$ | 936 |
| $RuF_5$ | 408 |
| $Ru_3(CO)_{12}$ | 400 |
| $Rh_4(CO)_{12}$ | 404 |
| $Rh_6(CO)_{16}$ | 468 |
| $Os_3(CO)_{12}$ | 420 |
| $Ir_4(CO)_{12}$ | 420 |
| $PtF_4$ | 548 |
| $PtF_6$ | 184. |

TABLE II-18

GROUP VIII B.
THERMODYNAMIC DATA
PART 1
$\Delta H_f^0(298\ K.)/\Delta G_f^0(298\ K.)$
(kJ mol$^{-1}$)

| SPECIES | Fe | Co | Ni |
|---|---|---|---|
| MO |  |  |  |
| (cr) | −272/−251 | −238/−214 | −240a/−212a |
| (l) | −250/−233 |  |  |
| (g) | +251/+218 |  | +314a/— |
| $M_3O_4$ |  |  |  |
| (cr) | −1121/−1017 | −910/−795 |  |
| $M_2O_3$ |  |  |  |
| (cr) | −826/−744 |  | −490a/— |
| MCl |  |  |  |
| (g) | +251/+216 | +193/+162 | +182/+149 |
| $MCl_2$ |  |  |  |
| (cr) | −342/−302 | −313/−270 | −305/−259 |
| (l) | −311/−278 | −272/−240 | −234/−203 |
| (g) | −141/−156 | −94/−107 | −74/−86 |

TABLE II-18-continued

GROUP VIII B.
THERMODYNAMIC DATA
PART 1
$\Delta H_f^0(298\ K.)/\Delta G_f^0(298\ K.)$
(kJ mol$^{-1}$)

| SPECIES | Fe | Co | Ni |
|---|---|---|---|
| $M_2Cl_4$ |  |  |  |
| (g) |  | −351/−334 |  |
| $MCl_3$ |  |  |  |
| (cr) | −399/−334 |  |  |
| (l) | −362/−315 |  |  |
| (g) | −253/−248 | −164/−155 |  |
| MF |  |  |  |
| (g) | +48/+14 |  |  |
| $MF_2$ |  |  |  |
| (cr) | −706/−663 | −672/−627 | −651a/−604a |
| (l) | −675/−634 | −638/−594 | −618b/— |
| (g) | −390/−400 | −356/−370 | −417b/— |
| $MF_3$ |  |  |  |
| (cr) | −1042/−972 | −790/−719 |  |
| (l) |  | −740b/— |  |
| (g) | −821/−813 | −698b/— |  |
| $M_2(CO)_8$ |  |  |  |
| (cr) |  | −1251c/— |  |
| (g) |  | −1185c/— |  |
| $M(CO)_n$ |  |  |  |
| (l) | n = 5  −766/−697 |  | n = 4  −632/−589 |
| (g) | −727/−689 |  | −602/−587 |

(a, Ref. <B>; b, Ref. <II-23>; c, Ref. <II-15>)

TABLE II-19

GROUP VIII B.
THERMODYNAMIC DATA
PART 2
$\Delta H_f^0(298\ K.)/\Delta G_f^0(298\ K.)$
(kJ mol$^{-1}$)

| SPECIES | Ru | Rh | Pd |
|---|---|---|---|
| MO |  |  |  |
| (cr) |  |  | −85a/— |
| (g) |  | +385a/— |  |
| $M_2O_3$ |  |  |  |
| (cr) |  | −343a/— |  |
| $MO_2$ |  |  |  |
| (cr) | −305a/— |  |  |
| (g) |  | +184a/— |  |
| $MO_3$ |  |  |  |
| (g) | −78a/— |  |  |

TABLE II-19-continued
GROUP VIII B. THERMODYNAMIC DATA PART 2
$\Delta H_f^0$(298 K.)/$\Delta G_f^0$(298 K.) (kJ mol$^{-1}$)

| SPECIES | Ru | Rh | Pd |
|---|---|---|---|
| MO$_4$ | | | |
| (cr) | −239a/−152a | | |
| (l) | −228a/−152a | | |
| (g) | −184a/−140a | | |
| MCL$_2$ | | | |
| (cr) | | | −199a/— |
| (g) | | +127a/— | |
| MCl$_3$ | | | |
| (cr) | −205a/— | −299a/— | |
| (g) | −1a/— | +67a/— | |
| MCl$_4$ | | | |
| (g) | −52a/ | | |
| MF$_2$ | | | |
| (cr) | | | −469d/−494d |
| MF$_5$ | | | |
| (cr) | −893a/— | | |
| (g) | −791a/— | | |
| M$_3$(CO)$_{12}$ | | | |
| (cr) | −1920c/— | | |
| (g) | −1820c/— | | |
| M$_4$(CO)$_{12}$ | | | |
| (cr) | | −1825c/— | |
| (g) | | −1724c/— | |
| M$_6$(CO)$_{16}$ | | | |
| (cr) | | −2418c/— | |
| (g) | | −2301c/— | |

(a, Ref <B>; c, Ref. <II-15>; d, Ref. <II-29>)

TABLE II-20
GROUP VIII B. THERMODYNAMIC DATA PART 3
$\Delta H_f^0$(298 K.)/$\Delta G_f^0$(298 K.) (kJ mol$^{-1}$)

| SPECIES | Os | Ir | Pt |
|---|---|---|---|
| M$_3$O$_4$ | | | |
| (cr) | | | −163a/— |
| MO$_2$ | | | |
| (cr) | | −274a/— | |
| (g) | | | +172a/+167a |
| MO$_3$ | | | |
| (g) | −284a/— | +8a/— | |
| MO$_4$ | | | |
| (cr) | −394a/−305a | | |
| (g) | −337a/−293a | | |
| MCl | | | |
| (cr) | | −82a/— | −56a/— |
| MCl$_2$ | | | |
| (cr) | | · | −123a/— |
| MCl$_3$ | | | |
| (cr) | −190a/— | −246a/— | −182a/— |
| MCl$_4$ | | | |
| (cr) | −255a/— | | −232a/— |
| (g) | −79a/— | | −232a/— |
| MF$_4$ | | | |
| (cr) | | | −681e/— |
| (g) | | | −544f/— |
| MF$_6$ | | | |
| (cr) | | −580a/−462a | −722g/— |
| (g) | | −544a/−460a | −676g/— |
| M$_3$(CO)$_{12}$ | | | |
| (cr) | −1749c/— | | |
| (g) | −1644c/— | | |
| M$_4$(CO)$_{12}$ | | | |
| (cr) | | −1820c/— | |
| (g) | | −1715c/— | |

(a, Ref. <B>; c, Ref. <II-15>; e, Ref. <II-30>; f, Ref. <II-31>; g, Ref. <II-32>)

2. BETA-DIKETONATES

For the main group elements we used as reagents O, O/NO$_2$, F, CH$_3$ and H. For GROUP VB we introduced CO. For the GROUP VIII B elements we find it useful to introduce the $\beta$-diketonyls. The $\beta$diketones exist in two forms—the keto-form and the enol-form,

[II-681]

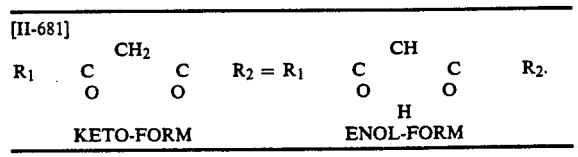

KETO-FORM             ENOL-FORM

We shall consider here only three of the $\beta$-diketones:
R$_1$=R$_2$=CH$_3$, acetylacetone, Hacac, B.P.=140° C.
R$_1$=CF$_3$, R$_2$=CH$_3$, trifluoroacetylacetone, Htfac, B.P.=107° C.
R$_1$=R$_2$=CF$_3$, hexafluoroacetylacetone, Hhfac, B.P.=70° C.

(All of the data in this SECTION are from Ref. <II-33> unless specifically noted.)

For the reaction $$H\text{-}\beta dik(g) \rightarrow H(g) + \beta dik\cdot(g), \quad [II\text{-}682]$$

$\beta$dik. being the $\beta$-diketonyl radical, the $\Delta H_r$ is estimated to be 418 kJ mol$^{-1}$. If we add to [II-682], $$H(g) + X(g) \rightarrow HX(g), \quad \Delta H_r(683), \quad [II\text{-}683]$$

we obtain $$H\text{-}\beta dik(g) + X(g) \rightarrow \beta dik\cdot(g) + HX(g), [II\text{-}684]$$

$$\Delta H_r(684) = 418 + \Delta H_r(684). \quad [II\text{-}684]$$

For $\Delta H_r(684) < 0$, we require that $\Delta H_r(683) < -418$.

| H(g) + H(g) → H$_2$(g) | | |
|---|---|---|
| 218  218 | 0, $\Delta H_r^0$(298 K.) = −436 kJ mol$^{-1}$, | |
| H(g) + O(g) → OH(g) | | |
| 218  249 | 39, $\Delta H_r^0$(298 K.) = −428 kJ mol$^{-1}$ | |
| and | | |
| H(g) + F(g) → HF(g) | | |
| 218  79 | −272, $\Delta H_r^0$(298 K.) = −569 kJ mol$^{-1}$. | |

Thus, we find that all three reagents are effective, but that monofluorine is the preferred reagent.

The enthalpies of formation of the three gaseous $\beta$-diketones are $$Hacac(g), \Delta H_f^0(298K) = -383 kJ\ mol^{-}$$

$$Htfac(g), \Delta H_f^0(298K) = -1014 kJ\ mol^{-1}$$

$$Hhfac(g), \Delta H_f^0(298K) = -1643 kJ\ mol^{-1}.$$

By [II-682]

$$418 = \Delta H_f^0\{\beta dik\cdot(g)\} + \Delta H_f^0\{H(g)\} - \Delta H_f^0\{H - \beta dik(g)\}$$
or
$$\Delta H_f^0\{\beta dik\cdot(g)\} = 418 - \Delta H_f^0\{H(g)\} + \Delta H_f^0\{H - \beta dik(g)\} =$$
$$= 418 - 218 + \Delta H_f^0\{H - \beta dik(g)\} =$$
$$200 + \Delta H_f^0\{H - \beta dik(g)\}$$

and $$\Delta H_f^0\{acac\cdot(g)\} = -183 kJ\ mol^{-1}$$

$\Delta H_f^0\{tfac(g)\} = -814 kJ\ mol^{-1}$ $\Delta H_f^0\{hfac(g)\} = -1443 kJ\ mol^{-1}$.

We now consider the reaction $$M(cr) + n\beta dik(g) \rightarrow M(\beta dik)_n(cr), \quad [\text{II-685}]$$

$\Delta H_r^0(685) = \Delta H_f^0\{M(\beta dik)_n(cr)\} - n\Delta H_f^0\{\beta dik(g)\}$.

By the 'times four' criterion we require that

| [II-686] | $4\Delta H_{sub}^0\{M(\beta dik)_n\} < -\Delta H_r^0(685)$ |
|---|---|
| | $< -\Delta H_f^0\{M(\beta dik)_n(cr)\}$ |
| | $+ n\Delta H_f^0\{\beta dik(g)\}$. |

For $M(acac)_n$ we have all the necessary data for three cases:

| Cr: | $4 \times 123 <^? 1565 + 3 \times -183$ |
|---|---|
| | $492 > 1016$ |
| Al: | $4 \times 120 <^? 1798 + 3 \times -183$ |
| | $480 < 1249$ |
| Cu: | $4 \times 110 <^? 810 + 2 \times -183$ |
| | $440 < 444$. |

Thus, we find that acac(g) is an effective volatilizing reagent for both Cr and Al and is borderline for Cu. (It should be noted that Ref. <II-33> gives two values for $\Delta H_f^0\{Cu(acac)_2(cr)\}$, $-809.9$ and $-782.4$ kJ mol$^{-1}$. The $-809.9$ kJ mol$^{-1}$ is the more recent value.)

For $M(tfac)_n$ we have all the necessary data for two cases:

| Be: | $4 \times 88 <^? 2498 - 2 \times 814$ |
|---|---|
| | $352 < 870$ |
| Al: | $4 \times 108 <^? 3696 - 3 \times 814$ |
| | $432 < 1254$. |

Again we find that $\beta$-dik(g) is an effective volatilizing reagent.

For $M(Hfac)_n$ we have data only for Cr and Cu, but the data are not complete. We have the enthalpies of sublimation, but not the enthalpies of formation for either the crystalline or gaseous states. We can, however, roughly estimate these values.

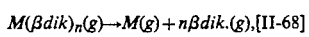

$M(\beta dik)_n(g) \rightarrow M(g) + n\beta dik.(g), [\text{II-68}]$ $\Delta H_r^0(687) = 2n\overline{D}(M-O)$, where $\overline{D}(M-O)$ is the average mean metal oxygen dissociation enthalpy. For Cr (hfac)$_3$, $\overline{D}(M-O) = 238$ kJ mol$^{-1}$, and for Cu (hfac)$_2$, $\overline{D}(M-O) = 163$ kJ mol$^{-1}$. (It should be noted that both of these values are given as $\pm 11$ kJ mol$^{-1}$.)

For Cr, $\Delta H_r^0(687) = 6 \times 238 = \Delta H_f^0\{Cr(g)\} + 3\Delta H_f^0\{hfac(g)\} - \Delta H_f^0\{Cr(hfac)_3(g)\}$

| $\Delta H_f^0\{Cr(hfac)_3(g)\}$ | $= -6 \times 238 + 397 + 3 \times -1443$ |
|---|---|
| | $= -5360$ kJ mol$^-$, |
| and | |
| $\Delta H_f^0\{Cr(hfac)_3(cr)\}$ | $= 5360 - 112$ |
| | $= -5472$ kJ mol$^{-1}$. |

Applying these numbers to [II-686] we have

| $4 \times 112 <^? 5472 + 3 \times -1443$ |
|---|
| $448 < 1143$. |

For Cu,

| $\Delta H_r(687) = 4 \times 163 = \Delta H_f^0\{cr(g)\} + 2\Delta H_f^0(hfac) - \Delta H_f^0\{Cu(hfac)_2(g)\}$, |
|---|
| or |
| $\Delta H_f^0\{Cu(hfac)_2(g)\} = -4 \times 163 + 338 + 2 \times 1443 =$ |
| $-3200$ kJ mol$^{-1}$, |
| and |
| $\Delta H_f^0\{Cu(hfac)_2(cr)\} = -3200 - 111 =$ |
| $-3311$ kJ mol$^{-1}$. |

Applying these numbers to [II-686] we have

| $4 \times 111 <^? 3311 + 2 \times -1443$ |
|---|
| $444 < 425$. |

If we had taken the extreme value for $\overline{D}(Cu-O) = 174$ kJ mol$^{-1}$, the inequality would have read

| $4 \times 111 <^? 355 + 2 \times -1443$ |
|---|
| $444 < 469$. |

Thus, the copper case is borderline. Under the conditions of the Apparatus the procedure is effective.

3. IRON

| [II-688] | Fe(cr) + O(g) → FeO(cr) | | | |
|---|---|---|---|---|
| | 0 | 249 | | $-272$, $\Delta H_r^0(298\ K.) = -521$ kJ mol$^{-1}$ |
| | 0 | 232 | | $-251$, $\Delta G_r^0(298\ K.) = -483$ kJ mol$^{-1}$, |
| [II-689] | FeO(cr) + ⅙ O(g) → ⅓ Fe$_3$O$_4$(cr) | | | |
| | $-272$ | ⅙ × 249 | ⅓ × $-1121$, | $\Delta H_r^0(298\ K.) = -185$ kJ mol$^{-1}$ |
| | $-251$ | ⅙ × 232 | ⅓ × $-1017$, | $\Delta G_r^0(298\ K.) = -165$ kJ mol$^{-1}$ |
| and | | | | |
| [II-690] | ⅓ Fe$_3$O$_4$cr) + 1/6 O(g) → ½ Fe$_2$O$_3$(cr) | | | |
| | ⅓ × $-1121$ | 1/6 × 249 | ½ × $-826$, | $\Delta H_r^0(298\ K.) = -81$ kJ mol$^{-1}$ |
| | ⅓ × $-1017$ | 1/6 × 232 | ½ × $-744$, | $\Delta G_r^0(298\ K.) = -72$ kJ mol$^{-1}$. |

Since the 'times four' criterion for the melting of the ferrous oxide is 88 kJ mol$^{-1}$, [II-688] will yield the liquid product. Whether the reaction will stop with [II-689] or continue to [II-690] is uncertain. For our present purposes, however, it does not make any difference.

| [II-691] | FeCl$_2$(cr) + 5 O(g) → FeO(cr) + 2 ClO$_2$(g) | | | |
|---|---|---|---|---|
| | $-342$ | 5 × 249 | $-272$ | 2 × 102, $\Delta H_r^0(298\ K.) = -971$ kJ mol$^{-1}$ |

-continued

| | | | |
|---|---|---|---|
| −302 | 5 × 232 | −251 | 2 × 120, $\Delta G_r^0(298\text{ K.}) = -869$ kJ mol$^{-1}$, |

[II-692] FeCl$_3$(cr) + 7 O(g) → FeO(cr) + 3 ClO$_2$(g)
    −399   7 × 249   −272   3 × 102, $\Delta H_r^0(298\text{ K.}) = -1310$ kJ mol$^{-1}$
    −334   7 × 232   −251   3 × 120, $\Delta G_r^0(298\text{ K.}) = -1181$ kJ mol$^{-1}$,

[II-693] FeF$_2$(cr) + 5 O(g) → FeO(cr) + 2 FO$_2$(g)
    −706   5 × 249   −270   2 × 13, $\Delta H_r^0(298\text{ K.}) = -783$ kJ mol$^{-1}$
    −663   5 × 232   −251   2 × 27, $\Delta G_r^0(298\text{ K.}) = -694$ kJ mol$^{-1}$ and

[II-694] FeF$_3$(cr) + 7 O(g) → FeO(cr) + 3 FO$_2$(g)
    −1042   7 × 249   −272   3 × 13, $\Delta H_r^0(298\text{ K.}) = -934$ kJ mol$^{-1}$
    −972   7 × 232   −251   3 × 27, $\Delta G_r^0(298\text{ K.}) = -822$ kJ mol$^{-1}$,

[II-695] Fe(cr) + 2 F(g) → FeF$_2$(cr)
    0   2 × 79   −706, $\Delta H_r^0(298\text{ K.}) = -864$ kJ mol$^{-1}$
    0   2 × 62   −663, $\Delta G_r^0(298\text{ K.}) = -787$ kJ mol$^{-1}$,

[II-696] FeF$_2$(cr) + F(g) → FeF$_3$(cr)
    −706   79   −1042, $\Delta H_r^0(298\text{ K.}) = -415$ kJ mol$^{-1}$
    −663   62   −972, $\Delta G_r^0(298\text{ K.}) = -371$ kJ mol$^{-1}$,

[II-697] FeF$_2$(cr) + F*(g) → FeF$_3$(cr)
    −706   245   −1042, $\Delta H_r^*(298\text{ K.}) = -581$ kJ mol$^{-1}$,

[II-698] FeO(cr) + 5 F(g) → FeF$_3$(cr) + OF$_2$(g)
    −272   5 × 79   −1042   24, $\Delta H_r^0(298\text{ K.}) = -1141$ kJ mol$^{-1}$
    −251   5 × 62   −972   42, $\Delta G_r^0(298\text{ K.}) = -989$ kJ mol$^{-1}$,

[II-699] Fe$_3$O$_4$(cr) + 17 F(g) → 3 FeF$_3$(cr) + 4 OF$_2$(g)
    −1121   17 × 79   3 × −1042   4 × 24, $\Delta H_r^0(298\text{ K.}) = -3252$ kJ mol$^{-1}$
    −1017   17 × 62   3 × −972   4 × 42, $\Delta G_r^0(298\text{ K.}) = -2785$ kJ mol$^{-1}$ and

[II-700] Fe$_2$O$_3$(cr) + 12 F(g) → 2 FeF$_3$(cr) + 3 OF$_2$(g)
    −826   12 × 79   2 × −1042   3 × 24, $\Delta H_r^0(298\text{ K.}) = -2134$ kJ mol$^{-1}$
    −744   12 × 62   2 × −972   3 × 42, $\Delta G_r^0(298\text{ K.}) = -1818$ kJ mol$^{-1}$.

Thus, O+F is an effective procedure. By virtue of [II-697] even excited state monofluorine alone is not an effective procedure.

[II-701] Fe(cr) + 5 CO(g) → Fe(CO)$_5$(l)
    0   5 × −110   −766, $\Delta H_r^0(298\text{ K.}) = -216$ kJ mol$^{-1}$
    0   5 × −137   −697, $\Delta G_r^0(298\text{ K.}) = -12$ kJ mol$^{-1}$,

[II-702] FeO(cr) + 6 CO(g) → Fe(CO)$_5$(l) + CO$_2$(g)
    −272   6 × −110   −766   −394, $\Delta H_r^0(298\text{ K.}) = -228$ kJ mol$^{-1}$
    −251   6 × −137   −697   −394, $\Delta G_r^0(298\text{ K.}) = -18$ kJ mol$^{-1}$,

[II-703] Fe$_3$O$_4$(cr) + 19 CO(g) → Fe(CO)$_5$(l) + 4 CO$_2$(g)
    −1121   19 × −110   3 × −766   4 × −394, $\Delta H_r^0(298\text{ K.}) = -663$ kJ mol$^{-1}$
    −1017   19 × −137   3 × −697   4 × −394, $\Delta G_r^0(298\text{ K.}) = -47$ kJ mol$^{-1}$,

[II-704] Fe$_2$O$_3$(cr) + 13 CO(g) → 2 Fe(CO)$_5$(l) + 3 CO$_2$(g)
    −826   13 × −110   2 × −766   3 × −394, $\Delta H_r^0(298\text{ K.}) = -458$ kJ mol$^{-1}$
    −744   13 × −137   2 × −697   3 × −394, $\Delta G_r^0(298\text{ K.}) = -51$ kJ mol$^{-1}$,

[II-705] FeCl$_2$(cr) + 7 CO(g) → Fe(CO)$_5$(l) + 2 COCl(g)
    −342   7 × −110   −766   2 × −63, $\Delta H_r^0(298\text{ K.}) = +220$ kJ mol$^{-1}$
    −302   7 × −137   −697   2 × −77, $\Delta G_r^0(298\text{ K.}) = +410$ kJ mol$^{-1}$,

[II-706] FeCl$_2$(cr) + 7 CO*(g) → Fe(CO)$_5$(l) + 2 COCl(g)
    −342   7 × 564   −766   2 × −63, $\Delta H_r^*(298\text{ K.}) = -4498$ kJ mol$^{-1}$,

[II-707] FeCl$_3$(cr) + 8 CO*(g) → Fe(CO)$_5$(l) + 3 COCl(g)
    −399   8 × 564   −766   3 × −63, $\Delta H_r^*(298\text{ K.}) = -5068$ kJ mol$^{-1}$,

[II-708] FeF$_2$(cr) + 7 CO*(g) → Fe(CO)$_5$(l) + 2 COF(g)
    −706   7 × 564   −766   2 × −172, $\Delta H_r^*(298\text{ K.}) = -4352$ kJ mol$^{-1}$, and

[II-709] FeF$_3$(cr) + 8 CO*(g) → Fe(CO)$_5$(l) + 3 COF(g)
    −1042   8 × 564   −766   3 × −172, $\Delta H_r^*(298\text{ K.}) = -4752$ kJ mol$^{-1}$.

Thus, we have the choice of three procedures for the volatilization of iron species:

O+F
O+CO
CO*

4. COBALT

[II-710] Co(cr) + O(g) → CoO(cr)
    0   249   −238, $\Delta H_r^0(298\text{ K.}) = -487$ kJ mol$^{-1}$
    0   232   −214, $\Delta G_r^0(298\text{ K.}) = -246$ kJ mol$^{-1}$ and

[II-711] CoO(cr) + ⅓ O(g) → ⅓ Co$_3$O$_4$(cr)
    −238   ⅓ × 249   ⅓ × −910, $\Delta H_r^0(298\text{ K.}) = -148$ kJ mol$^{-1}$
    −214   ⅓ × 232   ⅓ × −795, $\Delta G_r^0(298\text{ K.}) = -128$ kJ mol$^{-1}$.

The oxides Co$_2$O$_3$ and CoO$_2$ are also known, but we have no thermodynamic data on them.

[II-712] CoCl$_2$(cr) + 5 O(g) → CoO(cr) + 2 ClO$_2$(g)
    −313   5 × 249   −238   2 × 102, $\Delta H_r^0(298\text{ K.}) = -966$ kJ mol$^{-1}$
    −270   5 × 232   −214   2 × 120, $\Delta G_r^0(298\text{ K.}) = -864$ kJ mol$^{-1}$,

[II-713] CoF$_2$(cr) + 5 O(g) → CoO(cr) + 2 FO$_2$(g)
    −672   5 × 249   −238   2 × 13, $\Delta H_r^0(298\text{ K.}) = -785$ kJ mol$^{-1}$
    −627   5 × 232   −214   2 × 27, $\Delta G_r^0(298\text{ K.}) = -693$ kJ mol$^{-1}$ and

[II-714] $CoF_3(cr) + 7 O(g) \rightarrow CoO(cr) + 3 FO_2(g)$
  −790   7 × 249   −238   3 × 13, $\Delta H_r^0(298 K.) = -1152$ kJ mol$^{-1}$
  −719   7 × 232   −214   3 × 27, $\Delta G_r^0(298 K.) = -1038$ kJ mol$^{-1}$.

[II-715] $Co(cr) + 2 F(g) \rightarrow CoF_2(cr)$
  0   2 × 79   −672, $\Delta H_r^0(298 K.) = -830$ kJ mol$^{-1}$

|   |   |   |   |
|---|---|---|---|
|   |   | −672 245 | −790, $\Delta H_r^*(298 K.) = -363$ kJ mol$^{-1}$. |

Since the 'times four' criterion for the trifluoride is 368 kJ mol$^{-1}$, [II-718] is marginally effective in the volatilization of the trifluoride. It is, therefore, not advisable to depend on the F* procedure.

| | | | | |
|---|---|---|---|---|
| [II-719] | $CoO(cr) + 4 F(g) \rightarrow CoF_2(cr) + OF_2(g)$ | | | |
| | −238 | 4 × 79 | −672 | 24, $\Delta H_r^0(298 K.) = -726$ kJ mol$^{-1}$ |
| | −214 | 4 × 62 | −627 | 42, $\Delta G_r^0(298 K.) = -619$ kJ mol$^{-1}$, |
| [II-720] | $CoO(cr) + 4 F^*(g) \rightarrow CoF_2(cr) + OF_2(g)$ | | | |
| | −238 | 4 × 245 | −672 | 24, $\Delta H_r^*(298 K.) = -1390$ kJ mol$^{-1}$, |
| [II-721] | $CoO(cr) + 5 F(g) \rightarrow CoF_3(cr) + OF_2(g)$ | | | |
| | −238 | 5 × 79 | −790 | 24, $\Delta H_r^0(298 K.) = -923$ kJ mol$^{-1}$ |
| | −214 | 5 × 62 | −719 | 42, $\Delta G_r^0(298 K.) = -773$ kJ mol$^{-1}$, |
| [II-722] | $Co_3O_4(cr) + 14 F(g) \rightarrow 3 CoF_2(cr) + 4 OF_2(g)$ | | | |
| | −910 | 14 × 79 | 3 × −672 | 4 × 29, $\Delta H_r^0(298 K.) = -2116$ kJ mol$^{-1}$ |
| | −795 | 14 × 62 | 3 × −627 | 4 × 42, $\Delta G_r^0(298 K.) = -1786$ kJ mol$^{-1}$, |
| [II-723] | $Co_3O_4(cr) + 14 F^*(g) \rightarrow 3 CoF_2(cr) + 4 OF_2(g)$ | | | |
| | −910 | 14 × 245 | 3 × −672 | 4 × 24, $\Delta H_r^*(298 K.) = -4440$ kJ mol$^{-1}$ | and

| | | | | |
|---|---|---|---|---|
| [II-724] | $Co_3O_4(cr) + 17 F(g) \rightarrow 3 CoF_3(cr) + 4 OF_2(g)$ | | | |
| | −910 | 17 × 79 | 3 × −790 | 4 × 24, $\Delta H_r^0(298 K.) = -2707$ kJ mol$^{-1}$ |
| | −795 | 17 × 62 | 3 × −719 | 4 × 42, $\Delta G_r^0(298 K.) = -2248$ kJ mol$^{-1}$. |

0   2 × 62   −627, $\Delta G_r^0(298 K.) = -751$ kJ mol$^{-1}$,

[II-716] $Co(cr) + 2 F^*(g) \rightarrow CoF_2(cr)$
  0   2 × 245   −672, $\Delta H_r^*(298 K.) = -1162$ kJ mol$^{-1}$, Thus, O+F* is an effective procedure as is O+F is sufficient monofluorine is present to ensure that all of the fluoride formed is the trifluoride

| | | | | |
|---|---|---|---|---|
| [II-725] | $2 Co(cr) + 8 CO(g) \rightarrow Co_2(CO)_8(cr)$ | | | |
| | 0 | 8 × −110 | −1251, | $\Delta H_r^0(298 K.) = -371$ kJ mol$^{-1}$, |
| [II-726] | $2 CoO(cr) + 10 CO(g) \rightarrow Co_2(CO)_8(cr) + 2 CO_2(g)$ | | | |
| | 2 × −238 | 10 × −110 | −1251 | 2 × −394, $\Delta H_r^0(298 K.) = -463$ kJ mol$^{-1}$ | and

| | | | | |
|---|---|---|---|---|
| [II-727] | $Co_3O_4(cr) + 16 CO(g) \rightarrow 1.5 Co_2(CO)_8(cr) + 4 CO_2(g)$ | | | |
| | −910 | 16 × 110 | 1.5 × −1151 | 4 × −394, $\Delta H_r^0(298 K.) = -782$ kJ mol$^{-1}$. |

Thus, O+CO is an effective procedure.

| | | | | |
|---|---|---|---|---|
| [II-728] | $2 CoCl_2(cr) + 12 CO(g) \rightarrow Co(CO)_8(cr) + 4 COCl(g)$ | | | |
| | 2 × −313 | 12 × −110 | −1251 | 4 × −63, $\Delta H_r^0(298 K.) = +443$ kJ mol$^{-1}$, |
| [II-729] | $2 CoCl_2(cr) + 12 CO^*(g) \rightarrow Co_2(CO)_8(cr) + 4 COCl(g)$ | | | |
| | 2 × −313 | 12 × 564 | −1251 | 4 × −63, $\Delta H_r^*(298 K.) = -7645$ kJ mol$^{-1}$, |
| [II-730] | $2 CoF_2(cr) + 12 CO(g) \rightarrow Co_2(CO)_8(cr) + 4 COF(g)$ | | | |
| | 2 × −672 | 12 × −110 | −1251 | 4 × −172, $\Delta H_r^0(298 K.) = +725$ kJ mol$^{-1}$, |
| [II-731] | $2 CoF_2(cr) + 12 CO^*(g) \rightarrow Co_2(CO)_8(cr) + 4 COF(g)$ | | | |
| | 2 × −672 | 12 × 564 | −1251 | 4 × −172, $\Delta H_r^*(298 K.) = -7363$ kJ mol$^{-1}$, |
| [II-732] | $2 CoF_3(cr) + 14 CO(g) \rightarrow Co_2(CO)_8(cr) + 6 COF(g)$ | | | |
| | 2 × −790 | 14 × −110 | −1251 | 6 × −172, $\Delta H_r^0(298 K.) = +837$ kJ mol$^{-1}$ | and

| | | | | |
|---|---|---|---|---|
| [II-733] | $2 CoF_3(cr) + 14 CO^*(g) \rightarrow Co_2(CO)_8(cr) + 6 COF(g)$ | | | |
| | 2 × −790 | 14 × 564 | −1251 | 6 × −172, $\Delta H_r^*(298 K.) = -8599$ kJ mol$^{-1}$. |

[II-717] $CoF_2(cr) + F(g) \rightarrow CoF_3(cr)$
  −672   79   −790, $\Delta H_r^0(298 K.) = -197$ kJ mol$^{-1}$
  −627   62   −719, $\Delta G_r^0(298 K.) = -154$ kJ mol$^{-1}$ and

[II-718] $CoF_2(cr) + F^*(g) \rightarrow CoF_3(cr)$

Thus, the choices of procedures for the volatilization of cobalt species are
O+F (?)
)+F*
O+CO
CO*.

5. NICKEL

| | | | |
|---|---|---|---|
| [II-734] | $Ni(cr) + O(g) \rightarrow NiO(cr)$ | | |
| | 0 | 249 | −240, $\Delta H_r^0(298 K.) = -489$ kJ mol$^{-1}$ |
| | 0 | 232 | −212, $\Delta G_r^0(298 K.) = -444$ kJ mol$^{-1}$, |
| [II-735] | $NiO(cr) + 0.5 O(g) \rightarrow 0.5 Ni_2O_3(cr)$ | | |

-continued

| | | | | |
|---|---|---|---|---|
| | $-240$ | $0.5 \times 249$ | $0.5 \times -490$, | $\Delta H_r^0(298 \text{ K.}) = -130 \text{ kJ mol}^{-1}$, |
| [II-736] | $NiCl_2(cr) + 5 O(g) \rightarrow NiO(cr) + 2 ClO_2(g)$ | | | |
| | $-305$ | $5 \times 249$ | $-240$ | $2 \times 102$, $\Delta H_r^0(298 \text{ K.}) = -976 \text{ kJ mol}^{-1}$ |
| | $-259$ | $5 \times 232$ | $-212$ | $2 \times 120$, $\Delta G_r^0(298 \text{ K.}) = -873 \text{ kJ mol}^{-1}$ |
| and | | | | |
| [II-737] | $NiF_2(cr) + 5 O(g) \rightarrow NiO(cr) + 2 FO_2(g)$ | | | |
| | $-651$ | $5 \times 249$ | $-240$ | $2 \times 13$, $\Delta H_r^0(298 \text{ K.}) = -808 \text{ kJ mol}^{-1}$, |
| | $-604$ | $5 \times 232$ | $-212$ | $2 \times 27$, $\Delta G_r^0(298 \text{ K.}) = -714 \text{ kJ mol}^{-1}$, |
| [II-738] | $Ni(cr) + 2 F(g) \rightarrow NiF_2(cr)$ | | | |
| | $0$ | $2 \times 79$ | | $-651$, $\Delta H_r^0(298 \text{ K.}) = -809 \text{ kJ mol}^{-1}$ |
| | $0$ | $2 \times 62$ | | $-604$, $\Delta G_r^0(298 \text{ K.}) = -728 \text{ kJ mol}^{-1}$, |
| [II-739] | $Ni(cr) + 2 F^*(g) \rightarrow NiF_2(cr)$ | | | |
| | $0$ | $2 \times 245$ | | $-651$, $\Delta H_r^*(298 \text{ K.}) = -1141 \text{ kJ mol}^{-1}$, |
| [II-740] | $NiO(cr) + 4 F(g) \rightarrow NiF_2(cr) + OF_2(g)$ | | | |
| | $-240$ | $4 \times 79$ | $-651$ | $24$, $\Delta H_r^0(298 \text{ K.}) = -703 \text{ kJ mol}^{-1}$ |
| | $-212$ | $4 \times 62$ | $-604$ | $42$, $\Delta G_r^0(298 \text{ K.}) = -598 \text{ kJ mol}^{-1}$, |
| [II-741] | $NiO(cr) + 4 F^*(g) \rightarrow NiF_2(cr) + OF_2(g)$ | | | |
| | $-240$ | $4 \times 245$ | $-651$ | $24$, $\Delta H_r^*(298 \text{ K.}) = -1367 \text{ kJ mol}^{-1}$, |
| [II-742] | $Ni_2O_3(cr) + 10 F(g) \rightarrow 2 NiF_2(cr) + 3 OF_2(g)$ | | | |
| | $-490$ | $10 \times 79$ | $2 \times -651$ | $3 \times 24$, $\Delta H_r^0(298 \text{ K.}) = -1530 \text{ kJ mol}^{-1}$, |
| [II-743] | $Ni_2O_3(cr) + 10 F^*(g) \rightarrow 2 NiF_2(cr) = 3 OF_2(g)$ | | | |
| | $-490$ | $10 \times 245$ | $2 \times -651$ | $3 \times 24$, $\Delta H_r^*(298 \text{ K.}) = -3190 \text{ kJ mol}^{-1}$, |
| [II-744] | $NiCl_2(cr) + 8 F(g) \rightarrow NiF_2(cr) + 2 ClF_3(g)$ | | | |
| | $-305$ | $8 \times 79$ | $-651$ | $2 \times -159$, $\Delta H_r^0(198 \text{ K.}) = -1296 \text{ kJ mol}^{-1}$ |
| | $-259$ | $8 \times 62$ | $-604$ | $2 \times -119$, $\Delta G_r^0(298 \text{ K.}) = -1079 \text{ kJ mol}^{-1}$, |
| [II-745] | $Ni(cr) + 4 CO(g) \rightarrow Ni(CO)_4(l)$ | | | |
| | $0$ | $4 \times 110$ | | $-632$, $\Delta H_r^0(298 \text{ K.}) = -192 \text{ kJ mol}^{-1}$ |
| | $0$ | $4 \times -137$ | | $-589$, $\Delta G_r^0(298 \text{ K.}) = -41 \text{ kJ mol}^{-1}$, |
| [II-746] | $NiO(cr) + 5 CO(g) \rightarrow Ni(CO)_4(l) + CO_2(g)$ | | | |
| | $-240$ | $5 \times -110$ | $-632$ | $-394$, $\Delta H_r^0(298 \text{ K.}) = -236 \text{ kJ mol}^{-1}$ |
| | $-212$ | $5 \times -137$ | $-589$ | $-394$, $\Delta G_r^0(298 \text{ K.}) = -86 \text{ kJ mol}^{-1}$, |
| [II-747] | $Ni_2O_3(cr) + 11 CO(g) \rightarrow 2 Ni(CO)_4(l) + 3 CO_2(g)$ | | | |
| | $-490$ | $11 \times -110$ | $2 \times -632$ | $3 \times -394$, $\Delta H_r^0(298 \text{ K.}) = -746 \text{ kJ mol}^{-1}$, |
| [II-748] | $NiCl_2(cr) + 10 CO(g) \rightarrow Ni(CO)_4(l) + 2 COCl(g)$ | | | |
| | $-305$ | $10 \times -110$ | $-632$ | $2 \times -63$, $\Delta H_r^0(298 \text{ K.}) = +647 \text{ kJ mol}^{-1}$, |
| | $-259$ | $10 \times -137$ | $-589$ | $2 \times -77$, $\Delta G_r^0(298 \text{ K.}) = +886 \text{ kJ mol}^{-1}$, |
| [II-749] | $NiCl_2(cr) + 10 CO^*(g) \rightarrow Ni(CO)_4(l) + 2 COCl(g)$ | | | |
| | $-305$ | $10 \times 564$ | $-632$ | $2 \times -63$, $\Delta H_r^*(298 \text{ K.}) = -6093 \text{ kJ mol}^{-1}$, |
| [II-750] | $NiF_2(cr) + 10 CO(g) \rightarrow Ni(CO)_4(l) + 2 COF(g)$ | | | |
| | $-651$ | $10 \times -110$ | $-632$ | $2 \times -172$, $\Delta H^0(298 \text{ K.}) = +775 \text{ kJ mol}^{-1}$ |
| | $-604$ | $10 \times -137$ | $-589$ | $2 \times -183$, $\Delta G_r^0(298 \text{ K.}) = +1019 \text{ kJ mol}^{-1}$ |
| and | | | | |
| [II-751] | $NiF_2(cr) + 10 CO^*(g) \rightarrow Ni(CO)_4(l) + 2 COF(g)$ | | | |
| | $-651$ | $10 \times 564$ | $-632$ | $2 \times -172$, $\Delta H_r^*(298 \text{ K.}) = -5975 \text{ kJ mol}^{-1}$. |

Thus, we have the choice of four procedures for the volatilization of nickel species:

$O+F^*$
$F^*$ (in the absence of $NiF_2$)
$O+CO$
$CO^*$.

6. RUTHENIUM

| | | | |
|---|---|---|---|
| [II-752] | $Ru(cr) + 2 O(g) \rightarrow RuO_2(cr)$ | | |
| | $0$ | $2 \times 249$ | $-305$, $\Delta H_r^0(298 \text{ K.}) =$ $-803 \text{ kJ mol}^{-1}$, |
| [II-753] | $RuO_2(cr) + O(g) \rightarrow RuO_3(g)$ | | |
| | $-305$ | $249$ | $-78$, $\Delta H_r^0(298 \text{ K.}) =$ $-22 \text{ kJ mol}^{-1}$ |
| and | | | |
| [II-754] | $RuO_2(cr) + 2 O(g) \rightarrow RuO_4(cr)$ | | |
| | $-305$ | $2 \times 249$ | $-239$, $\Delta H_r^0(298 \text{ K.}) =$ $-432 \text{ kJ mol}^{-1}$. |

The dioxide crystallizes in the rutile structure. Each ruthenium atom is bonded to six oxygens octahedrally, and each oxygen is bonded to three ruthenium atoms. In the tetroxide, however, each ruthenium atom is bonded to four oxygen atoms tetrahedrally, and each oxygen atom is bonded to only one ruthenium atom <II−34>. Reaction [II-754] is, therefore, expected to be slow unless the dioxide is amorphous. Thus, it cannot be relied as a means of volatilizing the dioxide.

| | | | | |
|---|---|---|---|---|
| [II-755] | $RuCl_3(cr) + 10 O(g) \rightarrow RuO_4(cr) + 3 ClO_2(g)$ | | | |
| | $-205$ | $10 \times 249$ | $-239$ | $3 \times 102$, $\Delta H_r^0(298 \text{ K.}) =$ $-2218 \text{ kJ mol}^{-1}$, |
| and | | | | |
| [II-756] | $RuF_5(cr) + 14 O(g) \rightarrow RuO_4(cr) + 5 FO_2(g)$ | | | |
| | $-893$ | $14 \times 249$ | $-239$ | $5 \times 13$, $\Delta H_r^0(298 \text{ K.}) =$ $-2767 \text{ kJ mol}^{-1}$. |

Thus, with the caveat that the rate of removal of the dioxide may be quite slow monoxygen can be an effective volatilizing reagent for ruthenium species.

| | | | | |
|---|---|---|---|---|
| [II-757] | $Ru(cr) + 5 F(g) \rightarrow RuF_5(cr)$ | | | |
| | $0$ | $5 \times 79$ | $-893$, $\Delta H_r^0(298 \text{ K.}) = -1288 \text{ kJ mol}^{-1}$, | |
| [II-758] | $RuO_2(cr) + 9 F(g) \rightarrow RuF_5(cr) + 2 OF_2(g)$ | | | |
| | $-305$ | $9 \times 79$ | $-893$ | $2 \times 24$, $\Delta H_r^0(298 \text{ K.}) = -1251 \text{ kJ mol}^{-1}$ |
| and | | | | |
| [II-759] | $RuCl_3(cr) + 14 F(g) \rightarrow RuF_5(cr) + 3 ClF_3(g)$ | | | |
| | $-205$ | $14 \times 79$ | $-893$ | $3 \times -159$, $\Delta H_r^0(298 \text{ K.}) = -2271 \text{ kJ mol}^{-1}$, |
| [II-760] | $3 Ru(cr) + 12 CO(g) \rightarrow Ru_3(CO)_{12}(cr)$ | | | |
| | $0$ | $12 \times -110$ | $-1920$, $\Delta H_r^0(298 \text{ K.}) = -600 \text{ kJ mol}^{-1}$, | |
| [II-761] | $3 RuO_2(cr) + 18 CO(g) \rightarrow Ru_3(CO)_{12}(cr) + 6 CO_2(g)$ | | | |

-continued $$3 \times -305 \quad 18 \times -110 \quad -1920 \quad 6 \times -394, \Delta H_r^0(298\ K.) = -1389\ kJ\ mol^{-1},$$

[II-762] $3\ RuCl_3(cr) + 21\ CO(g) \rightarrow Ru_3(CO)_{12}(cr) + 9\ COCl(g)$
$$3 \times -205 \quad 21 \times -110 \quad -1920 \quad 9 \times -63, \Delta H_r^0(298\ K.) = +438\ kJ\ mol^{-1},$$

[II-763] $3\ RuCl_3(cr) + 21\ CO^*(g) \rightarrow Ru_3(CO)_{12}(cr) + 9\ COCl(g)$
$$3 \times -205 \quad 21 \times 564 \quad -1920 \quad 9 \times -63, \Delta H_r^*(298\ K.) = -13,716\ kJ\ mol^{-1},$$

[II-764] $3\ RuF_5(cr) + 27\ CO(g) \rightarrow Ru_3(CO)_{12} + 15\ COF(g)$
$$3 \times -893 \quad 27 \times -110 \quad -1920 \quad 15 \times -172, \Delta H_r^0(298\ K.) = +1149\ kJ\ mol^{-1}$$

and

[II-765] $3\ RuF_5(cr) + 27\ CO^*(g) \rightarrow Ru_3(CO)_{12} + 15\ COF(g)$
$$3 \times -893 \quad 27 \times 564 \quad -1920 \quad 15 \times -172, \Delta H_r^*(298\ K.) = -17,049\ mol^{-1}.$$

Thus, the choices of procedures for the volatilization of ruthenium species are

O (?)
O+F
F (in the absence of RuF$_5$)
O+CO
CO*.

7. RHODIUM

In the absence of data on the rhodium fluorides we can make no judgment relative to the efficacy of monofluorine.

[II-766] $Rh(cr) + O(g) \rightarrow RhO(g)$
$$0 \quad 249 \quad 385, \Delta H_r^0(298\ K.) = +136\ kJ\ mol^{-1},$$

[II-767] $Rh(cr) + 1.5\ O(g) \rightarrow 0.5\ Rh_2O_3(cr)$
$$0 \quad 1.5 \times 249 \quad 0.5 \times -343, \Delta H_r^0(298\ K.) = -545\ kJ\ mol^{-1}$$

and

[II-768] $0.5\ Rh_2O_3(cr) + 0.5\ O(g) \rightarrow RhO_2(g)$
$$0.5 \times -343 \quad 0.5 \times 249 \quad +184, \Delta H_r^0(298\ K.) = +231\ kJ\ mol^{-1}.$$

Thus, the sesquioxide is the product of the reaction of monoxygen with rhodium.

[II-769] $RhCl_3(cr) + 7.5\ O(g) \rightarrow 0.5\ Rh_2O_3(cr) + 3\ ClO_2(g)$
$$-299 \quad 7.5 \times 249 \quad 0.5 \times -343 \quad 3 \times 102, \Delta H_r^0(298\ K.) = -1434\ kJ\ mol^{-1},$$

and monoxygen will also convert the trichloride to the sesquioxide.

[II-770] $4\ Rh(cr) + 12\ CO(g) \rightarrow Rh_4(CO)_{12}(cr)$
$$0 \quad 12 \times -110 \quad -1825, \Delta H_r^0(298\ K.) = -505\ kJ\ mol^{-1},$$

[II-771] $2\ Rh_2O_3(cr) + 18\ CO(g) \rightarrow Rh_4(CO)_{12}(cr) + 6\ CO_2(g)$
$$2 \times -343 \quad 18 \times -110 \quad -1825 \quad 6 \times -394, \Delta H_r^0(298\ K.) = -1523\ kJ\ mol^{-1},$$

[II-772] $4\ RhCl_3(cr) + 24\ CO(g) \rightarrow Rh_4(CO)_{12}(cr) + 6\ COCl(g)$
$$4 \times -299 \quad 24 \times -110 \quad -1825 \quad 6 \times -63, \Delta H_r^0(298\ K.) = +1633\ kJ\ mol^{-1},$$

and

[II-773] $4\ RhCl_3(cr) + 24\ CO^*(g) \rightarrow Rh_4(CO)_{12}(cr) + 6\ COCl(g)$
$$4 \times -299 \quad 24 \times 564 \quad -1825 \quad 6 \times -63, \Delta H_r^*(298\ K.) = -14,543\ kJ\ mol^{-1}.$$

Since reaction [II−771] is expected to be slow with ground state carbon monoxide, but fast with the excited state carbon monoxide, only the excited state carbon monoxide is recommended. (The reason that the slow rate is expected is that in the carbonyl compound the rhodium atoms form a tetrahedron, whereas in the sesquioxide each rhodium is surrounded octahedrally by oxygens. The energentics of the excited state carbon monoxide is so great that the rhodium atoms will be quite mobile when the oxygens separating them are removed in the formation of carbon dioxide.) The recommended procedures, thus, are:

O+CO*
CO*.

8. PALLADIUM

The paucity of thermodynamic data on the palladium species precludes an extensive analysis at this time.

[II-774] $Pd(cr) + O(g) \rightarrow PdO(cr)$
$$0 \quad 249 \quad -85, \Delta H_r^0(298\ K.) = -334\ kJ\ mol^{-1},$$

[II-775] $PdCl_2(cr) + 5\ O(g) \rightarrow PdO(cr) + 2\ ClO_2(g)$
$$-199 \quad 5 \times 249 \quad -85 \quad 2 \times 102, \Delta H_r^0(298\ K.) = -927\ kJ\ mol^{-1}$$

and

[II-776] $PdF_2(cr) + 5\ O(g) \rightarrow PdO(cr) + 2\ FO_2(g)$
$$-469 \quad 5 \times 249 \quad -85 \quad 2 \times 13, \Delta H_r^0(298\ K.) = -835\ kJ\ mol^{-1}.$$

[II-777] $Pd(cr) + 2\ F(g) \rightarrow PdF_2(cr)$
$$0 \quad 2 \times 79 \quad -469, \Delta H_r^0(298\ K.) = -627\ kJ\ mol^{-1},$$

[II-778] $PdO(cr) + 4\ F(g) \rightarrow PdF_2(cr) + 2\ OF_2(g)$
$$-85 \quad 4 \times 79 \quad -469 \quad 2 \times -24, \Delta H_r^0(298\ K.) = -652\ kJ\ mol^{-1}$$

and

[II-779] $PdCl_2(cr) + 8\ F(g) \rightarrow PdF_2(cr) + 2\ ClF_3(g)$
$$-199 \quad 8 \times 79 \quad -469 \quad 2 \times -159, \Delta H_r^0(298\ K.) = -1220\ kJ\ mol^{-1}.$$

The vapor pressures of Pd(acac)$_2$ and Pt(acac)$^2$ are 1 mm at 74°–94° C. and 80°–102° C., respectively <II−35>. Furthermore, Pt (hfa)$_2$ sublimes at 65° C., <II−36>. Thus, hfa is expected to be an effective volatilizing reagent for palladium. The question, however, must be asked whether hfa is an effective volatilizing reagent for palladium species other than the metal itself? Will, for example,

[II-780] PdF$_2$(cr) + 4 hfa(g) → Pd(hfa)$_2$(g) + 2 F(hfa)(g)
occur? Consider the reactions

[II-781] CHF(g) → CH(g) + F(g)
126    594    79, $\Delta H_r^0$(298 K.) = +547 kJ mol$^{-1}$,
[II-782] CHF(g) → CF(g) + H(g)
126    255    218, $\Delta H_r^0$(298 K.) = +347 kJ mol$^{-1}$,
[II-783] CF(g) → C(g) + F(g)
255    717    79, $\Delta H_r^0$(298 K.) = +541 kJ mol$^{-1}$
and
[II-784] CH(g) → C(g) + H(g)
594    717    218, $\Delta H_r^0$(298 K.) = +341 kJ mol$^{-1}$.

Thus, we see that the C-F, bond strength is of the order of 540-550 kJ mol$^{-1}$, whereas the C-H bond strength is only of the order of 340-350 kJ mol$^{-1}$. The compound F(hfa) is, therefore, a stabile compound.

There would appear to be a contradiction here since we assumed a $\Delta H_r$ of 418 kJ mol$^{-1}$ for [II-682]. There actually is no contradiction since H-$\beta$dik(g) is the enol. The hydrogen is bonded to oxygen!

[II-785] OH(g) → O(g) + H(g)
39    249    218, $\Delta H_r^0$(298 K.) = +428 kJ mol$^{-1}$,
and
[II-786] CH$_3$OH(g) → CH$_3$O(g) → H(g)
−201    18    218, $\Delta H_r^0$(298 K.) = +437 kJ mol$^{-1}$, (The datum for methanol is from Ref. <B>, and the datum for methoxy is from Ref. <II−13>.) The value for H-$\beta$dik(g) is somewhat lower because of the resonance stabilization of $\beta$dik.

9. OSMIUM

[II-787] Os(cr) + 3 O(g) → OsO$_3$(g)
0    3 × 249    −284, $\Delta H_r^0$(298 K.) = −1031 kJ mol$^{-1}$,
[II-788] Os(cr) + 4 O(g) → OsO$_4$(cr)
0    4 × 249    −394, $\Delta H_r^0$(298 K.) = −1390 kJ mol$^{-1}$
0    4 × 232    −305, $\Delta G_r^0$(298 K.) = −1233 kJ mol$^{-1}$,
[II-789] OsCl$_3$(cr) + 10 O(g) → OsO$_4$(cr) + 3 ClO$_2$(g)
−190    10 × 249    −394    3 × 102, $\Delta H_r^0$(298 K.) = −2388 kJ mol$^{-1}$
and
[II-790] OsCl$_4$(cr) + 12 O(g) → OsO$_4$(cr) + 4 ClO$_2$(g)
−255    12 × 249    −394    4 × 102, $\Delta H_r^0$(298 K.) = −2719 kJ mol$^{-1}$.
[II-791] 3 Os(cr) + 12 CO(g) → Os$_3$(CO)$_{12}$(cr)
0    12 × −110    −1749, $\Delta H_r^0$(298 K.) = −429 kJ mol$^{-1}$,
[II-792] 3 OsCl$_3$(cr) + 21 CO(g) → Os$_3$(CO)$_{12}$(cr) + 9 COCl(g)
3 × −190    21 × −110    −1749    9 × −63, $\Delta H_r^0$(298 K.) = +564 kJ mol$^{-1}$,
[II-793] 3 OsCl$_3$(cr) + 21 CO*(g) → Os$_3$(CO)$_{12}$(cr) + 9 COCl(g)
3 × −190    21 × 564    −1749    9 × −63, $\Delta H_r^*$(298 K.) = −13,590 kJ mol$^{-1}$,
[II-794] 3 OsCl$_4$(cr) + 24 CO(g) → Os$_3$(CO)$_{12}$(cr) + 12 COCl(g)
3 × −255    24 × −110    −1749    12 × −63, $\Delta H_r^0$(298 K.) = +900 kJ mol$^{-1}$
and
[II-795] 3 OsCl$_4$(cr) + 24 CO*(g) → Os$_3$(CO)$_{12}$(cr) + 12 COCl(g)
3 × −255    24 × 564    −1749    12 × −63, $\Delta H_r^*$(298 K.) = −15,276 kJ mol$^{-1}$.

Thus, there are two choices of procedures for the volatilization of osmium species:
O
CO*.
The monoxygen procedure is usually the preferred procedure.

10. IRIDIUM

[II-796] Ir(cr) + 2 O(g) → IrO$_2$(cr)
0    2 × 249    −274, $\Delta H_r^0$(298 K.) = −772 kJ mol$^{-1}$,
[II-797] IrO$_2$(cr) + O(g) → IrO$_3$(g)
−274    249    8, $\Delta H_r^0$(298 K.) = +33 kJ mol$^{-1}$,
[II-798] IrCl(cr) + 4 O(g) → IrO$_2$(cr) + ClO$_2$(g)
−82    4 × 249    −274    102, $\Delta H_r^0$(298 K.) = −1086 kJ mol$^{-1}$
and
[II-799] IrCl$_3$(cr) + 8 O(g) → IrO$_2$(cr) + 3 ClO$_2$(g)
−246    8 × 249    −274    3 × 102, $\Delta H_r^0$(298 K.) = −1714 kJ mol$^{-1}$.

If O* were used in [II-797] rather than O, the enthalpy of reaction would be −247 kJ mol$^{-1}$. Since we know very little about the trioxide at the present time, we cannot recommend O* as a volatilizing procedure.

[II-800] Ir(cr) + 6 F(g) → IrF$_6$(cr)
0    6 × 79    −580, $\Delta H_r^0$(298 K.) = −1054 kJ mol$^{-1}$,
0    6 × 62    −462, $\Delta H_r^0$(298 K.) = −834 kJ mol$^{-1}$,
[II-801] IrO$_2$(cr) + 10 F(g) → IrF$_6$(cr) + 2 OF$_2$(g)
−274    10 × 79    −580    2 × 24, $\Delta H_r^0$(298 K.) = −1048 kJ mol$^{-1}$,
[II-802] IrCl(cr) + 9 F(g) → IrF$_6$(cr) + ClF$_3$(g)
−82    9 × 79    −580    −159, $\Delta H_r^0$(298 K.) = −1368 kJ mol$^{-1}$
and
[II-803] IrCl$_3$(cr) + 15 F(g) → IrF$_6$(cr) + 3 ClF$_3$(g)
−246    15 × 79    −580    3 × −159, $\Delta H_r^0$(298 K.) = −1996 kJ mol$^{-1}$.
[II-804] 4 Ir(cr) + 12 CO(g) → Ir$_4$(CO)$_{12}$(cr)
0    12 × −110    −1820, $\Delta H_r^0$(298 K.) = −500 kJ mol$^{-1}$,
[II-805] 4 IrO$_2$(cr) + 20 CO(g) → Ir$_4$(CO)$_{12}$(cr) + 8 CO$_2$(g)
4 × −274    20 × −110    −1820    8 × −394, $\Delta H_r^0$(298 K.) = −1676 kJ mol$^{-1}$
[II-806] 4 IrCl(cr) + 16 CO(g) → Ir$_4$(CO)$_{12}$(cr) + 4 COCl(g)
4 × −82    16 × −110    −1820    4 × −394, $\Delta H_r^0$(298 K.) = −1308 kJ mol$^{-1}$
and
[II-807] 4 IrCl$_3$(cr) + 24 CO(g) → Ir$_4$(CO)$_{12}$(cr) + 12 COCl(g)
4 × −246    24 × −110    −1820    12 × −394, $\Delta H_r^0$(298 K.) = −2924 kJ mol$^{-1}$.

The possible procedures for the volatilization of iridium species are:

O* (?)
O+F
F
O+CO
CO.

11. PLATINUM

[II-808] 3 Pt(cr) + 4 O(g) → Pt$_3$O$_4$(cr)
0   4 × 249   −163,   $\Delta H_r^0$(298 K.) = −1159 kJ mol$^{-1}$,
[II-809] Pt$_3$O$_4$(cr) + 2 O(g) → 3 PrO$_2$(g)
−163   2 × 249   3 × 172,   $\Delta H_r^0$(298 K.) = +181 kJ mol$^{-1}$,
[II-810] 3 PtCl(cr) + 10 O(g) → Pt$_3$O$_4$(cr) + 3 ClO$_2$(g)
3 × −56   10 × 249   −163   3 × 102,   $\Delta H_r^0$(298 K.) = −2179 kJ mol$^{-1}$,
[II-811] 3 PtCl$_2$(cr) + 16 O(g) → Pt$_3$O$_4$(cr) + 6 ClO$_2$(g)
3 × −123   16 × 249   −163   6 × 102,   $\Delta H_r^0$(298 K.) = −3166 kJ mol$^{-1}$,
[II-812] 3 PtCl$_3$(cr) + 22 O(g) → Pt$_3$O$_4$(cr) + 9 ClO$_2$(g)
3 × −182   22 × 249   −163   9 × 102,   $\Delta H_r^0$(298 K.) = −4177 kJ mol$^{-1}$,
[II-813] 3 PtCl$_4$(cr) + 28 O(g) → Pt$_3$O$_4$(cr) + 12 ClO$_2$(g)
3 × −232   28 × 249   −163   12 × 102,   $\Delta H_r^0$(298 K.) = −5215 kJ mol$^{-1}$,
[II-814] 3 PtF$_4$(cr) + 28 O(g) → Pt$_3$O$_4$(cr) + 12 FO$_2$(g)
3 × −681   28 × 249   −163   12 × 13,   $\Delta H_r^0$(298 K.) = −4936 kJ mol$^{-1}$,
[II-815] 3 PtF$_6$(cr) + 40 O(g) → Pt$_3$O$_4$(cr) + 18 FO$_2$(g)
3 × −722   40 × 249   −163   18 × 13,   $\Delta H_r^0$(298 K.) = −7723 kJ mol$^{-1}$,
[II-816] Pt(cr) + 4F(g) → PtF$_4$(cr)
0   4 × 79   −681,   $\Delta H_r^0$(298 K.) = −997 kJ mol$^{-1}$,
[II-817] Pt$_3$O$_4$(cr) + 20 F(g) → 3 PtF$_4$(cr) + 4 OF$_2$(g)
−163   20 × 79   3 × −681   4 × 24,   $\Delta H_r^0$(298 K.) = −3364 kJ mol$^{-1}$,
[II-818] PtCl(cr) + 7 F(g) → PtF$_4$(cr) + ClF$_3$(g)
−56   7 × 79   −681   −159,   $\Delta H_r^0$(298 K.) = −1337 kJ mol$^{-1}$,
[II-819] PtCl$_2$(cr) + 10 F(g) → PtF$_4$(cr) + 2 ClF$_3$(g)
−123   10 × 79   −681   2 × −159,   $\Delta H_r^0$(298 K.) = −1666 kJ mol$^{-1}$,
[II-820] PtCl$_3$(cr) + 13 F(g) → PtF$_4$(cr) + 3 ClF$_3$(g)
−182   13 × 79   −681   3 × −159,   $\Delta H_r^0$(298 K.) = −2003 kJ mol$^{-1}$,
[II-821] PtCl$_4$(cr) + 16 F(g) → PtF$_4$(cr) + 4 ClF$_3$(g)
−232   16 × 79   −681   4 × −159,   $\Delta H_r^0$(298 K.) = −2349 kJ mol$^{-1}$
and
[II-822] PtF$_4$(cr) + 2 F(g) → PtF$_6$(cr)
−681   2 × 79   −722,   $\Delta H_r^0$(298 K.) = −199 kJ mol$^{-1}$.

The possible procedures for the volatilization of platinum species are:
O+F
F (in the absence of PtF$_6$).

P. Group IB.

1. THERMODYNAMICS

Of the various species listed in TABLE II−21. only three have significantly low 'times four' criteria:

| | | |
|---|---|---|
| Cu$_2$O | cr → l | 236 kJ mol$^{-1}$ |
| CuF$_2$ | cr → l | 204 |
|  | cr → g | 1088 |
| AuCl$_3$ | cr → g | 278. |

In addition we should note the discussion of Cu(hfa)$_2$ in SECTION IX.O.2. have no volatile silver species to consider.

TABLE II-21

| | GROUP I B THERMODYNAMIC DATA $\Delta H_f^0$(298 K.)/$\Delta G_f^0$(298 K.) (kJ mol$^{-1}$) | | |
|---|---|---|---|
| SPECIES | Cu | Ag | Au |
| M$_2$O (cr) | −171/−148 | −31a/−11a | |
| (l) | −112/−100 | | |
| MO (cr) | −156/−128 | | |
| M$_2$O$_2$ (cr) | | −24a/+28a | |
| (g) | +306/+277 | | |
| M$_2$O$_3$ (cr) | | +34a/+121a | −3b/— |
| MCl (cr) | −138/−121 | −127a/−110a | −35a/— |
| (l) | −131/−116 | | |
| (g) | +91/+64 | | +197a/— |
| MCl$_2$ (cr) | −206/−162 | | |
| MCl$_3$ (cr) | | | −118a/— |
| M$_2$Cl$_6$ (g) | | | −97a/— |
| MF (cr) | −280/−260 | −205a/— | |
| (g) | −13/−40 | | −75b/— |
| MF$_2$ (cr) | −539/−492 | −360a/— | −238b/— |
| (l) | −488/−454 | | |
| (g) | −267/−276 | | |
| MF$_3$ (cr) | | | −364a/— |

(a, Ref. <B>; b, Ref. <II-23>)

[II-823] 2 Cu(cr) + O(g) → Cu$_2$O(cr)
0   249   −171,   $\Delta H_r^0$(298 K.) = −420 kJ mol$^{-1}$
0   232   −148,   $\Delta G_r^0$(298 K.) = −380 kJ mol$^{-1}$,
and
[II-824] Cu$_2$O(cr) + O(g) → 2 CuO(cr)
−171   249   2 × −156,   $\Delta H_r^0$(298 K.) = −390 kJ mol$^{-1}$
−148   232   2 × −128,   $\Delta G_r^0$(298 K.) = −340 kJ mol$^{-1}$.

Cuprous oxide will be formed in the liquid state. It will react further with monoxygen to form cupric oxide. The cupric oxide will not volatilize.

[II-825] CuCl(cr) + 3 O(g) → CuO(cr) + ClO$_2$(g)
−138   3 × 249   −156   102,   $\Delta H_r^0$(298 K.) = −663 kJ mol$^{-1}$
−121   3 × 232   −128   120,   $\Delta G_r^0$(298 K.) = −583 kJ mol$^{-1}$,
[II-826] CuCl$_2$(cr) + 5 O(g) → CuO(cr) + 2 ClO$_2$(g)

-continued

| | | | |
|---|---|---|---|
| −206 | 5 × 249 | −156 | 2 × 102, $\Delta H_r^0(298\ K.) = -991\ kJ\ mol^{-1}$ |
| −162 | 5 × 232 | −128 | 2 × 120, $\Delta G_r^0(298\ K.) = -886\ kJ\ mol^{-1}$, |

[II-827] $CuF(cr) + 3\ O(g) \rightarrow CuO + FO_2(g)$

| | | | |
|---|---|---|---|
| −280 | 3 × 249 | −156 | 13, $\Delta H_r^0(298\ K.) = -610\ kJ\ mol^{-1}$ |
| −260 | 3 × 232 | −128 | 27, $\Delta G_r^0(298\ K.) = -537\ kJ\ mol^{-1}$ | and

[II-828] $CuF_2(cr) + 5\ O(g) \rightarrow CuO(cr) + 2\ FO_2(g)$

| | | | |
|---|---|---|---|
| −539 | 5 × 249 | −156 | 2 × 13, $\Delta H_r^0(298\ K.) = -836\ kJ\ mol^{-1}$ |
| −492 | 5 × 232 | −128 | 2 × 27, $\Delta G_r^0(298\ K.) = -742\ kJ\ mol^{-1}$. |

[II-829] $Cu(cr) + F(g) \rightarrow CuF(cr)$

| | | | |
|---|---|---|---|
| 0 | 79 | −280, | $\Delta H_r^0(298\ K.) = -359\ kJ\ mol^{-1}$ |
| 0 | 62 | −260, | $\Delta G_r^0(298\ K.) = -322\ kJ\ mol^{-1}$, |

[II-830] $CuF(cr) + F(g) \rightarrow CuF_2(cr)$

| | | | |
|---|---|---|---|
| −280 | 79 | −539, | $\Delta H_r^0(298\ K.) = -338\ kJ\ mol^{-1}$ |
| −260 | 62 | −492, | $\Delta G_r^0(298\ K.) = -294\ kJ\ mol^{-1}$, |

[II-831] $Cu_2O(cr) + 6\ F(g) \rightarrow 2\ CuF_2(cr) + OF_2(g)$

| | | | |
|---|---|---|---|
| −171 | 6 × 79 | 2 × −539 | 24, $\Delta H_r^0(298\ K.) = -1357\ kJ\ mol^{-1}$ |
| −148 | 6 × 62 | 2 × −492 | 43, $\Delta G_r^0(298\ K.) = -1166\ kJ\ mol^{-1}$, |

[II-832] $Cu_2O(cr) + 6\ F^*(g) \rightarrow 2\ CuF_2(cr) + OF_2(g)$

| | | | |
|---|---|---|---|
| −171 | 6 × 245 | 2 × −539 | 24, $\Delta H_r^*(298\ K.) = -2353\ kJ\ mol^{-1}$, |

[II-833] $CuO(cr) + 4\ F(g) \rightarrow CuF_2(cr) + OF_2(g)$

| | | | |
|---|---|---|---|
| −138 | 4 × 79 | −539 | 24, $\Delta H_r^0(298\ K.) = -693\ kJ\ mol^{-1}$ |
| −11 | 4 × 62 | −492 | 42, $\Delta G_r^0(298\ K.) = -577\ kJ\ mol^{-1}$, |

[II-834] $CuO(cr) + 4\ F^*(g) \rightarrow CuF_2(cr) + OF_2(g)$

| | | | |
|---|---|---|---|
| −138 | 4 × 245 | −539 | 24, $\Delta H_r^*(298\ K.) = -1357\ kJ\ mol^{-1}$, |

[II-835] $CuCl(cr) + 5\ F(g) \rightarrow CuF_2(cr) + ClF_3(g)$

| | | | |
|---|---|---|---|
| −138 | 5 × 79 | −539 | −159, $\Delta H_r^0(298\ K.) = -955\ kJ\ mol^{-1}$ |
| −121 | 5 × 62 | −492 | −119, $\Delta G_r^0(298\ K.) = -800\ kJ\ mol^{-1}$ | and

[II-836] $CuCl_2(cr) + 8\ F(g) \rightarrow CuF_2(cr) + 2\ ClF_3(g)$

| | | | |
|---|---|---|---|
| −206 | 8 × 79 | −539 | 2 × −159, $\Delta H_r^0(298\ K.) = -1283\ kJ\ mol^{-1}$ |
| −162 | 8 × 62 | −492 | 2 × −119, $\Delta G_r^0(298\ K.) = -1064\ kJ\ mol^{-1}$. |

Thus, we have the choice of two procedures for the volatilization of copper species:

O+F*
F+hfa.

3. SILVER

-continued

| | | |
|---|---|---|
| 28 | 232 | 121, $\Delta G_r^0(298\ K.) = -139\ kJ\ mol^{-1}$. |

Thus, although dioxygen will take silver only to the argentous oxide, monoxygen will take it all the way to the sesquioxide.

[II-840] $2\ AgCl(cr) + 7\ O(g) \rightarrow Ag_2O_3(cr) + 2\ ClO_2(g)$

| | | | |
|---|---|---|---|
| 2 × −127 | 7 × 249 | 34 | 2 × 102, $\Delta H_r^0(298\ K.) = -1251\ kJ\ mol^{-1}$ |
| 2 × −110 | 7 × 232 | 121 | 2 × 120, $\Delta G_r^0(298\ K.) = -1043\ kJ\ mol^{-1}$, |

[II-841] $2\ AgF(cr) + 7\ O(g) \rightarrow Ag_2O_3(cr) + 2\ FO_2(g)$

| | | | |
|---|---|---|---|
| 2 × −205 | 7 × 249 | 34 | 2 × 13, $\Delta H_r^0(298\ K.) = -1273\ kJ\ mol^{-1}$ | and

[II-842] $2\ AgF_2(cr) + 11\ O(g) \rightarrow Ag_2O_3(cr) + 4\ FO_2(g)$

| | | | |
|---|---|---|---|
| 2 × −360 | 11 × 249 | 34 | 4 × 13, $\Delta H_r^0(298\ K.) = -1933\ kJ\ mol^{-1}$. |

[II-843] $Ag(cr) + F(g) \rightarrow AgF(cr)$

| | | |
|---|---|---|
| 0 | 79 | −205, $\Delta H_r^0(298\ K.) = -284\ kJ\ mol^{-1}$, |

[II-844] $AgF(cr) + F(g) \rightarrow AgF_2(cr)$

| | | |
|---|---|---|
| −205 | 79 | −360, $\Delta H_r^0(298\ K.) = -234\ kJ\ mol^{-1}$, |

[II-845] $Ag_2O(cr) + 4\ F(g) \rightarrow 2\ AgF(cr) + OF_2(g)$

| | | | |
|---|---|---|---|
| −31 | 4 × 79 | 2 × −205 | 13, $\Delta H_r^0(298\ K.) = -682\ kJ\ mol^{-1}$, |

[II-846] $Ag_2O_2(cr) + 6\ F(g) \rightarrow 2\ AgF(cr) + 2\ OF_2(g)$

| | | | |
|---|---|---|---|
| −24 | 6 × 79 | 2 × −205 | 2 × 13, $\Delta H_r^0(298\ K.) = -834\ kJ\ mol^{-1}$, |

[II-847] $Ag_2O_3(cr) + 8\ F(g) \rightarrow 2\ AgF(cr) + 3\ OF_2(g)$

| | | | |
|---|---|---|---|
| 34 | 8 × 79 | 2 × −205 | 3 × 13, $\Delta H_r^0(298\ K.) = -1037\ kJ\ mol^{-1}$ | and

[II-848] $AgCl(cr) + 4\ F(g) \rightarrow AgF(cr) + ClF_3(g)$

| | | | |
|---|---|---|---|
| −127 | 4 × 79 | −205 | −159, $\Delta H_r^0(298\ K.) = -553\ kJ\ mol^{-1}$. |

[II-837] $2\ Ag(cr) + O(g) \rightarrow Ag_2O(cr)$

| | | |
|---|---|---|
| 0 | 249 | −31, $\Delta H_r^0(298\ K.) = -280\ kJ\ mol^{-1}$, |
| 0 | 232 | −11, $\Delta G_r^0(298\ K.) = -243\ kJ\ mol^{-1}$, |

[II-838] $Ag_2O(cr) + O(g) \rightarrow Ag_2O_2(cr)$

| | | |
|---|---|---|
| −31 | 249 | −24, $\Delta H_r^0(298\ K.) = -242\ kJ\ mol^{-1}$ |
| −11 | 232 | +28, $\Delta G_r^0(298\ K.) = -193\ kJ\ mol^{-1}$ | and

[II-839] $Ag_2O_2(cr) + O(g) \rightarrow Ag_2O_3(cr)$

| | | |
|---|---|---|
| −24 | 249 | 34, $\Delta H_r^0(298\ K.) = -191\ kJ\ mol^{-1}$ |

In the absence of data on volatile silver species we can make no recommendations at this time.

4. GOLD

Gold trichloride sublimes at 180° at 760 nm <II-37>. At the time that SECTION V. was written we had not considered monochlorine as a potential volatilizing reagent. A discussion of it was therefore, not included. It should be noted that, whereas the datum for crystalline gold trichloride is for the monomer the datum for gaseous gold trichloride is for the dimer.

[II-849] $2 Au(cr) + 3 O(g) \rightarrow Au_2O_3(cr)$
0    3 × 249    −3, $\Delta H_r^0(298 K.) = −750$ kJ mol$^{-1}$,
[II-850] $2 AuCL(cr) + 7 O(g) \rightarrow Au_2O_3(cr) + 2 ClO_2(g)$
2 × −35    7 × 249    −3,    2 × 102, $\Delta H_r^0(298 K.) = −1472$ kJ mol$^{-1}$,
[II-851] $2 AuCl_3(cr) + 15 O(g) \rightarrow Au_2O_3(cr) + 6 ClO_2(g)$
2 × −35    15 × 249   −3    6 × 102, $\Delta H_r^0(298 K.) = −3056$ kJ mol$^{-1}$,
[II-852] $2 AuF_2(cr) + 11 O(g) \rightarrow Au_2O_3(cr) + 4 FO_2(g)$
2 × −238   11 × 249   −3    4 × 13, $\Delta H_r^0(298 K.) = −2214$ kJ mol$^{-1}$
and
[II-853] $2 AuF_3(cr) + 15 O(g) \rightarrow Au_2O_3(cr) + 6 FO_2(g)$
2 × −364   15 × 249   −3    6 × 13, $\Delta H_r^0(298 K.) = −2932$ kJ mol$^{-1}$.
[II-854] $Au(cr) + F(g) \rightarrow AuF(g)$
0    79    −75, $\Delta H_r^0(298 K.) = −154$ kJ mol$^{-1}$,
[II-855] $Au(cr) + 2 F(g) \rightarrow AuF_2(cr)$
0    2 × 79    −238, $\Delta H_r^0(298 K.) = −396$ kJ mol$^{-1}$,
[II-856] $AuF_2(cr) + F(g) \rightarrow AuF_3(cr)$
−238    79    −364, $\Delta H_r^0(298 K.) = −205$ kJ mol$^{-1}$,
[II-857] $Au_2O_3(cr) + 10 F(g) \rightarrow 2 AuF_2(cr) + 3 OF_2(g)$
−3    10 × 79    2 × −238    3 × 13, $\Delta H_r^0(298 K.) = −1224$ kJ mol$^{-1}$,
[II-858] $AuCl(cr) + 3 F(g) \rightarrow AuF_2(cr) + ClF(g)$
−35    3 × 79    −238    −50, $\Delta H_r^0(298 K.) = −490$ kJ mol$^{-1}$
and
[II-859] $AuCl_3(cr) + 5 F(g) \rightarrow AuF_2(cr) + 3 ClF(g)$
−118    5 × 79    −238    3 × −50, $\Delta H_r^0(298 K.) = −665$ kJ mol$^{-1}$,
[II-860] $Au(cr) + 3 Cl(g) + AuCl_3(cr)$
0    3 × 121    −118, $\Delta H_r^0(298 K.) = −481$ kJ mol$^{-1}$,
[II-861] $Au_2O_3(cr) + 9 Cl(g) \rightarrow 2 AuCl_3(cr) + 3 OCl_2(g)$
−3    9 × 121    2 × −118    3 × 88, $\Delta H_r^0(298 K.) = −1058$ kJ mol$^{-1}$,
[II-862] $AuCl(cr) + 2 Cl(g) \rightarrow AuCl_3(cr)$
−35    2 × 121    −118, $\Delta H_r^0(298 K.) = −325$ kJ mol$^{-1}$,
[II-863] $AuF_2(cr) + 5 Cl(g) \rightarrow AuCl_3(cr) + 2 ClF(g)$
−238    5 × 121    −118    2 × −50, $\Delta H_r^0(298 K.) = −585$ kJ mol$^{-1}$
and
[II-864] $AuF_3(cr) + 6 Cl(g) \rightarrow AuCl_3(cr) + 3 ClF(g)$
−364    6 × 121    −118    3 × −50, $\Delta H_r^0(298 K.) = −630$ kJ mol$^{-1}$.

Thus, we have the choice of four procedures for the volatilization of gold species:
O+F+Cl
O+Cl
F+Cl

Q. Group IIB
1. THERMODYNAMICS

TABLE II-22

THERMODYNAMIC DATA GROUP IIB.
$\Delta H_f^0(298 K.)/\Delta G_f^0(298 K.)$ (kJ mol$^{-1}$)

| SPECIES | Zn | Cd | Hg |
|---|---|---|---|
| MO | | | |
| (cr) | −348a/−318a | −258a/−228 | −91/−58 |
| (g) | | | +42/+23 |
| M$_2$Cl$_2$ | | | |
| (cr) | | | −265/−210 |
| MCl | | | |
| (g) | | | +78/+57 |
| MCl$_2$ | | | |
| (cr) | −415a/−369a | −392a/−344a | −230/−184 |
| (l) | | | −213/−173 |
| (g) | −266a/— | | −146/−145 |
| M$_2$F$_2$ | | | |
| (cr) | | | −485/−469 |
| MF | | | |
| (g) | | | +3/−18 |
| MF$_2$ | | | |
| (cr) | −764a/−713a | −700a/−648a | −423/−374 |
| (l) | −735b/— | −677b/— | −405/−362 |
| (g) | −551b/— | −459b/— | −294/−292 |
| (CH$_3$)M | | | |
| (g) | | | +167a/— |
| (CH$_3$)$_2$M | | | |
| (l) | +23a/— | +64a/+139a | +60a/+140a |
| (g) | +53a/— | +102a/+147a | +94a/+146a |

(a., Ref. <B>; b., Ref. <II-23>)

By the criterion of [II-1] the dimethyl compounds of cadmium and mercury will volatilize spontaneously in the Apparatus. The 'times four' criterion for some species of interest are

| | | |
|---|---|---|
| ZnF$_2$ | cr → l | 116 kJ mol$^{-1}$ |
| | cr → g | 852 |
| (CH$_3$)$_2$Zn | l → g | 120 |
| CdF$_2$) | cr → l | 92 |
| | cr → g | 964 |
| HgO | cr → g | 532 |
| HgF | cr → g | 982 (monomer) |
| HgF$_2$ | cr → l | 72 |
| | cr → g | 516. |

It should be noted that mercurous fluoride is a dimer in the crystalline state and a monomer in the gaseous state.

2. ZINC

[II-865] $Zn(cr) + O(g) \rightarrow ZnO(cr)$
0    249    −348, $\Delta H_r^0(298 K.) =$
−597 kJ mol$^{-1}$
0    232    −318, $\Delta G_r^0(298 K.) =$
−550 kJ mol$^{-1}$,
[II-866] $ZnCl_2(cr) + 5 O(g) \rightarrow ZnO(cr) + 2 ClO_2(g)$
−415    5 × 249    −348    2 × 102, $\Delta H_r^0(298 K.) =$
−974 kJ mol$^{-1}$
−369    5 × 232    −318    2 × 120, $\Delta G_r^0(298 K.) =$
−869 kJ mol$^{-1}$
and
[II-867] $ZnF_2(cr) + 5 O(g) \rightarrow ZnO(cr) + 2 FO_2(g)$
−764    5 × 249    −348    2 × 13, $\Delta H_r^0(298 K.) =$
−803 kJ mol$^{-1}$
−713    5 × 232    −318    2 × 27, $\Delta G_r^0(298 K.) =$
−711 kJ mol$^{-1}$,
[II-868] $Zn(cr) + 2 F(g) \rightarrow ZnF_2(cr)$
0    2 × 79    −764, $\Delta H_r^0(298 K.) =$
−922 kJ mol$^{-1}$,
0    2 × 62    −713, $\Delta G_r^0(298 K.) =$
−837 kJ mol$^{-1}$,

[II-869]  ZnO(cr) + 4 F(g) → ZnF$_2$(cr) + OF$_2$(g)
  −348    4 × 79    −764    24, $\Delta H_r^0$(298 K.) =
                                −708 kJ mol$^{-1}$,
  −318    4 × 62    −713    42, $\Delta G_r^0$(298 K.) =
                                −601 kJ mol$^{-1}$,
[II-870]  ZnO(cr) + 4 F*(g) → ZnF$_2$(cr) + OF$_2$(g)
  −348    4 × 245   −764    24, $\Delta H_r^*$(298 K.) =
                                −1372 kJ mol$^{-1}$
and
[II-871]  ZnCl$_2$(cr) + 8 F(g) → ZnF$_2$(cr) + 2 ClF$_3$(g)
  −415    8 × 79    −764    2 × −159, $\Delta H_r^0$(298 K.) =
                                −1299 kJ mol$^{-1}$
  −369    8 × 62    −713    2 × −119, $\Delta G_r^0$(298 K.) =
                                −1078 kJ mol$^{-1}$.

It should be noted that although O+F* is an effective procedure, F* is not since it will not volatilize ZnF$_2$!

[II-872]  Zn(cr) + 2 CH$_3$(g) → (CH$_3$)$_2$Zn(l)
  0       2 × 146   23       $\Delta H_r^0$(298 K.) =
                                −269 kJ mol$^{-1}$,
[II-873]  ZnO(cr) + 4 CH$_3$(g) → (CH$_3$)$_2$Zn(l) + (CH$_3$)$_2$O(g)
  −348    4 × 146   23    −184, $\Delta H_r^0$(298 K.) =
                                −397 kJ mol$^{-1}$,
[II-874]  ZnCl$_2$(cr) + 4 CH$_3$(g) → (CH$_3$)$_2$Zn(l) + 2 CH$_3$Cl(g)
  −415    4 × 146   23    2 × −84, $\Delta H_r^0$(298 K.) =
                                −314 kJ mol$^{-1}$
and
[II-875]  ZnF$_2$(cr) + 4 CH$_3$(g) → (CH$_3$)$_2$Zn(l) + 2 CH$_3$F(g)
  −764    4 × 146   23    2 × −234, $\Delta H_r^0$(298 K.) =
                                −265 kJ mol$^{-1}$.

Thus, we have the choice of four procedures for the volatilization of the zinc species:
O+F*
O+CH$_3$
F+CH$_3$
CH$_3$.

3. CADMIUM

[II-876]  Cd(cr) + O(g) → CdO(cr)
  0       249       −258,   $\Delta H_r^0$(298 K.) =
                                −507 kJ mol$^{-1}$,
  0       232       −228,   $\Delta G_r^0$(298 K.) =
                                −460 kJ mol$^{-1}$,
[II-877]  CdCl$_2$(cr) + 5 O(g) → CdO(cr) + 2 ClO$_2$(g)
  −392    5 × 249   −258    2 × 102, $\Delta H_r^0$(298 K.) =
                                −907 kJ mol$^{-1}$
  −344    5 × 232   −228    2 × 120, $\Delta G_r^0$(298 K.) =
                                −804 kJ mol$^{-1}$
and

[II-878]  CdF$_2$(cr) + 5 O(g) → CdO(cr) + 2 FO$_2$(g)
  −700    5 × 249   −258    2 × 13, $\Delta H_r^0$(298 K.) =
                                −777 kJ mol$^{-1}$
  −648    5 × 232   −228    2 × 27, $\Delta G_r^0$(298 K.) =
                                −686 kJ mol$^{-1}$.
[II-879]  Cd(cr) + 2 F(g) → CdF$_2$(cr)
  0       2 × 79    −700,   $\Delta H_r^0$(298 K.) =
                                −858 kJ mol$^{-1}$
  0       2 × 62    −648,   $\Delta G_r^0$(298 K.) =
                                −772 kJ mol$^{-1}$,
[II-880]  Cd(cr) + 2 F*(g) → CdF$_2$(cr)
  0       2 × 245   −700,   $\Delta H_r^*$(298 K.) =
                                −1190 kJ mol$^{-1}$,
[II-881]  CdO(cr) + 4 F(g) → CdF$_2$(cr) + OF$_2$(g)
  −258    4 × 79    −700    24, $\Delta H_r^0$(298 K.) =
                                −734 kJ mol$^{-1}$,
  −228    4 × 62    −648    42, $\Delta G_r^0$(298 K.) =
                                −626 kJ mol$^{-1}$,
[II-882]  CdO(cr) + 4 F*(g) → CdF$_2$(cr) + OF$_2$(g)
  −258    4 × 245   −700    24, $\Delta H_r^*$(298 K.) =
                                −1398 kJ mol$^{-1}$
and
[II-883]  CdCl$_2$(cr) + 8 F(g) → CdF$_2$(cr) + 2 ClF$_3$(g)
  −392    8 × 79    −700    2 × −159, $\Delta H_r^0$(298 K.) =
                                −1258 kJ mol$^{-1}$
  −344    8 × 62    −648    2 × −119, $\Delta G_r^0$(298 K.) =
                                −1038 kJ mol$^{-1}$.
[II-884]  Cd(cr) + 2 CH$_3$(g) → (CH$_3$)$_2$Cd(l)
  0       2 × 146   64, $\Delta H_r^0$(298 K.) =
                                −228 kJ mol$^{-1}$
  0       2 × 148   139, $\Delta G_r^0$(298 K.) =
                                −157 kJ mol$^{-1}$,
[II-885]  CdO(cr) + 4 CH$_3$(g) → (CH$_3$)$_2$Cd(l) + (CH$_3$)$_2$O(g)
  −258    4 × 146   64    −184, $\Delta H_r^0$(298 K.) =
                                −446 kJ mol$^{-1}$
  −228    4 × 148   139   −113, $\Delta G_r^0$(298 K.) =
                                −338 kJ mol$^{-1}$,
[II-886]  CdCl$_2$(cr) + 4 CH$_3$(g) → (CH$_3$)$_2$Cd(l) + 2 CH$_3$Cl(g)
  −392    4 × 146   64    2 × −84, $\Delta H_r^0$(298 K.) =
                                −296 kJ mol$^{-1}$
  −344    4 × 148   139   2 × −60, $\Delta G_r^0$(298 K.) =
                                −229 kJ mol$^{-1}$
and
[II-887]  CdF$_2$(cr) + 4 CH$_3$(g) → (CH$_3$)$_2$Cd(l) + 2 CH$_3$F(g)
  −700    4 × 146   64    2 × −234, $\Delta H_r^0$(298 K.) =
                                −288 kJ mol$^{-1}$
  −648    4 × 148   139   2 × −210, $\Delta G_r^0$(298 K.) =
                                −225 kJ mol$^{-1}$.

Again we have the choice of four procedures:
O+F*
O'CH$_3$
F+CH$_3$
CH$_3$.

4. MERCURY

[II-888]  Hg(l) + O(g) → HgO(cr)
  0       249       −91, $\Delta H_r^0$(298 K.) = −340 kJ mol$^{-1}$,
  0       232       −58, $\Delta G_r^0$(298 K.) = −290 kJ mol$^{-1}$,
[II-889]  Hg(l) + O*(g) → HgO(cr)
  0       529       −91, $\Delta H_r^*$(298 K.) = −620 kJ mol$^{-1}$
[II-890]  0.5 Hg$_2$Cl$_2$(cr) + 3 O(g) → HgO(cr) + ClO$_2$(g)
  0.5 × −265   3 × 249   −91    102, $\Delta H_r^0$(298 K.) = −604 kJ mol$^{-1}$
  0.5 × −210   3 × 232   −58    120, $\Delta G_r^0$(298 K.) = −529 kJ mol$^{-1}$,
[II-891]  HgCl$_2$(cr) + 4 O(g) → HgO(cr) + 2 ClO$_2$(g)
  −230    4 × 249   −91    2 × 102, $\Delta H_r^0$(298 K.) = −653 kJ mol$^{-1}$
  −184    4 × 232   −58    2 × 120, $\Delta G_r^0$(298 K.) = −562 kJ mol$^{-1}$,
[II-892]  0.5 Hg$_2$F$_2$(cr) + 3 O(g) → HgO(cr) + FO$_2$(g)
  0.5 × −485   3 × 249   −91    13, $\Delta H_r^0$(298 K.) = −582 kJ mol$^{-1}$
  0.5 × −469   3 × 232   −58    27, $\Delta G^0$(298 K.) = −492 kJ mol$^{-1}$
and
[II-893]  HgF$_2$(cr) + 5 O(g) → HgO(cr) + 2 FO$_2$(g)
  −423    5 × 249   −91    2 × 13, $\Delta H_r^0$(298 K.) = −887 kJ mol$^{-1}$
  −374    5 × 232   −58    2 × 27, $\Delta G_r^0$(298 K.) = −790 kJ mol$^{-1}$.
[II-894]  Hg(l) + F(g) → 0.5 Hg$_2$F$_2$(cr)
  0       79        0.5 × −485, $\Delta H_r^0$(298 K.) = −322 kJ mol$^{-1}$
  0       62        0.5 × −469, $\Delta G_r^0$(298 K.) = −296 kJ mol$^{-1}$,
[II-895]  Hg(l) + F*(g) → 0.5 Hg$_2$F$_2$(cr)

-continued

|   |   |   |   |   |   |
|---|---|---|---|---|---|
|   | 0 | 245 | 0.5 × −485, | $\Delta H_r^*(298\ K.) = -488\ kJ\ mol^{-1}$, |   |
| [II-896] | 0.5 Hg$_2$F$_2$(cr) + F(g) → HgF$_2$(cr) |   |   |   |   |
|   | 0.5 × −485 | 79 |   | −423, | $\Delta H_r^0(298\ K.) = -260\ kJ\ mol^{-1}$ |
|   | 0.5 × −469 | 62 |   | −374, | $\Delta G_r^0(298\ K.) = -202\ kJ\ mol^{-1}$ |
| and |   |   |   |   |   |
| [II-897] | 0.5 Hg$_2$F$_2$(cr) + F*(g) → HgF$_2$(cr) |   |   |   |   |
|   | 0.5 × −485 | 245 |   | −423, | $\Delta H_r^*(298\ K.) = -426\ kJ\ mol^{-1}$. |

Thus, although monofluorine will convert mercury to mercurous fluoride and mercurous fluoride to mercuric fluoride, even with excited state monofluorine the reactions are not sufficiently energetic to volatilized the product fluorides. We should, however, consider the reaction between monofluorine and the oxide.

| [II-898] | HgO(cr) + 4 F(g) → HgF$_2$(cr) + OF$_2$(g) |   |   |   |
|---|---|---|---|---|
|   | −91 | 4 × 79 | −423 | 24, $\Delta H_r^0(298\ K.) = -624\ kJ\ mol^{-1}$ |
|   | −58 | 4 × 62 | −374 | 42, $\Delta G_r^0(298\ K.) = -522\ kJ\ mol^{-1}$. |

Since monoxygen cannot volatilize the oxide, by itself it is not a satisfactory volatilizing reagent. Similarly, by itself monofluorine is not a satisfactory volatilizing reagent. The procedure O+F, however, is satisfactory.

| Sc | O + F* | H + F |
|---|---|---|
| Y | O + F* | H + F* |
| Lanthanides | O/NO$_2$ + F, O + F*, H + F |   |
| Ti | O + F, | H + F |
| Zr | O + F, | H + F |
| Hf | O + F, | H + F |
| V | O + F, F, O + CO, CO |   |
| Nb | O + F, F |   |
| Ta | O + F, | O + CH$_3$, CH$_3$ |
| Cr | O + F, | O + CO, CO* |
| Mo | O + F, F, O + CO, CO* |   |
| W | O + F, F, O + CO*, O + CH$_3$, CH$_3$ |   |
| Mn | O + F, | O + CO, CO* |
| Re | O + F, | O + CO, CO* |
| Fe | O + F, | O + CO, CO* |
| Co | O + F, | O + CO, CO* |
| Ni | O + F*, | O + CO, CO* |

| [II-899] | Hg(l) + 2 CH$_3$(g) → (CH$_3$)$_2$Hg(l) |   |   |   |
|---|---|---|---|---|
|   | 0 | 2 × 146 | 60, | $\Delta H_r^0(298\ K.) = -232\ kJ\ mol^{-1}$ |
|   | 0 | 2 × 148 | 140, | $\Delta G_r^0(298\ K.) = -156\ kJ\ mol^{-1}$, |
| [II-900] | HgO(cr) + 4 CH$_3$(g) → (CH$_3$)$_2$Hg(l) + (CH$_3$)$_2$O(g) |   |   |   |
|   | −91 | 4 × 146 | 60 | −184, $\Delta H_r^0(298\ K.) = -617\ kJ\ mol^{-1}$ |
|   | −58 | 4 × 148 | 140 | −113, $\Delta G_r^0(298\ K.) = -507\ kJ\ mol^{-1}$, |
| [II-901] | Hg$_2$Cl$_2$(cr) + 6 CH$_3$(g) → 2 (CH$_3$)$_2$Hg(l) + 2 CH$_3$Cl(g) |   |   |   |
|   | −265 | 6 × 146 | 2 × 60 | 2 × −84, $\Delta H_r^0(298\ K.) = -659\ kJ\ mol^{-1}$ |
|   | −210 | 6 × 148 | 2 × 140 | 2 × −60, $\Delta G_r^0(298\ K.) = -518\ kJ\ mol^{-1}$, |
| [II-902] | HgCl$_2$(cr) + 4 CH$_3$(g) → (CH$_3$)$_2$Hg(l) + 2 CH$_3$Cl(g) |   |   |   |
|   | −230 | 4 × 146 | 60 | 2 × −84, $\Delta H_r^0(298\ K.) = -462\ kJ\ mol^{-1}$ |
|   | −184 | 4 × 148 | 140 | 2 × −60, $\Delta G_r^0(298\ K.) = -388\ kJ\ mol^{-1}$, |
| [II-903] | Hg$_2$F$_2$(cr) + 6 CH$_3$(g) → 2 (CH$_3$)$_2$Hg(l) + 2 CH$_3$F(g) |   |   |   |
|   | −485 | 6 × 146 | 2 × 60 | 2 × −234, $\Delta H_r^0(298\ K.) = -739\ kJ\ mol^{-1}$ |
|   | −469 | 6 × 148 | 2 × 140 | 2 × −210, $\Delta G_r^0(298\ K.) = -559\ kJ\ mol^{-1}$ |
| and |   |   |   |   |
| [II-904] | HgF$_2$(cr) + 4 CH$_3$(g) → (CH$_3$)2 Hg(l) + 2 CH$_3$F(g) |   |   |   |
|   | −423 | 4 × 146 | 60 | 2 × −234, $\Delta H_r^0(298\ K.) = -569\ kJ\ mol^{-1}$ |
|   | −374 | 4 × 148 | 140 | 2 × −210, $\Delta G_r^0(298\ K.) = -498\ kJ\ mol^{-1}$. |

Thus, methyl by itself is an effective volatilizing reagent.

R. Summary of Transition Metals Chemistries

In SECTION IX.H. we received the chemistries for the Main Group elements. The recommended general procedures are $$(H)_a + O/NO_2 + F + CH_3 + (H)_b \quad [\text{II-905}]$$

where
a. monohydrogen is used as the first reagent if a large quantity of fluorocarbons is present, and
b. monohydrogen is used as the last reagent if only a small quantity of fluorocarbons is present.

In the absence of thermodynamic data on the nitrates except for the lanthanides no comments can be made with respect to O/NO$_2$. We have found CO or CO* to be a useful reagent in many cases and essential for rhodium. In addition, we have found hfa essential for palladium and monochlorine essential for gold.

Summarizing the procedures for the various elements we have:

| Ru | O + F, | O + CO, CO* |
|---|---|---|
| Rh |   | O + CO*, CO* |
| Pd |   | hfa |
| Os | O, | CO* |
| Ir | O + F, F, O + CO, CO |   |
| Pt | O + F, F, hfa |   |
| Cu | O + F* | hfa |
| Ag | NO RECOMMENDATION |   |
| Au |   | Cl |
| Zn | O + F* | O + CH$_3$, F + CH$_3$, CH$_3$ |
| Cd | O + F* | O + CH$_3$, F + CH$_3$, CH$_3$ |
| Hg | O + F, | CH$_3$. |

In order to accommodate Sc, Y and Cu we change F in [II-905] to F*. In order to accommodate Rh we add CO*. For Pd we add hfa, and for Au we add Cl. Thus, the general recommended procedures for the entire Periodic Table are $$(H)_a + O/NO_2 + F^* + CH_3 + CO^* + hfa + Cl + (H)_b \quad [\text{II-906}]$$

These procedures are for wafer cleaning. For film etching a specific procedure has to be chosen in accordance with the other materials present.

REFERENCES

<A> M. W. Chase, Jr., C. A. Davies, J. R. Downey, Jr., D. J. Frurip, R. A. Mc Donald and A. N. Syverud, 'JANAF Thermochemical Tables' 3rd ed., *J. Phys. Chem. Ref. Data*, 1985, 14, Supplement No. 1.

<B> Donald D. Wagman, William H. Evans, Vivian B. Parker, Richard H. Schumm, Ira Halow, Sylvia M. Bailey, Kenneth L. Churney and Ralph L. Nutell, 'The NBS Tables of Chemical Thermodynamic Properties, Selected Values for Inorganic and $C_1$ and, $C_2$ Organic Substances in SI Units', *J. Phys. Chem. Ref. Data*, 1982, 11, Supplement No. 2.

<C> John A. Dean, ed., *Lange's Handbook of Chemistry*, 13th ed. McGraw-Hill Book Company, New York (1985).

<I-1> W. Tsang and R. F. Hampson, 'Chemical Data Base for Combustion Chemistry. Part 1. Methane and Related Compounds' *J. Phys. Chem. Ref. Data*, 1986, 15(3), 1087–1279.

<I-2> Walter J. Moore, *Physical Chemistry*, 4th ed., Prentice-Hall, Inc., Englewood Cliffs, N.J. (1972), p. 157.

<I-3> Cheng-ping Tsai and David L. McFadden, 'Gas-Phase Atom-Radical Kinetics of Atomic Hydrogen Reactions with $CF_3$, $CF_2$, and CF Radicals', *J. Phys. Chem.*, 1989, 93, 2472.

<I-4> J. L. Franklin, J. G. Dillard, H. M. Rosenstock, J. T. Herron, K. Draxl and F. H. Field, *Ionization Potentials, Appearance Potentials, and Heats of Formation of Gaseous Positive Ions*, NSRDS-NBS 26 (June 1969), p. 114.

<I-5> Hideo Okabe, *Photochemistry of Small Molecules*, John Wiley & Sons, New York (1978), p. 166.

<I-6> Ref. <I-5>, p. 168.

<I-7> S. R. Hunter and L. G. Christophorou, 'Electron Motion in Low- and High-Pressure Gases' in L. G. Christophorou, ed., *Electron—Molecule Interactions and Their Applications*, Vol. 2, Academic Press, Inc., Orlando, Fla. (1984), p. 200.

<I-8> Ref. <I-4>, p. 145.

<I-9> Ref. <I-5>, p. 184.

<I-10> Robert K. Steunenberg and Richard C. Vogel, 'The Absorption Spectrum of Fluorine', *J. Am. Chem. Soc.*, 1956, 78, 901.

<I-11> A. L. G. Rees, 'Electronic Spectrum and Dissociation Energy of Fluorine', *J. Chem. Phys.*, 1957, 26 (6), 1567–1571.

<I-12> Ref. <I-4>, p. 14.

<I-13> Ref. <I-5>, p. 162.

<I-14> Martin Misakian and Jens C. Zorn, 'Dissociation Excitation of Molecular Hydrogen by Electron Impact', *Phys. Rev.* (A), 1972, 6 (6), 2193.

<I-15> J. E. Mentall and E. P. Gentieu, 'Lyman-$\alpha$ Fluorescence from the Photodissociation of $H_2$', *J. Chem. Phys.*, 1970, 52 (11), 5641–5645.

<I-16> S. Trajmar and D. C. Cartwright, 'Excitation of Molecules by Electron Impact', in L. G. Christophorou, ed., *Electron-Molecule Interactions and their Applications*, Vol. 1., Academic Press, Inc., Orlando, Fla. (1984), p. 214.

<I-17> M. J. Mumma and E. C. Zipf, 'Dissociation Excitation of Vacuum Ultraviolet Emission Features by Electron Impact on Molecular Gases. I. $H_2$ and $O_2$, *J. Chem. Phys.*, 1971, 55 (4), 1663.

<I-18> Ref. <I-4>, p. 111.

<I-19> Ref. <I-5>, p. 177.

<I-20> Keith Schofield, 'Critically Evaluated Rate Constants for Gaseous Reactions of Severally Electronically Excited Species; *J. Phys. Chem. Ref. Data*, 1979, 8(3), 775.

<I-21> Y. Itikawa, A. Ichimura, K. Onda, K. Sakimoto, K. Takayanagi, Y. Hatano, M. Hayashi, H. Nishimura and S. Tsurubuchi, 'Cross Sections for Collisions of Electrons and Photons with Oxygen Molecules', J. Phys. Chem. Ref. Data, 1989, 18 (1), 23–42.

<I-22> R. L. Mc Carthy, 'Chemical Synthesis from Free Radicals Produced in Microwave Fields', *J. Chem. Phys.*, 1954, 22 (8), 1366–1365.

<I-23> E. C. Zipf, 'Dissociation of Molecules by Electron Impact', in L. G. Christophorou, ed., *Electron-Molecule Interactions and Their Applications*, Vol. 1., Academic Press, Inc., Orlando, Fla. (1984), p. 340.

<I-24> Walter L. Borst and E. C. Zipf, 'Energy Spectra of Metastable Oxygen Atoms Produced by Electron-Impact Dissociation of $O_2$', *Phys. Rev.* (A), 1971, 4 (1), 153–161.

<I-25> Ref. <I-17>, pp. 1665–1666.

<II-1> Hideo Okabe, *Photochemistry of Small Molecules*, John Wiley & Sons, New York (1978), p. 208.

<II-2> Ref. <II-1>, p. 196.

<II-3> R. Atkinson, B. L. Baulch, R. A. Cox, R. F. Hampson, Jr., J. A. Kerr and J. Troe, 'Evaluated Kinetic and Photochemical Data for Atmospheric Chemistry. Supplement III.', *J. Phys. Chem. Ref. Data*, 1989, 18 (2), 891.

<11-4> John T. Herron and Robert E. Huie, 'Rate Constants for the Reactions of Atomic Oxygen ($O^3P$) with Organic Compounds in the Gas Phase', *J. Phys. Chem. Ref. Data*, 1973, 2 (3), 470.

<II-5> John T. Herron, 'Evaluated Chemical Kinetic Data for the Reactions of Atomic Oxygen O($^3P$) with Saturated Organic Compounds in the Gas Phase', *J. Phys. Chem. Ref. Data*, 1988, 17 (3), 1013–1015.

<II-6> Ref. <II-3>, p. 895.

<II-7> Ref. <C>, p. 9-82.

<II-8> Ref. <C>, p. 9-155.

<II-9> Eugene S. Domalski, William H. Evans and Elizabeth D. Hearing, 'Heat Capacities and Entropies of Organic Compounds in the Condensed Phase', *J. Phys. Chem. Ref. Data*, 1984, 13, Supplement No. 1, p. 232.

<II-10> Ref. <C>, p. 4-105.

<II-11> D. L. Baulch, R. A. Cox, R. F. Hampson, Jr., J. A. Kerr, J. Troe and R. T. Watson, 'Evaluated Kinetic and Photochemical Data for Atmospheric Chemistry: Supplement II. ', *J. Phys. Chem. Ref. Data*, 1984, 13 (4), 1354.

<II-12> Ko-ichi Sugawara, Fumiyuki Ito, Taisuke Nakanaga, Harutoshi Takeo and Chi Matsumura, 'Vibrational and Rotational Energy Distributions of $CH_3$ and IF Formed in the Reactions of F Atoms with $CH_4$ and $CH_3I$', *J. Chem. Phys.*, 1990, 92 (9), 5332.

<II-13> Ref. <II-3>, p. 1094.

<II-14> Ref. Eugene S. Domalski and Elizabeth D. Hearing 'Estimation of the Thermodynamic Properties of Hydrocarbons at 298.15K', *J. Phys. Chem. Ref. Data*, 1988, 17 (4), 1664–1665.

<II-15> Ref. G. Pilcher and H. A. Skinner, 'Thermochemistry of Organometallic Compounds', in Frank R Hartley and Saul Patai, eds., *The Chemistry* of the Metal-Cargon Bond, Vol. 1., John Wiley & Sons, Ltd., Chichester ( 1982 ), pp. 43–90.

<II-16> Jindŕich Leitner, Čestmír Černý, Petr Voñka and Jan Mikulec, 'Theoretical and Experimental Study of Chemical Equilibrium in the Systems Si-Cl and Si-Cl-H. Calculation of Chemical Equilibrium in the Systems Si-Cl and Si-Cl-H', Collection of Czechoslovak Chemical Communications, 1989, 54 (11), 2899.

<II-17> I. Barin, O. Knacke and O. Kubaschewski Thermochemical Properties of Inorganic Substances, Supplement, Springer-Verlag, Berlin (1977), p. 89.

<II-18> ΛI. Barin and O. Knacke, Thermochemical Properties of Inorganic Substances, Springer-Verlag, Berlin (1973), p. 394.

<II-19> Ref. <II-17>, p. 351.
<II-20> Ref. <II-17>, p. 155.
<II-21> Ref. <II-17>, p. 450.
<II-22> Ref. <II-17>, p. 310.
<II-23> C. E. Wicks and F. E. Block, Thermodynamic Properties of 65 Elements—Their Oxides, Halides, Carbides, and Nitrides, Bulletin 605, Bureau of Mines (1963).
<II-24> Ref. <II-17>, pp. 351, 155, 450, 310.
<II-25> G. G. Libowitz and A. J. Maeland, 'Hydrides',in Karl A. Gschneidner Jr., and LeRoy Eyring, Handbook on the Physics and Chemistry of Rare Earths, Vol. 3, North-Holland Publishing Company, Amsterdam (1979), p. 309.
<II-26> Ref. <C>, pp. 4–127, 4–83 and 4–117.
<II-27> G. Dittmer and U. Niemann, 'Heterogeneous Reactions and Chemical Transport of Tungsten with Halides and Oxygen Under Steady-State Conditions of Incandescent Lamps', Philips J. Res., 1981, 36, 89–113.
<II-28> Ref. A. A. Woolf, 'An Outline of Rhenium Chemistry', Quarterly Reviews, 1961, 15 (3), 386.
<II-29> Ref. <II-17>, p. 535.
<II-30,> Keith G. G. Hopkins and Peter G. Nelson, 'Comparison of the Thermochemistry of Difluorides and Potassium Hexaflorometallates (iv) of the Elements of the Germanium Triad with that of the Elements of the Nickel Triad: A Study of the Inert-pair Effect', J. Chem. Soc., Dalton Trans., 1984, 1393.
<II-31> A. A. Bondarenko, M. V. Korobov, O. L. Sharova, A. V. Ryzhov and L. N. Sideroy, 'Mass Spectral Study of Equilibrium with Participation of Higher Platinum Fluorides', Zh. Neorg. Kahim., 1987, 32 (1), 28.
<II-32> M. V. Korobov, V. V. Nikulin, N. S. Chilingarov and L. N. Siderov, 'Enthalpy of Formation of Platinum Hexafluoride', J. Chem. Thermodynamics, 1986, 18 (3), 235.
<II-33> Manuel A. V. Ribeiro da Silva, 'Thermochemistry of β-Diketones and Metal-β-Diketones, Metal-Oxygen Bond Enthalpies', in Manuel A. V. Ribeiro da Silvá, ed., Thermo-Chemistry and Its Applications to Chemical and Biochemical Systems, D. Reidel Publishing Company, Dordrecht (1984), pp. 317–338.
<II-34> Ref. A. F. Wells, Structural Inorganic Chemistry, 5th ed., Clarendon Press, Oxford (1984), 540–543.
<II-35> E. W. Berg and F. R. Hartlage, 'Fractional Sublimation of Various Acetylacetonates', Anal. Chim. Acta, 1965, 33 (2), 173–81.
<II-36 > Aesar Catalog, 1989–21990, Johnson Matthey, Seabrook, N.H., p. 181.
<II-37> Susan Budavari, ed., The Merck Index, 11th ed., Merck & Co., Inc., Rahway, N.J. ( 1989 ), pp. 710–1.

Industrial Applicability

The present invention provides VFFTE apparatus, methods and chemistries for wafer fabrication and related technologies. It features relatively fast reactions at low temperatures and with minimal human handling of the wafers. Thereby wafer throughput can be greatly increased.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

That which is claimed is:

1. An apparatus for providing a reactive radical species at a substrate surface, comprising:
   a wall structure defining an interior chamber;
   mounting means for mounting a substrate in the chamber at a target position therein with a surface region of the substrate oriented in a selected direction;
   first vaporous chemical introducing means for introducing a first vaporous chemical to the chamber with the first vaporous chemical flowing toward the surface region of the substrate;
   first radical species generating means intermediate the first vaporous chemical introducing means and the substrate surface region for generating a first radical species from the first vaporous chemical at a pressure of no more than about 0.1 Torr without producing significant amounts of ionized species with the first radical species flowing toward the surface region of the substrate; and
   pumping means for evacuating the chamber and for maintaining a pressure within the chamber of $\leq 10^{-7}$ Torr during the introduction of the first vaporous chemical.

2. An apparatus as set forth in claim 1, further including:
   second vaporous chemical introducing means for introducing a second vaporous chemical to the chamber intermediate the first radical species generating means and the surface region of the substrate with the second vaporous chemical flowing toward the surface region of the substrate, the second vaporous chemical being selected to react with substantially all of the first radical species to produce a second radical species flowing toward the surface region of the substrate, or to dilute the first radical species.

3. An apparatus as set forth in claim 1, wherein the first radical species generating means comprises a microwave generator.

4. An apparatus as set forth in claim 3, wherein the first radical species generating means further comprises an electron source.

5. An apparatus as set forth in claim 3, wherein the first radical species generating means further comprises a defocussed electron gun.

6. An apparatus as set forth in claim 1, wherein the first radical species generating means comprises an electron source.

7. An apparatus as set forth in claim 1, wherein the first radical species generating means comprises a defocussed electron gun.

8. An apparatus as set forth in claim 1, wherein the first radical species generating means comprises a defocussed tunable laser.

9. An apparatus as set forth in claim 1, wherein the first radical species generating means comprises a plurality of defocussed tunable lasers.

10. An apparatus as set forth in claim 1, wherein the orientation of the substrate surface region, the first vaporous chemical introducing means and the first radical species generating means is such as to provide a substantially uniform distribution of the first radical species over the surface region of the substrate.

11. An apparatus as set forth in claim 2, wherein the orientation of the substrate surface region, the first vaporous chemical introducing means, the first radical species generating means and the second vaporous chemical introducing means is such as to provide a substantially uniform distribution of the second radical species over the surface region of the substrate.

12. An apparatus as set forth in claim 1, wherein the chamber, where the substrate is mounted, is at least about three times the width of the largest dimension of the surface region.

13. A method of producing a radical species which can carry out a chemical reaction adjacent the surface of a substrate, comprising:
mounting a substrate in a sealed chamber at a target position therein with a surface region of the substrate oriented in a selected direction;
introducing a first vaporous chemical to the chamber with the first vaporous chemical flowing toward the surface region of the substrate;
generating a first radical species from the first vaporous chemical at a position in the chamber intermediate the place of introduction of the vaporous chemical and the surface region of the substrate without producing significant amounts of ionized species with the first radical species flowing toward the surface region of the substrate; and
evacuating the chamber at a rate sufficient for maintaining a pressure within the chamber of $10^{-7}$ Torr or below during the introduction of the first vaporous chemical.

14. A method as set forth in claim 13, further including:
introducing a second vaporous chemical to the chamber intermediate the position of generation of the first radical species and the surface region of the substrate with the second vaporous chemical flowing toward the surface region of the substrate, the second vaporous chemical being selected to react with substantially all of the first radical species to produce a second radical species flowing toward the surface region of the substrate.

15. A method as set forth in claim 13, wherein the orientation of the substrate surface region, the geometry of the first vaporous chemical introducing and the geometry of the first radical species generating is such as to provide a substantially uniform distribution of the first radical species over the surface region of the substrate.

16. A method as set forth in claim 14, wherein the orientation of the substrate surface region, the geometry of the first vaporous chemical introducing, the geometry of the first radical species generating and the geometry of the second vaporous chemical introducing is such as to provide a substantially uniform distribution of the second radical species over the surface region of the substrate.

17. A method of cleaning a surface of a substrate to remove one or more solids from a surface thereof, comprising:
generating a neutral activated chemical species without generating a substantial quantity of ionized activated species at a pressure of no more than about 0.1 Torr within a sealed evacuatable chamber;
flowing the neutral activated chemical species against the surface, the neutral activated chemical species being selected to react with and convert at least one of the solids to a vaporous species; and
evacuating the chamber at an evacuatiion rate sufficient to maintain the pressure therein at $\leq 10^{-7}$ Torr during the flowing until a desired quantity of the solid has been removed by vaporization.

18. A method as set forth in claim 17, wherein the solid comprises a layer of a different chemical composition from the surface, the layer covering the majority of the surface.

19. A method as set forth in claim 17, wherein the solid comprises a plurality of particles lying upon the surface.

20. A method as set forth in claim 17, wherein the generating and flowing steps comprise:
introducing a first vaporous chemical to the chamber with the first vaporous chemical flowing toward the surface; and
irradiating the first vaporous chemical to produce the neutral activated chemical species from the first vaporous chemical at a pressure of no more than about 0.1 Torr without producing significant amounts of ionized species.

21. A method as set forth in claim 17, wherein the generating and flowing steps comprise:
introducing a first vaporous chemical to the chamber with the first vaporous chemical flowing toward the surface;
irradiating the first vaporous chemical to produce a first activated chemical species from the first vaporous chemical at a pressure of no more than about 0.1 Torr without producing significant amounts of ionized species;
introducing a second vaporous chemical to the chamber intermediate the site of introduction of the first vaporous chemical and the surface with the second vaporous chemical flowing toward the surface, the second vaporous chemical being selected to react with substantially all of tne first activated chemical species to produce the neutral chemical activated species flowing toward the surface.

22. A method of etching into a surface of a substrate, comprising:
generating a neutral activated chemical species without generating a substantial quantity of ionized activated species at a pressure of no more than about 0.1 Torr within a sealed evacuatable chamber;
flowing the neutral activated chemical species against the surface, the neutral activated chemical species being selected to react with and convert the surface to a vaporous species until a desired quantity of the surface has been removed by vaporization; and evacuating the chamber at an evacuation rate sufficient to maintain the pressure therein at $\leq 10^{-7}$ Torr during the flowing until a desired quantity of the surface has been removed by vaporization.

23. A method as set forth in claim 22, wherein the generating and flowing steps comprise:

introducing a first vaporous chemical to the chamber with the first vaporous chemical flowing toward the surface; and irradiating the first vaporous chemical to produce the neutral activated chemical species from the first vaporous chemical at a pressure of no more than about 0.1 Torr without producing significant amounts of ionized species.

24. A method as set forth in claim 22, wherein the generating and flowing steps comprise:

introducing a first vaporous chemical to the chamber with the first vaporous chemical flowing toward the surface;

irradiating the first vaporous chemical to produce a first activated chemical species from the first vaporous chemical at a pressure of no more than about 0.1 Torr without producing significant amounts of ionized species;

introducing a second vaporous chemical to the chamber intermediate the site of introduction of the first vaporous chemical and the surface with the second vaporous chemical flowing toward the surface, the second vaporous chemical being selected to react with substantially all of the first activated chemical species to produce the neutral chemical activated species flowing toward the surface.

25. A method as set forth in claim 24, further including, prior to the generating step:

positioning a protective mask over selected portions of the surface, the mask being of a construction such that only those portions of the surface which are not covered by the mask are etched by the neutral activated chemical species.

26. A method as set forth in claim 25, wherein the generating and flowing steps comprise:

introducing a first vaporous chemical to the chamber with the first vaporous chemical flowing toward the surface; and irradiating the first vaporous chemical to produce the neutral activated chemical species from the first vaporous chemical at a pressure of no more than about 0.1 Torr without producing significant amounts of ionized species.

27. A method as set forth in claim 25, wherein the generating and flowing steps comprise:

introducing a first vaporous chemical to the chamber with the first vaporous chemical flowing toward the surface;

irradiating the first vaporous chemical to produce a first activated chemical species from the first vaporous chemical at a pressure of no more than about 0.1 Torr without producing significant amounts of ionized species;

introducing a second vaporous chemical to the chamber intermediate the site of introduction of the first vaporous chemical and the surface with the second vaporous chemical flowing toward the surface, the second vaporous chemical being selected to react with substantially all of the first activated chemical species to produce the neutral chemical activated species flowing toward the surface.

28. A method as set forth in claim 24, wherein the generating and flowing steps comprise:

introducing a first vaporous chemical to the chamber with the first vaporous chemical flowing toward the surface; and irradiating the first vaporous chemical to produce the neutral activated chemical species from the first vaporous chemical at a pressure of no more than about 0.1 Torr without producing significant amounts of ionized species.

29. A method as set forth in claim 24, wherein the generating and flowing steps comprise:

introducing a first vaporous chemical to the chamber with the first vaporous chemical flowing toward the surface;

irradiating the first vaporous chemical to produce a first activated chemical species from the first vaporous chemical at a pressure of no more than about 0.1 Torr without producing significant amounts of ionized species;

introducing a second vaporous chemical to the chamber intermediate the site of introduction of the first vaporous chemical and the surface with the second vaporous chemical flowing toward the surface region of the substrate, the second vaporous chemical being selected to react with substantially all of the first activated chemical species to produce the neutral chemical activated species flowing toward the surface.

30. A method as set forth in claim 29, wherein the substrate comprises a semiconductor wafer.

31. A method as set forth in claim 30, wherein the irradiating is by one or more of microwaves, defocussed electron guns and defocussed tunable lasers.

32. A method as set forth in claim 31, further including:

monitoring the composition of the gaseous species being evacuated from the chamber; and controlling how much of the layer is removed based upon the monitoring.

33. A method of depositing a chemical species adjacent a surface region of a substrate, comprising:

mounting a substrate in a sealed chamber at a target position therein with the surface region of the substrate oriented in a selected direction;

introducing a first vaporous chemical to the chamber with the first vaporous chemical flowing toward the surface region of the substrate;

generating a first radical species from the first vaporous chemical at a position in the chamber intermediate the place of introduction of the vaporous chemical and the surface region of the substrate without producing significant amounts of ionized species with the first radical species flowing toward the surface region of the substrate;

evacuating the chamber at a rate sufficient for maintaining a pressure within the chamber of $10^{-7}$ Torr or below during the introduction of the first vaporous chemical;

introducing a second vaporous chemical to the chamber intermediate the position of generation of the first radical species and the surface region of the substrate with the second vaporous chemical flowing toward the surface region of the substrate, the second vaporous chemical being selected to react with the first radical species such that substantially all of the second vaporous chemical reacts with the first radical species to produce a second radical species flowing toward the surface region of the substrate, the second radical species, on contacting the surface region of the substrate, depositing the chemical species adjacent the surface region of the substrate.

34. A method as set forth in claim 33, wherein the orientation of the substrate surface region, the geometry of the first vaporous chemical introducing, the geometry of the first radical species generating and the geometry of the second vaporous chemical introducing is such as to provide a substantially uniform distribution of the second radical species over the surface region of the substrate.

* * * * *